US009417637B2

(12) United States Patent
Matsuoka et al.

(10) Patent No.: US 9,417,637 B2
(45) Date of Patent: Aug. 16, 2016

(54) BACKGROUND SCHEDULE SIMULATIONS IN AN INTELLIGENT, NETWORK-CONNECTED THERMOSTAT

(71) Applicant: Google Inc., Mountain View, CA (US)

(72) Inventors: Yoky Matsuoka, Palo Alto, CA (US); Mark Malhotra, San Mateo, CA (US)

(73) Assignee: Google Inc., Mountain View, CA (US)

( * ) Notice: Subject to any disclaimer, the term of this patent is extended or adjusted under 35 U.S.C. 154(b) by 538 days.

(21) Appl. No.: 13/828,767

(22) Filed: Mar. 14, 2013

(65) Prior Publication Data

US 2013/0274928 A1 Oct. 17, 2013

Related U.S. Application Data

(63) Continuation-in-part of application No. PCT/US2012/000007, filed on Jan. 3, 2012, and a continuation-in-part of application No. 13/632,041, filed on Sep. 30, 2012, now Pat. No. 8,630,740.

(Continued)

(51) Int. Cl.
*G05D 23/19* (2006.01)
*H04L 12/28* (2006.01)
(Continued)

(52) U.S. Cl.
CPC ........ *G05D 23/1919* (2013.01); *G05D 23/1904* (2013.01); *G06N 99/005* (2013.01); *H04L 12/2825* (2013.01); *H04L 12/40013* (2013.01); *H04L 2012/285* (2013.01)

(58) Field of Classification Search
None
See application file for complete search history.

(56) References Cited

U.S. PATENT DOCUMENTS 3,991,357 A 11/1976 Kaminski
4,183,290 A 1/1980 Kucharczyk
(Continued)

FOREIGN PATENT DOCUMENTS

CA 2202008 2/2000
EP 196069 12/1991
(Continued)

OTHER PUBLICATIONS

Aprilaire Electronic Thermostats Model 8355 User's Manual, Research Products Corporation, Dec., 2000, 16 pages.
(Continued)

*Primary Examiner* — Kenneth M Lo
*Assistant Examiner* — Geoffrey Wellman
(74) *Attorney, Agent, or Firm* — Kilpatrick Townsend & Stockton LLP

(57) ABSTRACT

The current application is directed to intelligent controllers that initially aggressively learn, and then continue, in a steady-state mode, to monitor, learn, and modify one or more control schedules that specify a desired operational behavior of a device, machine, system, or organization controlled by the intelligent controller. An intelligent controller generally acquires one or more initial control schedules through schedule-creation and schedule-modification interfaces or by accessing a default control schedule stored locally or remotely in a memory or mass-storage device. The intelligent controller then proceeds to learn, over time, a desired operational behavior for the device, machine, system, or organization controlled by the intelligent controller based on immediate-control inputs, schedule-modification inputs, and previous and current control schedules, encoding the desired operational behavior in one or more control schedules and/or sub-schedules.

30 Claims, 88 Drawing Sheets

Related U.S. Application Data

(60) Provisional application No. 61/429,093, filed on Dec. 31, 2010, provisional application No. 61/627,996, filed on Oct. 21, 2011, provisional application No. 61/550,346, filed on Oct. 21, 2011.

(51) Int. Cl.
*H04L 12/40* (2006.01)
*G06N 99/00* (2010.01)

(56) References Cited

U.S. PATENT DOCUMENTS

| | | | |
|---|---|---|---|
| 4,223,831 A | 9/1980 | Szarka | |
| 4,335,847 A | 6/1982 | Levine | |
| 4,408,711 A | 10/1983 | Levine | |
| 4,615,380 A | 10/1986 | Beckey | |
| 4,674,027 A | 6/1987 | Beckey | |
| 4,685,614 A | 8/1987 | Levine | |
| 4,751,961 A | 6/1988 | Levine et al. | |
| 4,897,798 A | 1/1990 | Cler | |
| 4,971,136 A | 11/1990 | Mathur et al. | |
| 5,088,645 A | 2/1992 | Bell | |
| 5,211,332 A | 5/1993 | Adams | |
| 5,240,178 A | 8/1993 | Dewolf et al. | |
| 5,244,146 A | 9/1993 | Jefferson et al. | |
| 5,395,042 A | 3/1995 | Riley et al. | |
| 5,476,221 A | 12/1995 | Seymour | |
| 5,499,196 A | 3/1996 | Pacheco | |
| 5,555,927 A | 9/1996 | Shah | |
| 5,611,484 A | 3/1997 | Uhrich | |
| 5,808,294 A | 9/1998 | Neumann | |
| 5,902,183 A | 5/1999 | D'Souza | |
| 5,909,378 A | 6/1999 | De Milleville | |
| 5,918,474 A | 7/1999 | Khanpara et al. | |
| 5,977,964 A | 11/1999 | Williams et al. | |
| 6,062,482 A | 5/2000 | Gauthier et al. | |
| 6,066,843 A | 5/2000 | Scheremeta | |
| 6,072,784 A | 6/2000 | Agrawal et al. | |
| 6,092,376 A * | 7/2000 | Lake et al. | 62/133 |
| 6,095,427 A | 8/2000 | Hoium et al. | |
| 6,098,893 A | 8/2000 | Berglund et al. | |
| 6,216,956 B1 | 4/2001 | Ehlers et al. | |
| 6,349,883 B1 | 2/2002 | Simmons et al. | |
| 6,356,204 B1 | 3/2002 | Guindi et al. | |
| 6,370,894 B1 | 4/2002 | Thompson et al. | |
| 6,415,205 B1 | 7/2002 | Myron et al. | |
| 6,478,233 B1 | 11/2002 | Shah | |
| 6,490,174 B1 | 12/2002 | Kompelien | |
| 6,645,066 B2 | 11/2003 | Gutta et al. | |
| 6,769,482 B2 | 8/2004 | Wagner et al. | |
| 6,990,821 B2 | 1/2006 | Singh et al. | |
| 7,024,336 B2 | 4/2006 | Salsbury et al. | |
| 7,149,727 B1 | 12/2006 | Nicholls et al. | |
| 7,149,729 B2 | 12/2006 | Kaasten et al. | |
| 7,188,482 B2 | 3/2007 | Sadegh et al. | |
| 7,379,791 B2 | 5/2008 | Tamarkin et al. | |
| RE40,437 E | 7/2008 | Rosen | |
| 7,469,550 B2 | 12/2008 | Chapman, Jr. et al. | |
| 7,644,869 B2 | 1/2010 | Hoglund et al. | |
| 7,702,424 B2 | 4/2010 | Cannon et al. | |
| 7,784,704 B2 | 8/2010 | Harter | |
| 7,802,618 B2 | 9/2010 | Simon et al. | |
| 7,848,900 B2 | 12/2010 | Steinberg et al. | |
| 7,849,698 B2 | 12/2010 | Harrod et al. | |
| 7,854,389 B2 | 12/2010 | Ahmed | |
| 8,010,237 B2 | 8/2011 | Cheung et al. | |
| 8,019,567 B2 | 9/2011 | Steinberg et al. | |
| 8,037,022 B2 | 10/2011 | Rahman et al. | |
| 8,090,477 B1 | 1/2012 | Steinberg | |
| 8,091,375 B2 | 1/2012 | Crawford | |
| 8,131,497 B2 | 3/2012 | Steinberg et al. | |
| 8,174,381 B2 | 5/2012 | Imes et al. | |
| 8,180,492 B2 | 5/2012 | Steinberg | |
| 8,219,249 B2 | 7/2012 | Harrod et al. | |

| | | | |
|---|---|---|---|
| 2004/0249479 A1 | 12/2004 | Shorrock | |
| 2005/0090915 A1 | 4/2005 | Geiwitz | |
| 2005/0128067 A1 | 6/2005 | Zakrewski | |
| 2005/0150968 A1 | 7/2005 | Shearer | |
| 2005/0189429 A1 | 9/2005 | Breeden | |
| 2005/0192915 A1 | 9/2005 | Ahmed et al. | |
| 2005/0280421 A1 | 12/2005 | Yomoda et al. | |
| 2006/0186214 A1 | 8/2006 | Simon et al. | |
| 2006/0196953 A1 | 9/2006 | Simon et al. | |
| 2006/0208099 A1 | 9/2006 | Chapman et al. | |
| 2007/0045431 A1 | 3/2007 | Chapman, Jr. et al. | |
| 2007/0115902 A1 | 5/2007 | Shamoon et al. | |
| 2007/0167179 A1 | 7/2007 | Shamoon et al. | |
| 2007/0205297 A1 | 9/2007 | Finkam et al. | |
| 2008/0015742 A1 | 1/2008 | Kulyk et al. | |
| 2008/0177423 A1 * | 7/2008 | Brickfield et al. | 700/291 |
| 2008/0183335 A1 | 7/2008 | Poth et al. | |
| 2008/0191045 A1 | 8/2008 | Harter | |
| 2008/0273754 A1 | 11/2008 | Hick et al. | |
| 2008/0317292 A1 | 12/2008 | Baker et al. | |
| 2009/0171862 A1 | 7/2009 | Harrod et al. | |
| 2009/0195349 A1 | 8/2009 | Frader-Thompson et al. | |
| 2009/0254225 A1 | 10/2009 | Boucher et al. | |
| 2009/0259713 A1 | 10/2009 | Blumrich et al. | |
| 2009/0297901 A1 | 12/2009 | Kilian et al. | |
| 2009/0327354 A1 | 12/2009 | Resnick et al. | |
| 2010/0019051 A1 | 1/2010 | Rosen | |
| 2010/0025483 A1 | 2/2010 | Hoeynck et al. | |
| 2010/0050004 A1 | 2/2010 | Hamilton, II et al. | |
| 2010/0060479 A1 | 3/2010 | Salter | |
| 2010/0070084 A1 | 3/2010 | Steinberg et al. | |
| 2010/0070086 A1 | 3/2010 | Harrod et al. | |
| 2010/0070234 A1 | 3/2010 | Steinberg et al. | |
| 2010/0084482 A1 | 4/2010 | Kennedy et al. | |
| 2010/0101854 A1 | 4/2010 | Wallaert et al. | |
| 2010/0167783 A1 | 7/2010 | Alameh et al. | |
| 2010/0179704 A1 | 7/2010 | Ozog | |
| 2010/0211224 A1 | 8/2010 | Keeling et al. | |
| 2010/0262298 A1 | 10/2010 | Johnson et al. | |
| 2010/0262299 A1 | 10/2010 | Cheung et al. | |
| 2010/0280667 A1 | 11/2010 | Steinberg | |
| 2010/0289643 A1 | 11/2010 | Trundle et al. | |
| 2010/0305891 A1 | 12/2010 | Rodgers | |
| 2010/0308119 A1 | 12/2010 | Steinberg et al. | |
| 2010/0318227 A1 | 12/2010 | Steinberg et al. | |
| 2011/0046792 A1 | 2/2011 | Imes et al. | |
| 2011/0046805 A1 | 2/2011 | Bedros et al. | |
| 2011/0046806 A1 | 2/2011 | Nagel et al. | |
| 2011/0077758 A1 | 3/2011 | Tran et al. | |
| 2011/0077896 A1 | 3/2011 | Steinberg et al. | |
| 2011/0151837 A1 | 6/2011 | Winbush, III | |
| 2011/0160913 A1 | 6/2011 | Parker et al. | |
| 2011/0185895 A1 | 8/2011 | Freen | |
| 2011/0307103 A1 | 12/2011 | Cheung et al. | |
| 2011/0307112 A1 | 12/2011 | Barrilleaux | |
| 2012/0017611 A1 | 1/2012 | Coffel et al. | |
| 2012/0065935 A1 | 3/2012 | Steinberg et al. | |
| 2012/0085831 A1 | 4/2012 | Kopp | |
| 2012/0101637 A1 | 4/2012 | Imes et al. | |
| 2012/0158350 A1 | 6/2012 | Steinberg et al. | |
| 2012/0221151 A1 | 8/2012 | Steinberg | |
| 2012/0252430 A1 | 10/2012 | Imes et al. | |

FOREIGN PATENT DOCUMENTS

| | | |
|---|---|---|
| JP | 59106311 | 6/1984 |
| JP | 01252850 | 10/1989 |
| WO | 2012068591 | 5/2012 |

OTHER PUBLICATIONS

Braeburn 5300 Installer Guide, Braeburn Systems, LLC, Dec. 9, 2009, 10 pages.
Braeburn Model 5200, Braeburn Systems, LLC, Jul. 20, 2011, 11 pages.
Ecobee Smart Si Thermostat Installation Manual, Ecobee, Apr. 3, 2012, 40 pages.
Ecobee Smart Si Thermostat User Manual, Ecobee, Apr. 3, 2012, 44 pages.

(56) References Cited

OTHER PUBLICATIONS

Ecobee Smart Thermostat Installation Manual, Jun. 29, 2011, 20 pages.
Ecobee Smart Thermostat User Manual, May 11, 2010, 20 pages.
Electric Heat Lock Out on Heat Pumps, Washington State University Extension Energy Program, Apr. 2010, pp. 1-3.
Honeywell Installation Guide FocusPRO TH6000 Series, Honeywell International, Inc., Jan. 5, 2012, 24 pages.
Honeywell Operating Manual FocusPRO TH6000 Series, Honeywell International, Inc., Mar. 25, 2011, 80 pages.
Honeywell Prestige THX9321-9421 Operating Manual, Honeywell International, Inc., Jul. 6, 2011, 120 pages.
Honeywell THX9321 Prestige 2.0 and TXH9421 Prestige IAQ 2.0 with EIM Product Data, Honeywell International, Inc., 68/0311, Jan. 2012, 126 pages.
Hunter Internet Thermostat Installation Guide, Hunter Fan Co., Aug. 14, 2012, 8 pages.
Introducing the New Smart Si Thermostat, Datasheet [online], retrieved from the Internet: <URL:https://www.ecobee.com/solutions/home/smart-si/> [retrieved on Feb. 25, 2013], Ecobee, Mar. 12, 2012, 4 pages.
Lennox ComfortSense 5000 Owners Guide, Lennox Industries, Inc., Feb., 2008, 32 pages.
Lennox ComfortSense 7000 Owners Guide, Lennox Industries, Inc., May 2009, 15 pages.
Lennox iComfort Manual, Lennox Industries, Inc., Dec., 2010, 20 pages.
Lux PSPU732T Manual, LUX Products Corporation, Jan. 6, 2009, 48 pages.
NetX RP32-WIFI Network Thermostat Consumer Brochure, Network Thermostat, May 2011, 2 pages.
NetX RP32-WIFI Network Thermostat Specification Sheet, Network Thermostat, Feb. 28, 2012, 2 pages.
RobertShaw Product Manual 9620, Maple Chase Company, Jun. 12, 2001, 14 pages.
RobertShaw Product Manual 9825i2, Maple Chase Company, Jul. 17, 2006, 36 pages.
SYSTXCCUIZ01-V Infinity Control Installation Instructions, Carrier Corp., May 31, 2012, 20 pages.
T8611G Chronotherm IV Deluxe Programmable Heat Pump Thermostat Product Data, Honeywell International Inc., Oct. 1997, 24 pages.
TB-PAC, TB-PHP, Base Series Programmable Thermostats, Carrier Corp., May 14, 2012, 8 pages.
The Perfect Climate Comfort Center PC8900A W8900A-C Product Data Sheet, Honeywell International Inc., Apr. 2001, 44 pages.
TP-PAC, TP-PHP, TP-NAC, TP-NHP Performance Series AC/HP Thermostat Installation Instructions, Carrier Corp., Sep. 2007, 56 pages.
Trane Communicating Thermostats for Fan Coil, Trane, May 2011, 32 pages.
Trane Communicating Thermostats for Heat Pump Control, Trane, May 2011, 32 pages.
Trane Install XL600 Installation Manual, Trane, Mar. 2006, 16 pages.
Trane XL950 Installation Guide, Trane, Mar. 2011, 20 pages.
Venstar T2900 Manual, Venstar, Inc., Apr. 2008, 113 pages.
Venstar T5800 Manual, Venstar, Inc., Sep. 7, 2011, 63 pages.
VisionPRO TH8000 Series Installation Guide, Honeywell International, Inc., Jan. 2012, 12 pages.
VisionPRO TH8000 Series Operating Manual, Honeywell International, Inc., Mar. 2011, 96 pages.
VisionPRO Wi-Fi Programmable Thermostat User Guide, Honeywell International, Inc., Aug. 2012, 48 pages.
White Rodgers (Emerson) Model 1F81-261 Installation and Operating Instructions, White Rodgers, Apr. 15, 2010, 8 pages.
White Rodgers (Emerson) Model IF98EZ-1621 Homeowner's User Guide, White Rodgers, Jan. 25, 2012, 28 pages.
Akhlaghinia et al., Occupancy Monitoring in Intelligent Environment through Integrated Wireless Localizing Agents, IEEE, 2009, 7 pages.
Akhlaghinia et al., Occupant Behaviour Prediction in Ambient Intelligence Computing Environment, Journal of Uncertain Systems, vol. 2, No. 2, 2008, pp. 85-100.
Allen et al., Real-Time Earthquake Detection and Hazard Assessment by ElarmS Across California, Geophysical Research Letters, vol. 36, L00B08, 2009, pp. 1-6.
Chatzigiannakis et al., Priority Based Adaptive Coordination of Wireless Sensors and Actors, Q2SWinet '06, Oct. 2006, pp. 37-44.
Deleeuw, Ecobee WiFi Enabled Smart Thermostat Part 2: The Features Review, retrieved from <URL:http://www.homenetworkenabled.com/content.php?136-ecobee-WiFi-enabled-Smart-Thermostat-Part-2-The-Features-review> [retrieved on Jan. 8, 2013], Dec. 2, 2011, 5 pages.
Gao et al., The Self-Programming Thermostat: Optimizing Setback Schedules Based on Home Occupancy Patterns, In Proceedings of the First ACM Workshop on Embedded Sensing Systems for Energy-Efficiency in Buildings, Nov. 3, 2009, 6 pages.
Loisos et al., Buildings End-Use Energy Efficiency: Alternatives to Compressor Cooling, California Energy Commission, Public Interest Energy Research, Jan. 2000, 80 pages.
Lu et al., The Smart Thermostat: Using Occupancy Sensors to Save Energy in Homes, In Proceedings of the 8th ACM Conference on Embedded Networked Sensor Systems, Nov. 3-5, 2010, pp. 211-224.
Mozer, The Neural Network House: An Environmental that Adapts to its Inhabitants, Proceedings of the American Association for Artificial Intelligence SS-98-02, 1998, pp. 110-114.
International Application No. PCT/US2012/000007, International Preliminary Report on Patentability mailed on May 21, 2013, 8 pages.
International Application No. PCT/US2012/000007, International Search Report & Written Opinion mailed on Jan. 31, 2013 9 pages.
Ros et al., Multi-Sensor Human Tracking with the Bayesian Occupancy Filter, IEEE, 2009, 8 pages.
Wong et al., Maximum Likelihood Estimation of ARMA Model with Error Processes for Replicated Observations, National University of Singapore, Department of Economics, Working Paper No. 0217, Feb. 2002, pp. 1-19.

\* cited by examiner

| key | explanation |
| --- | --- |
| $a1, a4$ | schedule change results in sensor data, formerly within specified ranges, to now be outside of the specified ranges |
| $a2, a3$ | schedule change returns sensor data to within specified ranges |
| $b1, b4$ | analogous to a1, a4 as a result of immediate control |
| $b2, b3$ | analogous to a2, a3 as a result of immediate control |
| $c1, c2, c3, c4$ | schedule changed by user or by system |
| $d1, d2, d3, d4$ | return to former state following schedule change |
| $e1, e2, e3, e4$ | user initiated immediate control |
| $f1, f2, f3, f4$ | return to former state following schedule change |
| 1, 2 | power-on or reset followed by initial configuration |
| 3 | change in environment monitored by sensors |
| 4 | change in environment monitored by sensors |
| 5 | controller outputs system-activation control |
| 6 | system failure or manual de-activation |
| 7 | system changes environment so that sensor data returns to within specified ranges |
| 8 | environmental changes despite system activation |
| 9 | controller detects return of sensor data to specified ranges and outputs control to deactivate system |
| 10 | manual activation of system or system failure |

FIG. 11C

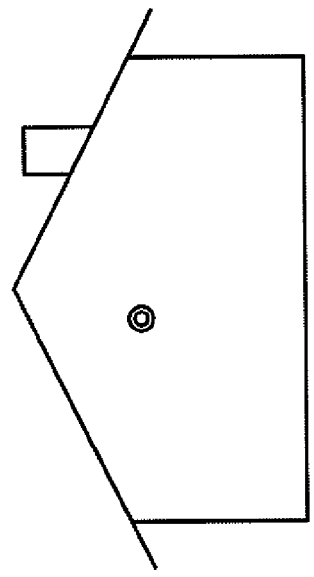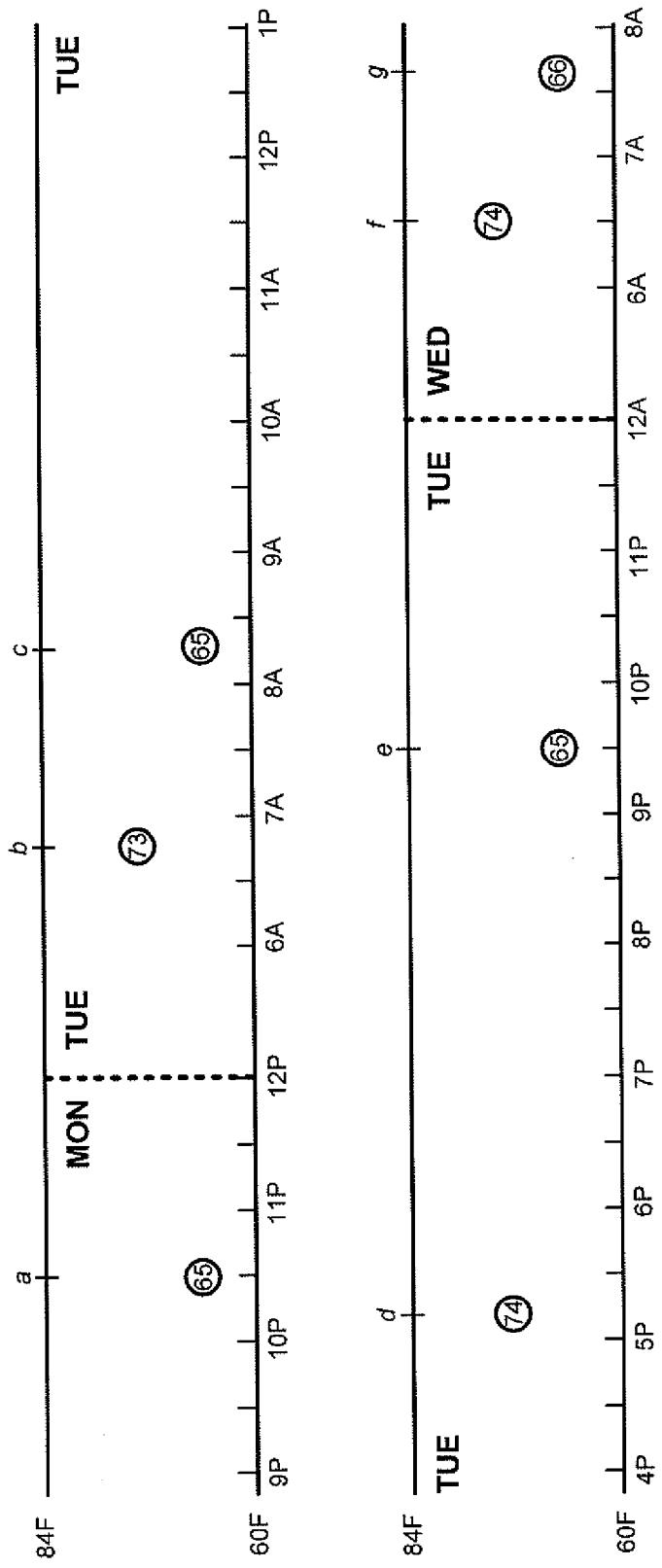
FIG. 41A

BACKGROUND SCHEDULE SIMULATIONS IN AN INTELLIGENT, NETWORK-CONNECTED THERMOSTAT

CROSS-REFERENCE TO RELATED APPLICATION

This application is a continuation-in-part of International Application No. PCT/US2012/000007 filed Jan. 3, 2012 and of U.S. Ser. No. 13/632,041 filed Sep. 30, 2012. International Application No. PCT/US2012/000007 claims the benefit of U.S. Provisional Application No. 61/429,093 filed Dec. 31, 2010 and U.S. Provisional Application No. 61/627,996 filed Oct. 21, 2011. U.S. Ser. No. 13/632,041 claims the benefit of U.S. Provisional Application No. 61/550,346 filed Oct. 21, 2011. Each of the above-referenced patent applications is incorporated by reference herein.

TECHNICAL FIELD

The current patent application is directed to machine learning and intelligent controllers and, in particular, to intelligent controllers, and machine-learning methods incorporated within intelligent controllers, that develop and refine one or more control schedules, over time, based on received control inputs and inputs through schedule-creation and schedule-modification interfaces.

BACKGROUND

Control systems and control theory are well-developed fields of research and development that have had a profound impact on the design and development of a large number of systems and technologies, from airplanes, spacecraft, and other vehicle and transportation systems to computer systems, industrial manufacturing and operations facilities, machine tools, process machinery, and consumer devices. Control theory encompasses a large body of practical, system-control-design principles, but is also an important branch of theoretical and applied mathematics. Various different types of controllers are commonly employed in many different application domains, from simple closed-loop feedback controllers to complex, adaptive, state-space and differential-equations-based processor-controlled control system.

Many controllers are designed to output control signals to various dynamical components of a system based on a control model and sensor feedback from the system. Many systems are designed to exhibit a predetermined behavior or mode of operation, and the control components of the system are therefore designed, by traditional design and optimization techniques, to ensure that the predetermined system behavior transpires under normal operational conditions. A more difficult control problem involves design and implementation of controllers that can produce desired system operational behaviors that are specified following controller design and implementation. Theoreticians, researchers, and developers of many different types of controllers and automated systems continue to seek approaches to controller design to produce controllers with the flexibility and intelligence to control systems to produce a wide variety of different operational behaviors, including operational behaviors specified after controller design and manufacture.

SUMMARY

The current application is directed to intelligent controllers that initially aggressively learn, and then continue, in a steady-state mode, to monitor, learn, and modify one or more control schedules that specify a desired operational behavior of a device, machine, system, or organization controlled by the intelligent controller. An intelligent controller generally acquires one or more initial control schedules through schedule-creation and schedule-modification interfaces or by accessing a default control schedule stored locally or remotely in a memory or mass-storage device. The intelligent controller then proceeds to learn, over time, a desired operational behavior for the device, machine, system, or organization controlled by the intelligent controller based on immediate-control inputs, schedule-modification inputs, and previous and current control schedules, encoding the desired operational behavior in one or more control schedules and/or sub-schedules. Control-schedule learning is carried out in at least two different phases, the first of which favors frequent immediate-control inputs and the remaining of which generally tend to minimize the frequency of immediate-control inputs. Learning occurs following monitoring periods and learning results may be propagated from a new provisional control schedule or sub-schedule associated with a completed monitoring period to one or more related control schedules or sub-schedules associated with related time periods.

Provided according to some embodiments is a method for promoting energy efficiency in association with an HVAC system of a climate controlled enclosure, the HVAC system being controlled by a network-connected thermostat having a user interface controllable by a user. The method includes receiving a first HVAC schedule including a plurality of setpoints that each include an indication of a setpoint time and a setpoint temperature for the climate controlled enclosure, operating, over a period of time, the HVAC system according to the first HVAC schedule, measuring, over the period of time, an actual ambient temperature in the climate controlled enclosure, receiving an update corresponding to at least one of: a real-time setpoint change including a desired temperature for immediate implementation entered by the user using the user interface during the period of time, a schedule change including at least one of (i) a change to the setpoint temperature or setpoint time of one or more setpoints of the first HVAC schedule, (ii) the removal of the one or more setpoints from the first HVAC schedule, and (iii) the addition of one or more new setpoints to the first HVAC schedule, and an occupancy profile including indications over the period of time of whether one or more occupants is present in the climate controlled enclosure, processing the received update in conjunction with the first HVAC schedule to generate a second HVAC schedule representative of what would have been generated by a first automated schedule learning algorithm operating over the period of time, generating a cost difference indicator, subsequent to the period of time, corresponding to a cost difference between an actual cost of operating the HVAC system according to the first HVAC schedule over the period of time and a hypothetical cost of operating the HVAC system according to the second HVAC schedule over the period of time, and displaying the cost difference indicator to the user using the user interface.

Provided according to some embodiments is a method for promoting energy efficiency in association with an HVAC system of a climate controlled enclosure, the HVAC system being controlled by a network-connected thermostat having a user interface controllable by a user. The method includes measuring an actual ambient temperature in a climate controlled enclosure over a period of time, generating a plurality of control signals, to direct the operation of an HVAC system, over the period of time according to at least one of a first HVAC schedule including a plurality of setpoints, each setpoint including an indication of a setpoint time and a desired setpoint temperature for the climate controlled enclosure, and an update includes at least one of a real-time setpoint change, a schedule change, and an occupancy profile, determining the actual energy consumed by operating the HVAC system according to the plurality of control signals over the period of time, receiving data indicative of the ambient temperature of an area outside the climate controlled enclosure, processing the actual ambient temperature in the enclosure over the period of time in conjunction with the outside temperature over the period of time and the control signals to generate a thermal model of the climate controlled enclosure, generating a hypothetical runtime profile from the first HVAC schedule, the period of time, the update, the thermal model of the climate controlled enclosure, the actual ambient temperature in the climate controlled enclosure, and the data indicative of the temperature of the ambient temperature of the area outside the climate controlled enclosure, calculating the hypothetical energy consumed by the HVAC system as a result of the hypothetical runtime profile during the period of time, generating an indicator of the difference between the hypothetical energy consumed by the HVAC system and the actual energy consumed by the HVAC system for the period of time, and providing the indicator of the difference to a user.

Provided according to some embodiments is a system for promoting energy efficiency in association with an HVAC system of a climate controlled enclosure, the HVAC system being controlled by a network-connected thermostat having a user interface controllable by a user. The system includes a sensor that measures ambient temperature in a climate controlled enclosure, and a processor that requests measurement of an actual ambient temperature in a climate controlled enclosure over a period of time, generates a plurality of control signals, to direct the operation of an HVAC system, over the period of time according to at least one of a first HVAC schedule including a plurality of setpoints that each include an indication of a setpoint time and a desired setpoint temperature for the climate controlled enclosure, and an update that includes at least one of a real-time setpoint change, a schedule change, and an occupancy profile, determines the actual energy consumed by operating the HVAC system according to the plurality of control signals over the period of time, receives data indicative of the ambient temperature of an area outside the climate controlled enclosure, processes the actual ambient temperature in the enclosure over the period of time in conjunction with the outside temperature over the period of time and the control signals to generate a thermal model of the climate controlled enclosure, generates a hypothetical runtime profile from the first HVAC schedule, the period of time, the update, the thermal model of the climate controlled enclosure, the actual ambient temperature in the climate controlled enclosure, and the data indicative of the temperature of the ambient temperature of the area outside the climate controlled enclosure, calculates the hypothetical energy consumed by the HVAC system as a result of the hypothetical runtime profile during the period of time, generates an indicator of the difference between the hypothetical energy consumed by the HVAC system and the actual energy consumed by the HVAC system for the period of time, and provides the indicator of the difference to a user.

BRIEF DESCRIPTION OF THE DRAWINGS

FIGS. 11A-E provide a transition-state-diagram-based illustration of intelligent-controller operation.

FIGS. 41A-M illustrate a progression of conceptual views of a thermostat control schedule.

DETAILED DESCRIPTION

The current application is directed to a general class of intelligent controllers that includes many different specific types of intelligent controllers that can be applied to, and incorporated within, many different types of devices, machines, systems, and organizations. Intelligent controllers control the operation of devices, machines, systems, and organizations. The general class of intelligent controllers to which the current application is directed include automated learning components that allow the intelligent controllers to learn desired operational behaviors of the devices, machines, systems, and organizations which they control and incorporate the learned information into control schedules. The subject matter of this patent specification relates to the subject matter of the following commonly assigned applications, each of which is incorporated by reference herein: U.S. Ser. No. 12/881,463 filed Sep. 14, 2010; U.S. Ser. No. 13/269,501 filed Oct. 7, 2011; U.S. Ser. No. 13/317,423 filed Oct. 17, 2011; U.S. Ser. No. 13/440,910 filed Apr. 5, 2012; U.S. Ser. No. 13/632,028 filed Sep. 30, 2012; and U.S. Ser. No. 13/632,070 filed Sep. 30, 2012.

The current application discloses, in addition to methods and implementations for automated control-schedule learning, a specific example of an intelligent thermostat controller, or intelligent thermostat, and a specific control-schedule-learning method for the intelligent thermostat that serves as a detailed example of the automated control-schedule-learning methods employed by the general class of intelligent controllers to which the current application is directed. The intelligent thermostat is an example of a smart-home device.

Figure 1:
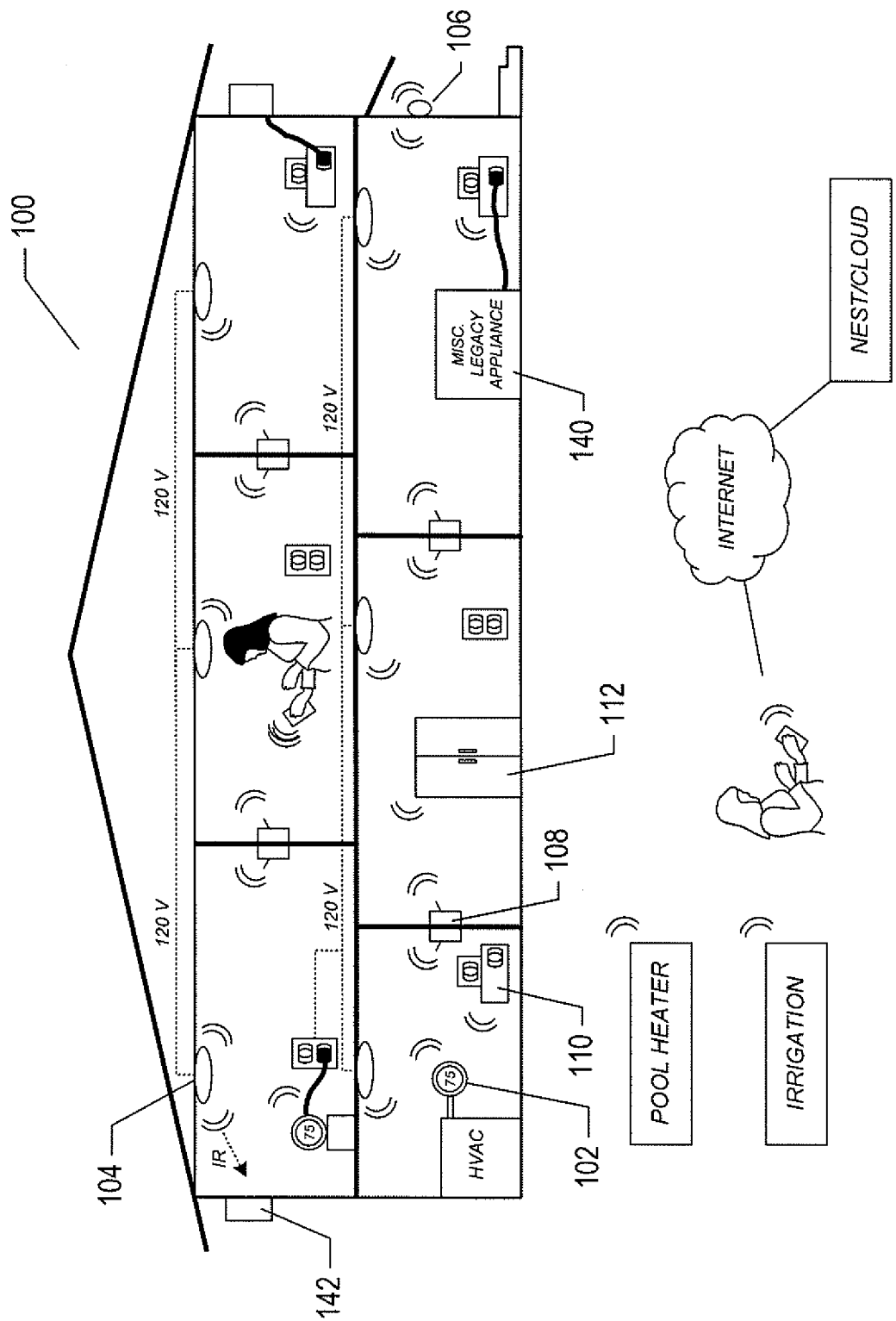
FIG. 1 illustrates a smart-home environment.

The detailed description includes four subsections: (1) an overview of the smart-home environment; (2) automated control-schedule learning; (3) automated control-schedule learning in the context of an intelligent thermostat; and (4) background schedule simulation. The first subsection provides a description of one area of technology that offers many opportunities for application and incorporation of automated-control-schedule-learning methods. The second subsection provides a detailed description of automated control-schedule learning, including a first, general implementation. The third subsection provides a specific example of an automated-control-schedule-learning method incorporated within an intelligent thermostat. The fourth subsection provides a detailed description of background schedule simulation, including systems and processes for background schedule simulation Overview of the Smart-Home Environment FIG. 1 illustrates a smart-home environment. The smart-home environment 100 includes a number of intelligent, multi-sensing, network-connected devices. These smart-home devices intercommunicate and are integrated together within the smart-home environment. The smart-home devices may also communicate with cloud-based smart-home control and/or data-processing systems in order to distribute control functionality, to access higher-capacity and more reliable computational facilities, and to integrate a particular smart home into a larger, multi-home or geographical smart-home-device-based aggregation.

The smart-home devices may include one more intelligent thermostats 102, one or more intelligent hazard-detection units 104, one or more intelligent entryway-interface devices 106, smart switches, including smart wall-like switches 108, smart utilities interfaces and other services interfaces, such as smart wall-plug interfaces 110, and a wide variety of intelligent, multi-sensing, network-connected appliances 112, including refrigerators, televisions, washers, dryers, lights, audio systems, intercom systems, mechanical actuators, wall air conditioners, pool-heating units, irrigation systems, and many other types of intelligent appliances and systems.

In general, smart-home devices include one or more different types of sensors, one or more controllers and/or actuators, and one or more communications interfaces that connect the smart-home devices to other smart-home devices, routers, bridges, and hubs within a local smart-home environment, various different types of local computer systems, and to the Internet, through which a smart-home device may communicate with cloud-computing servers and other remote computing systems. Data communications are generally carried out using any of a large variety of different types of communications media and protocols, including wireless protocols, such as Wi-Fi, ZigBee, 6LoWPAN, various types of wired protocols, including CAT6 Ethernet, HomePlug, and other such wired protocols, and various other types of communications protocols and technologies. Smart-home devices may themselves operate as intermediate communications devices, such as repeaters, for other smart-home devices. The smart-home environment may additionally include a variety of different types of legacy appliances and devices 140 and 142 which lack communications interfaces and processor-based controllers.

Figure 2:
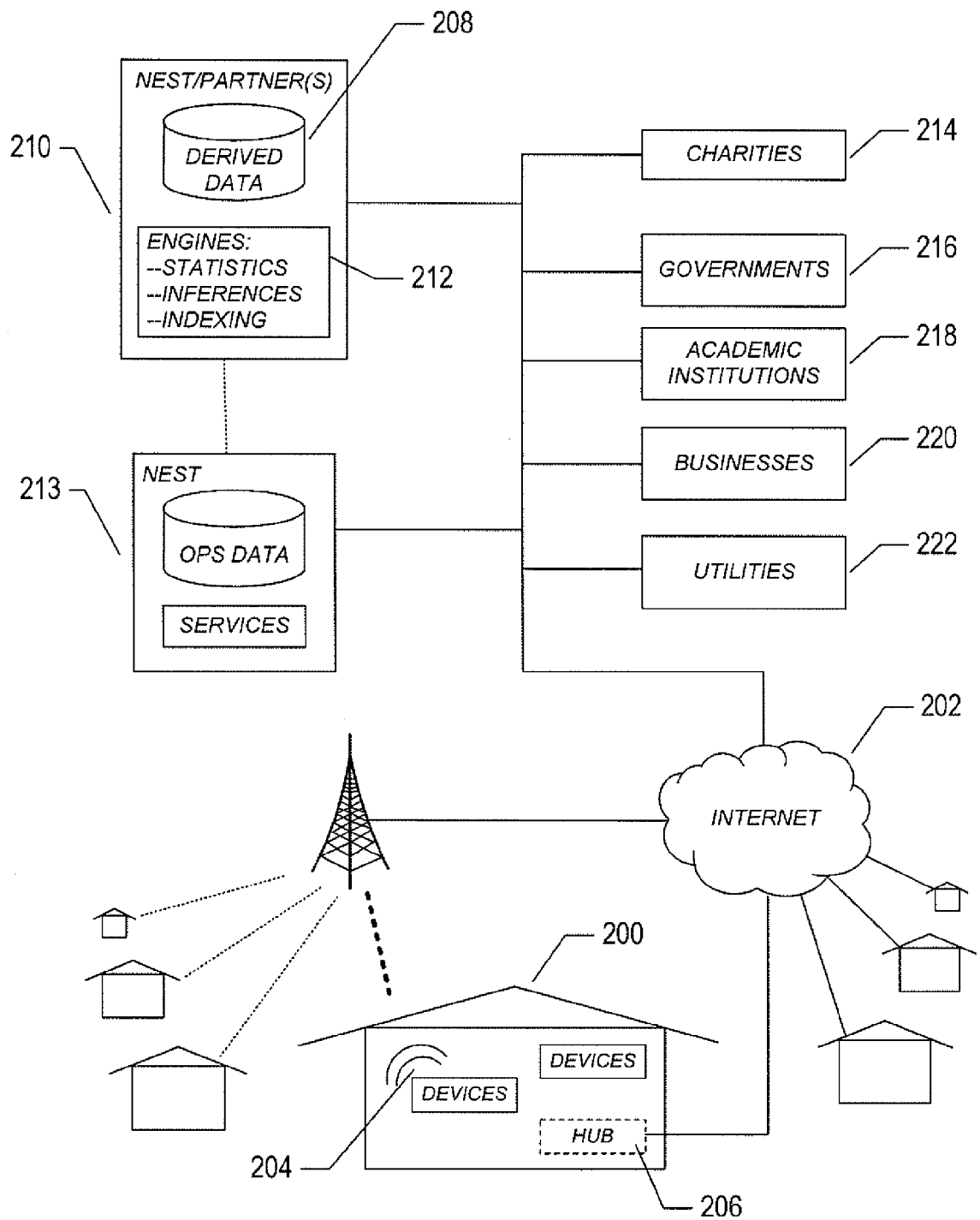
FIG. 2 illustrates integration of smart-home devices with remote devices and systems.

FIG. 2 illustrates integration of smart-home devices with remote devices and systems. Smart-home devices within a smart-home environment 200 can communicate through the Internet 202 via 3G/4G wireless communications 204, through a hubbed network 206, or by other communications interfaces and protocols. Many different types of smart-home-related data, and data derived from smart-home data 208, can be stored in, and retrieved from, a remote system 210, including a cloud-based remote system. The remote system may include various types of statistics, inference, and indexing engines 212 for data processing and derivation of additional information and rules related to the smart-home environment. The stored data can be exposed, via one or more communications media and protocols, in part or in whole, to various remote systems and organizations, including charities 214, governments 216, academic institutions 218, businesses 220, and utilities 222. In general, the remote data-processing system 210 is managed or operated by an organization or vendor related to smart-home devices or contracted for remote data-processing and other services by a homeowner, landlord, dweller, or other smart-home-associated user. The data may also be further processed by additional commercial-entity data-processing systems 213 on behalf of the smart-homeowner or manager and/or the commercial entity or vendor which operates the remote data-processing system 210. Thus, external entities may collect, process, and expose information collected by smart-home devices within a smart-home environment, may process the information to produce various types of derived results which may be communicated to, and shared with, other remote entities, and may participate in monitoring and control of smart-home devices within the smart-home environment as well as monitoring and control of the smart-home environment. Of course, in many cases, export of information from within the smart-home environment to remote entities may be strictly controlled and constrained, using encryption, access rights, authentication, and other well-known techniques, to ensure that information deemed confidential by the smart-home manager and/or by the remote data-processing system is not intentionally or unintentionally made available to additional external computing facilities, entities, organizations, and individuals.

Figure 3:
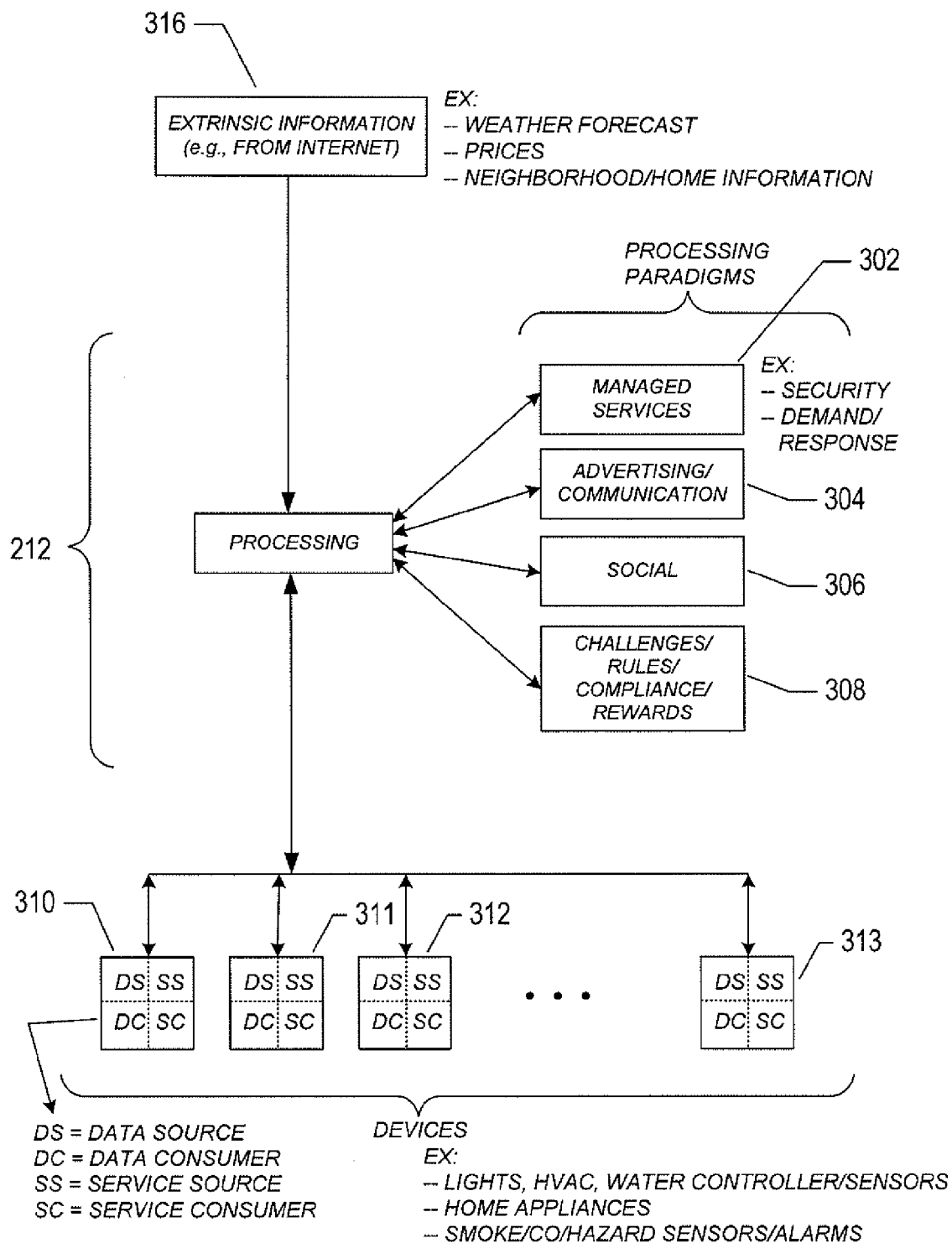
FIG. 3 illustrates information processing within the environment of intercommunicating entities illustrated in FIG. 2.

FIG. 3 illustrates information processing within the environment of intercommunicating entities illustrated in FIG. 2. The various processing engines 212 within the external data-processing system 210 can process data with respect to a variety of different goals, including provision of managed services 302, various types of advertizing and communications 304, social-networking exchanges and other electronic social communications 306, and for various types of monitoring and rule-generation activities 308. The various processing engines 212 communicate directly or indirectly with smart-home devices 310-313, each of which may have data-consumer ("DC"), data-source ("DS"), services-consumer ("SC"), and services-source ("SS") characteristics. In addition, the processing engines may access various other types of external information 316, including information obtained through the Internet, various remote information sources, and even remote sensor, audio, and video feeds and sources.

Automated Schedule Learning

Figure 4:
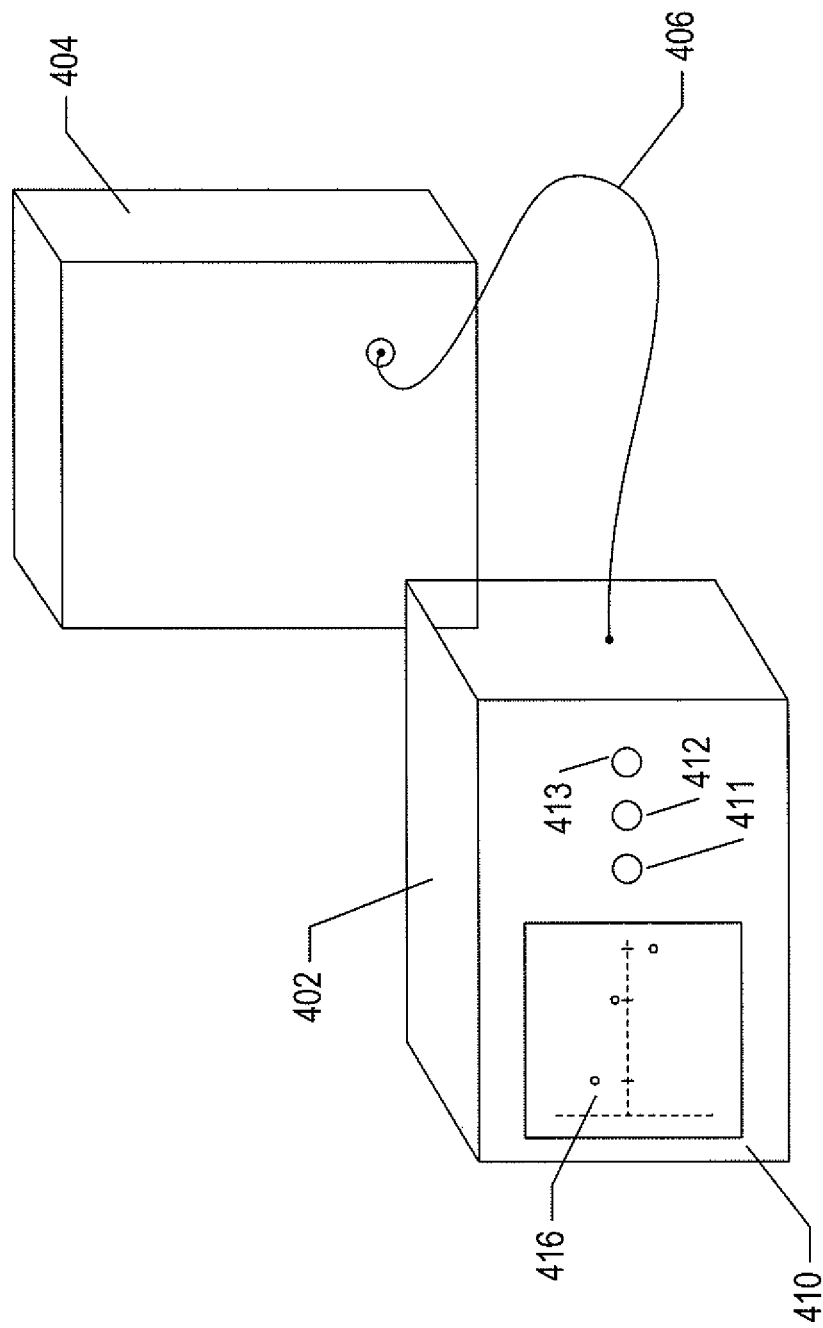
FIG. 4 illustrates a general class of intelligent controllers to which the current application is directed.

FIG. 4 illustrates a general class of intelligent controllers to which the current application is directed. The intelligent controller 402 controls a device, machine, system, or organization 404 via any of various different types of output control signals and receives information about the controlled entity and the environment from sensor output received by the intelligent controller from sensors embedded within the controlled entity 404, the intelligent controller 402, or in the environment of the intelligent controller and/or controlled entity. In FIG. 4, the intelligent controller is shown connected to the controlled entity 404 via a wire or fiber-based communications medium 406. However, the intelligent controller may be interconnected with the controlled entity by alternative types of communications media and communications protocols, including wireless communications. In many cases, the intelligent controller and controlled entity may be implemented and packaged together as a single system that includes both the intelligent controller and a machine, device, system, or organization controlled by the intelligent controller. The controlled entity may include multiple devices, machines, system, or organizations and the intelligent controller may itself be distributed among multiple components and discrete devices and systems. In addition to outputting control signals to controlled entities and receiving sensor input, the intelligent controller also provides a user interface 410-413 through which a human user or remote entity, including a user-operated processing device or a remote automated control system, can input immediate-control inputs to the intelligent controller as well as create and modify the various types of control schedules. In FIG. 4, the intelligent controller provides a graphical-display component 410 that displays a control schedule 416 and includes a number of input components 411-413 that provide a user interface for input of immediate-control directives to the intelligent controller for controlling the controlled entity or entities and input of scheduling-interface commands that control display of one or more control schedules, creation of control schedules, and modification of control schedules.

To summarize, the general class of intelligent controllers to which the current is directed receive sensor input, output control signals to one or more controlled entities, and provide a user interface that allows users to input immediate-control command inputs to the intelligent controller for translation by the intelligent controller into output control signals as well as to create and modify one or more control schedules that specify desired controlled-entity operational behavior over one or more time periods. These basic functionalities and features of the general class of intelligent controllers provide a basis upon which automated control-schedule learning, to which the current application is directed, can be implemented.

Figure 5:
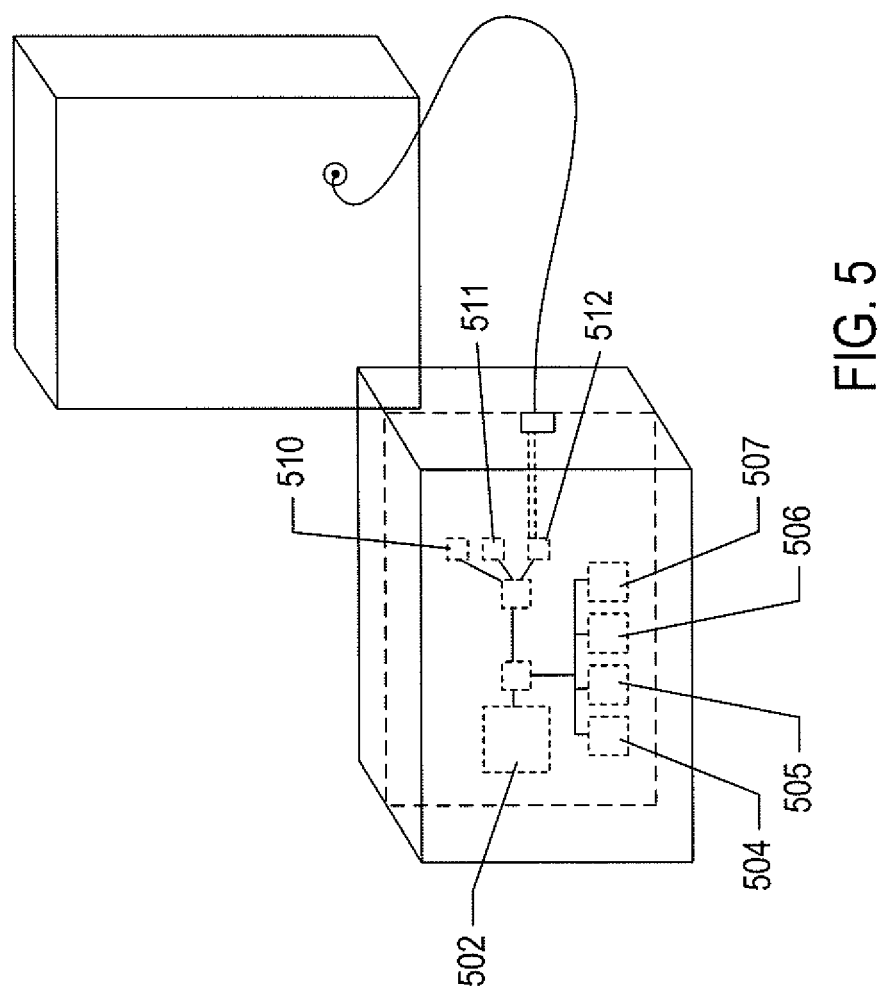
FIG. 5 illustrates additional internal features of an intelligent controller.

FIG. 5 illustrates additional internal features of an intelligent controller. An intelligent controller is generally implemented using one or more processors 502, electronic memory 504-507, and various types of microcontrollers 510-512, including a microcontroller 512 and transceiver 514 that together implement a communications port that allows the intelligent controller to exchange data and commands with one or more entities controlled by the intelligent controller, with other intelligent controllers, and with various remote computing facilities, including cloud-computing facilities through cloud-computing servers. Often, an intelligent controller includes multiple different communications ports and interfaces for communicating by various different protocols through different types of communications media. It is common for intelligent controllers, for example, to use wireless communications to communicate with other wireless-enabled intelligent controllers within an environment and with mobile-communications carriers as well as any of various wired communications protocols and media. In certain cases, an intelligent controller may use only a single type of communications protocol, particularly when packaged together with the controlled entities as a single system. Electronic memories within an intelligent controller may include both volatile and non-volatile memories, with low-latency, high-speed volatile memories facilitating execution of control routines by the one or more processors and slower, non-volatile memories storing control routines and data that need to survive power-on/power-off cycles. Certain types of intelligent controllers may additionally include mass-storage devices.

Figure 6:
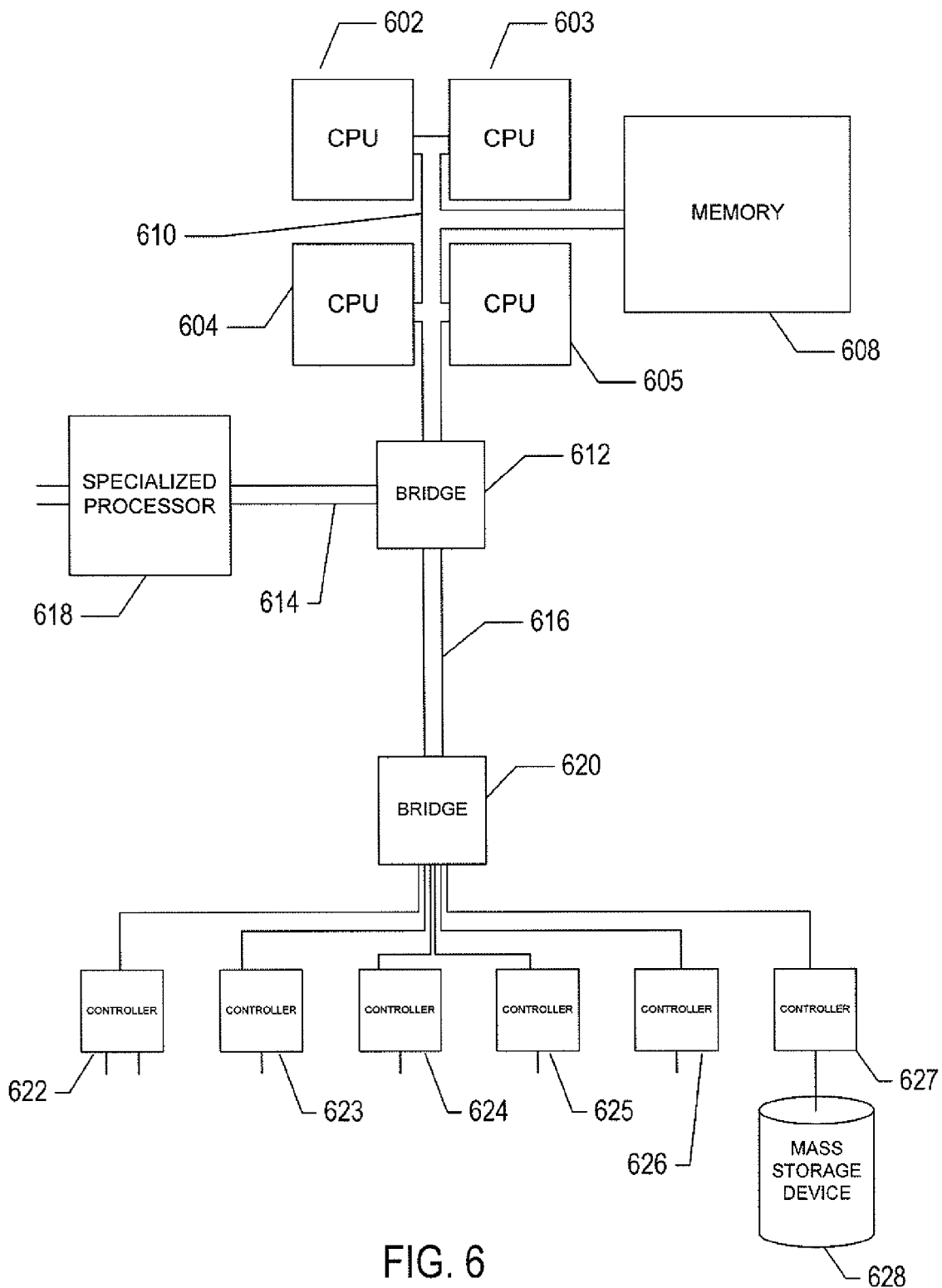
FIG. 6 illustrates a generalized computer architecture that represents an example of the type of computing machinery that may be included in an intelligent controller, server computer, and other processor-based intelligent devices and systems.

FIG. 6 illustrates a generalized computer architecture that represents an example of the type of computing machinery that may be included in an intelligent controller, server computer, and other processor-based intelligent devices and systems. The computing machinery includes one or multiple central processing units ("CPUs") 602-605, one or more electronic memories 608 interconnected with the CPUs by a CPU/memory-subsystem bus 610 or multiple busses, a first bridge 612 that interconnects the CPU/memory-subsystem bus 610 with additional busses 614 and 616 and/or other types of high-speed interconnection media, including multiple, high-speed serial interconnects. These busses and/or serial interconnections, in turn, connect the CPUs and memory with specialized processors, such as a graphics processor 618, and with one or more additional bridges 620, which are interconnected with high-speed serial links or with multiple controllers 622-627, such as controller 627, that provide access to various different types of mass-storage devices 628, electronic displays, input devices, and other such components, subcomponents, and computational resources.

Figure 7:
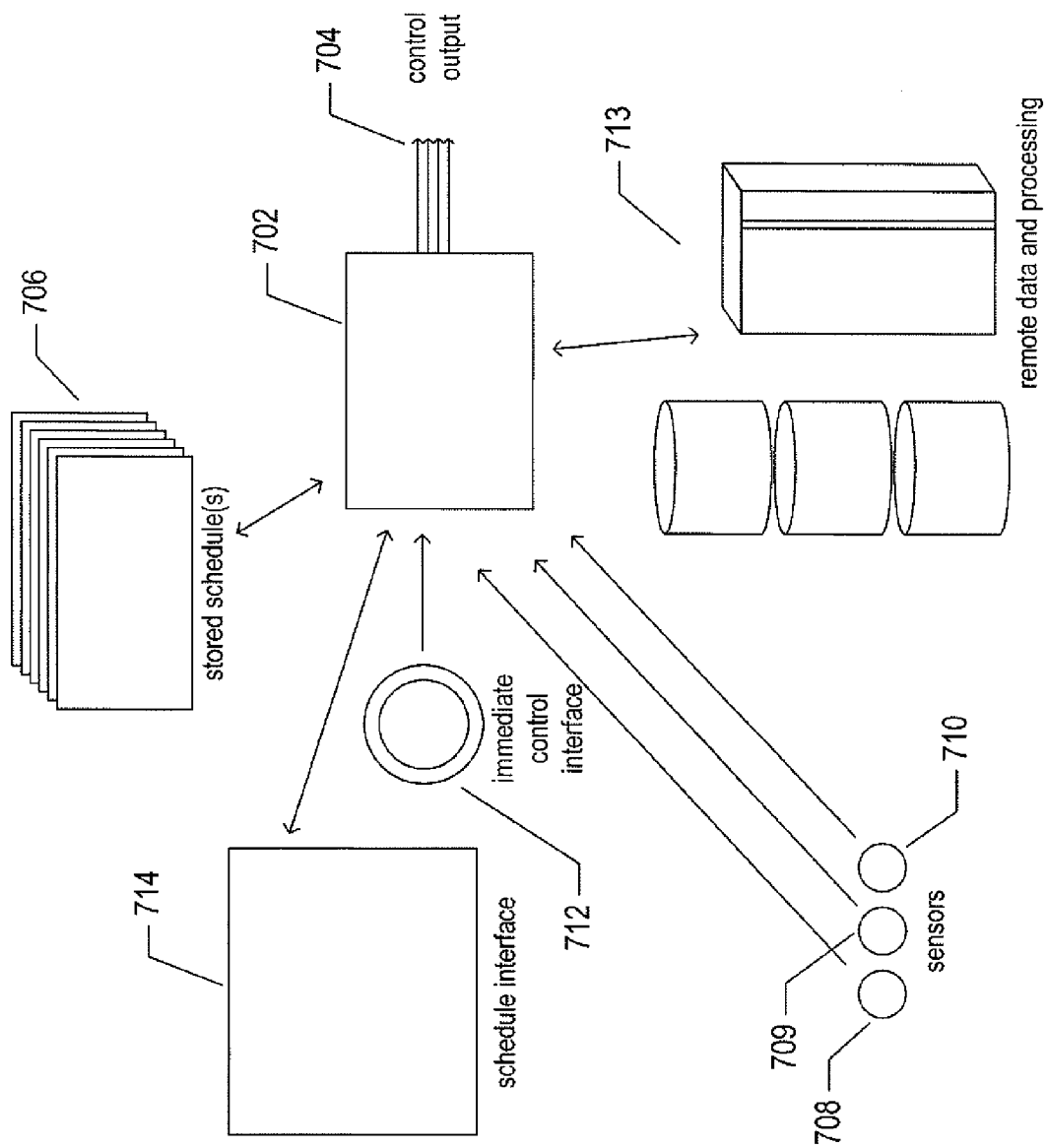
FIG. 7 illustrates features and characteristics of an intelligent controller of the general class of intelligent controllers to which the current application is directed.

FIG. 7 illustrates features and characteristics of an intelligent controller of the general class of intelligent controllers to which the current application is directed. An intelligent controller includes controller logic 702 generally implemented as electronic circuitry and processor-based computational components controlled by computer instructions stored in physical data-storage components, including various types of electronic memory and/or mass-storage devices. It should be noted, at the onset, that computer instructions stored in physical data-storage devices and executed within processors comprise the control components of a wide variety of modern devices, machines, and systems, and are as tangible, physical, and real as any other component of a device, machine, or system. Occasionally, statements are encountered that suggest that computer-instruction-implemented control logic is "merely software" or something abstract and less tangible than physical machine components. Those familiar with modern science and technology understand that this is not the case. Computer instructions executed by processors must be physical entities stored in physical devices. Otherwise, the processors would not be able to access and execute the instructions. The term "software" can be applied to a symbolic representation of a program or routine, such as a printout or displayed list of programming-language statements, but such symbolic representations of computer programs are not executed by processors. Instead, processors fetch and execute computer instructions stored in physical states within physical data-storage devices.

The controller logic accesses and uses a variety of different types of stored information and inputs in order to generate output control signals 704 that control the operational behavior of one or more controlled entities. The information used by the controller logic may include one or more stored control schedules 706, received output from one or more sensors 708-710, immediate control inputs received through an immediate-control interface 712, and data, commands, and other information received from remote data-processing systems, including cloud-based data-processing systems 713. In addition to generating control output 704, the controller logic provides an interface 714 that allows users to create and modify control schedules and may also output data and information to remote entities, other intelligent controllers, and to users through an information-output interface.

Figure 8:
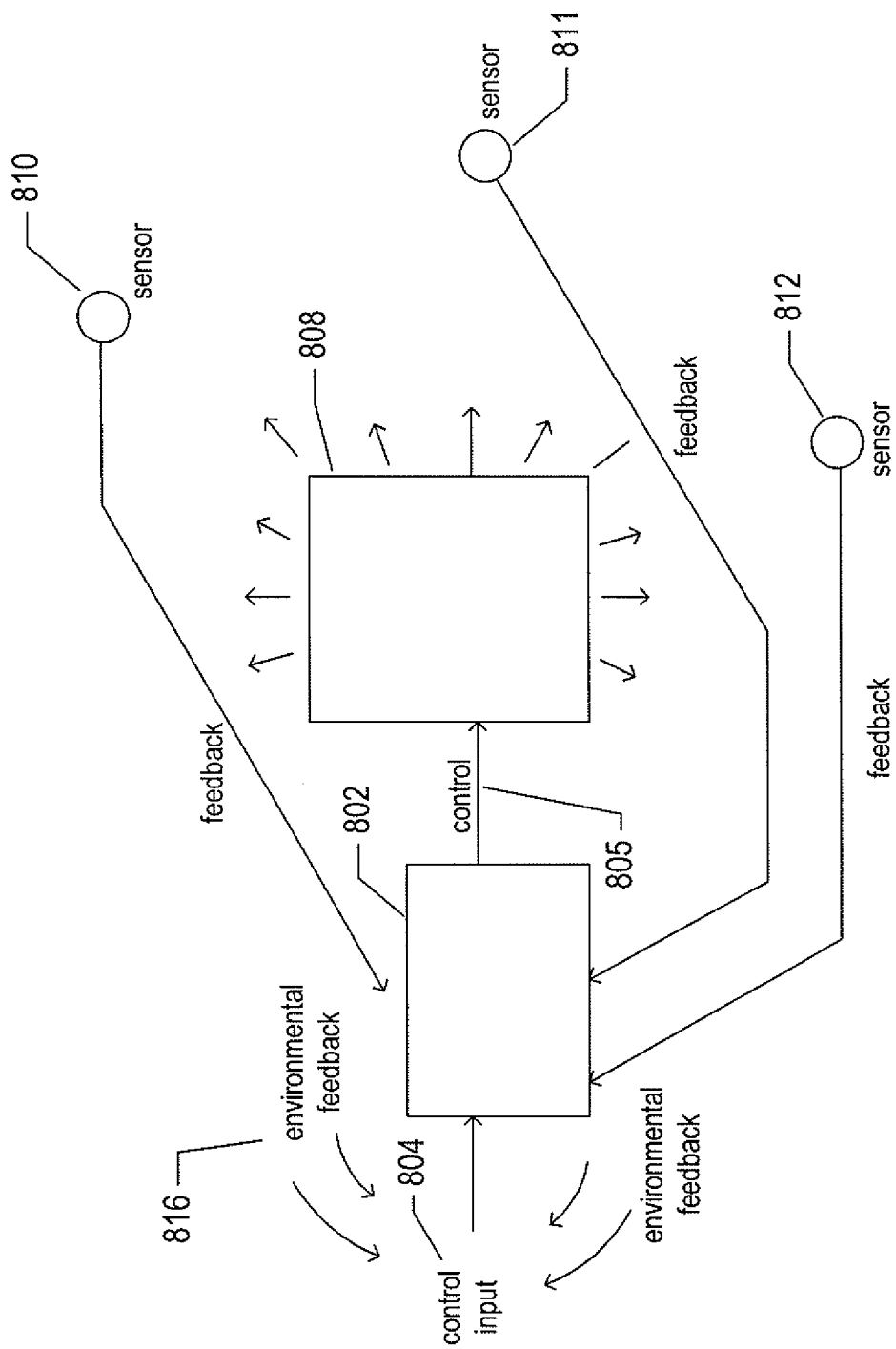
FIG. 8 illustrates a typical control environment within which an intelligent controller operates.

FIG. 8 illustrates a typical control environment within which an intelligent controller operates. As discussed above, an intelligent controller 802 receives control inputs from users or other entities 804 and uses the control inputs, along with stored control schedules and other information, to generate output control signals 805 that control operation of one or more controlled entities 808. Operation of the controlled entities may alter an environment within which sensors 810-812 are embedded. The sensors return sensor output, or feedback, to the intelligent controller 802. Based on this feedback, the intelligent controller modifies the output control signals in order to achieve a specified goal or goals for controlled-system operation. In essence, an intelligent controller modifies the output control signals according to two different feedback loops. The first, most direct feedback loop includes output from sensors that the controller can use to determine subsequent output control signals or control-output modification in order to achieve the desired goal for controlled-system operation. In many cases, a second feedback loop involves environmental or other feedback 816 to users which, in turn, elicits subsequent user control and scheduling inputs to the intelligent controller 802. In other words, users can either be viewed as another type of sensor that outputs immediate-control directives and control-schedule changes, rather than raw sensor output, or can be viewed as a component of a higher-level feedback loop.

Figure 9:
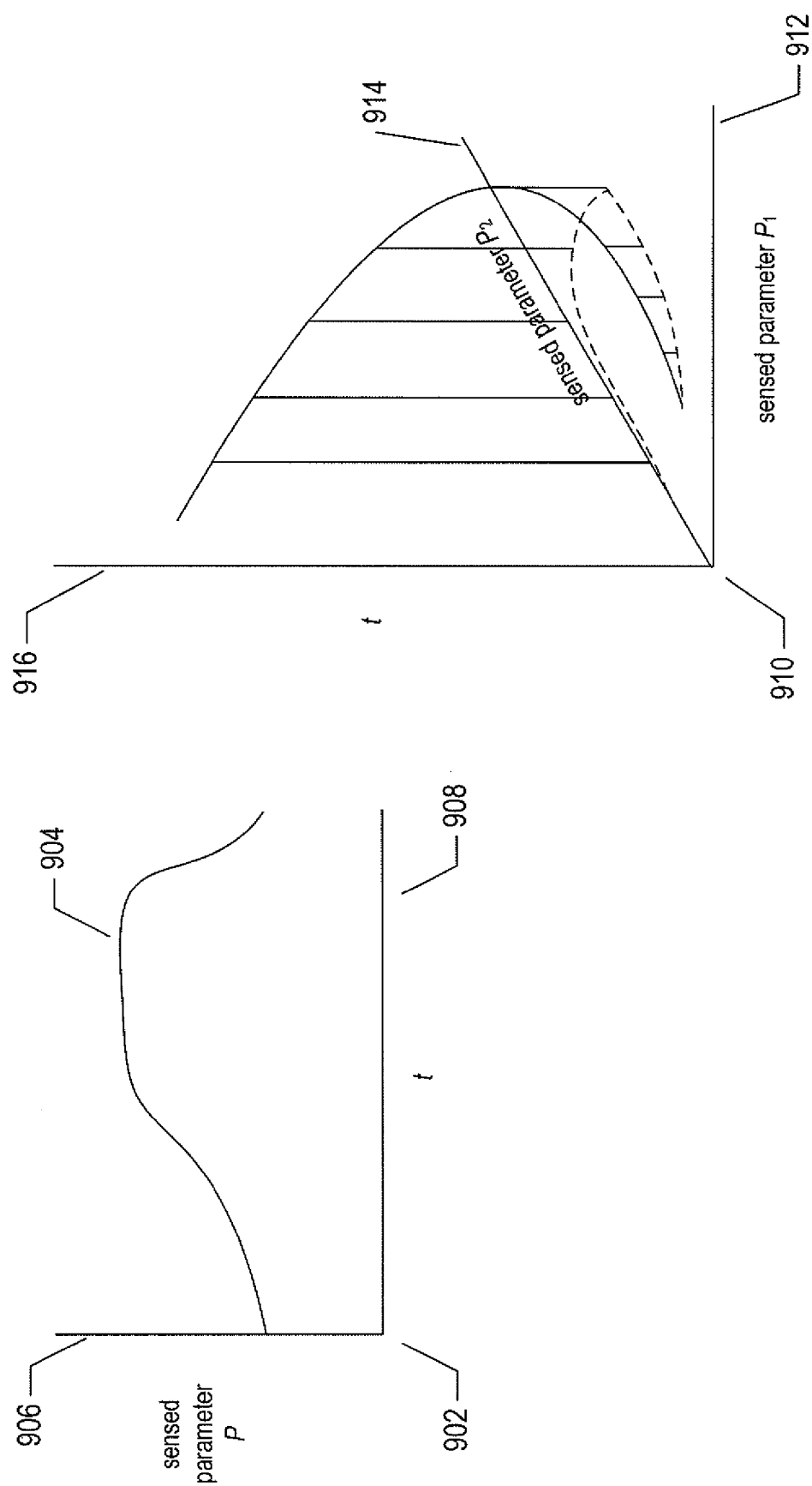
FIG. 9 illustrates the general characteristics of sensor output.

There are many different types of sensors and sensor output. In general, sensor output is directly or indirectly related to some type of parameter, machine state, organization state, computational state, or physical environmental parameter. FIG. 9 illustrates the general characteristics of sensor output. As shown in a first plot 902 in FIG. 9, a sensor may output a signal, represented by curve 904, over time, with the signal directly or indirectly related to a parameter P, plotted with respect to the vertical axis 906. The sensor may output a signal continuously or at intervals, with the time of output plotted with respect to the horizontal axis 908. In certain cases, sensor output may be related to two or more parameters. For example, in plot 910, a sensor outputs values directly or indirectly related to two different parameters P1 and P2, plotted with respect to axes 912 and 914, respectively, over time, plotted with respect to vertical axis 916. In the following discussion, for simplicity of illustration and discussion, it is assumed that sensors produce output directly or indirectly related to a single parameter, as in plot 902 in FIG. 9. In the following discussion, the sensor output is assumed to be a set of parameter values for a parameter P. The parameter may be related to environmental conditions, such as temperature, ambient light level, sound level, and other such characteristics. However, the parameter may also be the position or positions of machine components, the data states of memory-storage address in data-storage devices, the current drawn from a power supply, the flow rate of a gas or fluid, the pressure of a gas or fluid, and many other types of parameters that comprise useful information for control purposes.

Figure 10A:
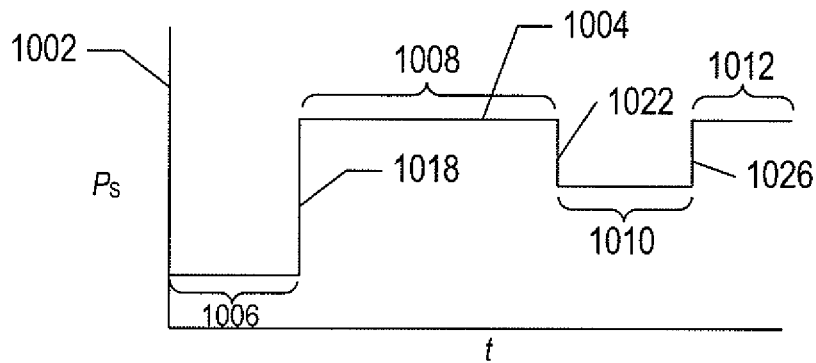
FIGS. 10A-D illustrate information processed and generated by an intelligent controller during control operations.

FIGS. 10A-D illustrate information processed and generated by an intelligent controller during control operations. All the figures show plots, similar to plot 902 in FIG. 9, in which values of a parameter or another set of control-related values are plotted with respect to a vertical axis and time is plotted with respect to a horizontal axis. FIG. 10A shows an idealized specification for the results of controlled-entity operation. The vertical axis 1002 in FIG. 10A represents a specified parameter value, Ps. For example, in the case of an intelligent thermostat, the specified parameter value may be temperature. For an irrigation system, by contrast, the specified parameter value may be flow rate. FIG. 10A is the plot of a continuous curve 1004 that represents desired parameter values, over time, that an intelligent controller is directed to achieve through control of one or more devices, machines, or systems. The specification indicates that the parameter value is desired to be initially low 1006, then rise to a relatively high value 1008, then subside to an intermediate value 1010, and then again rise to a higher value 1012. A control specification can be visually displayed to a user, as one example, as a control schedule.

Figure 10B:
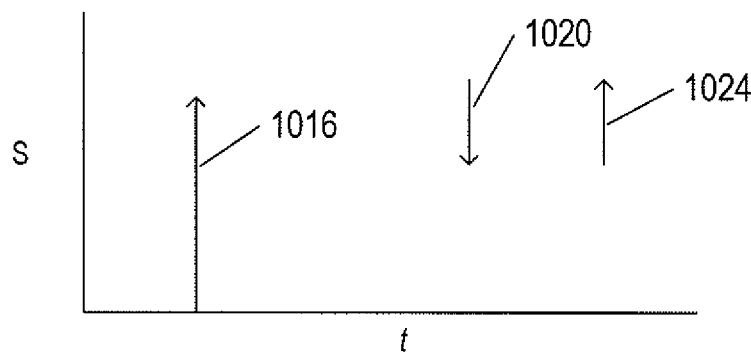

FIG. 10B shows an alternate view, or an encoded-data view, of a control schedule corresponding to the control specification illustrated in FIG. 10A. The control schedule includes indications of a parameter-value increase 1016 corresponding to edge 1018 in FIG. 10A, a parameter-value decrease 1020 corresponding to edge 1022 in FIG. 10A, and a parameter-value increase 1024 corresponding to edge 1016 in FIG. 10A. The directional arrows plotted in FIG. 10B can be considered to be setpoints, or indications of desired parameter changes at particular points in time within some period of time.

The control schedules learned by an intelligent controller represent a significant component of the results of automated learning. The learned control schedules may be encoded in various different ways and stored in electronic memories or mass-storage devices within the intelligent controller, within the system controlled by the intelligent controller, or within remote data-storage facilities, including cloud-computing-based data-storage facilities. In many cases, the learned control schedules may be encoded and stored in multiple locations, including control schedules distributed among internal intelligent-controller memory and remote data-storage facilities. A setpoint change may be stored as a record with multiple fields, including fields that indicate whether the setpoint change is a system-generated setpoint or a user-generated setpoint, whether the setpoint change is an immediate-control-input setpoint change or a scheduled setpoint change, the time and date of creation of the setpoint change, the time and date of the last edit of the setpoint change, and other such fields. In addition, a setpoint may be associated with two or more parameter values. As one example, a range setpoint may indicate a range of parameter values within which the intelligent controller should maintain a controlled environment. Setpoint changes are often referred to as "setpoints."

Figure 10C:
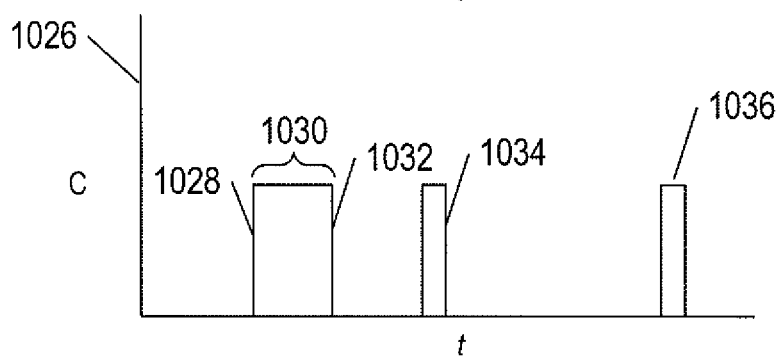

FIG. 10C illustrates the control output by an intelligent controller that might result from the control schedule illustrated in FIG. 10B. In this figure, the magnitude of an output control signal is plotted with respect to the vertical axis 1026. For example, the control output may be a voltage signal output by an intelligent thermostat to a heating unit, with a high-voltage signal indicating that the heating unit should be currently operating and a low-voltage output indicating that the heating system should not be operating. Edge 1028 in FIG. 10C corresponds to setpoint 1016 in FIG. 10B. The width of the positive control output 1030 may be related to the length, or magnitude, of the desired parameter-value change, indicated by the length of setpoint arrow 1016. When the desired parameter value is obtained, the intelligent controller discontinues output of a high-voltage signal, as represented by edge 1032. Similar positive output control signals 1034 and 1036 are elicited by setpoints 1020 and 1024 in FIG. 10B.

Figure 10D:
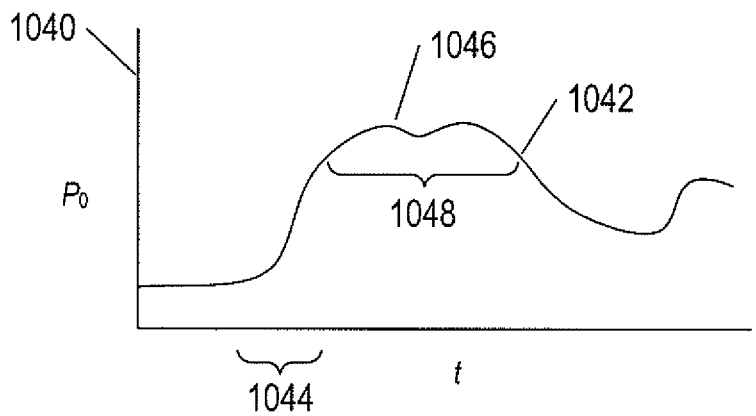

Finally, FIG. 10D illustrates the observed parameter changes, as indicated by sensor output, resulting from control, by the intelligent controller, of one or more controlled entities. In FIG. 10D, the sensor output, directly or indirectly related to the parameter P, is plotted with respect to the vertical axis 1040. The observed parameter value is represented by a smooth, continuous curve 1042. Although this continuous curve can be seen to be related to the initial specification curve, plotted in FIG. 10A, the observed curve does not exactly match that specification curve. First, it may take a finite period of time 1044 for the controlled entity to achieve the parameter-valued change represented by setpoint 1016 in the control schedule plotted in FIG. 10B. Also, once the parameter value is obtained, and the controlled entity directed to discontinue operation, the parameter value may begin to fall 1046, resulting in a feedback-initiated control output to resume operation of the controlled entity in order to maintain the desired parameter value. Thus, the desired high-level constant parameter value 1008 in FIG. 10A may, in actuality, end up as a time-varying curve 1048 that does not exactly correspond to the control specification 1004. The first level of feedback, discussed above with reference to FIG. 8, is used by the intelligent controller to control one or more control entities so that the observed parameter value, over time, as illustrated in FIG. 10D, matches the specified time behavior of the parameter in FIG. 10A as closely as possible. The second level feedback control loop, discussed above with reference to FIG. 8, may involve alteration of the specification, illustrated in FIG. 10A, by a user, over time, either by changes to stored control schedules or by input of immediate-control directives, in order to generate a modified specification that produces a parameter-value/time curve reflective of a user's desired operational results.

There are many types of controlled entities and associated controllers. In certain cases, control output may include both an indication of whether the controlled entity should be currently operational as well as an indication of a level, throughput, or output of operation when the controlled entity is operational. In other cases, the control out may be simply a binary activation/deactivation signal. For simplicity of illustration and discussion, the latter type of control output is assumed in the following discussion.

Figure 11A:
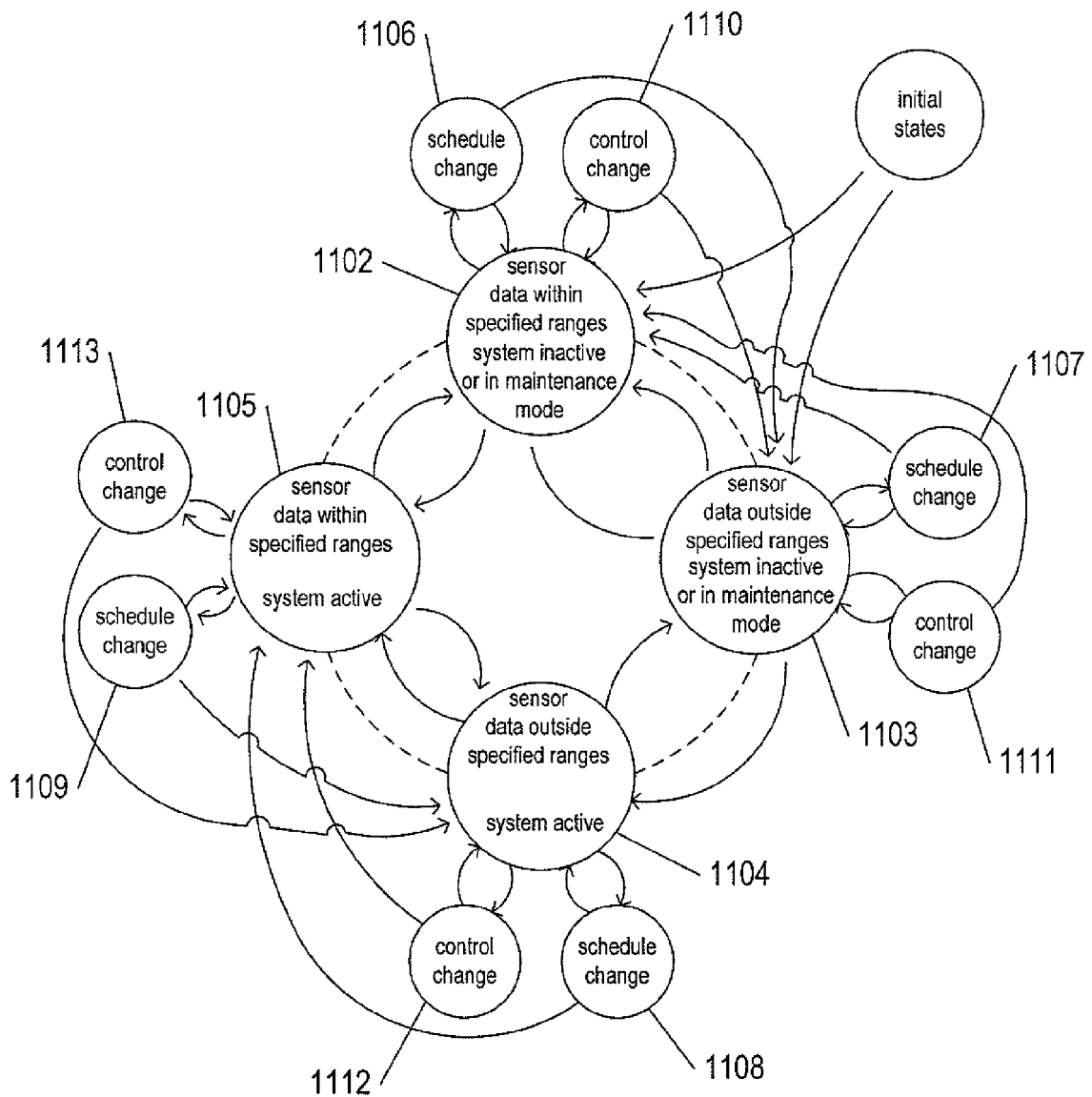

FIGS. 11A-E provide a transition-state-diagram-based illustration of intelligent-controller operation. In these diagrams, the disk-shaped elements, or nodes, represent intelligent-controller states and the curved arrows interconnecting the nodes represent state transitions. FIG. 11A shows one possible state-transition diagram for an intelligent controller. There are four main states 1102-1105. These states include: (1) a quiescent state 1102, in which feedback from sensors indicate that no controller outputs are currently needed and in which the one or more controlled entities are currently inactive or in maintenance mode; (2) an awakening state 1103, in which sensor data indicates that an output control may be needed to return one or more parameters to within a desired range, but the one or more controlled entities have not yet been activated by output control signals; (3) an active state 1104, in which the sensor data continue to indicate that observed parameters are outside desired ranges and in which the one or more controlled entities have been activated by control output and are operating to return the observed parameters to the specified ranges; and (4) an incipient quiescent state 1105, in which operation of the one or more controlled entities has returned the observed parameter to specified ranges but feedback from the sensors has not yet caused the intelligent controller to issue output control signals to the one or more controlled entities to deactivate the one or more controlled entities. In general, state transitions flow in a clockwise direction, with the intelligent controller normally occupying the quiescent state 1102, but periodically awakening, in step 1103, due to feedback indications in order to activate the one or more controlled entities, in state 1104, to return observed parameters back to specified ranges. Once the observed parameters have returned to specified ranges, in step 1105, the intelligent controller issues deactivation output control signals to the one or more controlled entities, returning to the quiescent state 1102.

Each of the main-cycle states 1102-1105 is associated with two additional states: (1) a schedule-change state 1106-1109 and a control-change state 1110-1113. These states are replicated so that each main-cycle state is associated with its own pair of schedule-change and control-change states. This is because, in general, schedule-change and control-change states are transient states, from which the controller state returns either to the original main-cycle state from which the schedule-change or control-change state was reached by a previous transition or to a next main-cycle state in the above-described cycle. Furthermore, the schedule-change and control-change states are a type of parallel, asynchronously operating state associated with the main-cycle states. A schedule-change state represents interaction between the intelligent controller and a user or other remote entity carrying out control-schedule-creation, control-schedule-modification, or control-schedule-management operations through a displayed-schedule interface. The control-change states represent interaction of a user or other remote entity to the intelligent controller in which the user or other remote entity inputs immediate-control commands to the intelligent controller for translation into output control signals to the one or more controlled entities.

Figure 11B:
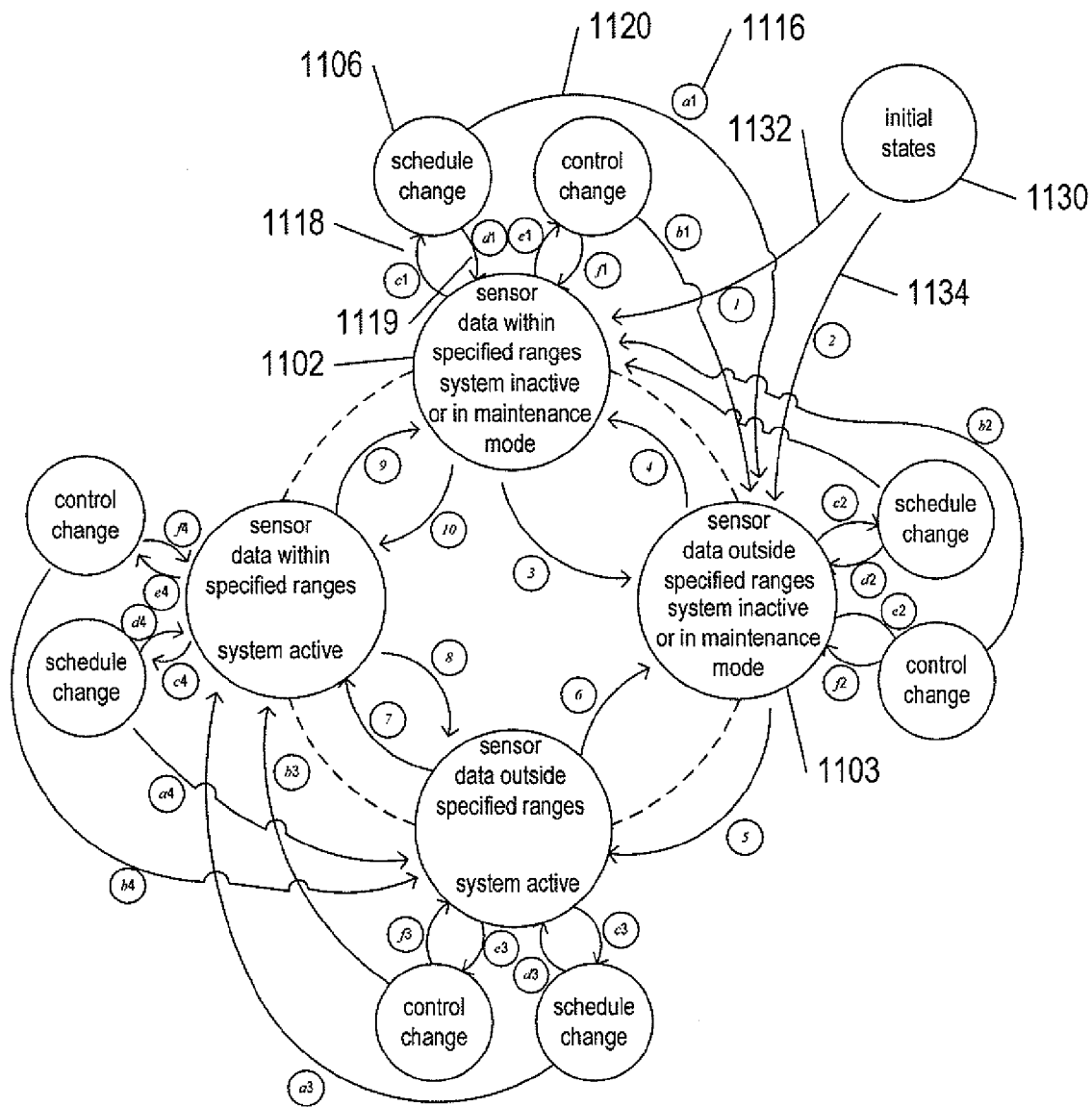

FIG. 11B is the same state-transition diagram shown in FIG. 11A, with the addition of circled, alphanumeric labels, such as circled, alphanumeric label 1116, associated with each transition. FIG. 11C provides a key for these transition labels. FIGS. 11B-C thus together provide a detailed illustration of both the states and state transitions that together represent intelligent-controller operation.

To illustrate the level of detail contained in FIGS. 11B-C, consider the state transitions 1118-1120 associated with states 1102 and 1106. As can be determined from the table provided in FIG. 11C, the transition 1118 from state 1102 to state 1106 involves a control-schedule change made by either a user, a remote entry, or by the intelligent controller itself to one or more control schedules stored within, or accessible to, the intelligent controller. In general, following the schedule change, operation transitions back to state 1102 via transition 1119. However, in the relatively unlikely event that the schedule change has resulted in sensor data that was previously within specified ranges now falling outside newly specified ranges, the state transitions instead, via transition 1120, to the awakening state 1103.

Automated control-schedule learning by the intelligent controller, in fact, occurs largely as a result of intelligent-controller operation within the schedule-change and control-change states. Immediate-control inputs from users and other remote entities, resulting in transitions to the control-change states 1110-1113, provide information from which the intelligent controller learns, over time, how to control the one or more controlled entities in order to satisfy the desires and expectations of one or more users or remote entities. The learning process is encoded, by the intelligent controller, in control-schedule changes made by the intelligent controller while operating in the schedule-change states 1106-1109. These changes are based on recorded immediate-control inputs, recorded control-schedule changes, and current and historical control-schedule information. Additional sources of information for learning may include recorded output control signals and sensor inputs as well as various types of information gleaned from external sources, including sources accessible through the Internet. In addition to the previously described states, there is also an initial state or states 1130 that represent a first-power-on state or state following a reset of the intelligent controller. Generally, a boot operation followed by an initial-configuration operation or operations leads from the one or more initial states 1130, via transitions 1132 and 1134, to one of either the quiescent state 1102 or the awakening state 1103.

Figure 11D:
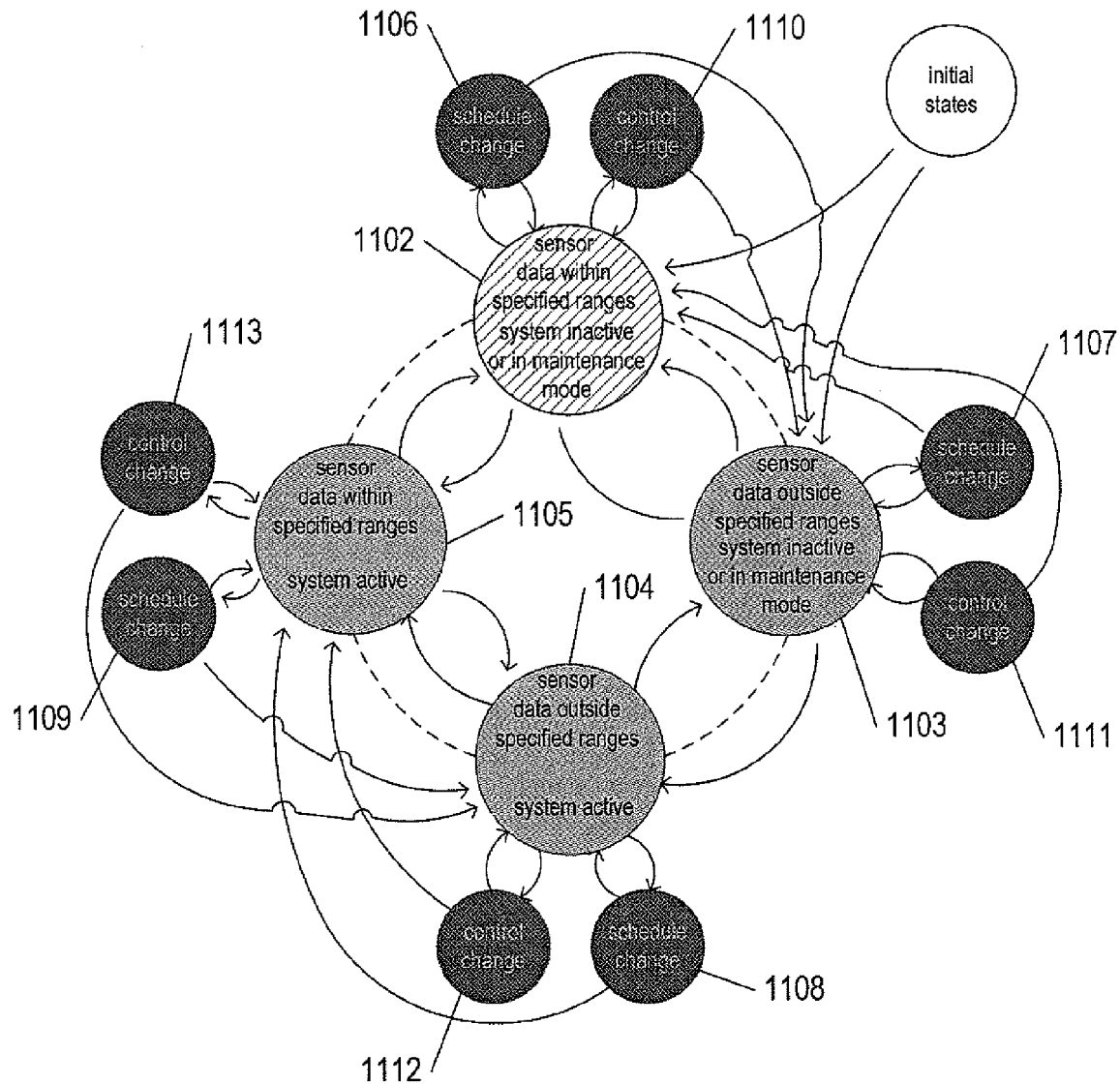
Figure 11E:
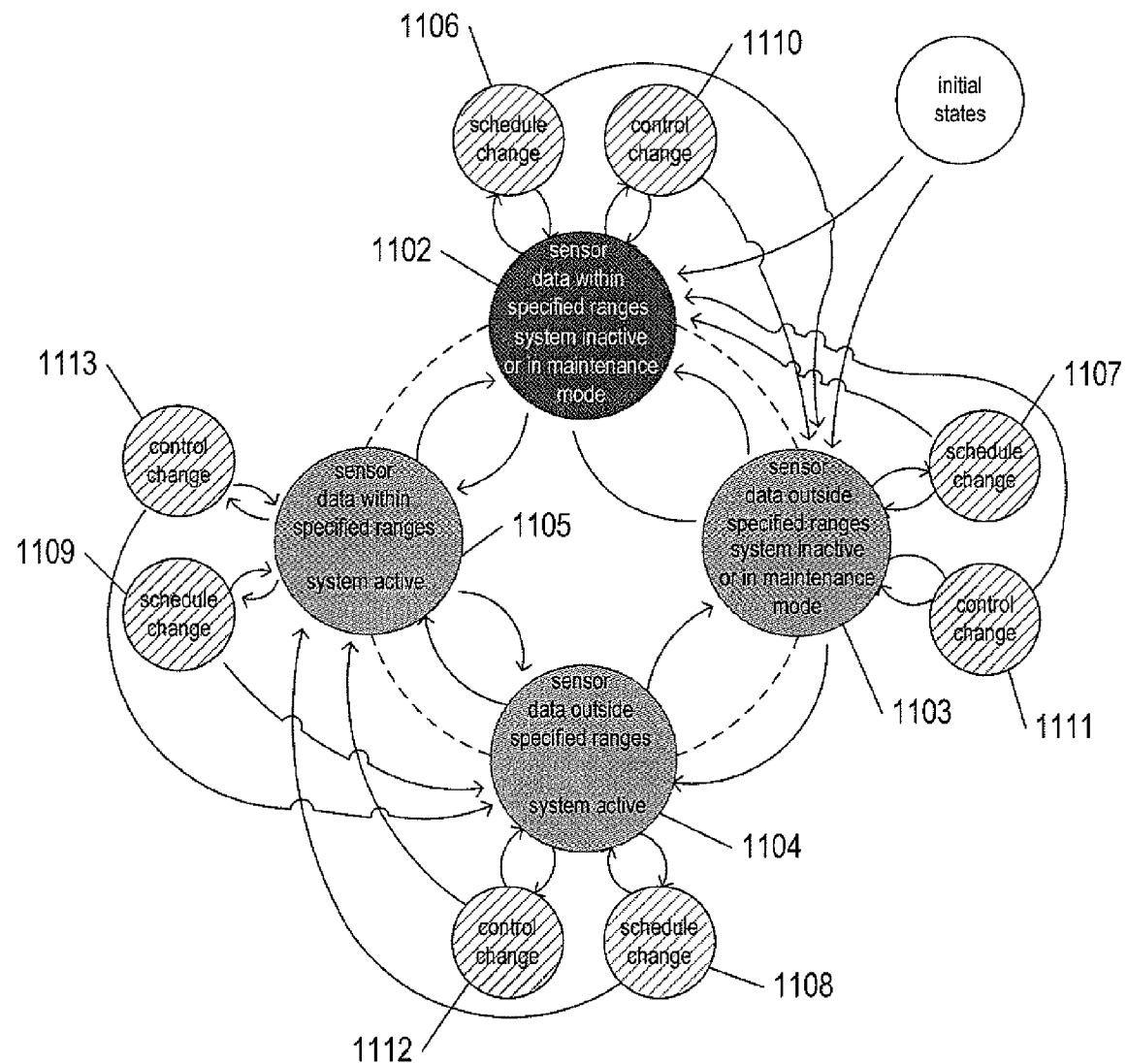

FIGS. 11D-E illustrate, using additional shading of the states in the state-transition diagram shown in FIG. 11A, two modes of automated control-schedule learning carried out by an intelligent controller to which the current application is directed. The first mode, illustrated in FIG. 11D, is a steady-state mode. The steady-state mode seeks optimal or near-optimal control with minimal immediate-control input. While learning continues in the steady-state mode, the learning is implemented to respond relatively slowly and conservatively to immediate-control input, sensor input, and input from external information sources with the presumption that steady-state learning is primarily tailored to small-grain refinement of control operation and tracking of relatively slow changes in desired control regimes over time. In steady-state learning and general intelligent-controller operation, the most desirable state is the quiescent state 1102, shown cross-hatched in FIG. 11D to indicate this state as the goal, or most desired state, of steady-state operation. Light shading is used to indicate that the other main-cycle states 1103-1105 have neutral or slighted favored status in the steady-state mode of operation. Clearly, these states are needed for intermediate or continuous operation of controlled entities in order to maintain one or more parameters within specified ranges, and to track scheduled changes in those specified ranges. However, these states are slightly disfavored in that, in general, a minimal number, or minimal cumulative duration, of activation and deactivation cycles of the one or more controlled entities often leads to most optimal control regimes, and minimizing the cumulative time of activation of the one or more controlled entities often leads to optimizing the control regime with respect to energy and/or resource usage. In the steady-state mode of operation, the schedule-change and control-change states 1110-1113 are highly disfavored, because the intent of automated control-schedule learning is for the intelligent controller to, over time, devise one or more control schedules that accurately reflect a user's or other remote entity's desired operational behavior. While, at times, these states may be temporarily frequently inhabited as a result of changes in desired operational behavior, changes in environmental conditions, or changes in the controlled entities, a general goal of automated control-schedule learning is to minimize the frequency of both schedule changes and immediate-control inputs. Minimizing the frequency of immediate-control inputs is particularly desirable in many optimization schemes.

FIG. 11E, in contrast to FIG. 11D, illustrates an aggressive-learning mode in which the intelligent controller generally operates for a short period of time following transitions within the one or more initial states 730 to the main-cycle states 1102-1103. During the aggressive-learning mode, in contrast to steady-state operational mode shown in FIG. 11D, the quiescent state 1102 is least favored and the schedule-change and control-change states 1106-1113 are most favored, with states 1103-1105 having neutral desirability. In the aggressive-learning mode or phase of operation, the intelligent controller seeks frequent immediate-control inputs and schedule changes in order to quickly and aggressively acquire one or more initial control schedules. As discussed below, by using relatively rapid immediate-control-input relaxation strategies, the intelligent controller, while operating in aggressive-learning mode, seeks to compel a user or other remote entity to provide immediate-control inputs at relatively short intervals in order to quickly determine the overall shape and contour of an initial control schedule. Following completion of the initial aggressive learning and generation of adequate initial control schedules, relative desirability of the various states reverts to those illustrated in FIG. 11D as the intelligent controller begins to refine control schedules and track longer-term changes in control specifications, the environment, the control system, and other such factors. Thus, the automated control-schedule-learning methods and intelligent controllers incorporating these methods to which the current application is directed feature an initial aggressive-learning mode that is followed, after a relatively short period of time, by a long-term, steady-state learning mode.

Figure 12:
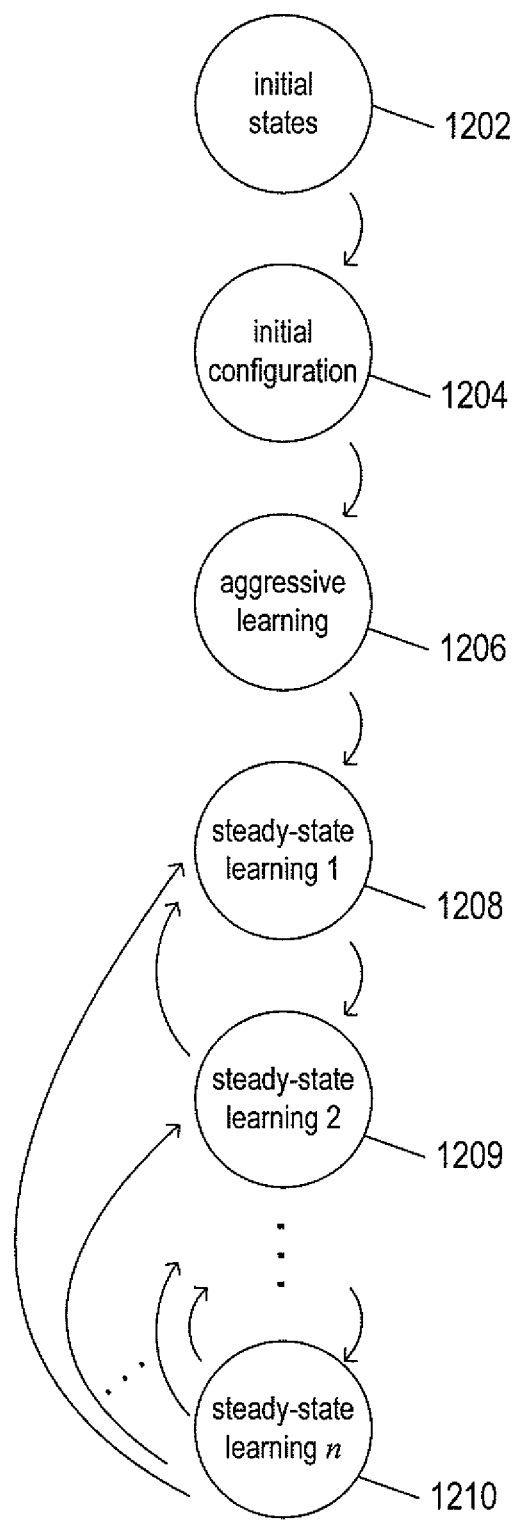
FIG. 12 provides a state-transition diagram that illustrates automated control-schedule learning.

FIG. 12 provide a state-transition diagram that illustrates automated control-schedule learning. Automated learning occurs during normal controller operation, illustrated in FIGS. 11A-C, and thus the state-transition diagram shown in FIG. 12 describes operation behaviors of an intelligent controller that occur in parallel with the intelligent-controller operation described in FIGS. 11A-C. Following one or more initial states 1202, corresponding to the initial states 1130 in FIG. 11B, the intelligent controller enters an initial-configuration learning state 1204 in which the intelligent controller attempts to create one or more initial control schedules based on one or more of default control schedules stored within the intelligent controller or accessible to the intelligent controller, an initial-schedule-creation dialog with a user or other remote entity through a schedule-creation interface, by a combination of these two approaches, or by additional approaches. The initial-configuration learning mode 1204 occurs in parallel with transitions 1132 and 1134 in FIG. 11B. During the initial-learning mode, learning from manually entered setpoint changes does not occur, as it has been found that users often make many such changes inadvertently, as they manipulate interface features to explore the controller's features and functionalities.

Following initial configuration, the intelligent controller transitions next to the aggressive-learning mode 1206, discussed above with reference to FIG. 11E. The aggressive-learning mode 1206 is a learning-mode state which encompasses most or all states except for state 1130 of the states in FIG. 11B. In other words, the aggressive-learning-mode state 1206 is a learning-mode state parallel to the general operational states discussed in FIGS. 11A-E. As discussed above, during aggressive learning, the intelligent controller attempts to create one or more control schedules that are at least minimally adequate to specify operational behavior of the intelligent controller and the entities which it controls based on frequent input from users or other remote entities. Once aggressive learning is completed, the intelligent controller transitions forward through a number of steady-state learning phases 1208-1210. Each transition downward, in the state-transition diagram shown in FIG. 12, through the series of steady-state learning-phase states 1208-1210, is accompanied by changes in learning-mode parameters that result in generally slower, more conservative approaches to automated control-schedule learning as the one or more control schedules developed by the intelligent controller in previous learning states become increasingly accurate and reflective of user desires and specifications. The determination of whether or not aggressive learning is completed may be made based on a period of time, a number of information-processing cycles carried out by the intelligent controller, by determining whether the complexity of the current control schedule or schedules is sufficient to provide a basis for slower, steady-state learning, and/or on other considerations, rules, and thresholds. It should be noted that, in certain implementations, there may be multiple aggressive-learning states.

Figure 13:
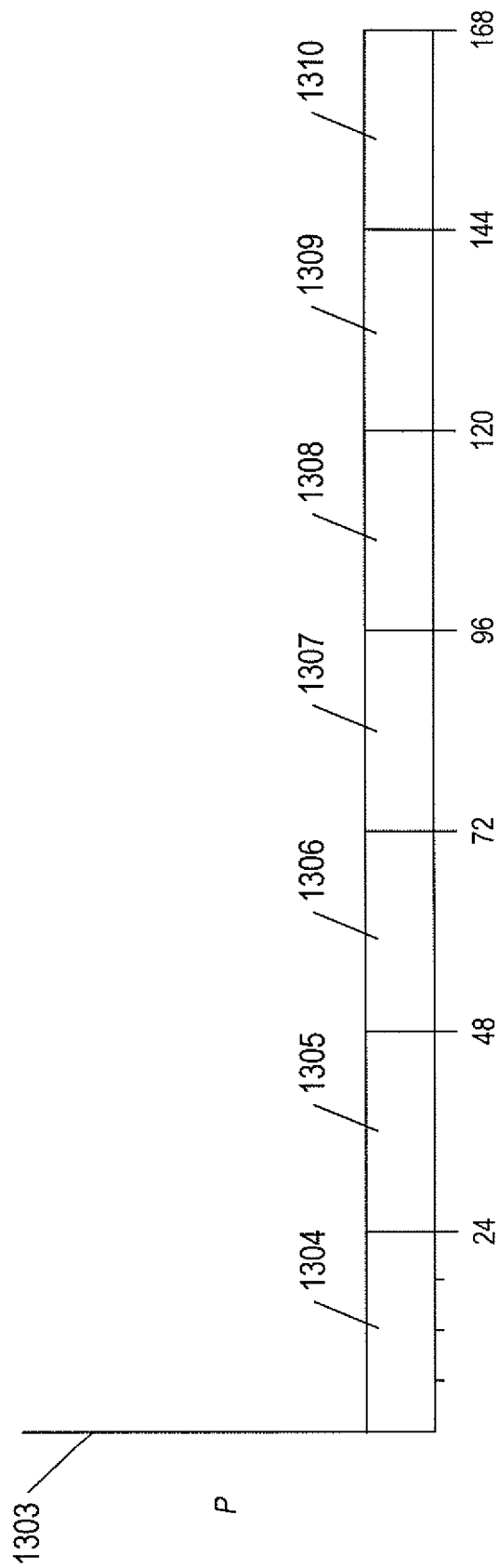
FIG. 13 illustrates time frames associated with an example control schedule that includes shorter-time-frame sub-schedules.

FIG. 13 illustrates time frames associated with an example control schedule that includes shorter-time-frame sub-schedules. The control schedule is graphically represented as a plot with the horizontal axis 1302 representing time. The vertical axis 1303 generally represents one or more parameter values. As discussed further, below, a control schedule specifies desired parameter values as a function of time. The control schedule may be a discrete set of values or a continuous curve. The specified parameter values are either directly or indirectly related to observable characteristics in environment, system, device, machine, or organization that can be measured by, or inferred from measurements obtained from, any of various types of sensors. In general, sensor output serves as at least one level of feedback control by which an intelligent controller adjusts the operational behavior of a device, machine, system, or organization in order to bring observed parameter values in line with the parameter values specified in a control schedule. The control schedule used as an example in the following discussion is incremented in hours, along the horizontal axis, and covers a time span of one week. The control schedule includes seven sub-schedules 1304-1310 that correspond to days. As discussed further below, in an example intelligent controller, automated control-schedule learning takes place at daily intervals, with a goal of producing a robust weekly control schedule that can be applied cyclically, week after week, over relatively long periods of time. As also discussed below, an intelligent controller may learn even longer-period control schedules, such as yearly control schedules, with monthly, weekly, daily, and even hourly sub-schedules organized hierarchically below the yearly control schedule. In certain cases, an intelligent controller may generate and maintain shorter-time-frame control schedules, including hourly control schedules, minute-based control schedules, or even control schedules incremented in milliseconds and microseconds. Control schedules are, like the stored computer instructions that together compose control routines, tangible, physical components of control systems. Control schedules are stored as physical states in physical storage media. Like control routines and programs, control schedules are necessarily tangible, physical control-system components that can be accessed and used by processor-based control logic and control systems.

Figure 14A:
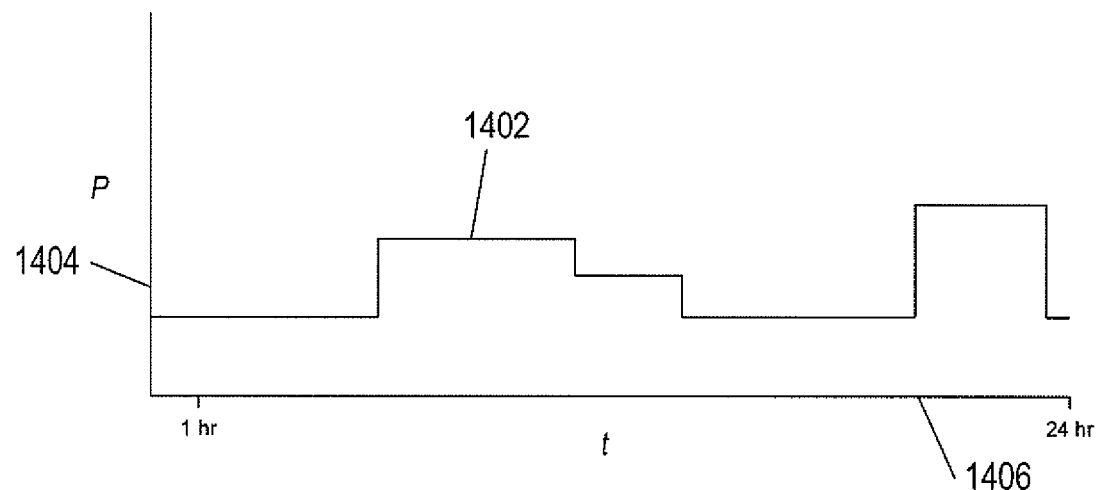
FIGS. 14A-C show three different types of control schedules.
Figure 14B:
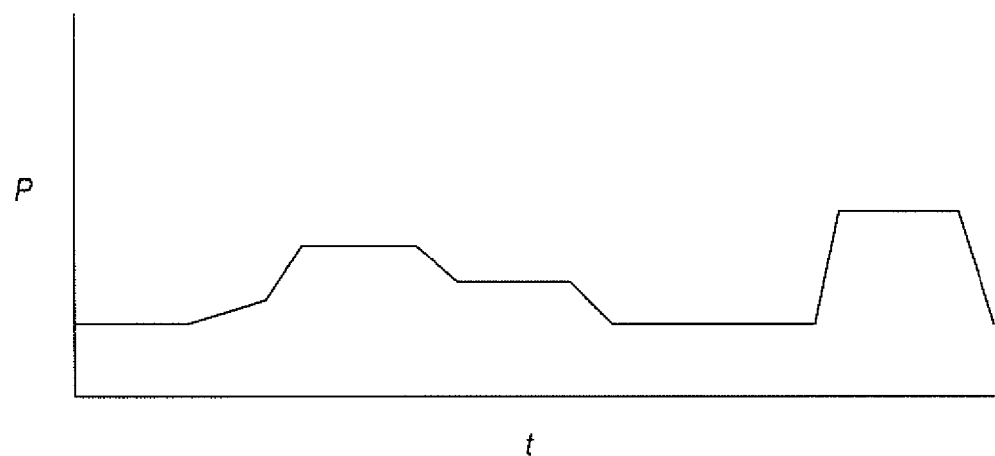
Figure 14C:
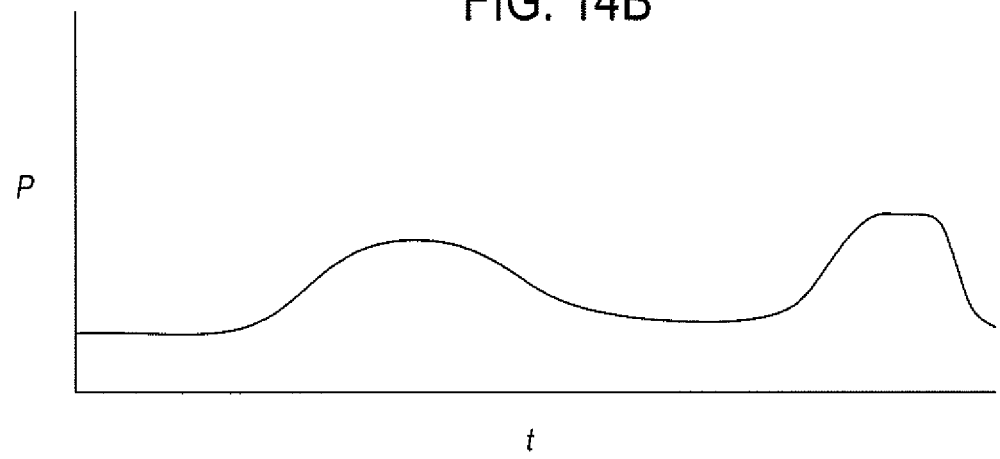

FIGS. 14A-C show three different types of control schedules. In FIG. 14A, the control schedule is a continuous curve 1402 representing a parameter value, plotted with respect to the vertical axis 1404, as a function of time, plotted with respect to the horizontal axis 1406. The continuous curve comprises only horizontal and vertical sections. Horizontal sections represent periods of time at which the parameter is desired to remain constant and vertical sections represent desired changes in the parameter value at particular points in time. This is a simple type of control schedule and is used, below, in various examples of automated control-schedule learning. However, automated control-schedule-learning methods can also learn more complex types of schedules. For example, FIG. 14B shows a control schedule that includes not only horizontal and vertical segments, but arbitrarily angled straight-line segments. Thus, a change in the parameter value may be specified, by such a control schedule, to occur at a given rate, rather than specified to occur instantaneously, as in the simple control schedule shown in FIG. 14A. Automatedcontrol-schedule-learning methods may also accommodate smooth-continuous-curve-based control schedules, such as that shown in FIG. 14C. In general, the characterization and data encoding of smooth, continuous-curve-based control schedules, such as that shown in FIG. 14C, is more complex and includes a greater amount of stored data than the simpler control schedules shown in FIGS. 14B and 14A.

In the following discussion, it is generally assumed that a parameter value tends to relax towards lower values in the absence of system operation, such as when the parameter value is temperature and the controlled system is a heating unit. However, in other cases, the parameter value may relax toward higher values in the absence of system operation, such as when the parameter value is temperature and the controlled system is an air conditioner. The direction of relaxation often corresponds to the direction of lower resource or expenditure by the system. In still other cases, the direction of relaxation may depend on the environment or other external conditions, such as when the parameter value is temperature and the controlled system is an HVAC system including both heating and cooling functionality.

Turning to the control schedule shown in FIG. 14A, the continuous-curve-represented control schedule 1402 may be alternatively encoded as discrete setpoints corresponding to vertical segments, or edges, in the continuous curve. A continuous-curve control schedule is generally used, in the following discussion, to represent a stored control schedule either created by a user or remote entity via a schedule-creation interface provided by the intelligent controller or created by the intelligent controller based on already-existing control schedules, recorded immediate-control inputs, and/or recorded sensor data, or a combination of these types of information.

Figure 15A:
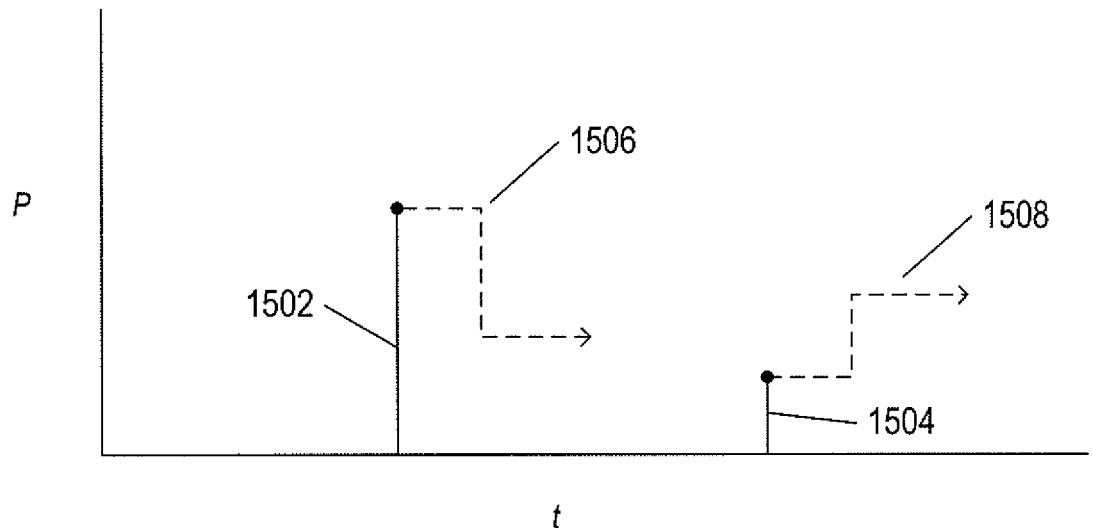
FIGS. 15A-G show representations of immediate-control inputs that may be received and executed by an intelligent controller, and then recorded and overlaid onto control schedules, such as those discussed above with reference to FIGS. 14A-C, as part of automated control-schedule learning.

Immediate-control inputs are also graphically represented in parameter-value versus time plots. FIGS. 15A-G show representations of immediate-control inputs that may be received and executed by an intelligent controller, and then recorded and overlaid onto control schedules, such as those discussed above with reference to FIGS. 14A-C, as part of automated control-schedule learning. An immediate-control input is represented graphically by a vertical line segment that ends in a small filled or shaded disk. FIG. 15A shows representations of two immediate-control inputs 1502 and 1504. An immediate-control input is essentially equivalent to an edge in a control schedule, such as that shown in FIG. 14A, that is input to an intelligent controller by a user or remote entity with the expectation that the input control will be immediately carried out by the intelligent controller, overriding any current control schedule specifying intelligent-controller operation. An immediate-control input is therefore a real-time setpoint input through a control-input interface to the intelligent controller.

Because an immediate-control input alters the current control schedule, an immediate-control input is generally associated with a subsequent, temporary control schedule, shown in FIG. 15A as dashed horizontal and vertical lines that form a temporary-control-schedule parameter vs. time curve extending forward in time from the immediate-control input. Temporary control schedules 1506 and 1508 are associated with immediate-control inputs 1502 and 1504, respectively, in FIG. 15A.

Figure 15B:
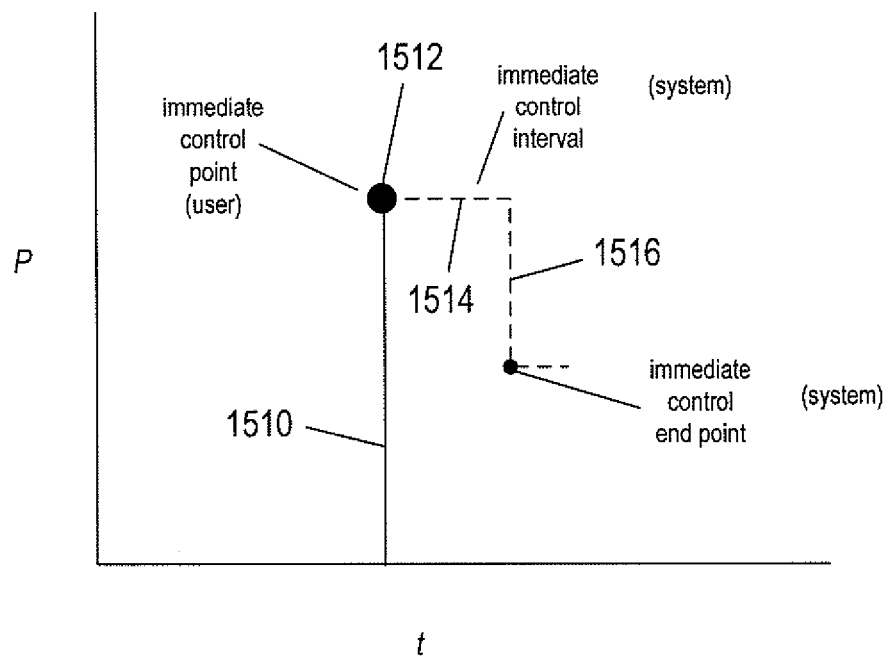

FIG. 15B illustrates an example of immediate-control input and associated temporary control schedule. The immediate-control input 1510 is essentially an input setpoint that overrides the current control schedule and directs the intelligent controller to control one or more controlled entities in order to achieve a parameter value equal to the vertical coordinate of the filled disk 1512 in the representation of the immediate-control input. Following the immediate-control input, a temporary constant-temperature control-schedule interval 1514 extends for a period of time following the immediate-control input, and the immediate-control input is then relaxed by a subsequent immediate-control-input endpoint, or subsequent setpoint 1516. The length of time for which the immediate-control input is maintained, in interval 1514, is a parameter of automated control-schedule learning. The direction and magnitude of the subsequent immediate-control-input endpoint setpoint 1516 represents one or more additional automated-control-schedule-learning parameters. Please note that an automated-control-schedule-learning parameter is an adjustable parameter that controls operation of automated control-schedule learning, and is different from the one or more parameter values plotted with respect to time that comprise control schedules. The parameter values plotted with respect to the vertical axis in the example control schedules to which the current discussion refers are related directly or indirectly to observables, including environmental conditions, machines states, and the like.

Figure 15C:
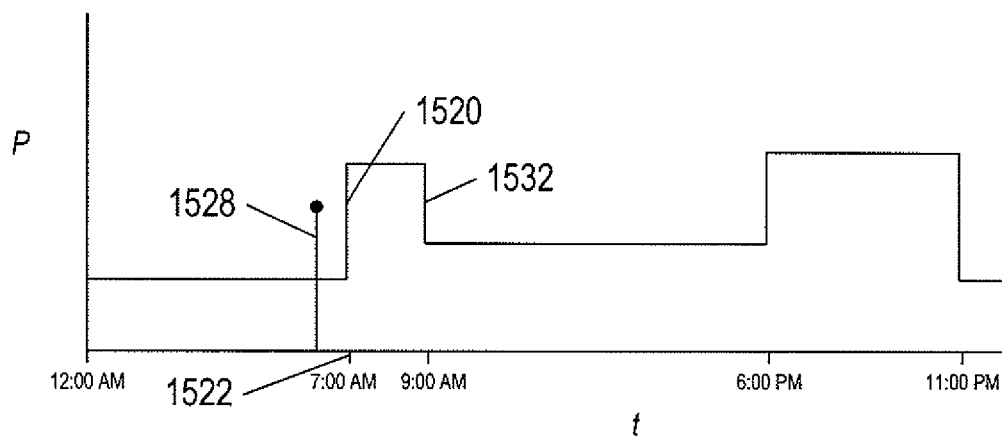
Figure 15D:
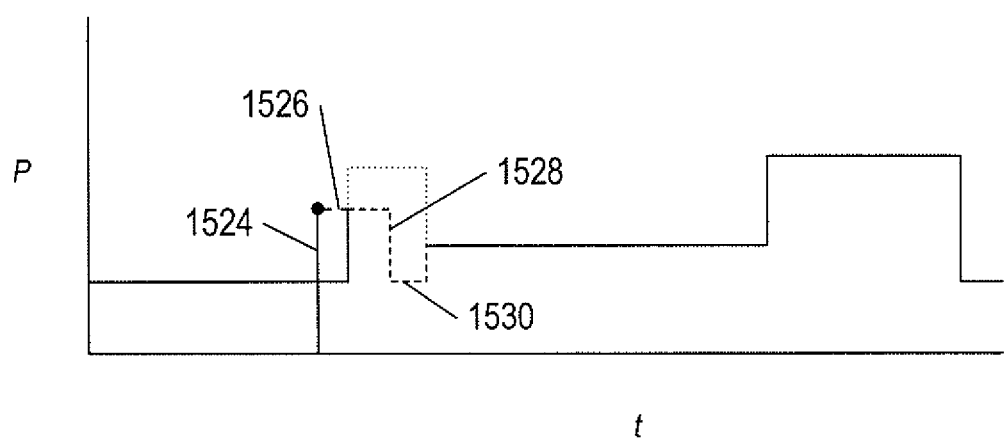

FIG. 15C shows an existing control schedule on which an immediate-control input is superimposed. The existing control schedule called for an increase in the parameter value P, represented by edge 1520, at 7:00 a.m. (1522 in FIG. 15C). The immediate-control input 1524 specifies an earlier parameter-value change of somewhat less magnitude. FIGS. 15D-G illustrate various subsequent temporary control schedules that may obtain, depending on various different implementations of intelligent-controller logic and/or current values of automated-control-schedule-learning parameter values. In FIGS. 15D-G, the temporary control schedule associated with an immediate-control input is shown with dashed line segments and that portion of the existing control schedule overridden by the immediate-control input is shown by dotted line segments. In one approach, shown in FIG. 15D, the desired parameter value indicated by the immediate-control input 1524 is maintained for a fixed period of time 1526 after which the temporary control schedule relaxes, as represented by edge 1528, to the parameter value that was specified by the control schedule at the point in time that the immediate-control input is carried out. This parameter value is maintained 1530 until the next scheduled setpoint, which corresponds to edge 1532 in FIG. 15C, at which point the intelligent controller resumes control according to the control schedule.

Figure 15E:
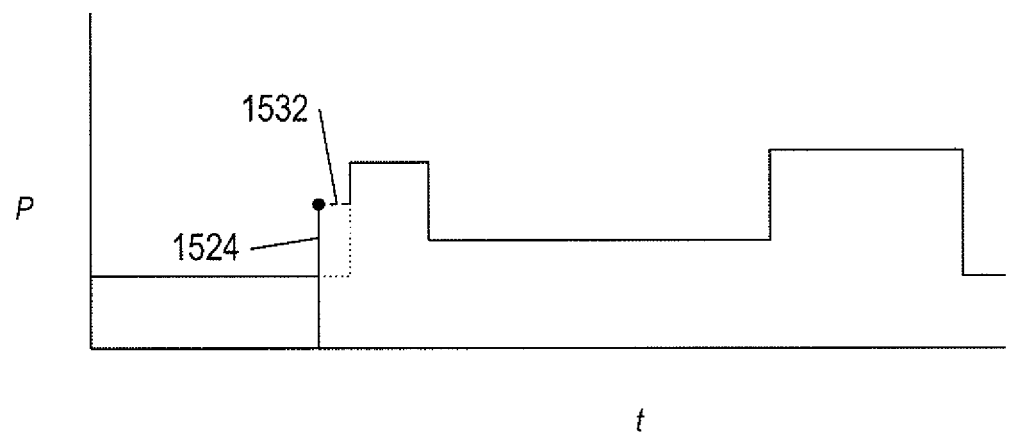

In an alternative approach shown in FIG. 15E, the parameter value specified by the immediate-control input 1524 is maintained 1532 until a next scheduled setpoint is reached, in this case the setpoint corresponding to edge 1520 in the control schedule shown in FIG. 15C. At the next setpoint, the intelligent controller resumes control according to the existing control schedule. This approach is often desirable, because users often expect a manually entered setpoint to remain in force until a next scheduled setpoint change.

Figure 15F:
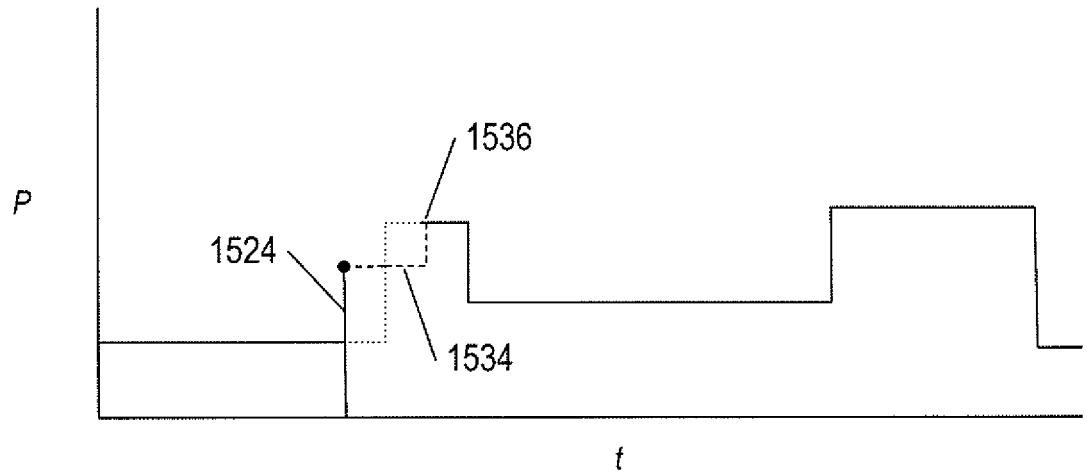

In a different approach, shown in FIG. 15F, the parameter value specified by the immediate-control input 1524 is maintained by the intelligent controller for a fixed period of time 1534, following which the parameter value that would have been specified by the existing control schedule at that point in time is resumed 1536.

Figure 15G:
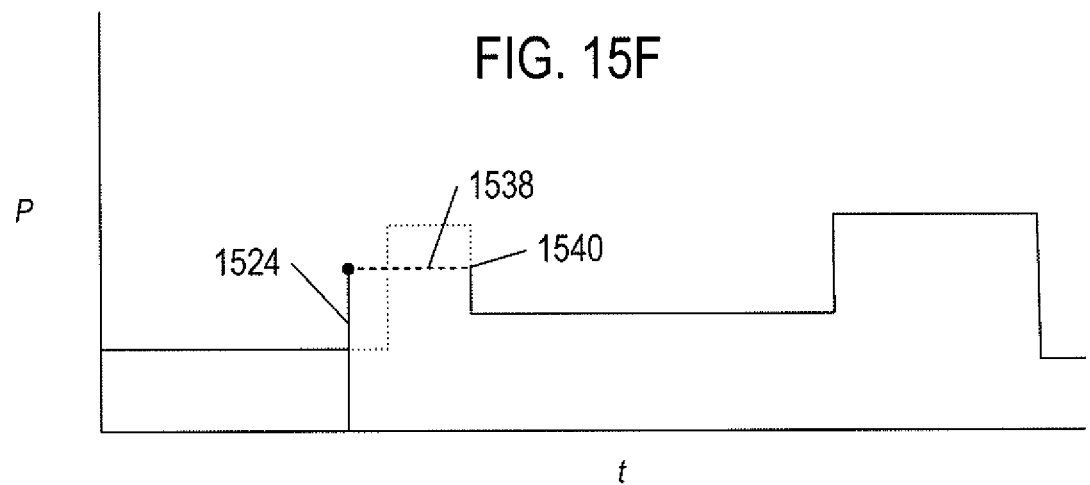

In the approach shown in FIG. 15G, the parameter value specified by the immediate-control input 1524 is maintained 1538 until a setpoint with opposite direction from the immediate-control input is reached, at which the existing control schedule is resumed 1540. In still alternative approaches, the immediate-control input may be relaxed further, to a lowestreasonable level, in order to attempt to optimize system operation with respect to resource and/or energy expenditure. In these approaches, generally used during aggressive learning, a user is compelled to positively select parameter values greater than, or less than, a parameter value associated with a minimal or low rate of energy or resource usage.

In one example implementation of automated control-schedule learning, an intelligent controller monitors immediate-control inputs and schedule changes over the course of a monitoring period, generally coinciding with the time span of a control schedule or sub-schedule, while controlling one or more entities according to an existing control schedule except as overridden by immediate-control inputs and input schedule changes. At the end of the monitoring period, the recorded data is superimposed over the existing control schedule and a new provisional schedule is generated by combining features of the existing control schedule and schedule changes and immediate-control inputs. Following various types of resolution, the new provisional schedule is promoted to the existing control schedule for future time intervals for which the existing control schedule is intended to control system operation.

Figure 16A:
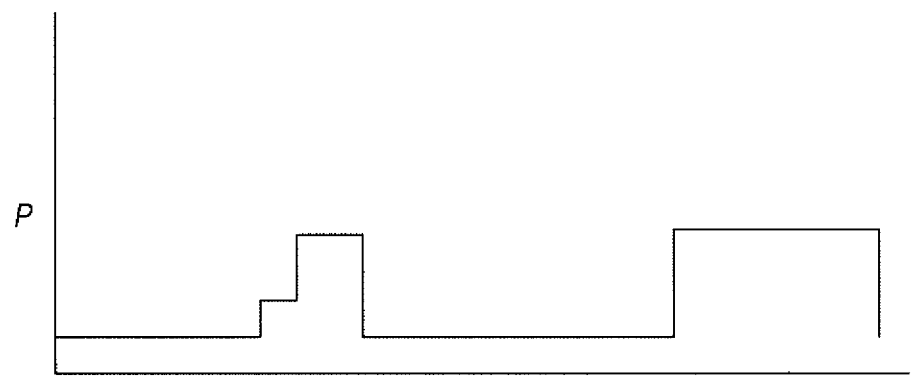
FIGS. 16A-E illustrate one aspect of the method by which a new control schedule is synthesized from an existing control schedule and recorded schedule changes and immediate-control inputs.
Figure 16B:
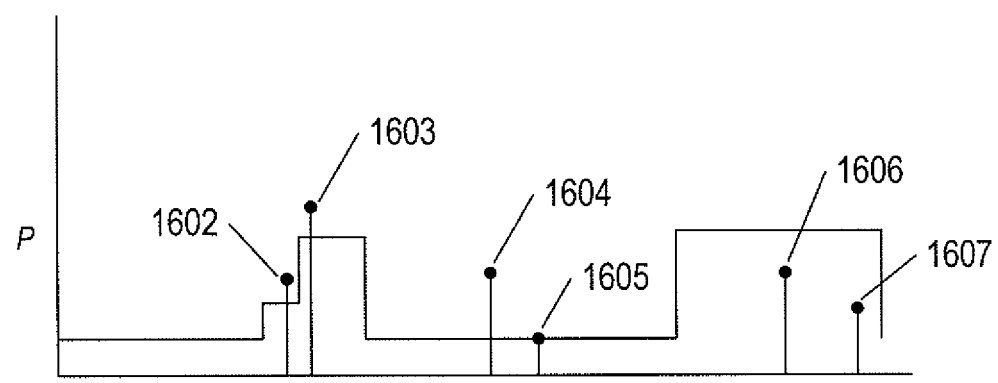
Figure 16C:
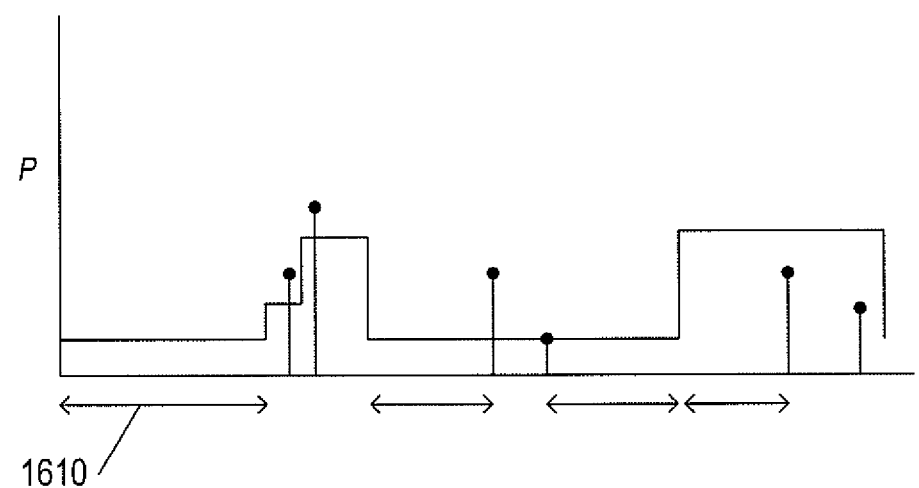
Figure 16D:
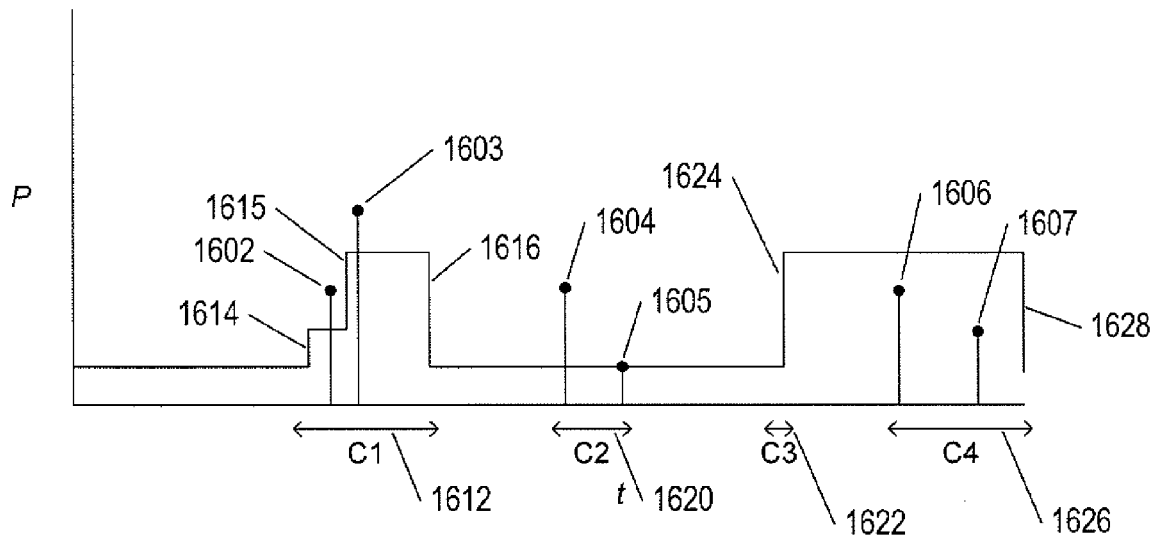
Figure 16E:
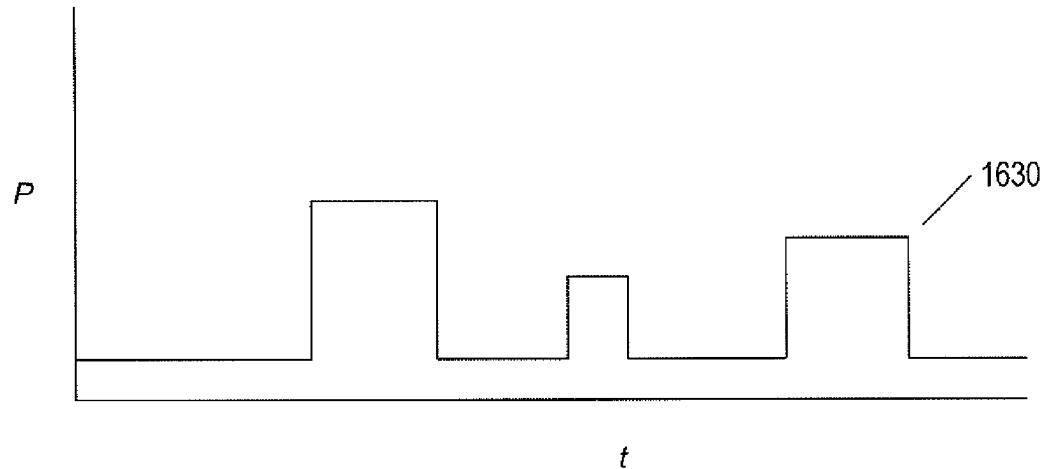

FIGS. 16A-E illustrate one aspect of the method by which a new control schedule is synthesized from an existing control schedule and recorded schedule changes and immediate-control inputs. FIG. 16A shows the existing control schedule for a monitoring period. FIG. 16B shows a number of recorded immediate-control inputs superimposed over the control schedule following the monitoring period. As illustrated in FIG. 16B, there are six immediate-control inputs 1602-1607. In a clustering technique, clusters of existing-control-schedule setpoints and immediate-control inputs are detected. One approach to cluster detection is to determine all time intervals greater than a threshold length during which neither existing-control-schedule setpoints nor immediate-control inputs are present, as shown in FIG. 16C. The horizontal, double-headed arrows below the plot, such as double-headed arrow 1610, represent the intervals of greater than the threshold length during which neither existing-control-schedule setpoints nor immediate-control inputs are present in the superposition of the immediate-control inputs onto the existing control schedule. Those portions of the time axis not overlapping by these intervals are then considered to be clusters of existing-control-schedule setpoints and immediate-control inputs, as shown in FIG. 16D. A first cluster 1612 encompasses existing-control-schedule setpoints 1614-1616 and immediate-control inputs 1602 and 1603. A second cluster 1620 encompasses immediate-control inputs 1604 and 1605. A third cluster 1622 encompasses only existing-control-schedule setpoint 1624. A fourth cluster 1626 encompasses immediate-control inputs 1606 and 1607 as well as the existing-control-schedule setpoint 1628. In one cluster-processing method, each cluster is reduced to zero, one, or two setpoints in a new provisional schedule generated from the recorded immediate-control inputs and existing control schedule. FIG. 16E shows an exemplary new provisional schedule 1630 obtained by resolution of the four clusters identified in FIG. 16D.

Cluster processing is intended to simplify the new provisional schedule by coalescing the various existing-control-schedule setpoints and immediate-control inputs within a cluster to zero, one, or two new-control-schedule setpoints that reflect an apparent intent on behalf of a user or remote entity with respect to the existing control schedule and the immediate-control inputs. It would be possible, by contrast, to generate the new provisional schedule as the sum of the existing-control-schedule setpoints and immediate-control inputs. However, that approach would often lead to a ragged, highly variable, and fine-grained control schedule that generally does not reflect the ultimate desires of users or other remote entities and which often constitutes a parameter-value vs. time curve that cannot be achieved by intelligent control. As one example, in an intelligent thermostat, two setpoints 15 minutes apart specifying temperatures that differ by ten degrees may not be achievable by an HVAC system controlled by an intelligent controller. It may be the case, for example, that under certain environmental conditions, the HVAC system is capable of raising the internal temperature of a residence by a maximum of only five degrees per hour. Furthermore, simple control schedules can lead to a more diverse set of optimization strategies that can be employed by an intelligent controller to control one or more entities to produce parameter values, or P values, over time, consistent with the control schedule. An intelligent controller can then optimize the control in view of further constraints, such as minimizing energy usage or resource utilization.

There are many possible approaches to resolving a cluster of existing-control-schedule setpoints and immediate-control inputs into one or two new provisional schedule setpoints. FIGS. 17A-E illustrate one approach to resolving schedule clusters. In each of FIGS. 17A-E, three plots are shown. The first plot shows recorded immediate-control inputs superimposed over an existing control schedule. The second plot reduces the different types of setpoints to a single generic type of equivalent setpoints, and the final plot shows resolution of the setpoints into zero, one, or two new provisional schedule setpoints.

Figure 17A:
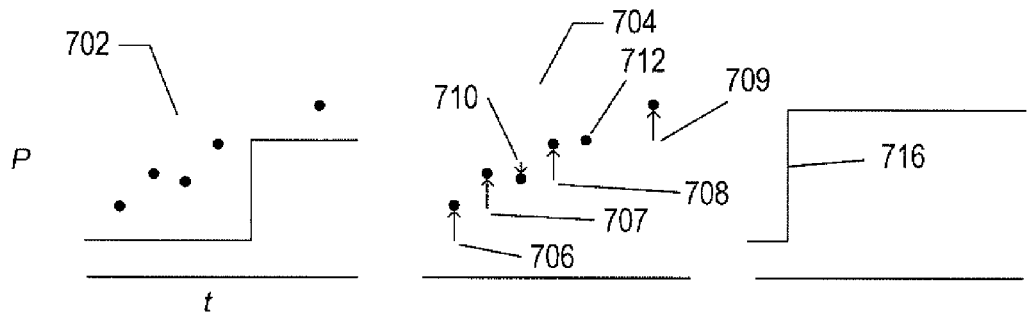
FIGS. 17A-E illustrate one approach to resolving schedule clusters.

FIG. 17A shows a cluster 1702 that exhibits an obvious increasing P-value trend, as can be seen when the existing-control-schedule setpoints and immediate-control inputs are plotted together as a single type of setpoint, or event, with directional and magnitude indications with respect to actual control produced from the existing-control-schedule setpoints and immediate-control inputs 704 within an intelligent controller. In this case, four out of the six setpoints 706-709 resulted in an increase in specified P value, with only a single setpoint 710 resulting in a slight decrease in P value and one setpoint 712 produced no change in P value. In this and similar cases, all of the setpoints are replaced by a single setpoint specifying an increase in P value, which can be legitimately inferred as the intent expressed both in the existing control schedule and in the immediate-control inputs. In this case, the single setpoint 716 that replaces the cluster of setpoints 704 is placed at the time of the first setpoint in the cluster and specifies a new P value equal to the highest P value specified by any setpoint in the cluster.

Figure 17B:
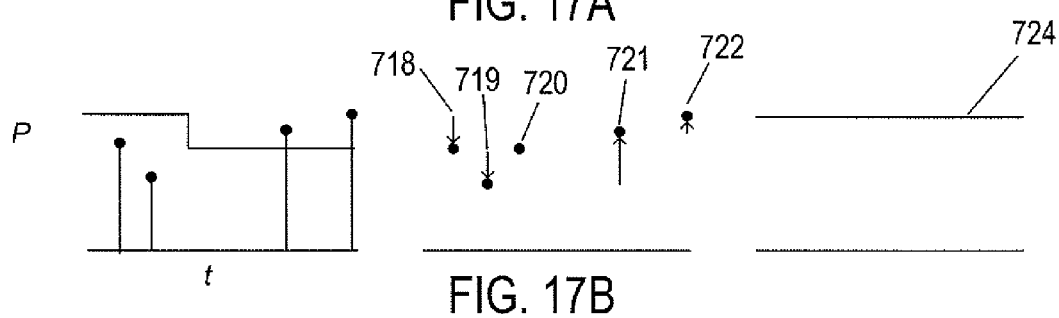

The cluster illustrated in FIG. 17B contains five setpoints 718-722. Two of these setpoints specify a decrease in P value, two specify an increase in P value, and one had no effect. As a result, there is no clear P-value-change intent demonstrated by the collection of setpoints, and therefore the new provisional schedule 724 contains no setpoints over the cluster interval, with the P value maintained at the initial P value of the existing control schedule within the cluster interval.

Figure 17C:
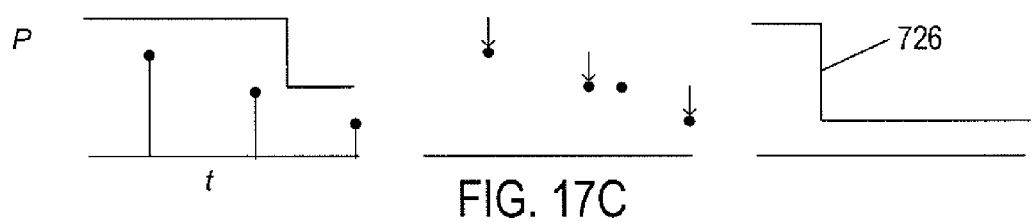

FIG. 17C shows a cluster exhibiting a clear downward trend, analogous to the upward trend exhibited by the clustered setpoints shown in FIG. 17A. In this case, the four cluster setpoints are replaced by a single new provisional schedule setpoint 726 at a point in time corresponding to the first setpoint in the cluster and specifying a decrease in P value equivalent to the lowest P value specified by any of the setpoints in the cluster.

Figure 17D:
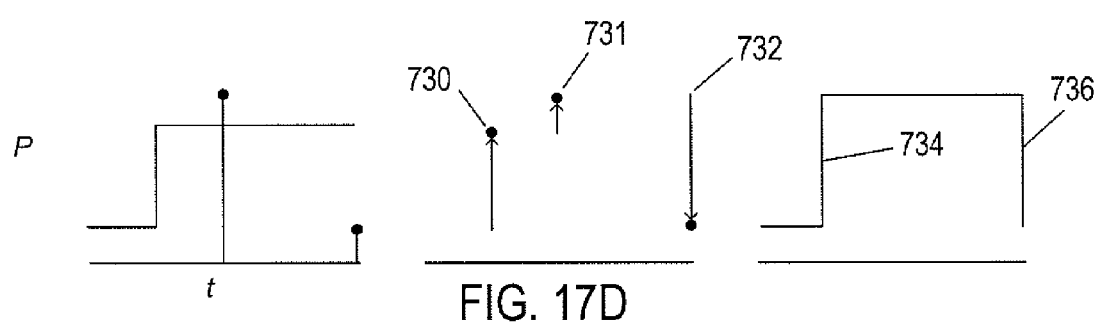
Figure 17E:
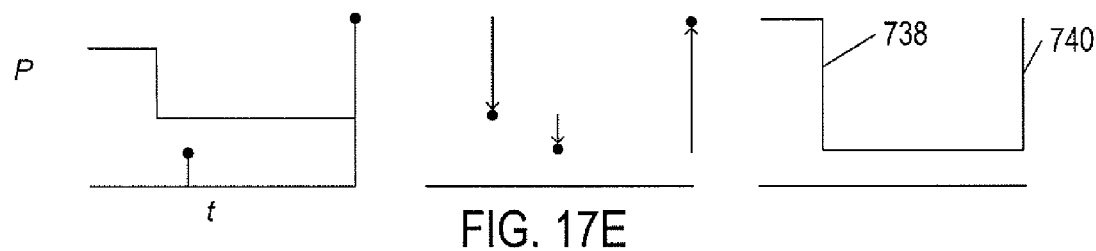

In FIG. 17D, the cluster includes three setpoints 730-732. The setpoint corresponding to the existing-control-schedule setpoint 730 and a subsequent immediate-control setpoint 731 indicate a clear intent to raise the P value at the beginning of the cluster interval and the final setpoint 732 indicates a clear intent to lower the P value at the end of the cluster interval. In this case, the three setpoints are replaced by two setpoints 734 and 736 in the new provisional schedule that mirror the intent inferred from the three setpoints in the cluster. FIG. 17E shows a similar situation in which three setpoints in the cluster are replaced by two new-provisional-schedule setpoints 738 and 740, in this case representing a temporary lowering and then subsequent raising of the P value as opposed to the temporary raising and subsequent lowering of the P value in the new provisional schedule in FIG. 17B.

There are many different computational methods that can recognize the trends of clustered setpoints discussed with reference to FIGS. 17A-E. These trends provide an example of various types of trends that may be computationally recognized. Different methods and strategies for cluster resolution are possible, including averaging, curve fitting, and other techniques. In all cases, the goal of cluster resolution is to resolve multiple setpoints into a simplest possible set of setpoints that reflect a user's intent, as judged from the existing control schedule and the immediate-control inputs.

Figure 18A:
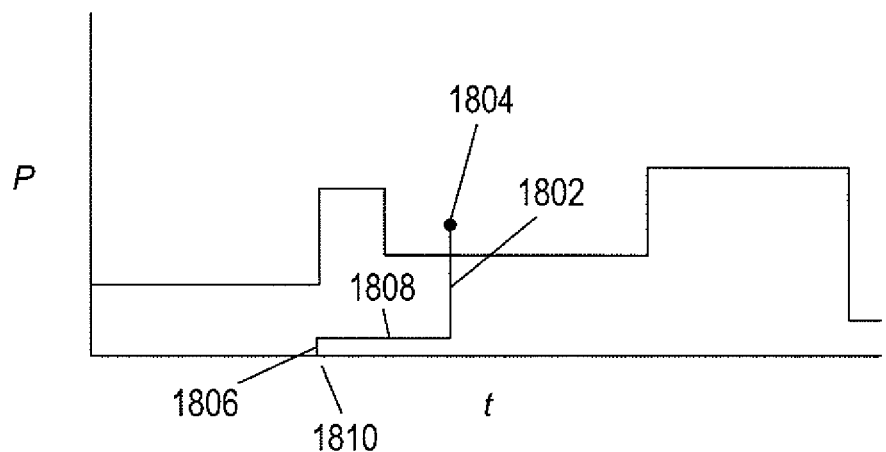
FIGS. 18A-B illustrate the effect of a prospective schedule change entered by a user during a monitoring period.
Figure 18B:
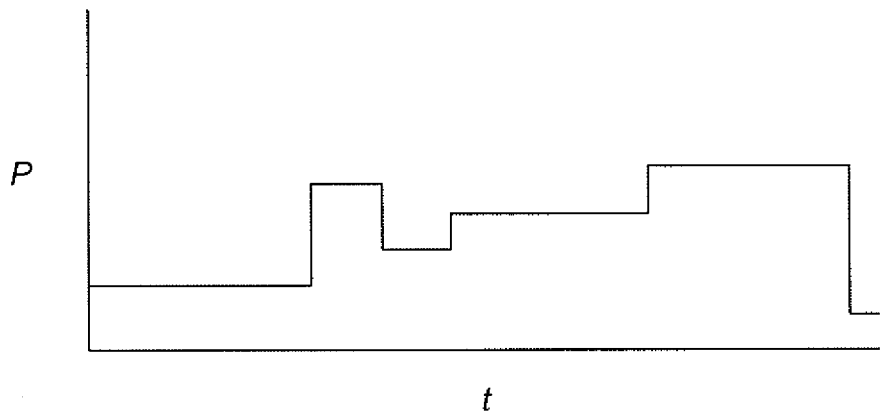

FIGS. 18A-B illustrate the effect of a prospective schedule change entered by a user during a monitoring period. In FIGS. 18A-B, and in subsequent figures, a schedule-change input by a user is represented by a vertical line 1802 ending in a small filled disk 1804 indicating a specified P value. The setpoint is placed with respect to the horizontal axis at a time at which the setpoint is scheduled to be carried out. A short vertical line segment 1806 represents the point in time that the schedule change was made by a user or remote entity, and a horizontal line segment 1808 connects the time of entry with the time for execution of the setpoint represented by vertical line segments 1806 and 1802, respectively. In the case shown in FIG. 18A, a user altered the existing control schedule, at 7:00 a.m. 1810, to include setpoint 1802 at 11:00 a.m. In cases such as those shown in FIG. 18A, where the schedule change is prospective and where the intelligent controller can control one or more entities according to the changed control schedule within the same monitoring period, the intelligent controller simply changes the control schedule, as indicated in FIG. 18B, to reflect the schedule change. In one automated-control-schedule-learning method, therefore, prospective schedule changes are not recorded. Instead, the existing control schedule is altered to reflect a user's or remote entity's desired schedule change.

Figure 19A:
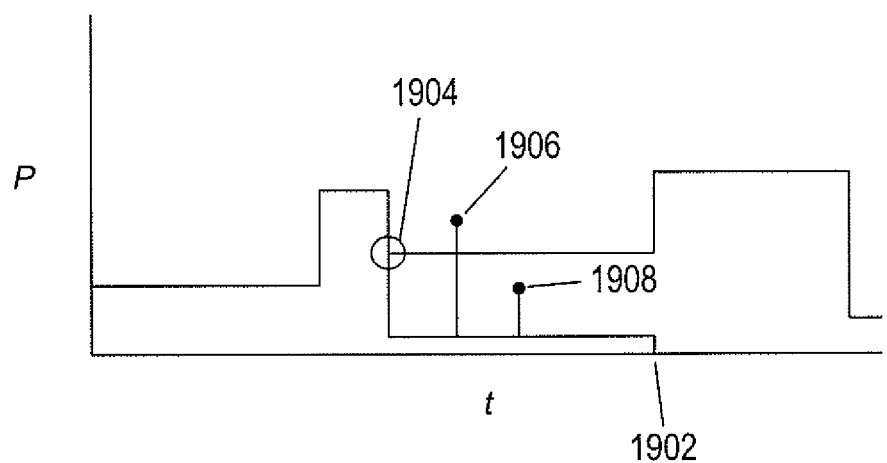
FIGS. 19A-B illustrate the effect of a retrospective schedule change entered by a user during a monitoring period.
Figure 19B:
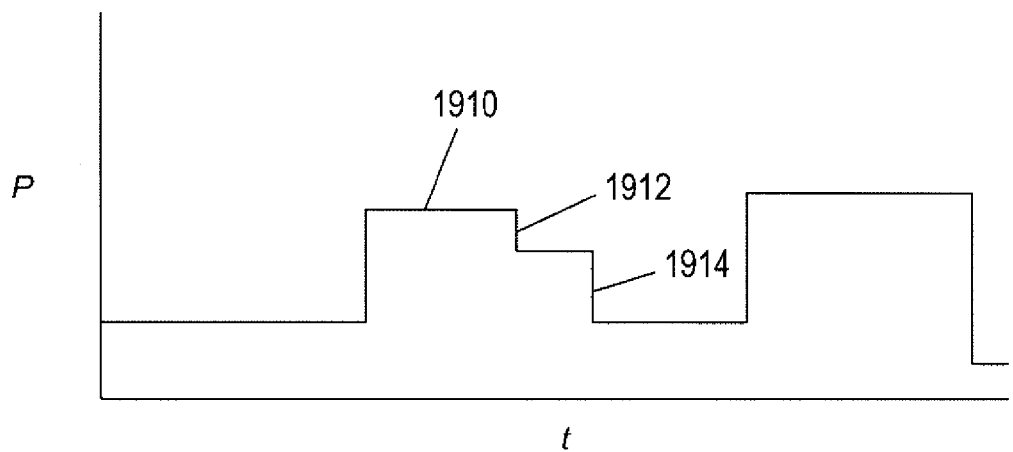

FIGS. 19A-B illustrate the effect of a retrospective schedule change entered by a user during a monitoring period. In the case shown in FIG. 19A, a user input three changes to the existing control schedule at 6:00 p.m. 1902, including deleting an existing setpoint 1904 and adding two new setpoints 1906 and 1908. All of these schedule changes would impact only a future monitoring period controlled by the modified control schedule, since the time at which they were entered is later than the time at which the changes in P value are scheduled to occur. For these types of schedule changes, the intelligent controller records the schedule changes in a fashion similar to the recording of immediate-control inputs, including indications of the fact that this type of setpoint represents a schedule change made by a user through a schedule-modification interface rather than an immediate-control input.

FIG. 19B shows a new provisional schedule that incorporates the schedule changes shown in FIG. 19A. In general, schedule changes are given relatively large deference by the currently described automated-control-schedule-learning method. Because a user has taken the time and trouble to make schedule changes through a schedule-change interface, it is assumed that the schedule changes are strongly reflective of the user's desires and intentions. As a result, as shown in FIG. 19B, the deletion of existing setpoint 1904 and the addition of the two new setpoints 1906 and 1908 are entered into the existing control schedule to produce the new provisional schedule 1910. Edge 1912 corresponds to the schedule change represented by setpoint 1906 in FIG. 19A and edge 1914 corresponds to the schedule change represented by setpoint 1908 in FIG. 19A. In summary, either for prospective schedule changes or retrospective schedule changes made during a monitoring period, the schedule changes are given great deference during learning-based preparation of a new provisional schedule that incorporates both the existing control schedule and recorded immediate-control inputs and schedule changes made during the monitoring period.

Figure 20A:
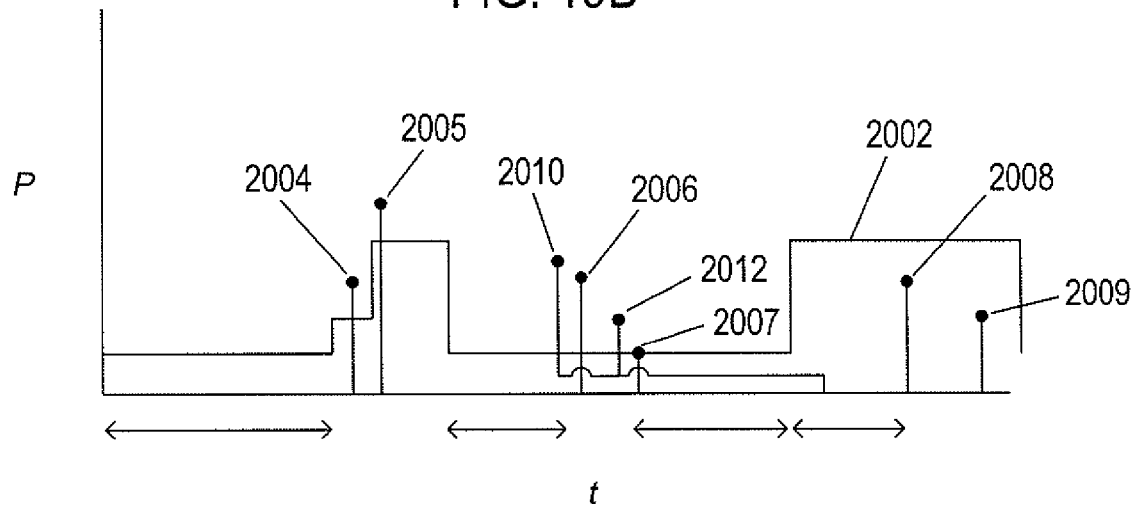
FIGS. 20A-C illustrate overlay of recorded data onto an existing control schedule, following completion of a monitoring period, followed by clustering and resolution of clusters.
Figure 20B:
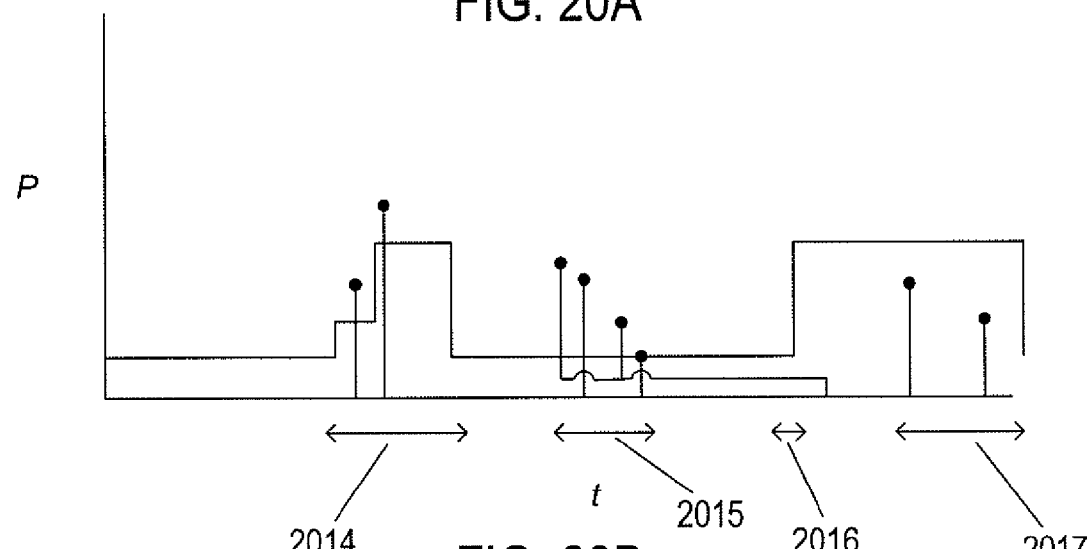
Figure 20C:
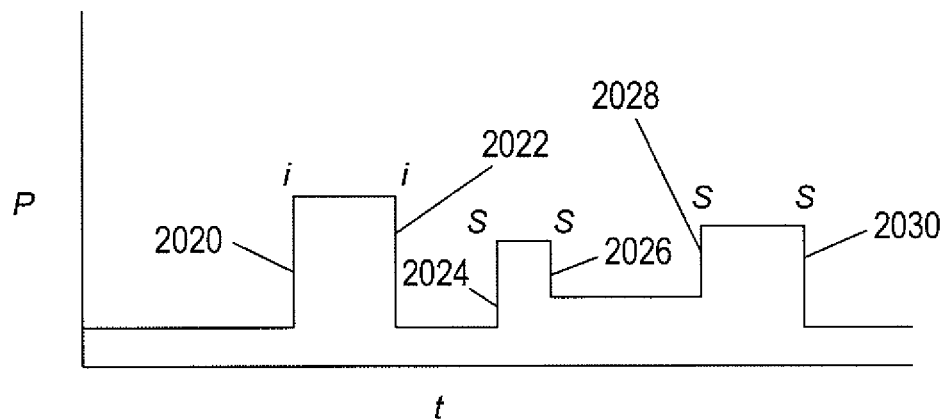

FIGS. 20A-C illustrate overlay of recorded data onto an existing control schedule, following completion of a monitoring period, followed by clustering and resolution of clusters. As shown in FIG. 20A, a user has input six immediate-control inputs 2004-2009 and two retrospective schedule changes 2010 and 2012 during the monitoring period, which are overlain or superimposed on the existing control schedule 2002. As shown in FIG. 20B, clustering produces four clusters 2014-2017. FIG. 20C shows the new provisional schedule obtained by resolution of the clusters. Cluster 2014, with three existing-control-schedule setpoints and two immediate-control setpoints, is resolved to new-provisional-schedule setpoints 2020 and 2022. Cluster 2 (2015 in FIG. 20B), containing two immediate-control setpoints and two retrospective-schedule setpoints, is resolved to setpoints 2024 and 2026. Cluster 3 (2016 in FIG. 20B) is resolved to the existing-control-schedule setpoint 2028, and cluster 4 (2017 in FIG. 20B), containing two immediate-control setpoints and an existing-control-schedule setpoint, is resolved to setpoint 2030. In preparation for a subsequent schedule-propagation step, each of the new-provisional-schedule setpoints is labeled with an indication of whether or not the setpoint parameter value is derived from an immediate-control setpoint or from either an existing-control-schedule setpoint or retrospective schedule-change setpoint. The latter two categories are considered identical, and setpoints of those categories are labeled with the character "s" in FIG. 20C, while the setpoints with temperatures derived from immediate-control setpoints, 2020 and 2022, are labeled "i." As discussed further, below, only setpoints labeled "i" are propagated to additional, related sub-schedules of a higher-level control schedule.

Figure 21A:
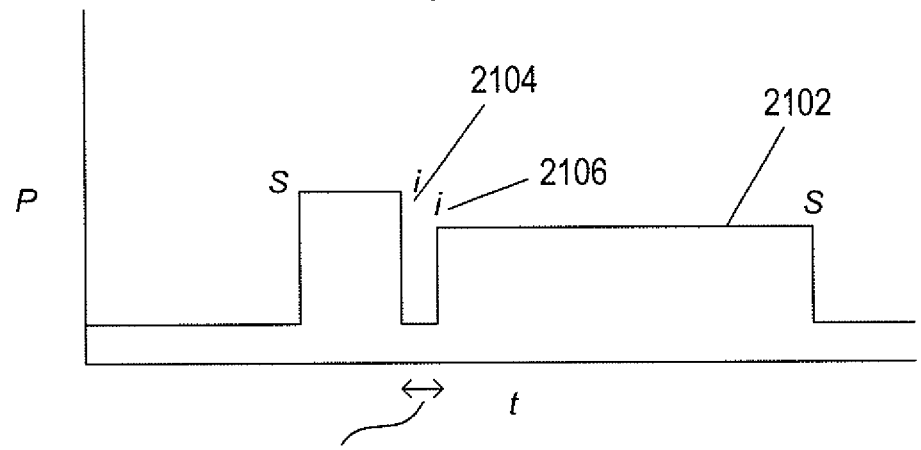
FIGS. 21A-B illustrate the setpoint-spreading operation.
Figure 21B:
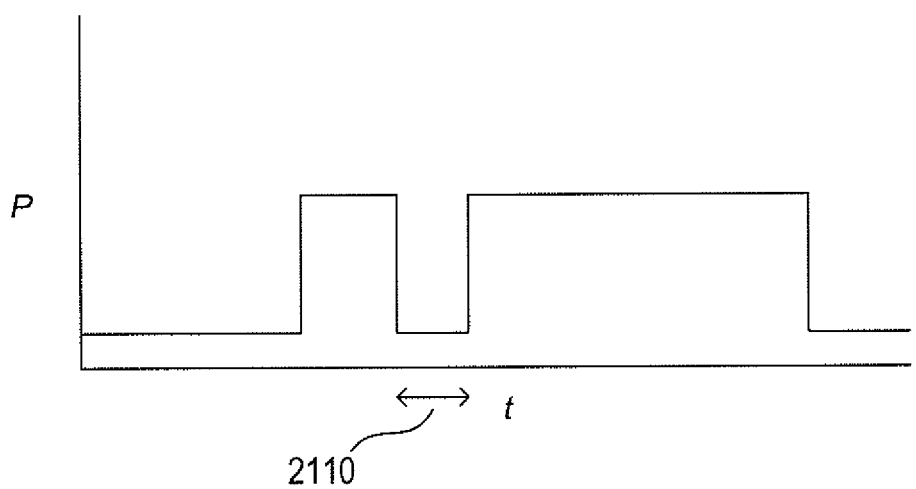

An additional step that may follow clustering and cluster resolution and precede new-provisional-schedule propagation, in certain implementations, involves spreading apart setpoints derived from immediate-control setpoints in the new provisional schedule. FIGS. 21A-B illustrate the setpoint-spreading operation. FIG. 21A shows a new provisional schedule with setpoints labeled, as discussed above with reference to FIG. 20C, with either "s" or "i" in order to indicate the class of setpoints from which the setpoints were derived. In this new provisional schedule 2102, two setpoints labeled "i" 2104 and 2106 are separated by a time interval 2108 of length less than a threshold time interval for separation purposes. The spreading operation detects pairs of "i" labeled setpoints that are separated, in time, by less than the threshold time interval and moves the latter setpoint of the pair forward, in time, so that the pair of setpoints are separated by at least a predetermined fixed-length time interval 2110 in FIG. 21B. In a slightly more complex spreading operation, in the case that the latter setpoint of the pair would be moved closer than the threshold time to a subsequent setpoint, the latter setpoint may be moved to a point in time halfway between the first setpoint of the pair and the subsequent setpoint. The intent of the spreading operation is to ensure adequate separation between setpoints for schedule simplicity and in order to produce a control schedule that can be realized under intelligent-controller control of a system.

Figure 22A:
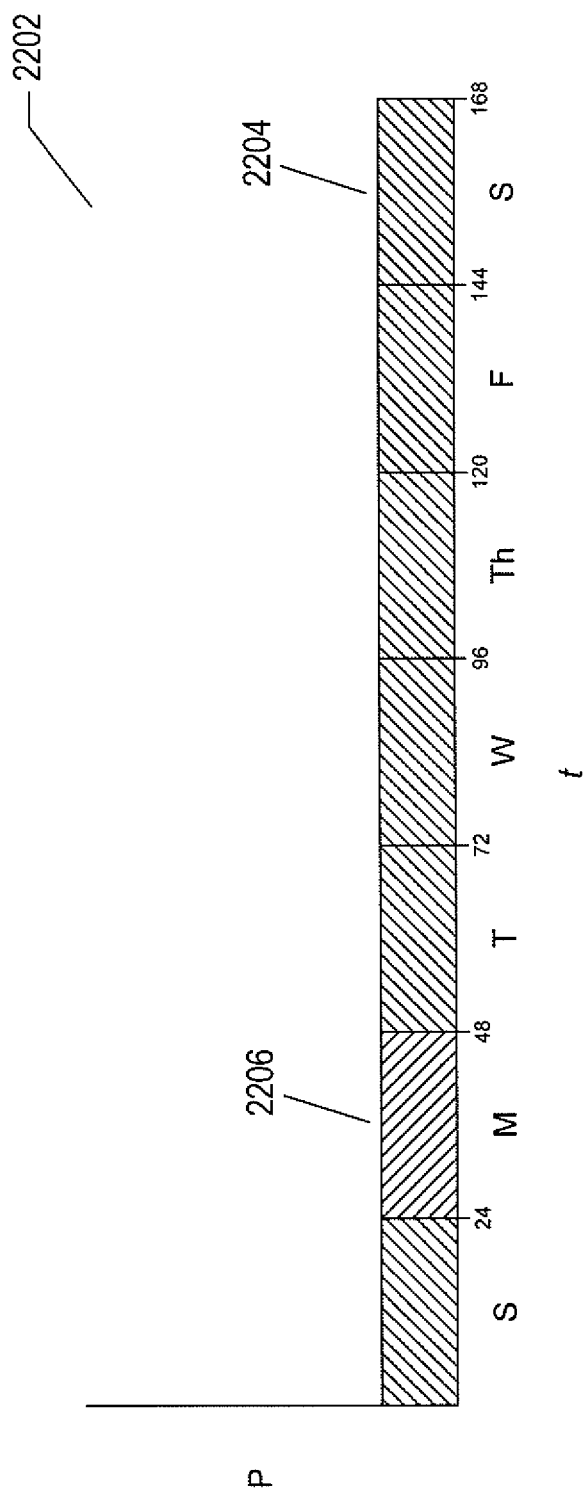
FIGS. 22A-B illustrate schedule propagation.
Figure 22B:
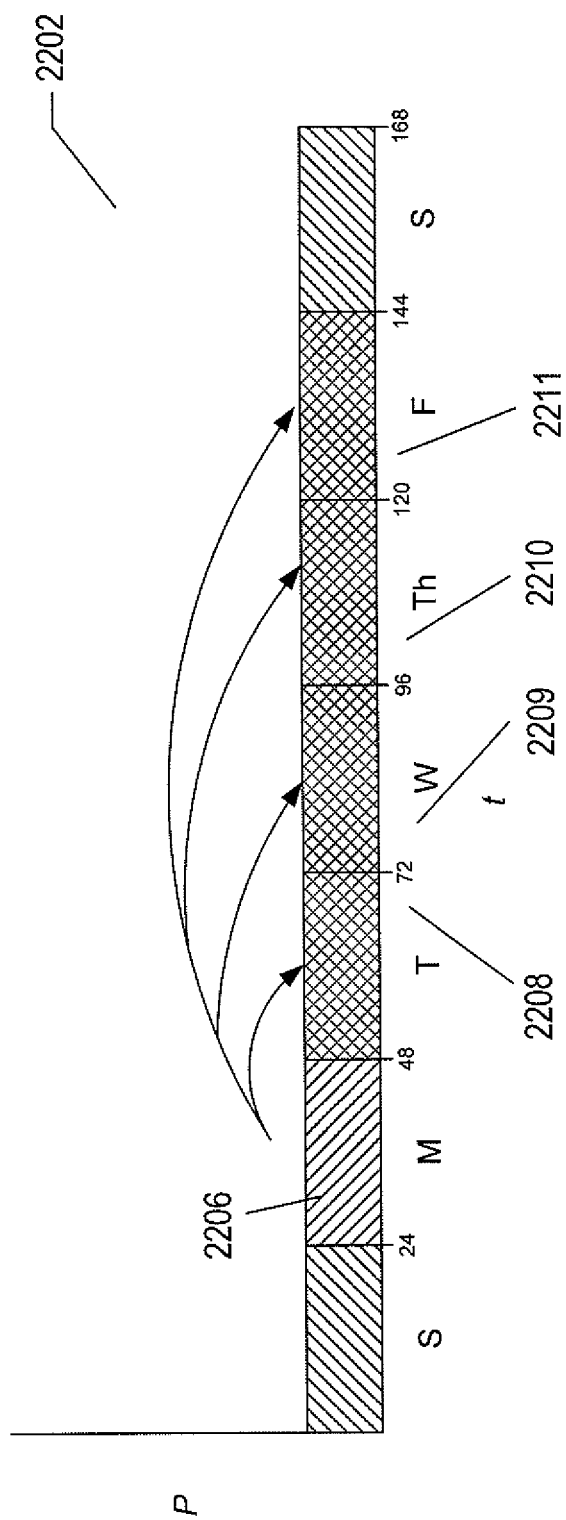

A next operation carried out by the currently discussed automated-control-schedule-learning method is propagation of a new provisional sub-schedule, created, as discussed above, following a monitoring period, to related sub-schedules in a higher-level control schedule. Schedule propagation is illustrated in FIGS. 22A-B. FIG. 22A shows a higher-level control schedule 2202 that spans a week in time and that includes daily sub-schedules, such as the Saturday sub-schedule 2204. In FIG. 22A, the Monday sub-schedule 2206 has recently been replaced by a new provisional Monday sub-schedule following the end of a monitoring period, indicated in FIG. 22A by crosshatching oppositely slanted from the crosshatching of the sub-schedules corresponding to other days of the week. As shown in FIG. 22B, the schedule-propagation technique used in the currently discussed automated-control-schedule-learning method involves propagating the new provisional Monday sub-schedule 2206 to other, related sub-schedules 2208-2211 in the higher-level control schedule 2202. In this case, weekday sub-schedules are considered to be related to one another, as are weekend sub-schedules, but weekend sub-schedules are not considered to be related to weekday sub-schedules. Sub-schedule propagation involves overlaying the "i"-labeled setpoints in the new provisional schedule 2206 over related existing control schedules, in this case sub-schedules 2208-2211, and then resolving the setpoint-overlaid existing control schedules to produce new provisional sub-schedules for the related sub-schedules. In FIG. 22B, overlaying of "i"-labeled setpoints from new provisional sub-schedule 2206 onto the related sub-schedules 2208-2211 is indicated by bi-directional crosshatching. Following resolution of these overlaid setpoints and existing sub-schedules, the entire higher-level control schedule 2202 is then considered to be the current existing control schedule for the intelligent controller. In other words, following resolution, the new provisional sub-schedules are promoted to existing sub-schedules. In certain cases, the sub-schedule propagation rules may change, over time. As one example, propagation may occur to all days, initially, of a weekly schedule but may then more selectively propagate weekday sub-schedules to weekdays and week-end-day sub-schedules to week-end-days. Other such rules may be employed for propagation of sub-schedules.

As discussed above, there can be multiple hierarchical layers of control schedules and sub-schedules maintained by an intelligent controller, as well as multiple sets of hierarchically related control schedules. In these cases, schedule propagation may involve relatively more complex propagation rules for determining to which sub-schedules a newly created provisional sub-schedule should be propagated. Although propagation is shown, in FIG. 22B, in the forward direction in time, propagation of a new provisional schedule or new provisional sub-schedule may be carried out in either a forward or reverse direction with respect to time. In general, new-provisional-schedule propagation is governed by rules or by tables listing those control schedules and sub-schedules considered to be related to each control schedule and/or sub-schedule.

Figure 23A:
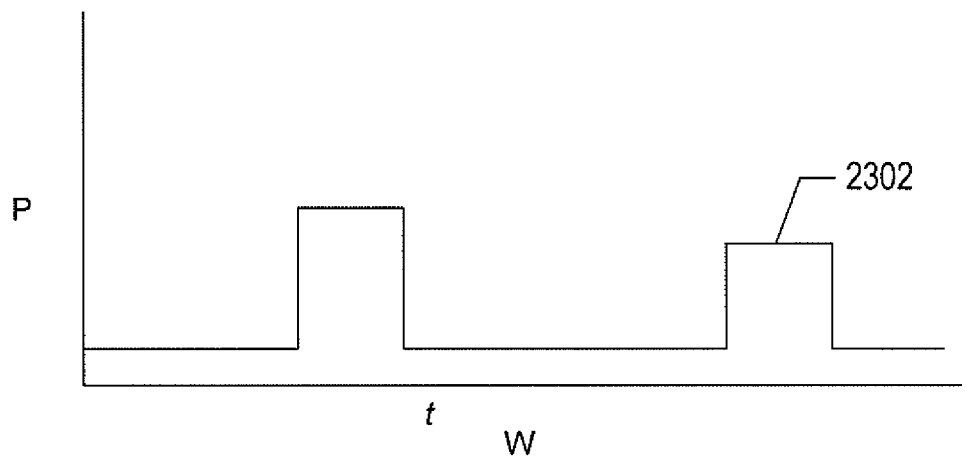
FIGS. 23A-C illustrate new-provisional-schedule propagation using P-value vs. t control-schedule plots.
Figure 23B:
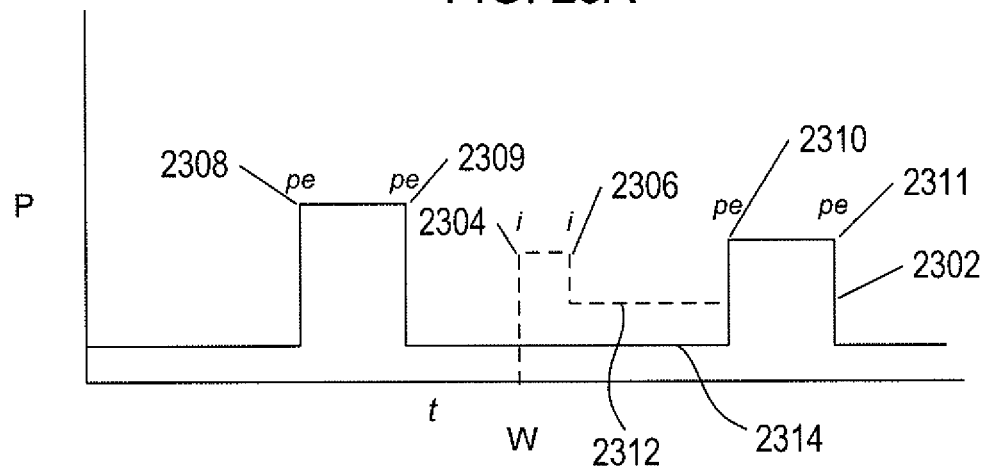
Figure 23C:
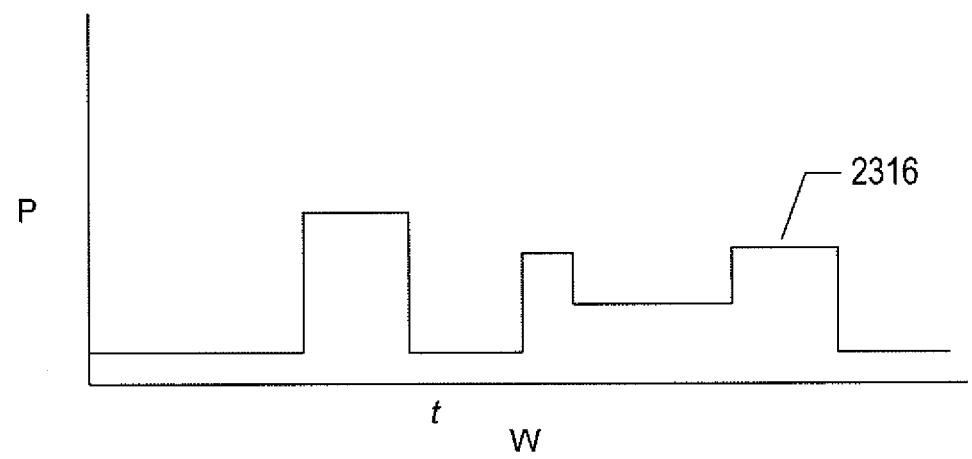

FIGS. 23A-C illustrate new-provisional-schedule propagation using P-value vs. t control-schedule plots. FIG. 23A shows an existing control schedule 2302 to which the "i"-labeled setpoints in a new provisional schedule are propagated. FIG. 23B shows the propagated setpoints with "i" labels overlaid onto the control schedule shown in FIG. 23A. Two setpoints 2304 and 2306 are overlaid onto the existing control schedule 2302. The existing control schedule includes four existing setpoints 2308-2311. The second of the propagated setpoints 2306 lowers the parameter value to a level 2312 greater than the corresponding parameter-value level 2314 of the existing control schedule 2302, and therefore overrides the existing control schedule up to existing setpoint 2310. In this simple case, no further adjustments are made, and the propagated setpoints are incorporated in the existing control schedule to produce a new provisional schedule 2316 shown in FIG. 23C. When setpoints have been propagated to all related control schedules or sub-schedules, and new provisional schedules and sub-schedules are generated for them, the propagation step terminates, and all of the new provisional schedules and sub-schedules are together considered to be a new existing higher-level control schedule for the intelligent controller.

Following propagation and overlaying of "i"-labeled setpoints onto a new provisional schedule to a related sub-schedule or control schedule, as shown in FIG. 23B, numerous rules may be applied to the overlying setpoints and existing control schedule in order to simplify and to make realizable the new provisional schedule generated from the propagated setpoints and existing control schedule. FIGS. 24A-I illustrate a number of example rules used to simplify a existing control schedule overlaid with propagated setpoints as part of the process of generating a new provisional schedule. Each of FIGS. 24A-I include two P-value vs. t plots, the first showing a propagated setpoint overlying a existing control schedule and the second showing resolution of the propagated setpoint to generate a portion of a new provisional schedule obtained by resolving a propagated setpoint.

Figure 24A:
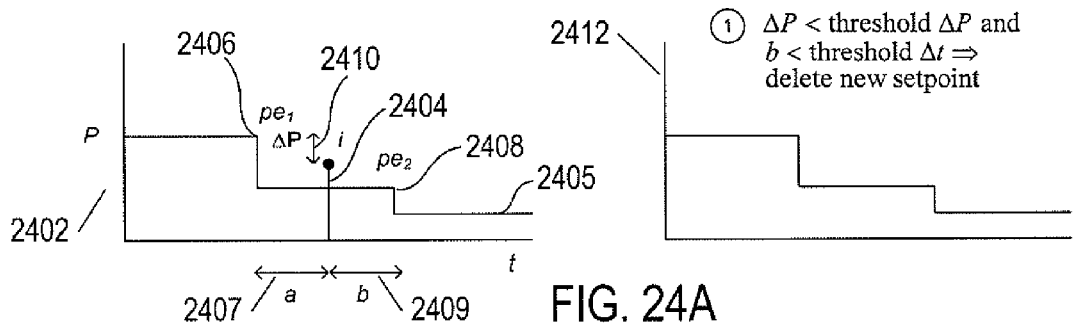
FIGS. 24A-I illustrate a number of example rules used to simplify a pre-existing control schedule overlaid with propagated setpoints as part of the process of generating a new provisional schedule.

The first, left-hand P-value vs. t plot 2402 in FIG. 24A shows a propagated setpoint 2404 overlying an existing control schedule 2405. FIG. 24A also illustrates terminology used in describing many of the example rules used to resolve propagated setpoints with existing control schedules. In FIG. 24A a first existing setpoint, pe1 2406, precedes the propagated setpoint 2404 in time by a length of time a 2407 and a second existing setpoint of the existing control schedule, pe2 2408, follows the propagated setpoint 2404 in time by a length of time b 2409. The P-value difference between the first existing-control-schedule setpoint 2406 and the propagated setpoint 2404 is referred to as "$\Delta P$" 2410. The right-hand P-value vs. t plot 2412 shown in FIG. 24A illustrates a first propagated-setpoint-resolution rule. As shown in this Figure, when $\Delta P$ is less than a threshold $\Delta P$ and b is less than a threshold $\Delta t$, then the propagated setpoint is deleted. Thus, resolution of the propagated setpoint with the existing control schedule, by rule 1, removes the propagated setpoint, as shown in the right-hand side of FIG. 24A.

Figure 24B:
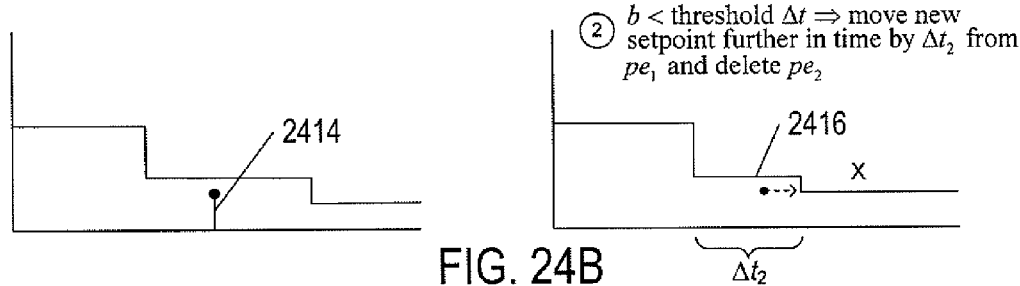

FIGS. 24B-I illustrate an additional example of propagated-setpoint-resolution rules in similar fashion to the illustration of the first propagated-setpoint-resolution rule in FIG. 24A. FIG. 24B illustrates a rule that, when b is less than a threshold $\Delta t$ and when the first rule illustrated in FIG. 24A does not apply, then the new propagated setpoint 2414 is moved ahead in time by a value $\Delta t2$ 2416 from existing setpoint pe1 and existing setpoint pe2 is deleted.

Figure 24C:
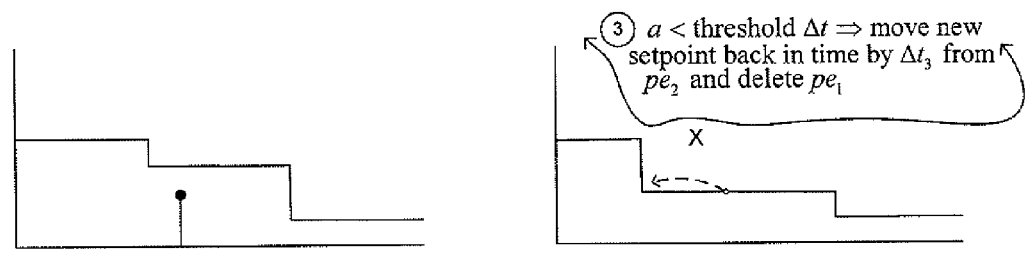

FIG. 24C illustrates a third rule applied when neither of the first two rules are applicable to a propagated setpoint. If a is less than a threshold value $\Delta t$, then the propagated setpoint is moved back in time by a predetermined value $\Delta t3$ from pe2 and the existing setpoint pe1 is deleted.

Figure 24D:
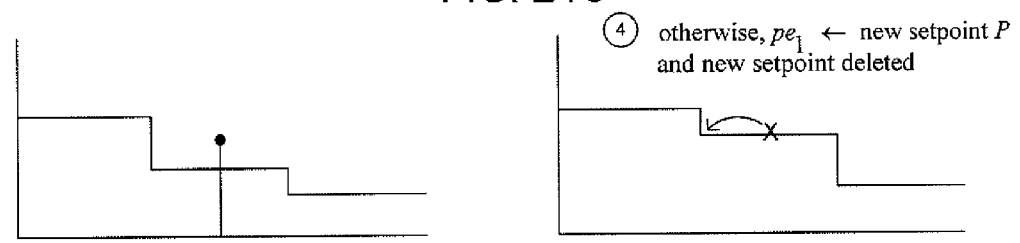

FIG. 24D illustrates a fourth row applicable when none of the first three rules can be applied to a propagated setpoint. In this case, the P value of the propagated setpoint becomes the P value for the existing setpoint pe1 and the propagated setpoint is deleted.

Figure 24E:
Figure 24F:
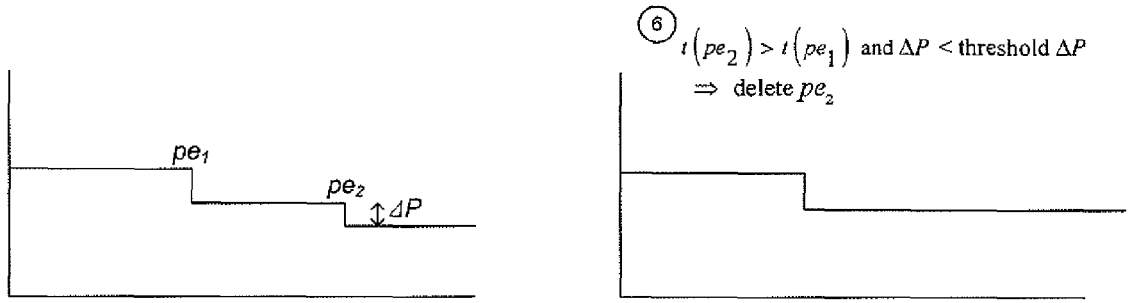
Figure 24G:
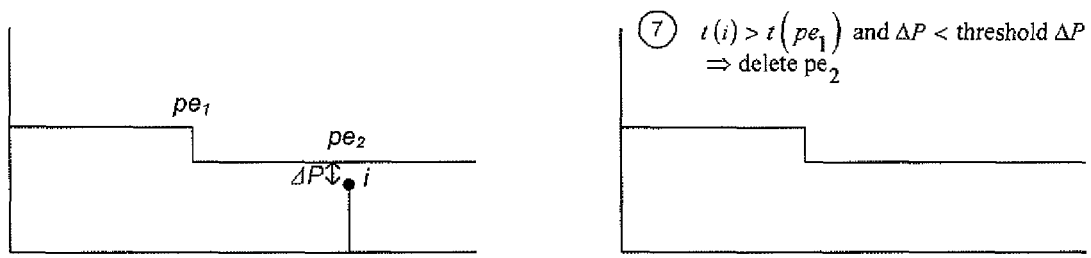
Figure 24H:
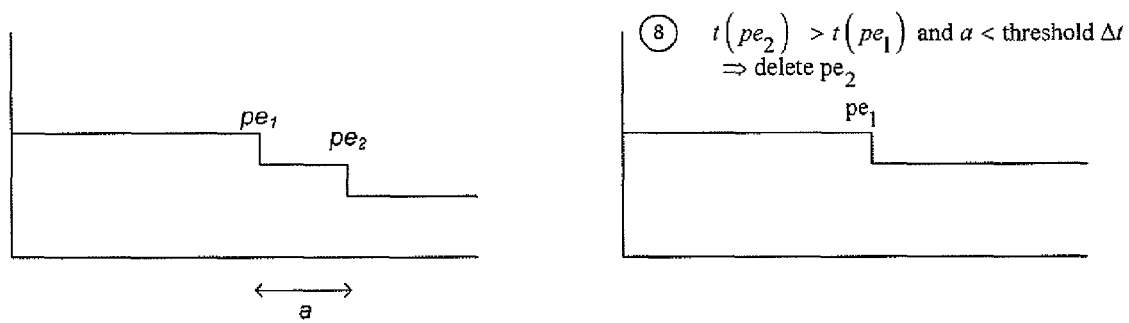
Figure 24I:
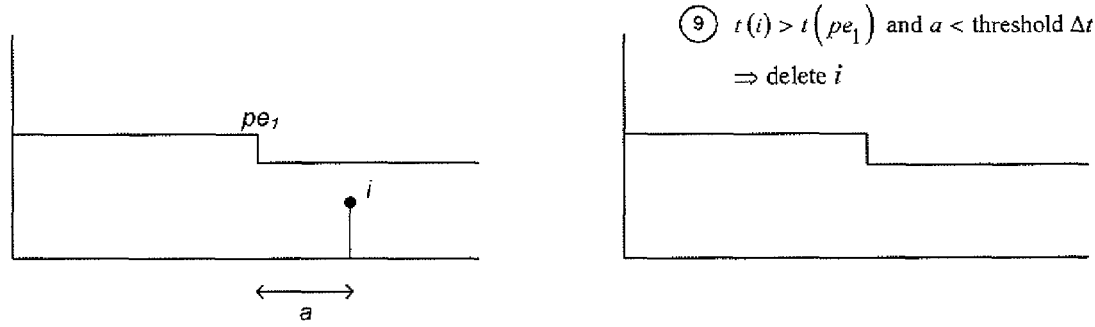

When none of the first four rules, described above with reference to FIGS. 24A-D, are applicable, then additional rules may be tried in order to resolve a propagated setpoint with an existing control schedule. FIG. 24E illustrates a fifth rule. When b is less than a threshold Δt and ΔP is less than a threshold Δp, then, as shown in FIG. 24E, the propagated setpoint 2424 is deleted. In other words, a propagated setpoint too close to an existing control schedule setpoint is not incorporated into the new provisional control schedule. The existing setpoints may also be reconsidered, during propagated-setpoint resolution. For example, as shown in FIG. 24F, when a second existing setpoint pe2 that occurs after a first existing setpoint pe1 results in a change in the parameter value ΔP less than a threshold ΔP, then the second existing setpoint pe2 may be removed. Such proximal existing setpoints may arise due to the deference given to schedule changes following previous monitoring periods. Similarly, as shown in FIG. 24G, when a propagated setpoint follows an existing setpoint, and the change in the parameter value ΔP produced by the propagated setpoint is less than a threshold ΔP value, then the propagated setpoint is deleted. As shown in FIG. 24H, two existing setpoints that are separated by less than a threshold Δt value may be resolved into a single setpoint coincident with the first of the two existing setpoints. Finally, in similar fashion, a propagated setpoint that is too close, in time, to an existing setpoint may be deleted.

In certain implementations, a significant distinction is made between user-entered setpoint changes and automatically generated setpoint changes. The former setpoint changes are referred to as "anchor setpoints," and are not overridden by learning. In many cases, users expect that the setpoints which they manually enter should not be changed. Additional rules, heuristics, and consideration can be used to differentiate setpoint changes for various levels of automated adjustment during both aggressive and steady-state learning. It should also be noted that setpoints associated with two parameter values that indicate a parameter-value range may be treated in different ways during comparison operations used in pattern matching and other automated learning calculations and determinations. For example, a range setpoint change may need to match another range setpoint change in both parameters to be deemed to be equivalent or identical.

Next, an example implementation of an intelligent controller that incorporates the above-described automated-control-schedule-learning method is provided. FIGS. 25A-M illustrate an example implementation of an intelligent controller that incorporates the above-described automated-control-schedule-learning method. At the onset, it should be noted that the following implementation is but one of many different possible implementations that can be obtained by varying any of many different design and implementation parameters, including modular organization, control structures, data structures, programming language, hardware components, firmware, and other such design and implementation parameters. Many different types of control schedules may be used by different types of intelligent controllers applied to different control domains. Automated-control-schedule-learning methods incorporated into intelligent-controller logic may significantly vary depending on the types and numbers of control schedules that specify intelligent-controller operation. The time periods spanned by various different types of control schedules and the granularity, in time, of control schedules may vary widely depending on the control tasks for which particular controllers are designed.

Figure 25A:
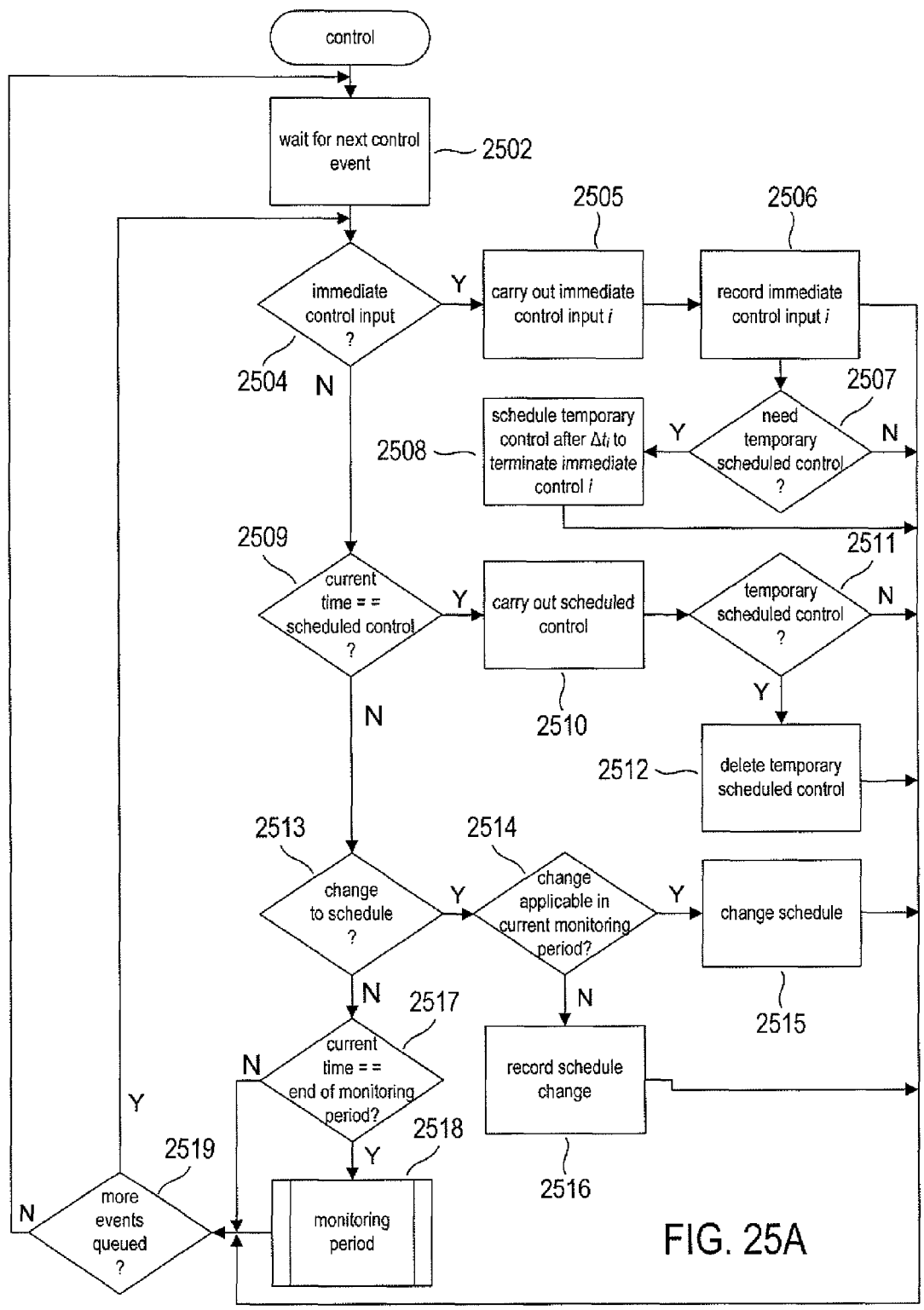
FIGS. 25A-M illustrate an example implementation of an intelligent controller that incorporates the above-described automated-control-schedule-learning method.

FIG. 25A shows the highest-level intelligent-controller control logic. This high-level control logic comprises an event-handling loop in which various types of control-related events are handled by the intelligent controller. In FIG. 25A, four specific types of control-related events are handled, but, in general, the event-handling loop may handle many additional types of control-related events that occur at lower levels within the intelligent-controller logic. Examples include communications events, in which the intelligent controller receives or transmits data to remote entities, such as remote smart-home devices and cloud-computing servers. Other types of control-related events include control-related events related to system activation and deactivation according to observed parameters and control schedules, various types of alarms and timers that may be triggered by sensor data falling outside of control-schedule-specified ranges for detection and unusual or rare events that require specialized handling. Rather than attempt to describe all the various different types of control-related events that may be handled by an intelligent controller, FIG. 25A illustrates handling of four example control-related events.

In step 2502, the intelligent controller waits for a next control-related event to occur. When a control-related event occurs, control flows to step 2504, and the intelligent controller determines whether an immediate-control input has been input by a user or remote entity through the immediate-control-input interface. When an immediate-control input has been input by a user or other remote entity, as determined in step 2504, the intelligent controller carries out the immediate control input, in step 2505, generally by changing internally stored specified ranges for parameter values and, when needed, activating one or more controlled entities, and then the immediate-control input is recorded in memory, in step 2506. When an additional setpoint or other schedule feature needs to be added to terminate the immediate-control input, as determined in step 2507, then the additional setpoint or other schedule feature is added to the control schedule, in step 2508. Examples of such added setpoints are discussed above with reference to FIGS. 15A-G. When the control-related event that triggered exit from step 2502 is a timer event indicating that the current time is that of a scheduled setpoint or scheduled control, as determined in step 2509, then the intelligent controller carries out the scheduled controller setpoint in step 2510. When the scheduled control carried out in step 2510 is a temporary scheduled control added in step 2508 to terminate an immediate-control input, as determined in step 2511, then the temporary scheduled control is deleted in step 2512. When the control-related event that triggered exit from step 2502 is a change made by a user or remote entity to the control schedule via the control-schedule-change interface, as determined in step 2513, then, when the schedule change is prospective, as determined in step 1514, the schedule change is made by the intelligent controller to the existing control schedule in step 2515, as discussed above with reference to FIGS. 18A-B. Otherwise, the schedule change is retrospective, and is recorded by the intelligent controller into memory in step 2516 for later use in varying a new provisional schedule at the termination of the current monitoring period.

When the control-related event that triggered exit from 2502 is a timer event associated with the end of the current monitoring period, as determined in step 2517, then a monitoring-period routine is called, in step 2518, to process recorded immediate-control inputs and schedule changes, as discussed above with reference to FIGS. 15A-24F. When additional control-related events occur after exit from step 2502, which are generally queued to an occurred event queue, as determined in step 2519, control flows back to step 2504 for handling a next queued event. Otherwise, control flows back in step 2502 where the intelligent controller waits for a next control-related event.

Figure 25B:
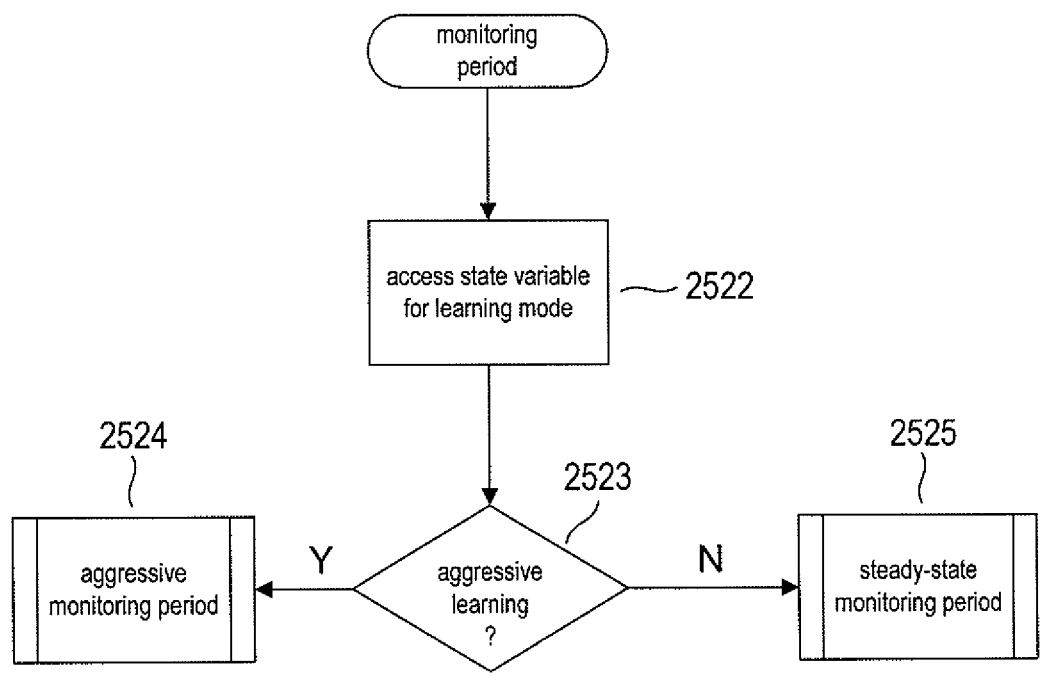

FIG. 25B provides a control-flow diagram for the routine "monitoring period" called in step 2518 in FIG. 25A. In step 2522, the intelligent controller accesses a state variable that stores an indication of the current learning mode. When the current learning mode is an aggressive-learning mode, as determined in step 2523, the routine "aggressive monitoring period" is called in step 2524. Otherwise, the routine "steady-state monitoring period" is called, in step 2525. While this control-flow diagram is simple, it clearly shows the feature of automated-control-schedule-learning discussed above with reference to FIGS. 11D-E and FIG. 12. Automated-control-schedule learning is bifurcated into an initial, aggressive-learning period followed by a subsequent steady-state learning period.

Figure 25C:
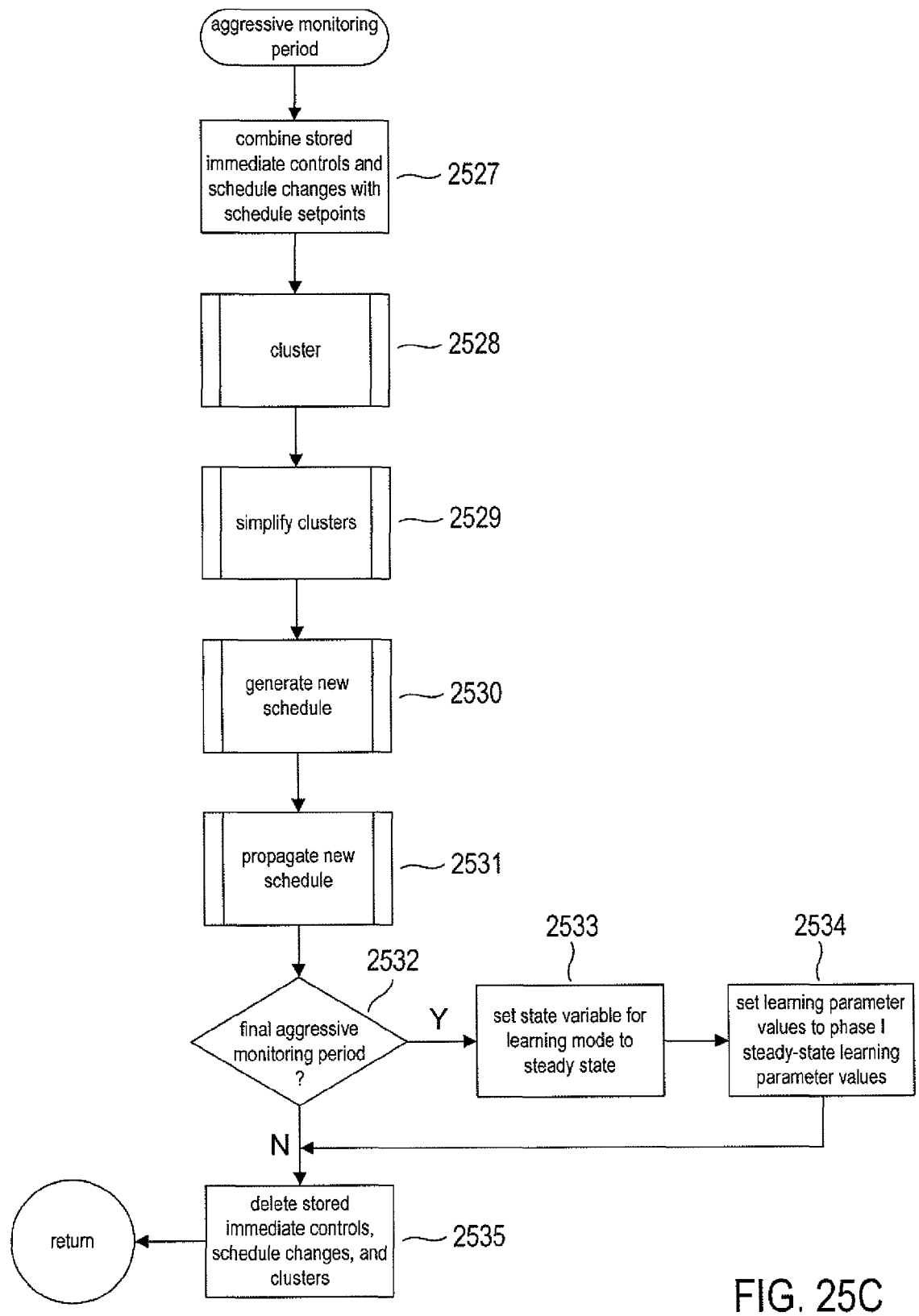

FIG. 25C provides a control-flow diagram for the routine "aggressive monitoring period" called in step 2524 of FIG. 25B. This routine is called at the end of each monitoring period. In the example discussed above, a monitoring period terminates at the end of each daily control schedule, immediately after 12:00 p.m. However, monitoring periods, in alternative implementations, may occur at a variety of other different time intervals and may even occur variably, depending on other characteristics and parameters. Monitoring periods are generally the smallest-granularity time periods corresponding to control schedules or sub-schedules, as discussed above.

In step 2527, the intelligent controller combines all recorded immediate-control inputs with the existing control schedule, as discussed above with reference to FIGS. 16B and 20A. In step 2528, the routine "cluster" is called in order to partition the recorded immediate-control inputs and schedule changes and existing-control-schedule setpoints to clusters, as discussed above with reference to FIGS. 16C-D and FIG. 20B. In step 2529, the intelligent controller calls the routine "simplify clusters" to resolve the various setpoints within each cluster, as discussed above with reference to FIGS. 16A-20C. In step 2530, the intelligent controller calls the routine "generate new schedule" to generate a new provisional schedule following cluster resolution, as discussed above with reference to FIGS. 20C and 21A-B. In step 2531, the intelligent controller calls the routine "propagateNewSchedule" discussed above with reference to FIGS. 22A-24I, in order to propagate features of the provisional schedule generated in step 2530 to related sub-schedules and control schedules of the intelligent controller's control schedule. In step 2532, the intelligent controller determines whether or not the currently completed monitoring period is the final monitoring period in the aggressive-learning mode. When the recently completed monitoring period is the final monitoring period in the aggressive-monitoring learning mode, as determined in step 2532, then, in step 2533, the intelligent controller sets various state variables that control the current learning mode to indicate that the intelligent controller is now operating in the steady-state learning mode and, in step 2534, sets various learning parameters to parameter values compatible with phase I of steady-state learning.

Many different learning parameters may be used in different implementations of automated control-schedule learning. In the currently discussed implementation, learning parameters may include the amount of time that immediate-control inputs are carried out before termination by the intelligent controller, the magnitudes of the various threshold $\Delta t$ and threshold $\Delta P$ values used in cluster resolution and resolution of propagated setpoints with respect to existing control schedules. Finally, in step 2535, the recorded immediate-control inputs and schedule changes, as well as clustering information and other temporary information derived and stored during creation of a new provisional schedule and propagation of the provisional schedule are deleted and the learning logic is reinitialized to begin a subsequent monitoring period.

Figure 25D:
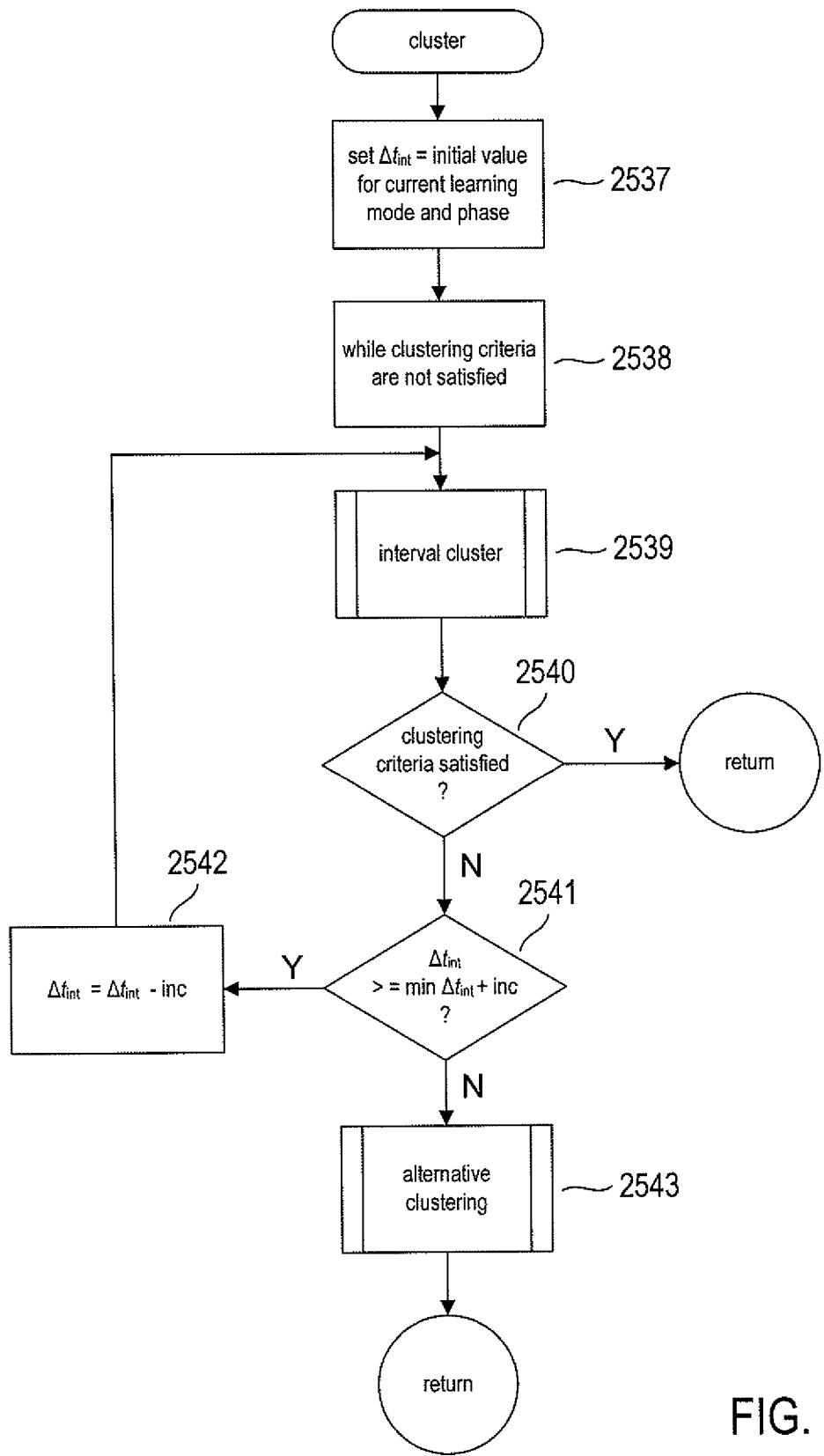

FIG. 25D provides a control-flow diagram for the routine "cluster" called in step 2528 of FIG. 25C. In step 2537, the local variable $\Delta tint$ is set to a learning-mode and learning-phase-dependent value. Then, in the while-loop of steps 2538-2542, the routine "interval cluster" is repeatedly called in order to generate clusters within the existing control schedule until one or more clustering criteria are satisfied, as determined in step 2540. Prior to satisfaction of the clustering criteria, the value of $\Delta tint$ is incremented, in step 2542, prior to each next call to the routine "interval cluster" in step 2539, in order to alter the next clustering for satisfying the clustering criteria. The variable $\Delta tint$ corresponds to the minimum length of time between setpoints that results in the setpoints being classified as belonging to two different clusters, as discussed above with reference to FIG. 16C, or the time period 1610 the interval between two clusters. Decreasing $\Delta tint$ generally produces additional clusters.

Various different types of clustering criteria may be used by an intelligent controller. In general, it is desirable to generate a sufficient number of clusters to produce adequate control-schedule simplification, but too many clusters result in additional control-schedule complexity. The clustering criteria are designed, therefore, to choose a $\Delta tint$ sufficient to produce a desirable level of clustering that leads to a desirable level of control-schedule simplification. The while-loop continues while the value of $\Delta tint$ remains within an acceptable range of values. When the clustering criteria fails to be satisfied by repeated calls to the routine "intervalCluster" in the while-loop of steps 2538-2542, then, in step 2543, one or more alternative clustering methods may be employed to generate clusters, when needed for control-schedule simplification. Alternative methods may involve selecting clusters based on local maximum and minimum parameter values indicated in the control schedule or, when all else fails, by selecting, as cluster boundaries, a number of the longest setpoint-free time intervals within the setpoints generated in step 2537.

Figure 25E:
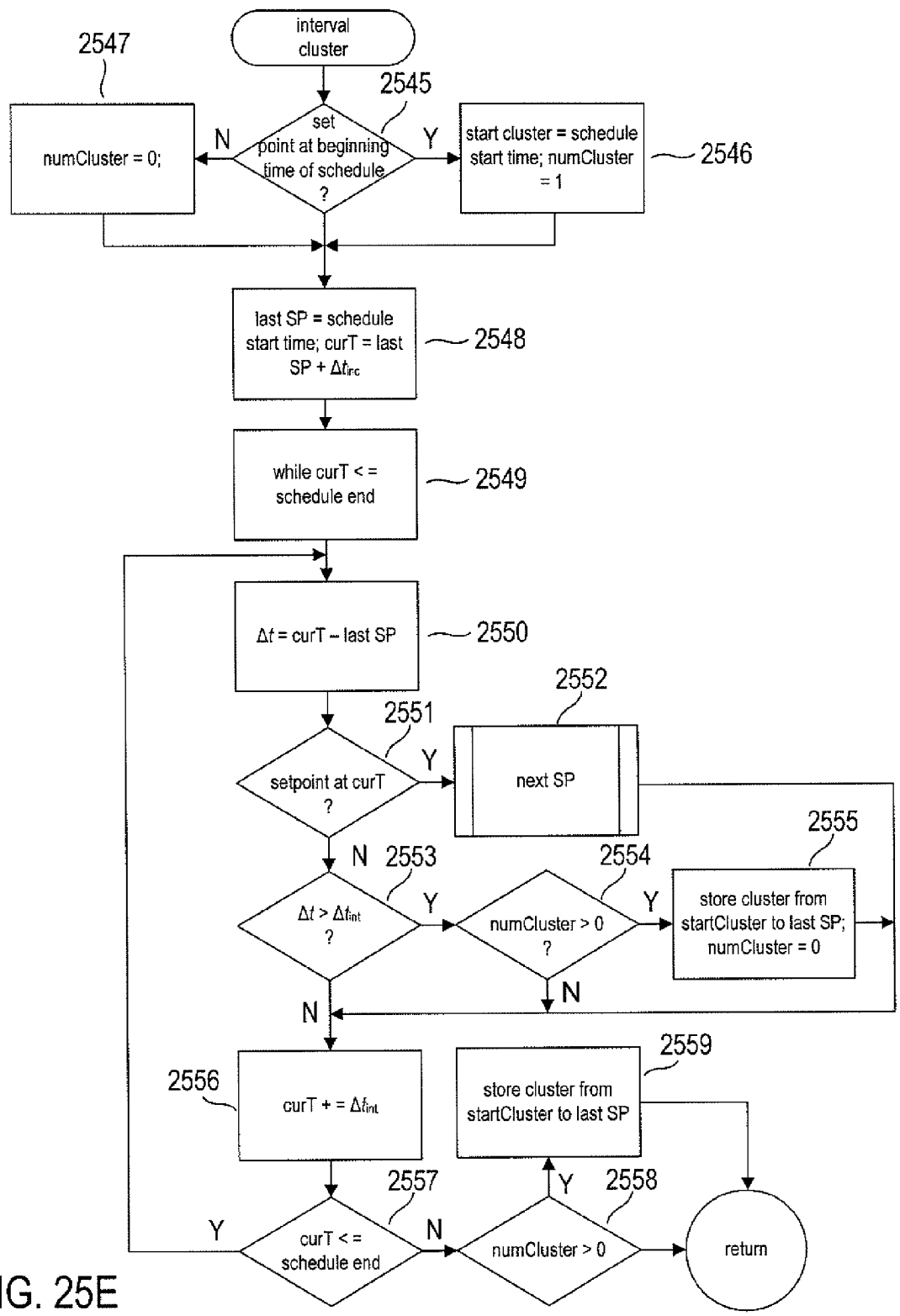

FIG. 25E provides a control-flow diagram for the routine "interval cluster" called in step 2539 of FIG. 25D. In step 2545, the intelligent controller determines whether or not a setpoint coincides with the beginning time of the control schedule corresponding to the monitoring period. When a setpoint does coincide with the beginning of the time of the control schedule, as determined in step 2545, then the local variable "startCluster" is set to the start time of the control schedule and the local variable "numCluster" is set to 1, in step 2546. Otherwise, the local variable "numCluster" is set to 0 in step 2547. In step 2548, the local variable "lastSP" is set to the start time of the control schedule and the local variable "curT" is set to "lastSP" plus a time increment Atinc in step 2548. The local variable "curt" is an indication of the current time point in the control schedule being considered, the local variable "numCluster" is an indication of the number of setpoints in a next cluster that is being created, the local variable "startCluster" is an indication of the point in time of the first setpoint in the cluster, and the local variable "lastSP" is an indication of the time of the last detected setpoint in the control schedule. Next, in the while-loop of steps 2549-2559, the control schedule corresponding to the monitoring period is traversed, from start to finish, in order to generate a sequence of clusters from the control schedule. In step 2550, a local variable Δt is set to the length of the time interval between the last detected setpoint and the current point in time that is being considered. When there is a setpoint that coincides with the current point in time, as determined in step 2551, then a routine "nextSP" is called, in step 2552, to consider and process the setpoint. Otherwise, when Δt is greater than Δtint, as determined in step 2553, then, when a cluster is being processed, as determined in step 2554, the cluster is closed and stored, in step 2555, and the local variable "numCluster" is reinitialized to begin processing of a next cluster. The local variable "curt" is incremented, in step 2556, and the while-loop continues to iterate when curT is less than or equal to the time at which the control schedule ends, as determined in step 2557. When the while-loop ends, and when a cluster was being created, as determined in step 2558, then that cluster is closed and stored in step 2559.

Figure 25F:
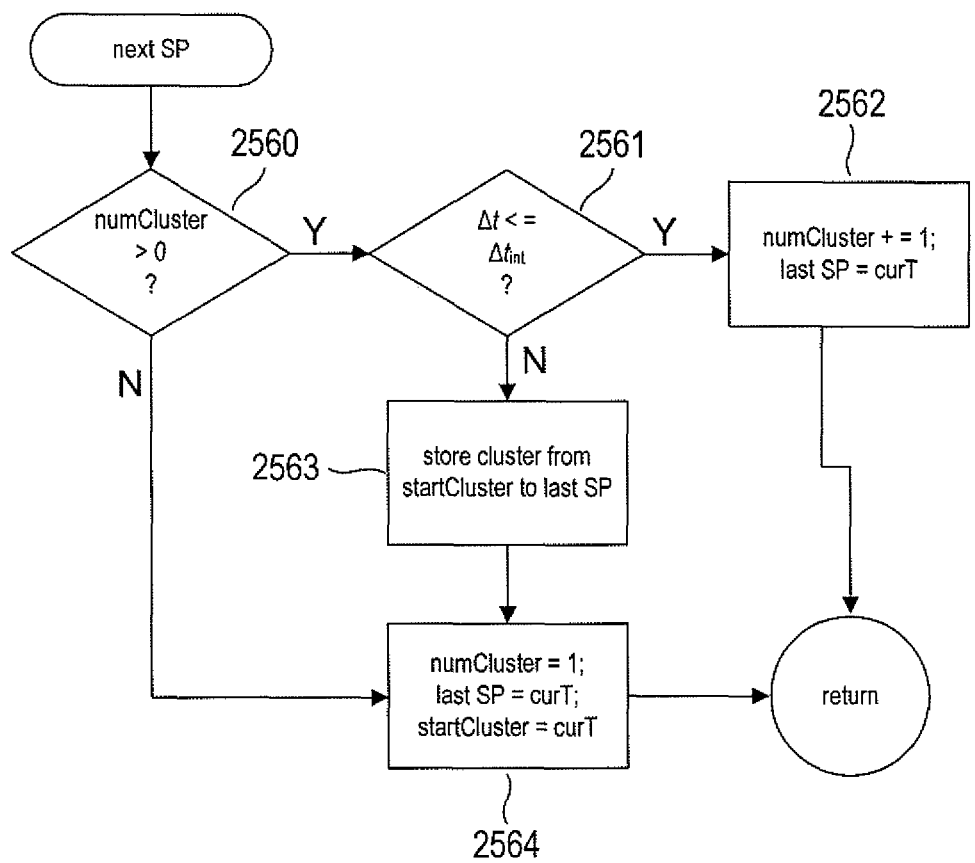

FIG. 25F provides a control-flow diagram for the routine "next SP" called in step 2552 of FIG. 25E. In step 2560, the intelligent controller determines whether or not a cluster was being created at the time of the routine call. When a cluster was being created, and when Δt is less than Δtint, as determined in step 2561, then the current setpoint is added to the cluster in step 2562. Otherwise, the currently considered cluster is closed and stored, in step 2563. When a cluster was not being created, then the currently detected setpoint becomes the first setpoint in a new cluster, in step 2564.

Figure 25G:
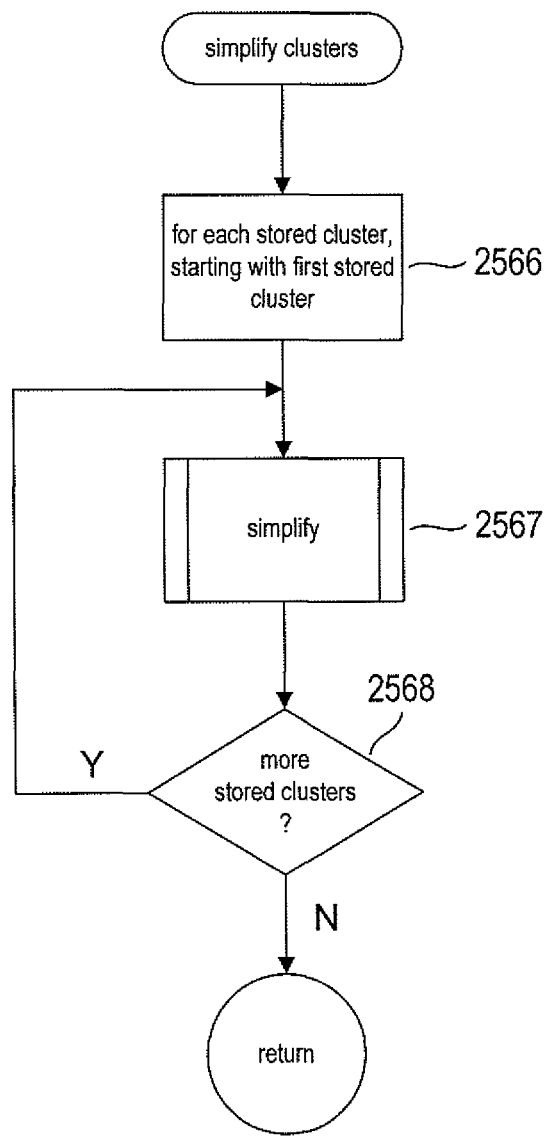

FIG. 25G provides a control-flow diagram for the routine "simplify clusters" called in step 2529 of FIG. 25C. This routine is a simple for-loop, comprising steps 2566-2568 in which each cluster, determined by the routine "cluster" called in step 2528 of FIG. 25C, is simplified, as discussed above with reference to FIGS. 16A-21D. The cluster is simplified by a call to the routine "simplify" in step 2567.

Figure 25H:
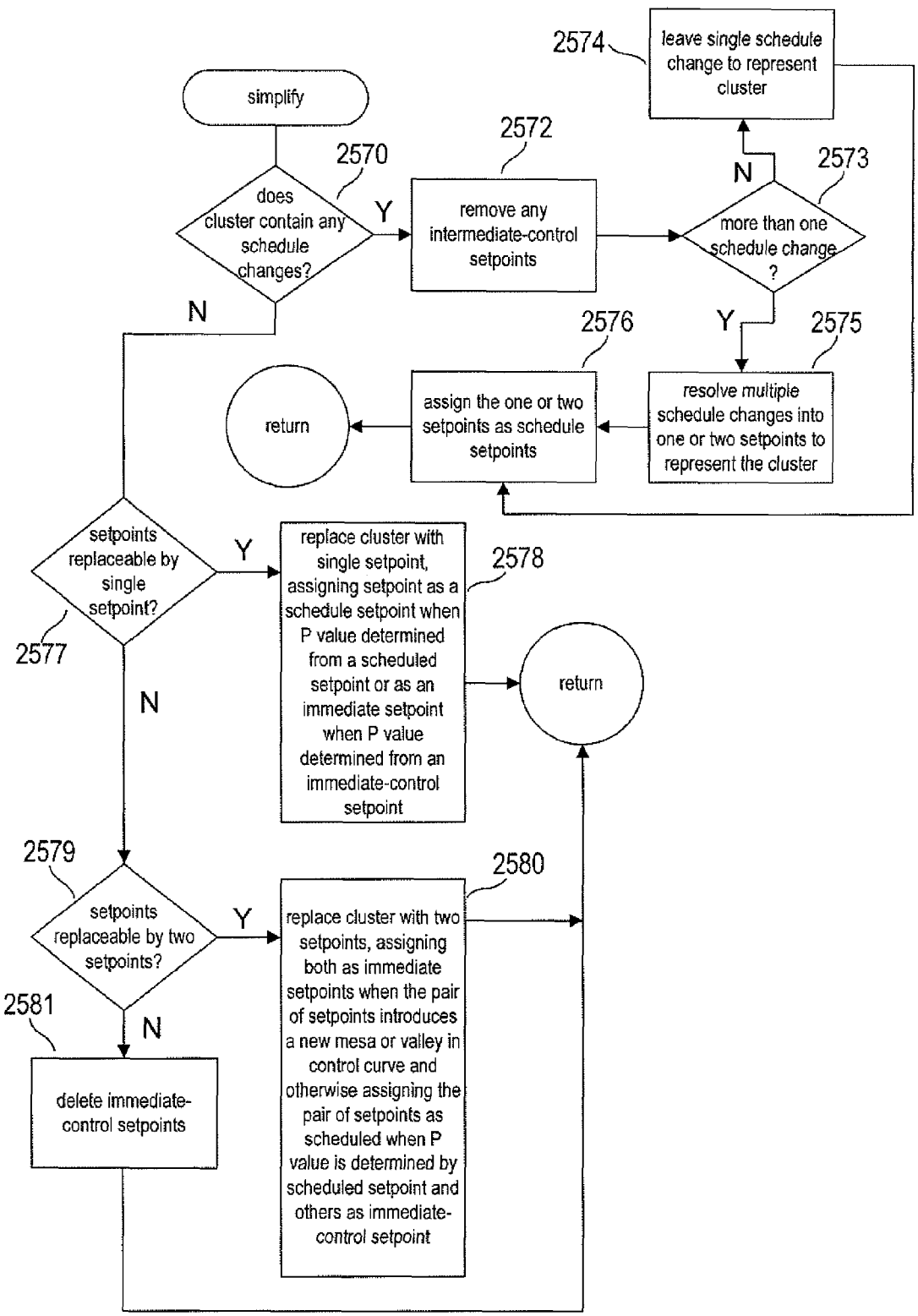

FIG. 25H is a control-flow diagram for the routine "simplify" called in step 2567 of FIG. 25G. In step 2570, the intelligent controller determines whether or not the currently considered cluster contains any schedule-change setpoints. When the currently considered cluster contains schedule-change setpoints, then any immediate-control setpoints are removed, in step 2572. When the cluster contains only a single schedule-change setpoint, as determined in step 2573, then that single schedule-change setpoint is left to represent the entire cluster, in step 2574. Otherwise, the multiple schedule changes are resolved into zero, one, or two setpoints to represent the cluster as discussed above with reference to FIGS. 17A-E in step 2575. The zero, one, or two setpoints are then entered into the existing control schedule in step 2576. When the cluster does not contain any schedule-change setpoints, as determined in step 2570, and when the setpoints in the cluster can be replaced by a single setpoint, as determined in step 2577, as discussed above with reference to FIGS. 17A and 17C, then the setpoints of the cluster are replaced with a single setpoint, in step 2578, as discussed above with reference to FIGS. 17A and 17C. Note that, as discussed above with reference to FIGS. 20A-C, the setpoints are associated with labels "s" and "i" to indicate whether they are derived from scheduled setpoints or from immediate-control setpoints. Similarly, when the setpoints of the cluster can be replaced by two setpoints, as determined in step 2579, then the cluster is replaced by the two setpoints with appropriate labels, as discussed above with reference to FIGS. 17D-E, in step 2580. Otherwise, the condition described with reference to FIG. 717B has occurred, in which case all of the remaining setpoints are deleted from the cluster in step 2581.

Figure 25I:
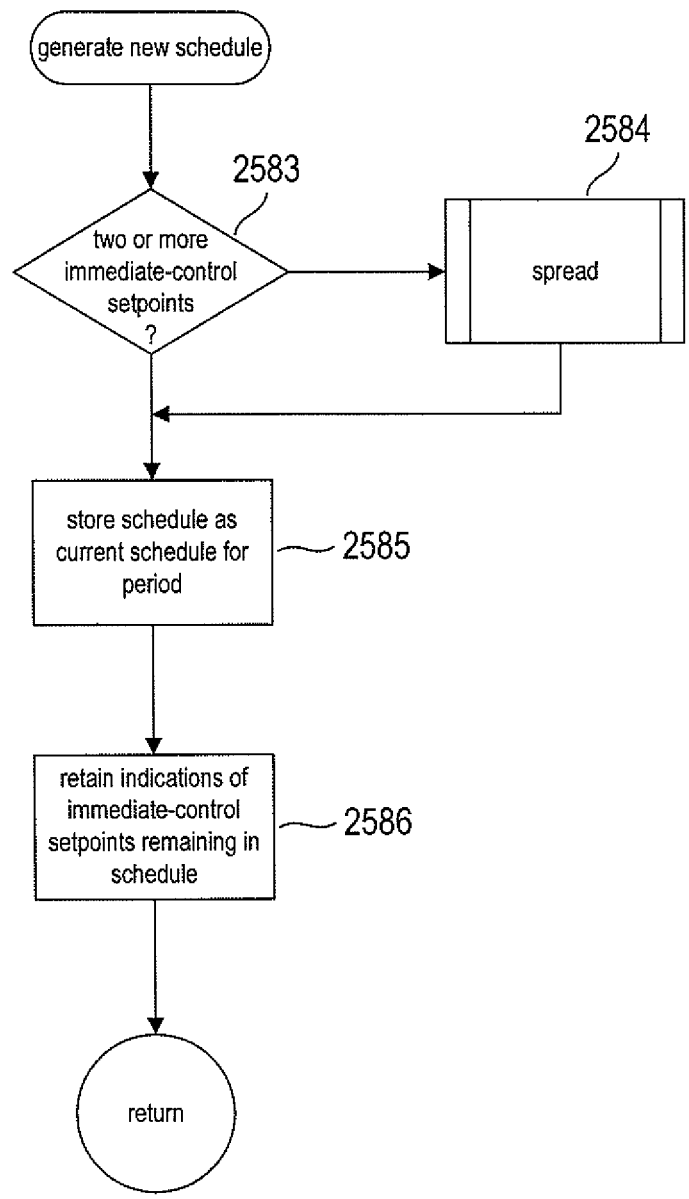

FIG. 25I provides a control-flow diagram for the routine "generate new schedule" called in step 2530 of FIG. 25C. When the new provisional schedule includes two or more immediate-control setpoints, as determined in step 2583, then the routine "spread" is called in step 2584. This routine spreads "i"-labeled setpoints, as discussed above to FIGS. 21A-B. The control schedule is then stored as a new current control schedule for the time period in step 2585 with the indications of whether the setpoints are derived from immediate-control setpoints or schedule setpoints retained for a subsequent propagation step in step 2586.

Figure 25J:
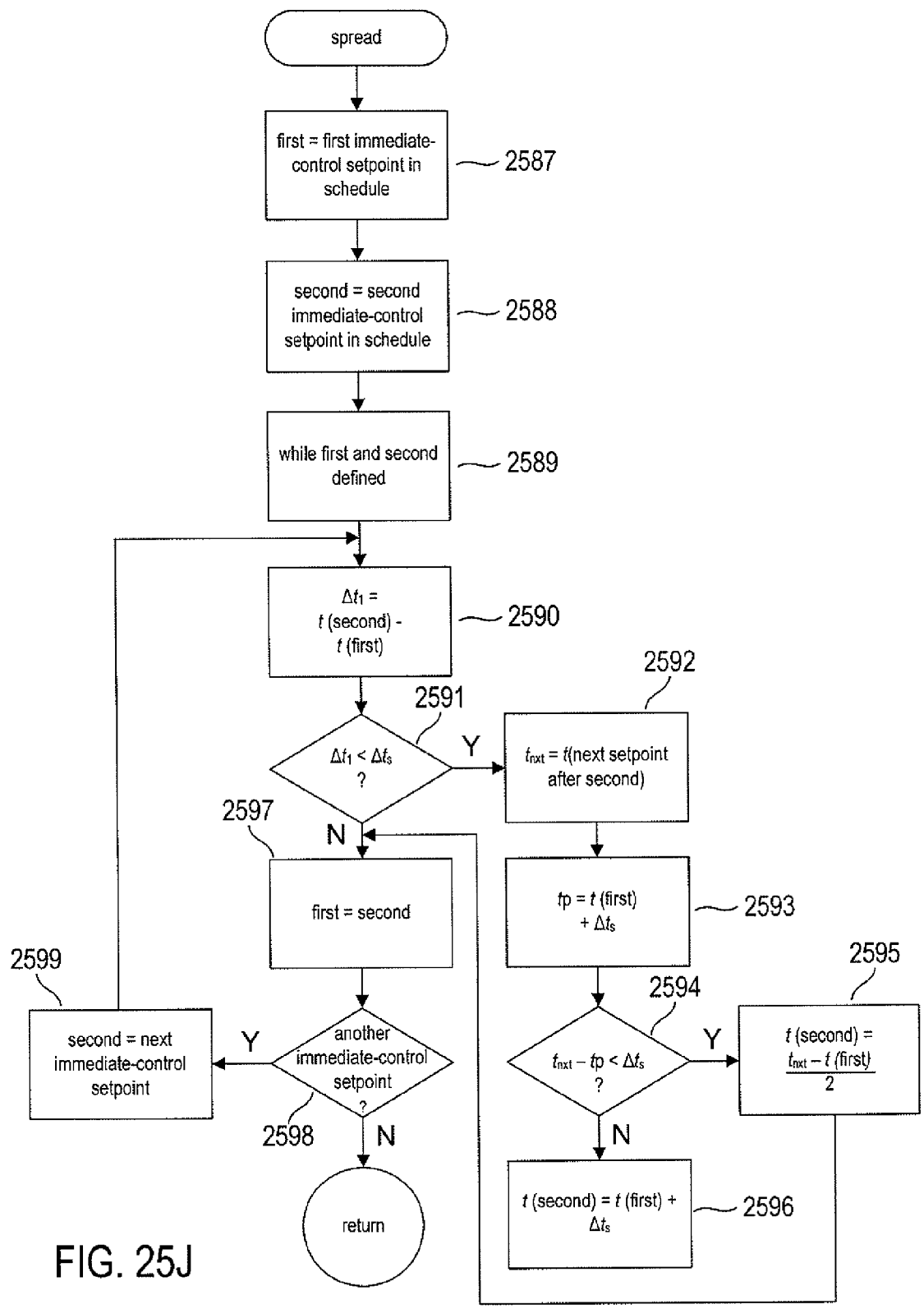

FIG. 25J provides a control-flow diagram for the routine "spread," called in step 2584 in FIG. 25I. In step 2587, the local variable "first" is set to the first immediate-control setpoint in the provisional schedule. In step 2588, the variable "second" is set to the second immediate-control setpoint in the provisional schedule. Then, in the while-loop of steps 2589-2599, the provisional schedule is traversed in order to detect pairs of immediate-control setpoints that are closer together, in time, than a threshold length of time Δt1. The second setpoint is moved, in time, in steps 2592-2596, either by a fixed time interval Δts or to a point halfway between the previous setpoint and the next setpoint, in order to spread the immediate-control setpoints apart.

Figure 25K:
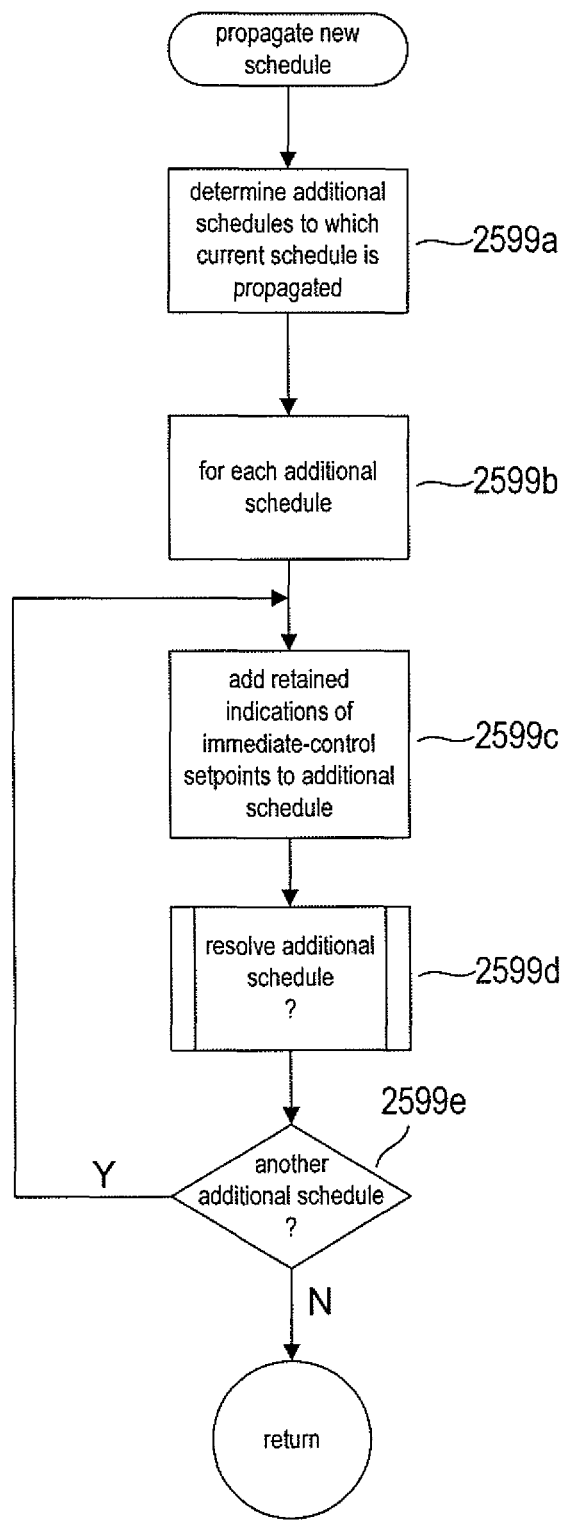

FIG. 25K provides a control-flow diagram for the routine "propagate new schedule" called in step 2531 of FIG. 25C. This routine propagates a provisional schedule created in step 2530 in FIG. 25C to related sub-schedules, as discussed above with reference to FIGS. 22A-B. In step 2599a, the intelligent controller determines the additional sub-schedules or schedules to which the provisional schedule generated in step 2530 should be propagated. Then, in the for-loop of steps 2599b-2599e, the retained immediate-control setpoints, retained in step 2586 in FIG. 25I, are propagated to a next related control schedule and those setpoints, along with existing-control-schedule setpoints in the next control schedule, are resolved by a call to the routine "resolve additional schedule," in step 2599d.

Figure 25L:
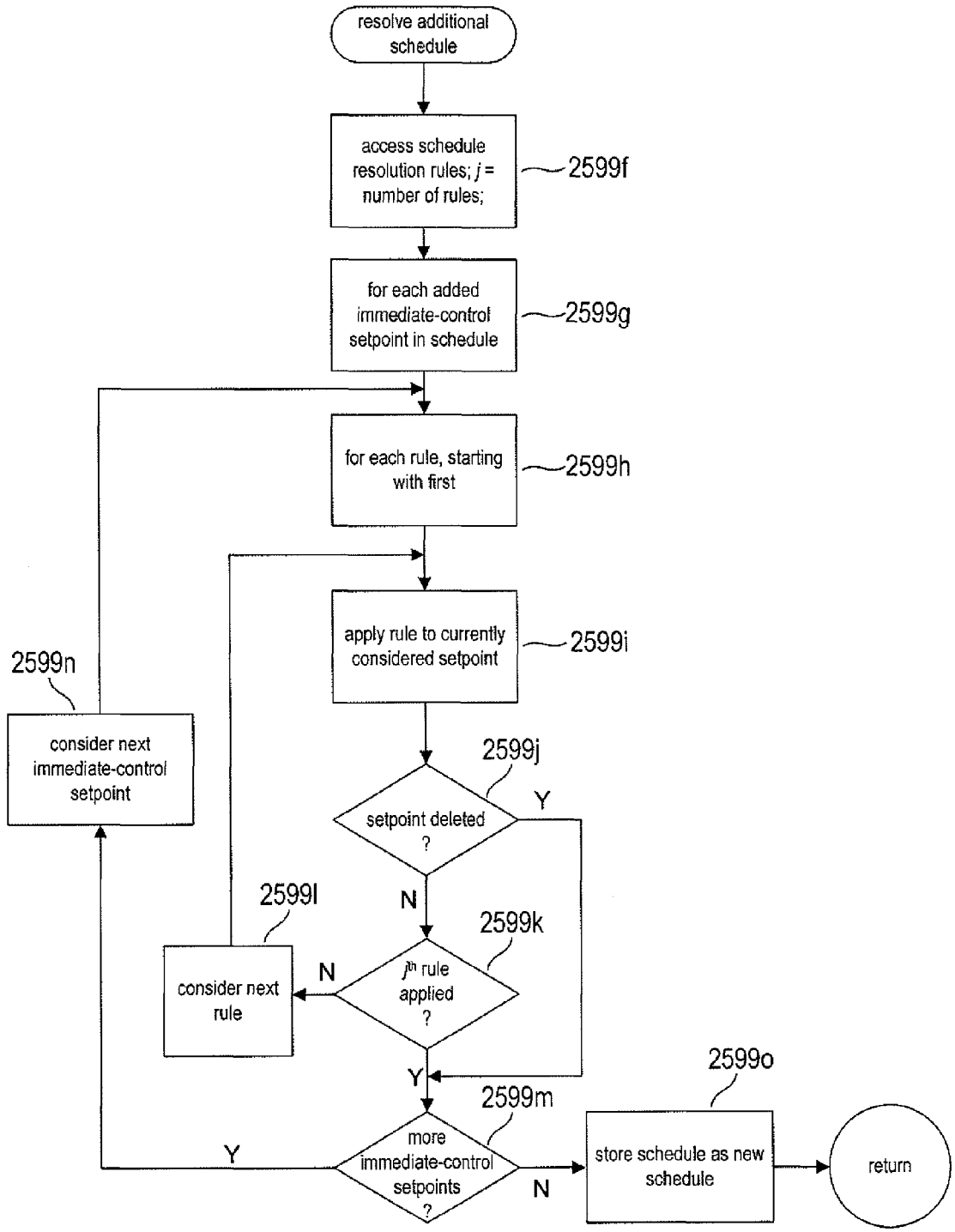

FIG. 25L provides a control-flow diagram for the routine "resolve additional schedule," called in step 2599d of FIG. 25K. In step 2599f, the intelligent controller accesses a stored set of schedule-resolution rules, such as those discussed above with reference to FIGS. 24A-I, and sets the local variable j to the number of schedule-resolution rules to be applied. Again, in the nested for-loops of steps 2599g-2599n, the rules are applied to each immediate-control setpoint in the set of setpoints generated in step 2599c of FIG. 25K. The rules are applied in sequence to each immediate-control setpoint until either the setpoint is deleted, as determined in step 2599j, or until the rule is successfully applied to simplify the schedule, in step 2599k. Once all the propagated setpoints have been resolved in the nested for-loops of steps 2599g-2599n, then the schedule is stored as a new provisional schedule, in step 2599o.

Figure 25M:
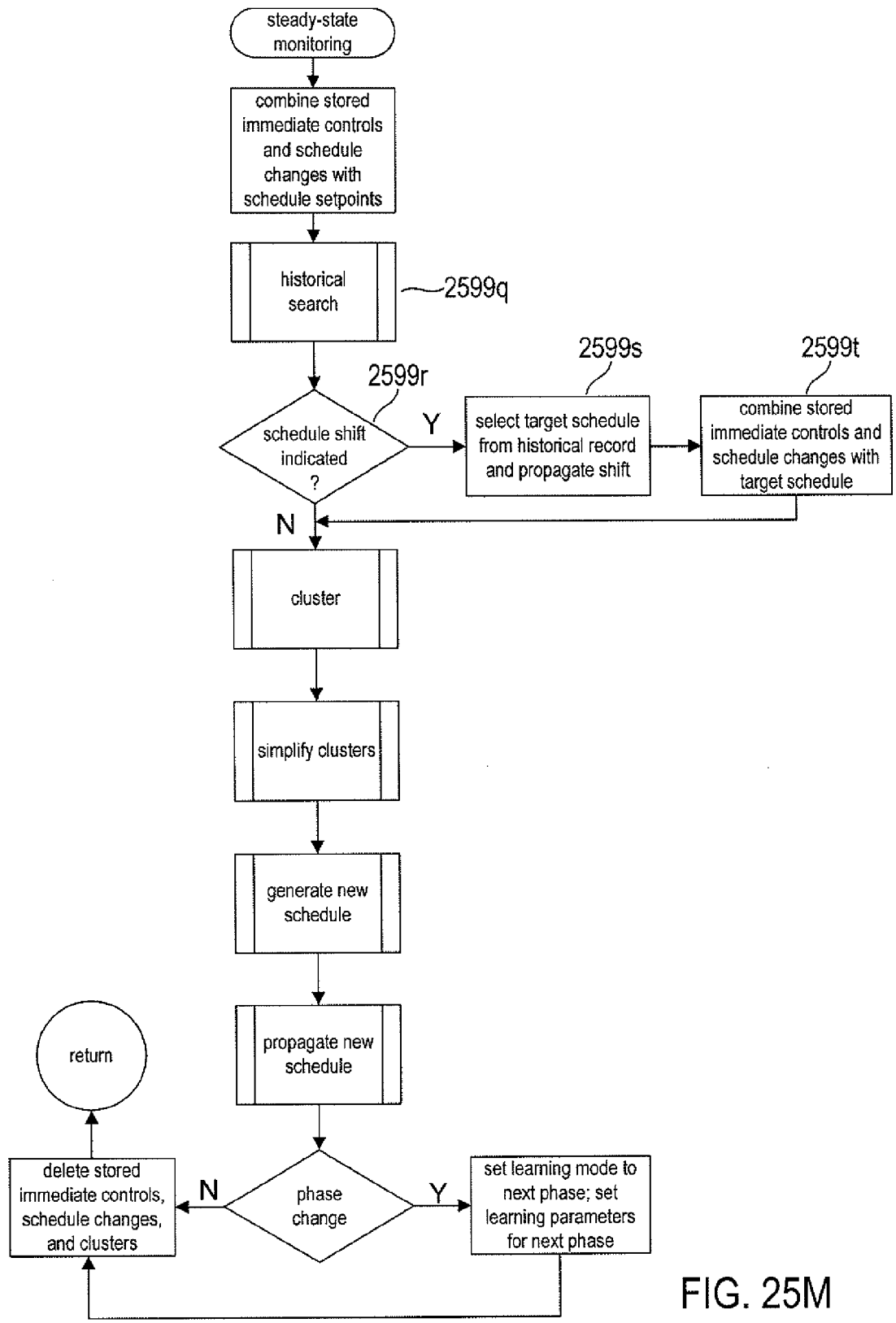

FIG. 25M provides a control-flow diagram for the routine "steady-state monitoring" called in step 2525 of FIG. 25B. This routine is similar to the routine "aggressive monitoring period" shown in FIG. 25C and called in step 2524 of FIG. 25B. Many of the steps are, in fact, nearly identical, and will not be again described, in the interest of brevity. However, step 2599q is an additional step not present in the routine "aggressiveMonitoringPeriod." In this step, the immediate-control setpoints and schedule-change setpoints overlaid on the existing-control-schedule setpoints are used to search a database of recent historical control schedules in order to determine whether or not the set of setpoints is more closely related to another control schedule to which the intelligent controller is to be targeted or shifted. When the control-schedule shift is indicated by this search, as determined in step 2599$h$, then the shift is carried out in step 2599I, and the stored immediate-controls and schedule changes are combined with a sub-schedule of the target schedule to which the intelligent controller is shifted, in step 2599$t$, prior to carrying out generation of the new provisional schedule. The historical-search routine, called in step 2599$q$, may also filter the recorded immediate-control setpoints and schedule-change setpoints recorded during the monitoring period with respect to one or more control schedules or sub-schedules corresponding to the monitoring period. This is part of a more conservative learning approach, as opposed to the aggressive learning approach used in the aggressive-learning mode, that seeks to only conservatively alter a control schedule based on inputs recorded during a monitoring period. Thus, while the procedure carried out at the end of a monitoring period are similar both for the aggressive-learning mode and the steady-state learning mode, schedule changes are carried out in a more conservative fashion during steady-state learning, and the schedule changes become increasingly conservative with each successive phase of steady-state learning. With extensive recent and historical control-schedule information at hand, the intelligent controller can make intelligent and increasingly accurate predictions of whether immediate-control inputs and schedule changes that occurred during the monitoring period reflect the user's desire for long-term changes to the control schedule or, instead, reflect temporary control changes related to temporally local events and conditions.

As mentioned above, an intelligent controller may employ multiple different control schedules that are applicable over different periods of time. For example, in the case of a residential HVAC thermostat controller, an intelligent controller may use a variety of different control schedules applicable to different seasons during the year; perhaps a different control schedule for winter, summer, spring, and fall. Other types of intelligent controllers may use a number of control schedules for various different periods of control that span minutes and hours to months, years, and even greater periods of time.

Figure 26:
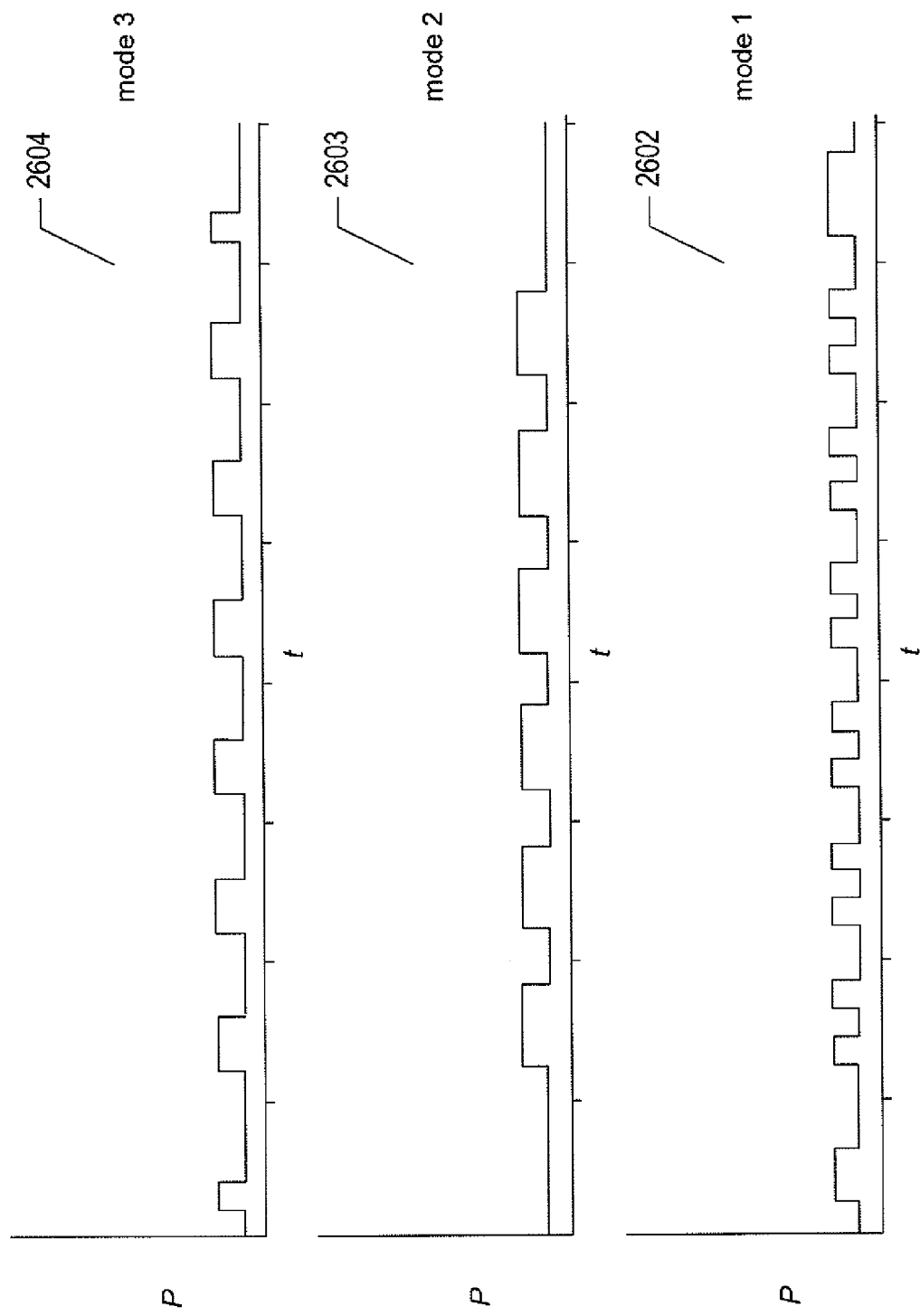
FIG. 26 illustrates three different week-based control schedules corresponding to three different control modes for operation of an intelligent controller.
Figure 27:
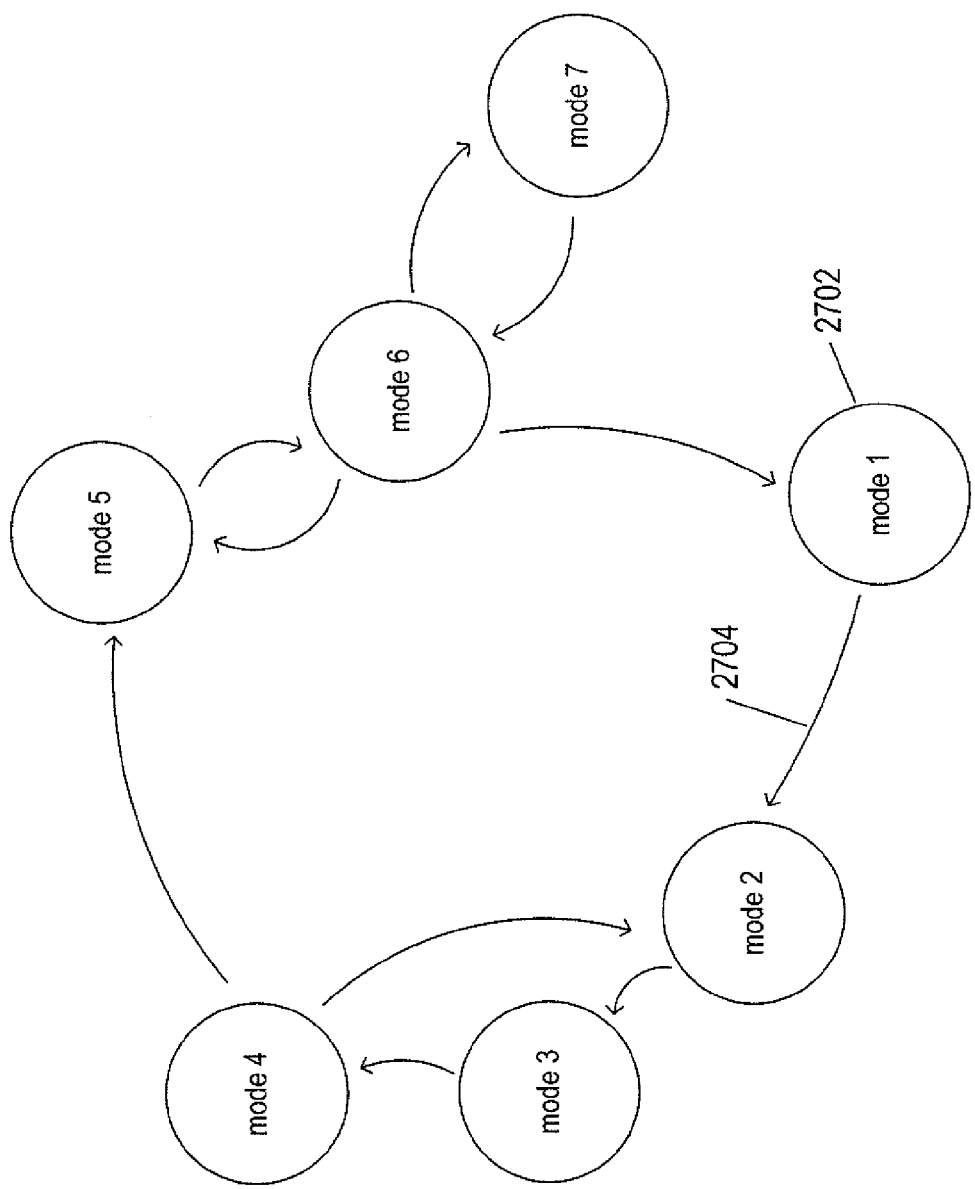
FIG. 27 illustrates a state-transition diagram for an intelligent controller that operates according to seven different control schedules.

FIG. 26 illustrates three different week-based control schedules corresponding to three different control modes for operation of an intelligent controller. Each of the three control schedules 2602-2604 is a different week-based control schedule that controls intelligent-controller operation for a period of time until operational control is shifted, in step 2599$s$ of FIG. 25M, to another of the control schedules. FIG. 27 illustrates a state-transition diagram for an intelligent controller that operates according to seven different control schedules. The modes of operation controlled by the particular control schedules are shown as disks, such as disk 2702, and the transitions between the modes of operation are shown as curved arrows, such as curved arrow 2704. In the case shown in FIG. 27, the state-transition diagram expresses a deterministic, higher-level control schedule for the intelligent controller comprising seven different operational modes, each controlled by a particular control schedule. Each of these particular control schedules may, in turn, be composed of additional hierarchical levels of sub-schedules. The automated-learning methods to which the current application is directed can accommodate automated learning of multiple control schedules and sub-schedules, regardless of their hierarchical organization. Monitoring periods generally encompass the shortest-time, smallest-grain sub-schedules in a hierarchy, and transitions between sub-schedules and higher-level control schedules are controlled by higher-level control schedules, such as the transition-state-diagram-expressed higher-level control schedule illustrated in FIG. 27, by the sequential ordering of sub-schedules within a larger control schedule, such as the daily sub-schedules within a weekly control schedule discussed with reference to FIG. 13, or according to many other control-schedule organizations and schedule-shift criteria.

Figure 28A:
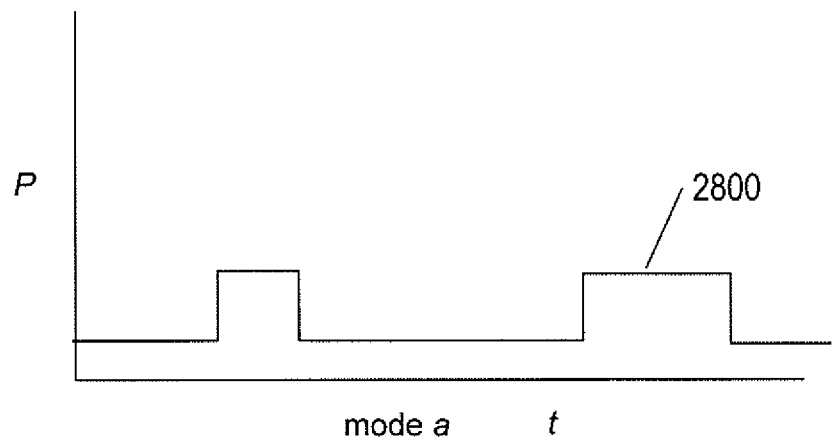
FIGS. 28A-C illustrate one type of control-schedule transition that may be carried out by an intelligent controller.
Figure 28B:
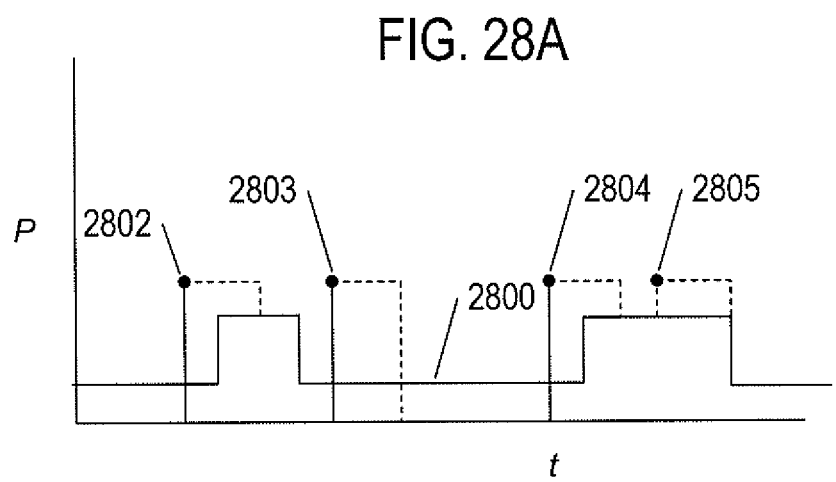
Figure 28C:
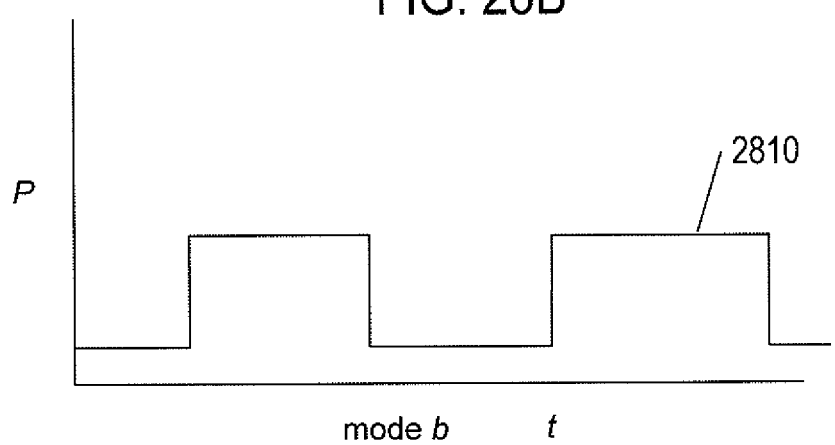

FIGS. 28A-C illustrate one type of control-schedule transition that may be carried out by an intelligent controller. FIG. 28A shows the existing control schedule according to which the intelligent controller is currently operating. FIG. 28B shows recorded immediate-control inputs over a recently completed monitoring period superimposed over the control schedule shown in FIG. 28A. These immediate-control inputs 2802-2805 appear to represent a significant departure from the existing control schedule 2800. In step 2599$q$ of FIG. 25M, an intelligent controller may consider various alternative control schedules or historical control schedules, including control schedule 2810, shown in FIG. 28C, that may be alternate control schedules for the recently completed monitoring period. As it turns out, resolution of the immediate-control inputs with the existing control schedule would produce a control schedule very close to control schedule 2810 shown in FIG. 28C. This then provides a strong indication to the intelligent controller that the recorded immediate-control inputs may suggest a need to shift control to control schedule 2810 rather than to modify the existing control schedule and continue using the modified control schedule. Although this is one type of schedule-change transition that may occur in step 2599$s$ in FIG. 25M, other schedule-change shifts may be controlled by knowledge of the current date, day of the week, and perhaps knowledge of various environmental parameters that together specify use of multiple control schedules to be used to control intelligent-control operations.

Figure 29:
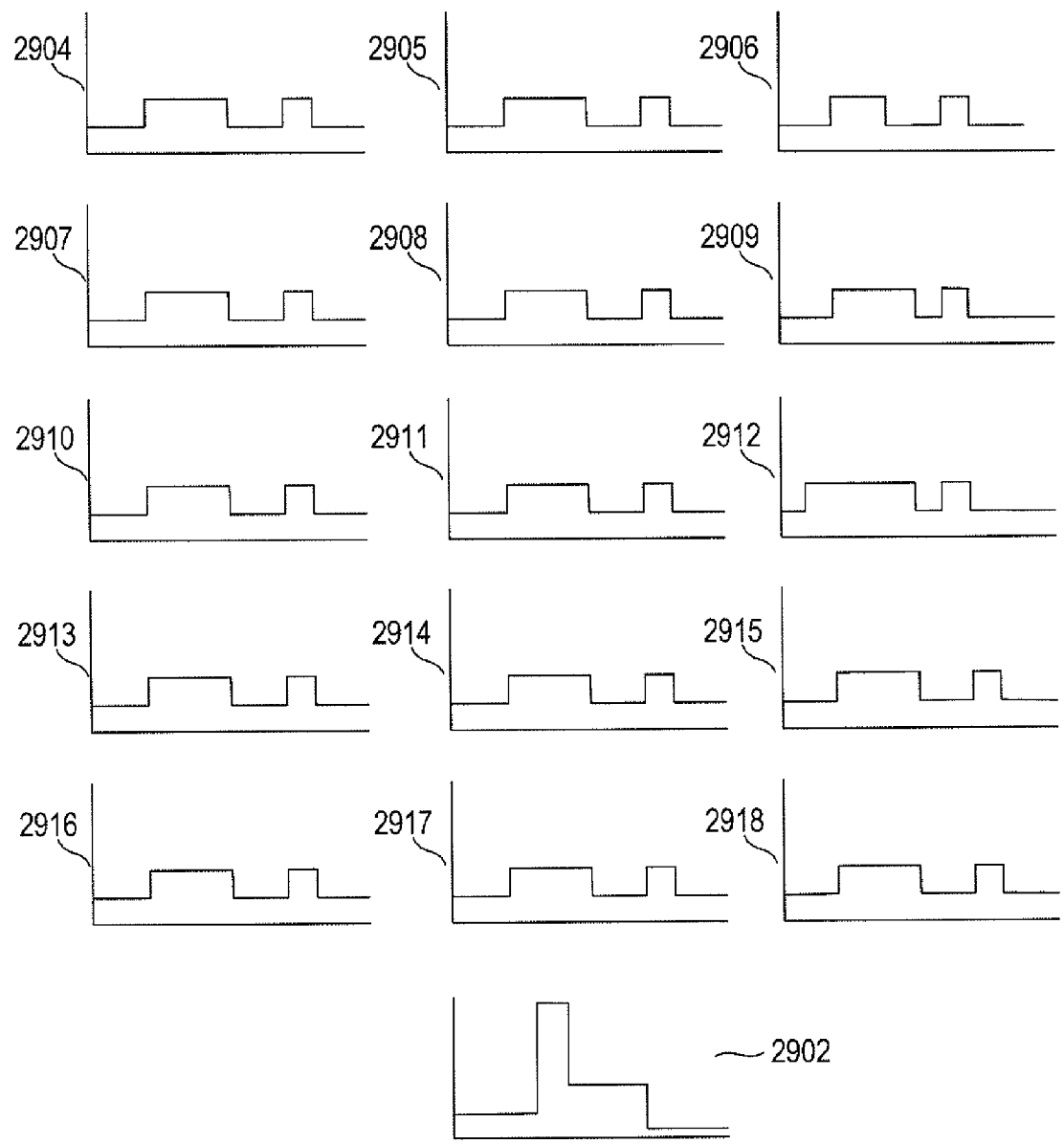
FIGS. 29-30 illustrate types of considerations that may be made by an intelligent controller during steady-state-learning phases.
Figure 30:
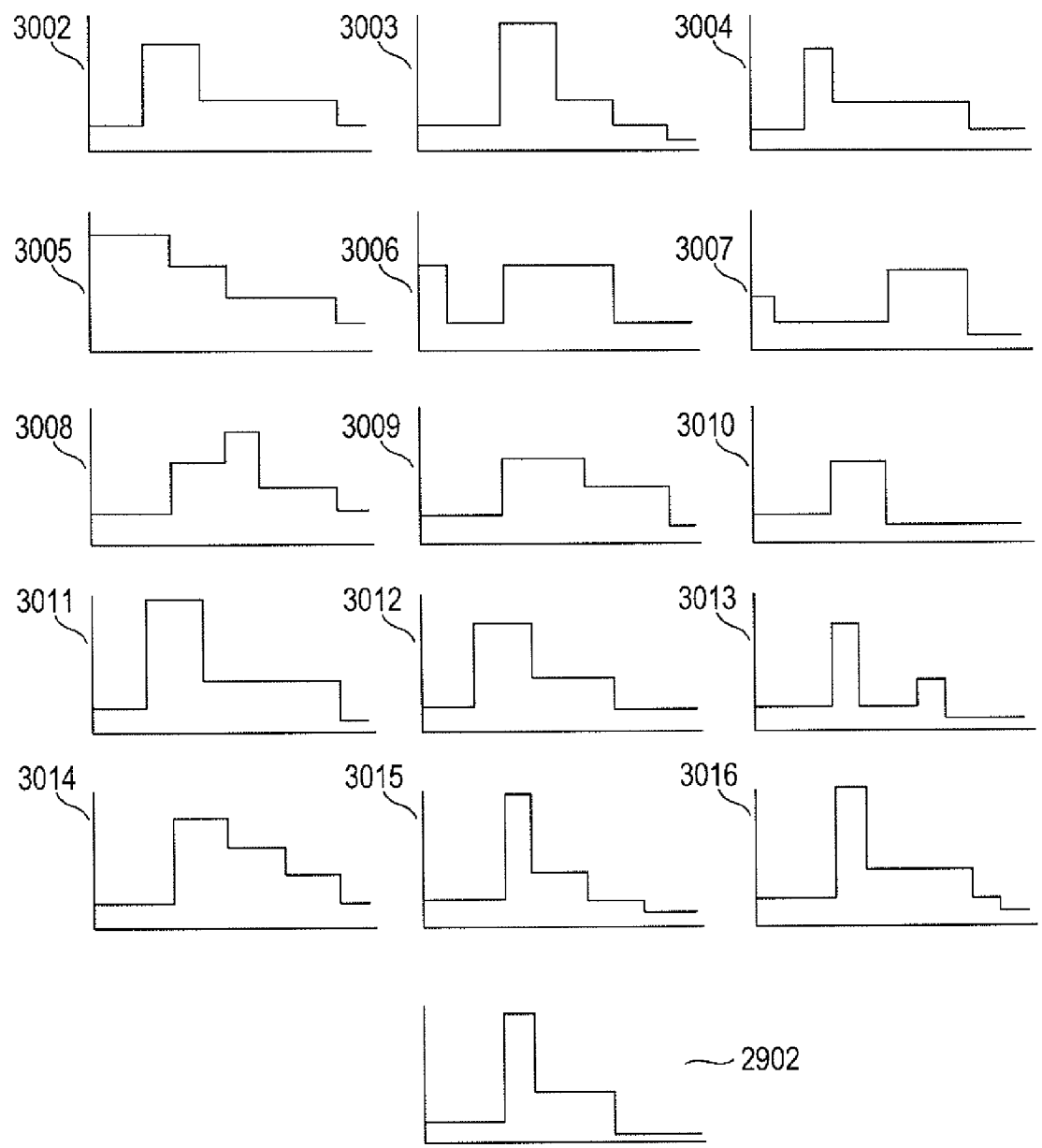

FIGS. 29-30 illustrate types of considerations that may be made by an intelligent controller during steady-state-learning phases. In FIG. 29, the plot of a new provisional schedule 2902 is shown, along with similar plots of 15 recent or historical control schedules or provisional schedules applicable to the same time period 2904-2918. Visual comparison of the new provisional schedule 2902 to the recent and historical provisional schedules 2904-2918 immediately reveals that the new provisional schedule represents a rather radical change in the control regime. During steady-state learning, such radical changes may not be propagated or used to replace existing control schedules, but may instead be recorded and used for propagation or replacement purposes only when the accumulated record of recent and historical provisional schedules provide better support for considering the provisional schedule as an indication of future user intent. For example, as shown in FIG. 30, were the new provisional schedule compared to a record of recent and/or historical control schedules 3002-3016, the intelligent controller would be far more likely to use new provisional schedule 2902 for replacement or propagation purposes.

Automated Schedule Learning in the Context of an Intelligent Thermostat

An implementation of automated control-schedule learning is included in a next-described intelligent thermostat. The intelligent thermostat is provided with a selectively layered functionality that exposes unsophisticated users to a simple user interface, but provides advanced users with an ability to access and manipulate many different energy-saving and energy tracking capabilities. Even for the case of unsophisticated users who are only exposed to the simple user interface, the intelligent thermostat provides advanced energy-saving functionality that runs in the background. The intelligent thermostat uses multi-sensor technology to learn the heating and cooling environment in which the intelligent thermostat is located and to optimize energy-saving settings.

The intelligent thermostat also learns about the users, beginning with a setup dialog in which the user answers a few simple questions, and then continuing, over time, using multi-sensor technology to detect user occupancy patterns and to track the way the user controls the temperature using schedule changes and immediate-control inputs. On an ongoing basis, the intelligent thermostat processes the learned and sensed information, automatically adjusting environmental control settings to optimize energy usage while, at the same time, maintaining the temperature within the environment at desirable levels, according to the learned occupancy patterns and comfort preferences of one or more users.

Advantageously, the selectively layered functionality of the intelligent thermostat allows for effective operation in a variety of different technological circumstances within home and business environments. For simple environments having no wireless home network or Internet connectivity, the intelligent thermostat operates effectively in a standalone mode, learning and adapting to an environment based on multi-sensor technology and user input. However, for environments that have home network or Internet connectivity, the intelligent thermostat operates effectively in a network-connected mode to offer additional capabilities.

When the intelligent thermostat is connected to the Internet via a home network, such as through IEEE 802.11 (Wi-Fi) connectivity, the intelligent thermostat may: (1) provide real-time or aggregated home energy performance data to a utility company, intelligent thermostat data service provider, intelligent thermostats in other homes, or other data destinations; (2) receive real-time or aggregated home energy performance data from a utility company, intelligent thermostat data service provider, intelligent thermostats in other homes, or other data sources; (3) receive new energy control instructions and/or other upgrades from one or more intelligent thermostat data service providers or other sources; (4) receive current and forecasted weather information for inclusion in energy-saving control algorithm processing; (5) receive user control commands from the user's computer, network-connected television, smart phone, and/or other stationary or portable data communication appliance; (6) provide an interactive user interface to a user through a digital appliance; (7) receive control commands and information from an external energy management advisor, such as a subscription-based service aimed at leveraging collected information from multiple sources to generate energy-saving control commands and/or profiles for their subscribers; (8) receive control commands and information from an external energy management authority, such as a utility company to which limited authority has been voluntarily given to control the intelligent thermostat in exchange for rebates or other cost incentives; (9) provide alarms, alerts, or other information to a user on a digital appliance based on intelligent thermostat-sensed HVAC-related events; (10) provide alarms, alerts, or other information to the user on a digital appliance based on intelligent thermostat-sensed non-HVAC related events; and (11) provide a variety of other useful functions enabled by network connectivity.

Figure 31A:
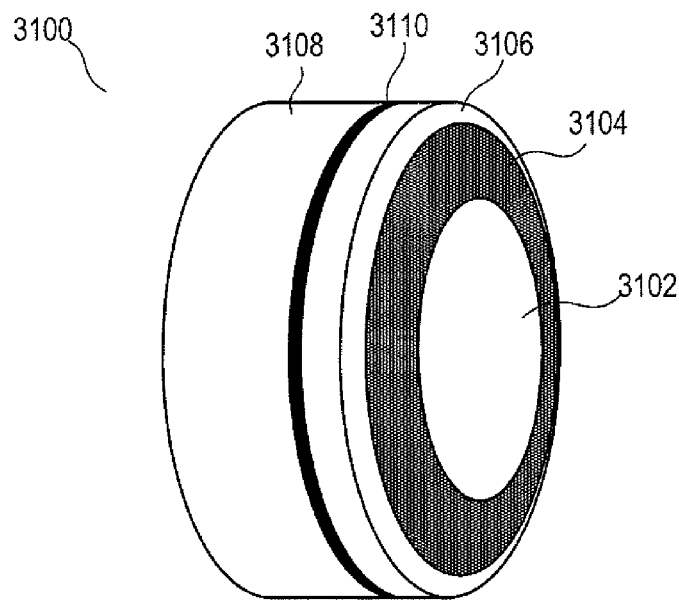
FIG. 31A illustrates a perspective view of an intelligent thermostat.

FIG. 31A illustrates a perspective view of an intelligent thermostat. The intelligent thermostat 3100 has a sleek, elegant appearance. The intelligent thermostat 3100 comprises a circular main body 3108 with a diameter of about 8 cm and that has a visually pleasing outer finish, such as a satin nickel or chrome finish. A cap-like structure comprising a rotatable outer ring 3106, a sensor ring 3104, and a circular display monitor 3102 is separated from the main body 3108 by a small peripheral gap 3110. The outer ring 3106 may have an outer finish identical to that of the main body 3108, while the sensor ring 3104 and circular display monitor 3102 may have a common circular glass (or plastic) outer covering that is gently arced in an outward direction and that provides a sleek yet solid and durable-looking overall appearance. The sensor ring 3104 contains any of a wide variety of sensors, including infrared sensors, visible-light sensors, and acoustic sensors. The glass or plastic that covers the sensor ring 3104 may be smoked or mirrored such that the sensors themselves are not visible to the user. An air venting functionality may be provided, via the peripheral gap 3110, which allows the ambient air to be sensed by the internal sensors without the need for gills or grill-like vents.

Figure 31B:
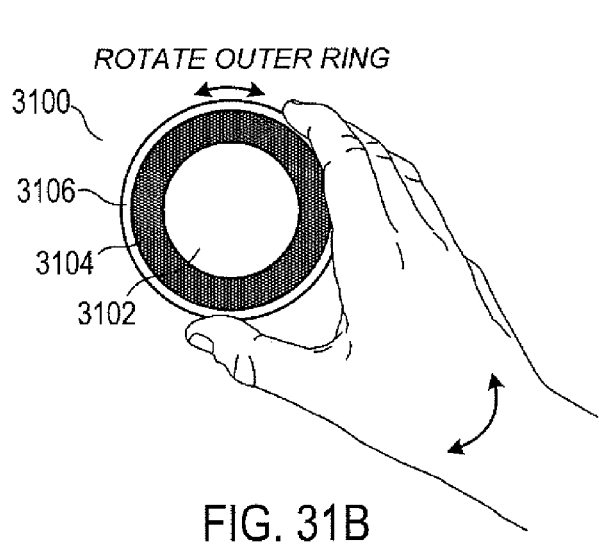
FIGS. 31B-31C illustrate the intelligent thermostat being controlled by a user.
Figure 31C:
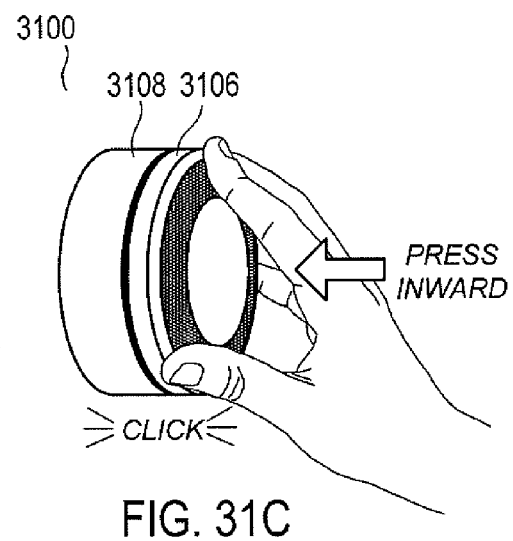

FIGS. 31B-31C illustrate the intelligent thermostat being controlled by a user. The intelligent thermostat 3100 is controlled by two types of user input: (1) a rotation of the outer ring 3106 (FIG. 31B); and (2) an inward push on the outer ring 3106 (FIG. 31C) until an audible and/or tactile "click" occurs. The inward push may cause the outer ring 3106 to move forward, while in another implementation, the entire cap-like structure, including both the outer ring 3106 and the glass covering of the sensor ring 3104 and circular display monitor 3102, move inwardly together when pushed. The sensor ring 3104, the circular display monitor 3102, and the common glass covering do not rotate with outer ring 3106 in one implementation.

By rotation of the outer ring 3106, or ring rotation, and inward pushing of the outer ring 3106, or inward click, the intelligent thermostat 3100 can receive all necessary information from the user for basic setup and operation. The outer ring 3106 is mechanically mounted in a manner that provides a smooth yet viscous feel to the user, for further promoting an overall feeling of elegance while also reducing spurious or unwanted rotational inputs. The intelligent thermostat 3100 recognizes three fundamental user inputs: (1) ring rotate left, (2) ring rotate right, and (3) inward click. In other implementations, more complex fundamental user inputs can be recognized, such as double-click or triple-click inward presses and speed-sensitive or acceleration-sensitive rotational inputs.

Figure 32:
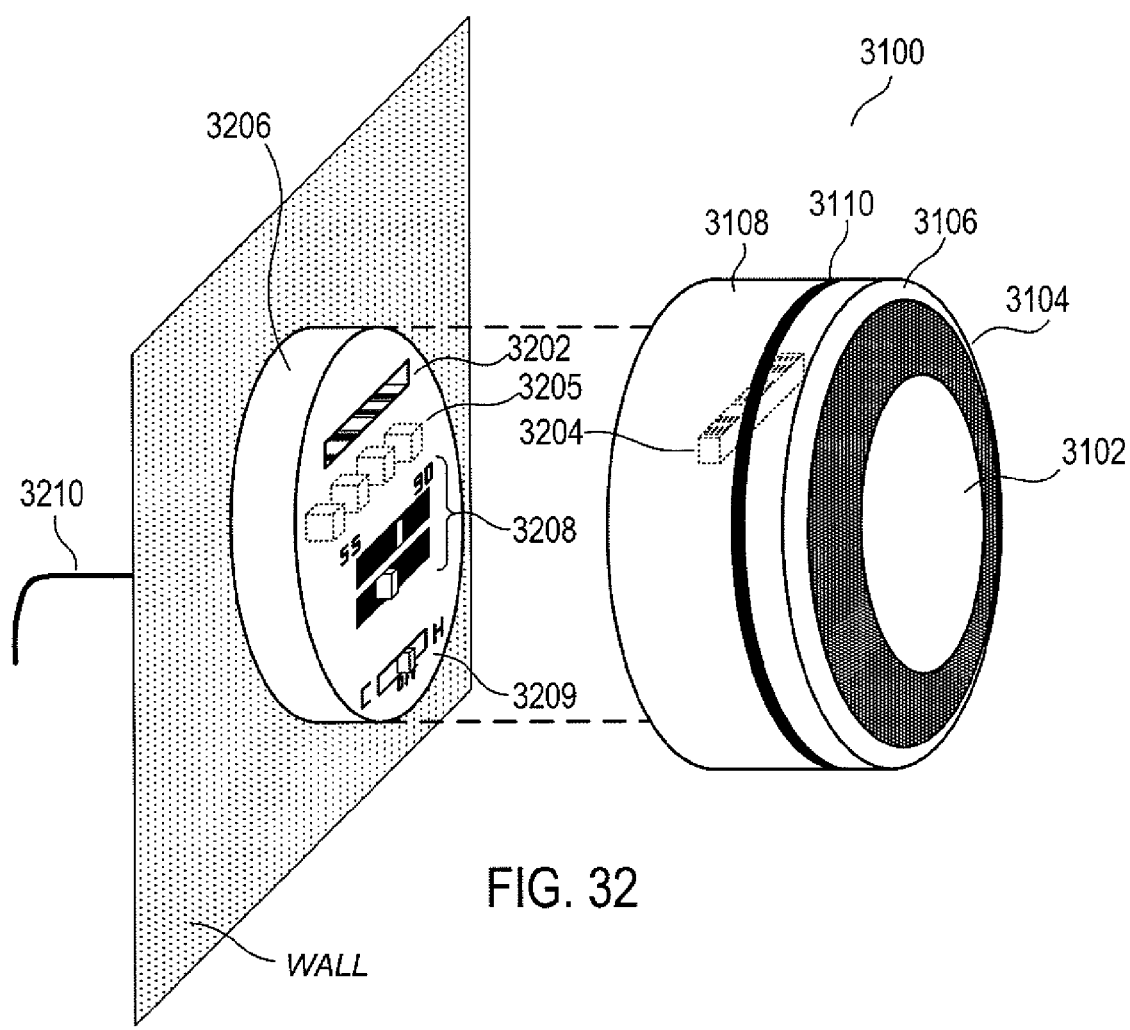
FIG. 32 illustrates an exploded perspective view of the intelligent thermostat and an HVAC-coupling wall dock.

FIG. 32 illustrates an exploded perspective view of the intelligent thermostat and an HVAC-coupling wall dock. The HVAC-coupling wall dock 3206 has the functionality as a very simple, elemental, standalone thermostat when the intelligent thermostat 3100 is removed, the elemental thermostat including a standard temperature readout/setting dial 3208 and a simple COOL-OFF-HEAT switch 3209. This can prove useful for a variety of situations, such as when the intelligent thermostat 3100 needs to be removed for service or repair for an extended period of time. In one implementation, the elemental thermostat components 3208 and 3209 are entirely mechanical in nature, so that no electrical power is needed to trip the control relays. In other implementations, simple electronic controls, such as electrical up/down buttons and/or an LCD readout, are provided. In other implementations, a subset of the advanced functionalities of the intelligent thermostat 3100 can be provided, such as elemental network access to allow remote control that provides a brain-stem functionality while the intelligent thermostat is temporarily removed.

Figure 33A:
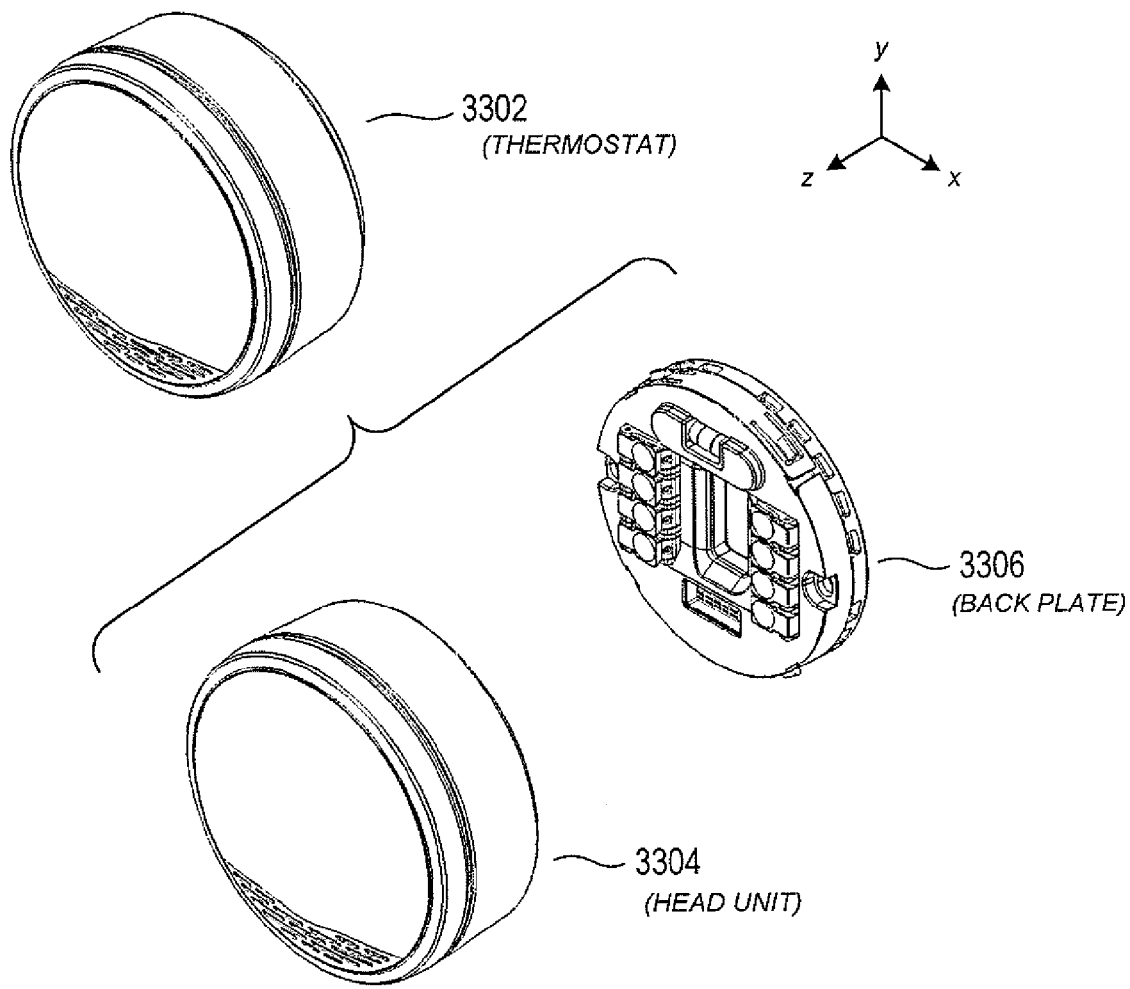
FIGS. 33A-33B illustrate exploded front and rear perspective views of the intelligent thermostat.
Figure 33B:
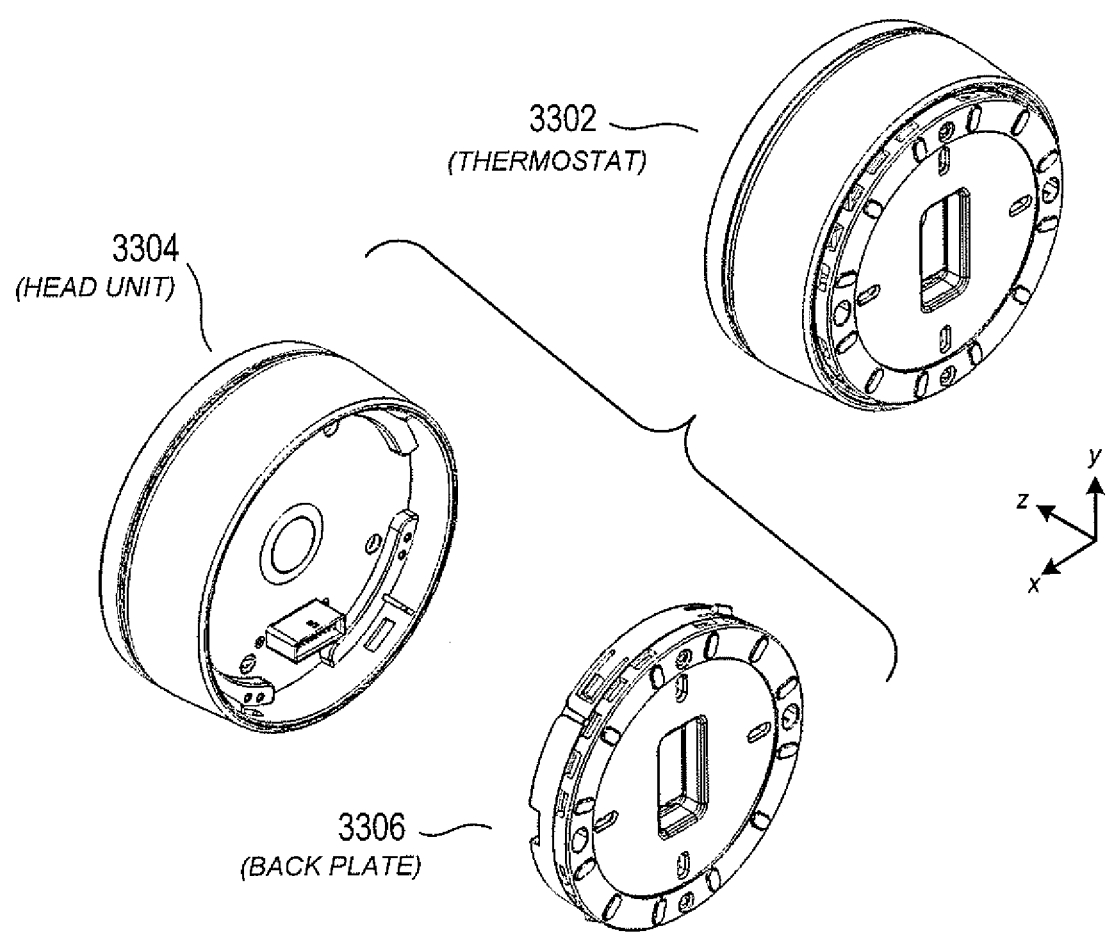

FIGS. 33A-33B illustrate exploded front and rear perspective views of the intelligent thermostat. FIGS. 33A-33B show the intelligent thermostat 3302 with respect to its two main components: (1) the head unit 3204; and (2) the back plate 3306. In the drawings shown, the z direction is outward from the wall, the y direction is the head-to-toe direction relative to a walk-up user, and the x direction is the user's left-to-right direction.

Figure 34A:
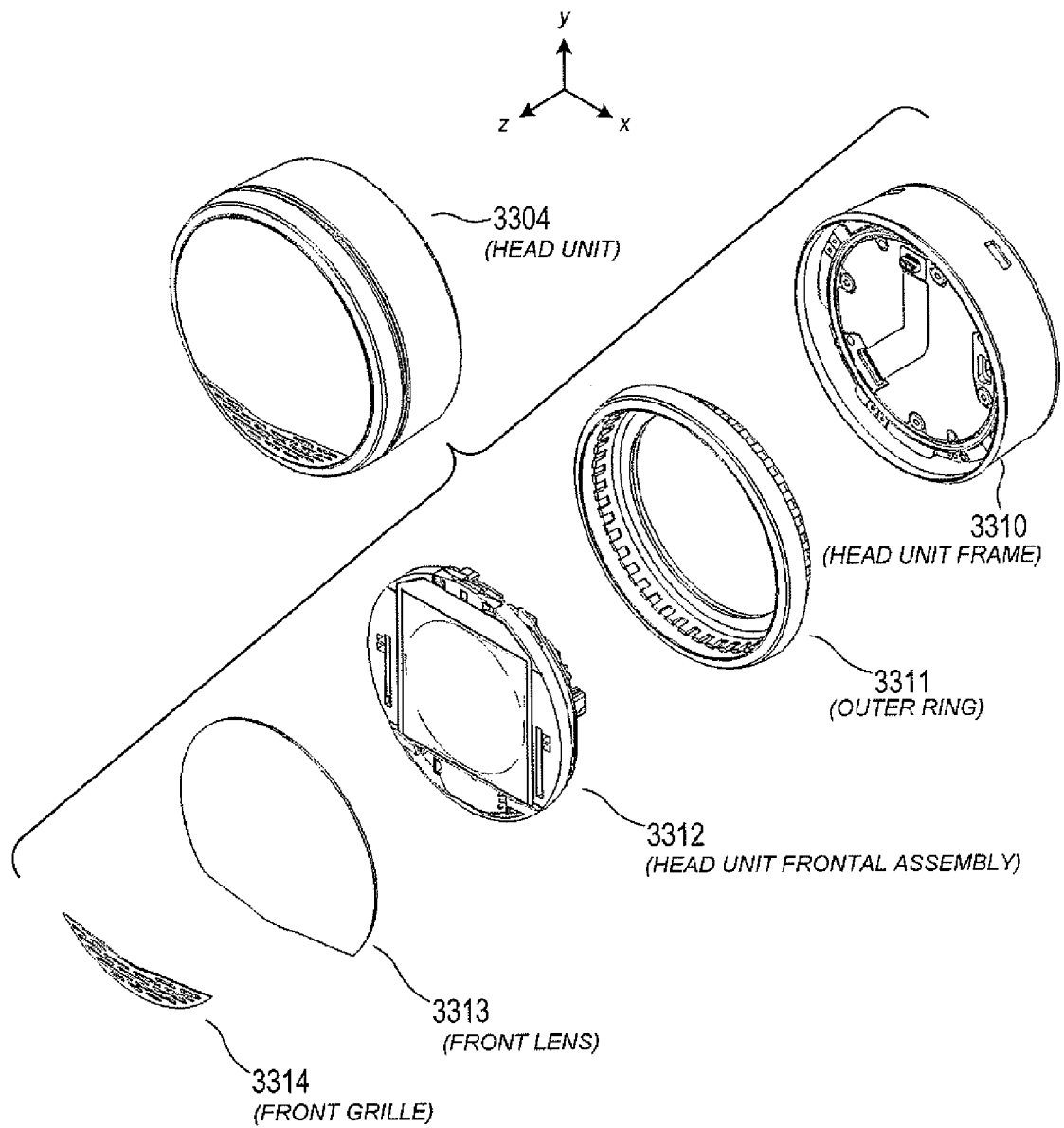
FIGS. 34A-34B illustrate exploded front and rear perspective views, respectively, of the head unit.
Figure 34B:
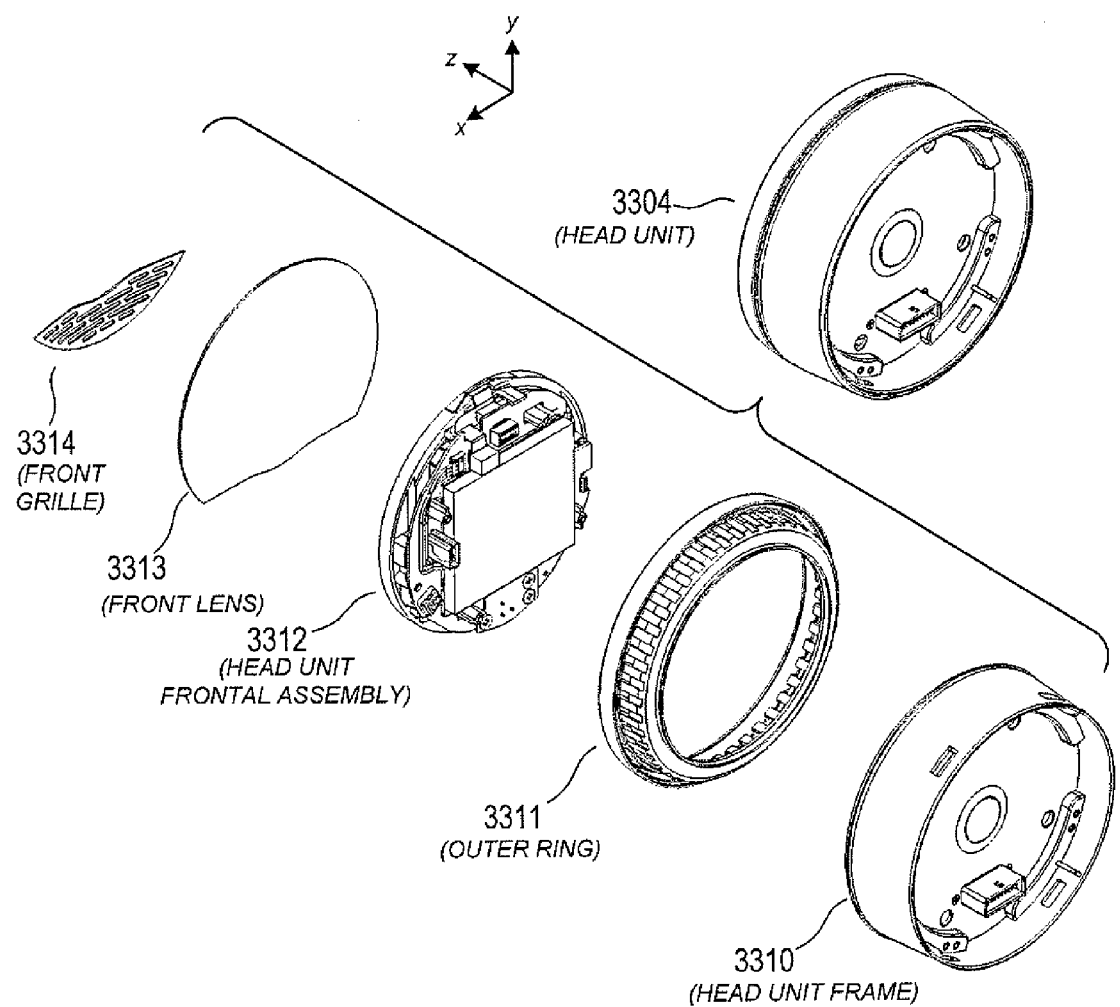

FIGS. 34A-34B illustrate exploded front and rear perspective views, respectively, of the head unit. Head unit 3304 includes a head unit frame 3310, the outer ring 3311, a head unit frontal assembly 3312, a front lens 3313, and a front grille 3314. Electrical components on the head unit frontal assembly 3312 can connect to electrical components on the backplate 3306 via ribbon cables and/or other plug type electrical connectors.

Figure 35A:
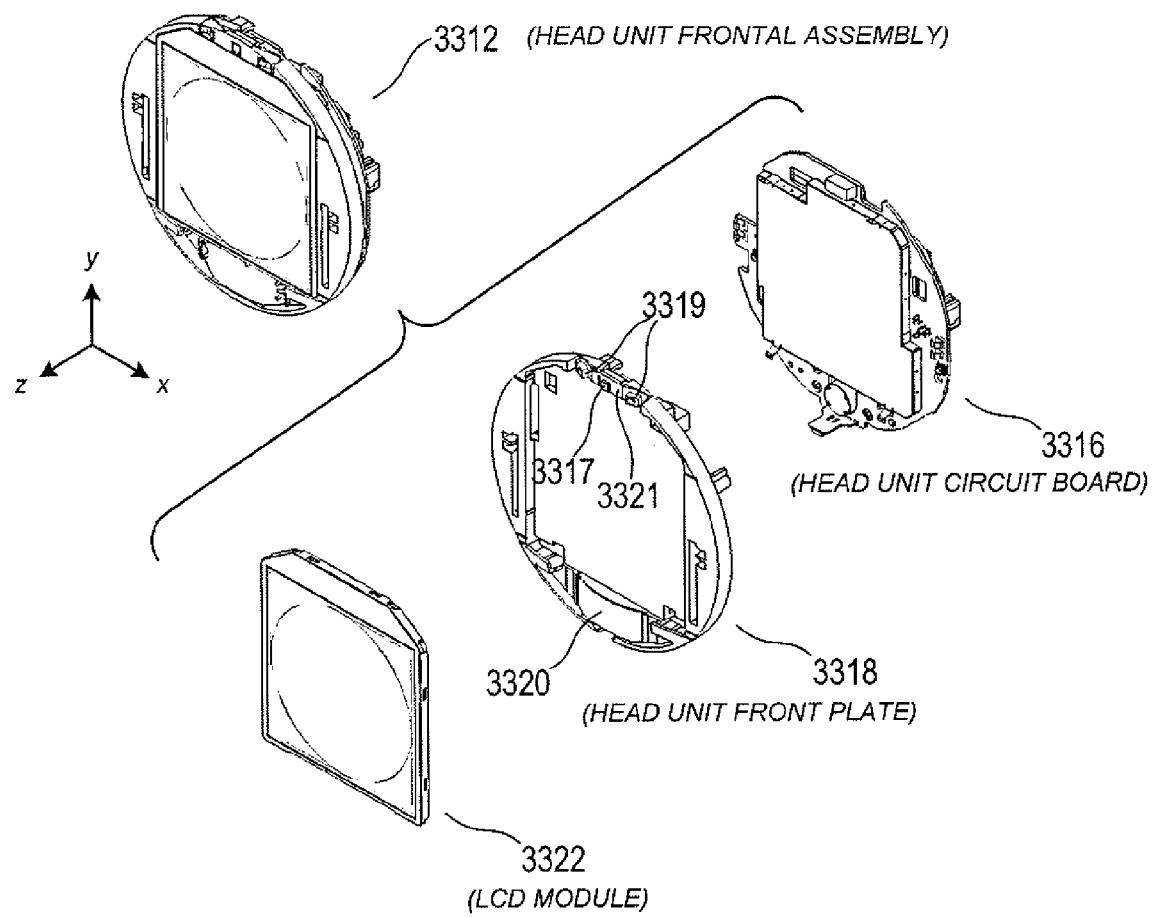
FIGS. 35A-35B illustrate exploded front and rear perspective views, respectively, of the head unit frontal assembly.
Figure 35B:
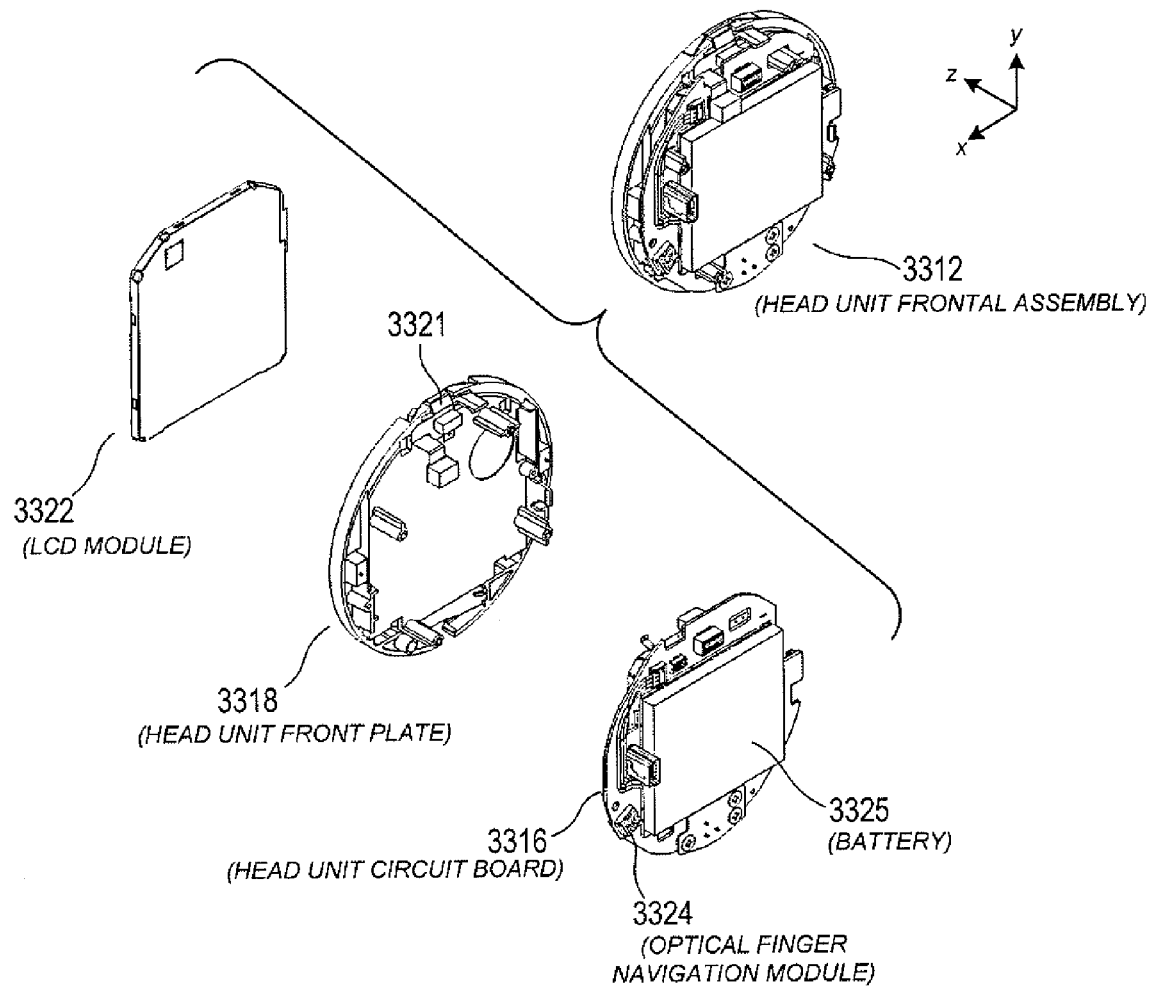

FIGS. 35A-35B illustrate exploded front and rear perspective views, respectively, of the head unit frontal assembly. Head unit frontal assembly 3312 comprises a head unit circuit board 3316, a head unit front plate 3318, and an LCD module 3322. The components of the front side of head unit circuit board 3316 are hidden behind an RF shield in FIG. 35A. A rechargeable Lithium-Ion battery 3325 is located on the back of the head unit circuit board 3316, which, in one implementation, has a nominal voltage of 3.7 volts and a nominal capacity of 560 mAh. To extend battery life, the battery 3325 is normally not charged beyond 450 mAh by the thermostat battery charging circuitry. Moreover, although the battery 3325 is rated to be capable of being charged to 4.2 volts, the intelligent thermostat battery-charging circuitry normally does not charge the intelligent thermostat beyond 3.95 volts. Also shown in FIG. 35B is an optical finger navigation module 3324 that is configured and positioned to sense rotation of the outer ring 3311. The module 3324 uses methods analogous to the operation of optical computer mice to sense the movement of a texturable surface on a facing periphery of the outer ring 3311. Notably, the module 3324 is one of the very few sensors that are controlled by the relatively power-intensive head unit microprocessor rather than the relatively low-power backplate microprocessor. This is achievable without excessive power drain because the head unit microprocessor is already awake when a user is manually turning the dial, avoiding excessive wake-up power drain. Advantageously, very fast response can also be provided by the head unit microprocessor. Also shown in FIG. 35A is a Fresnel lens 3320 that operates in conjunction with a PIR motion sensor disposes thereunderneath.

Figure 36A:
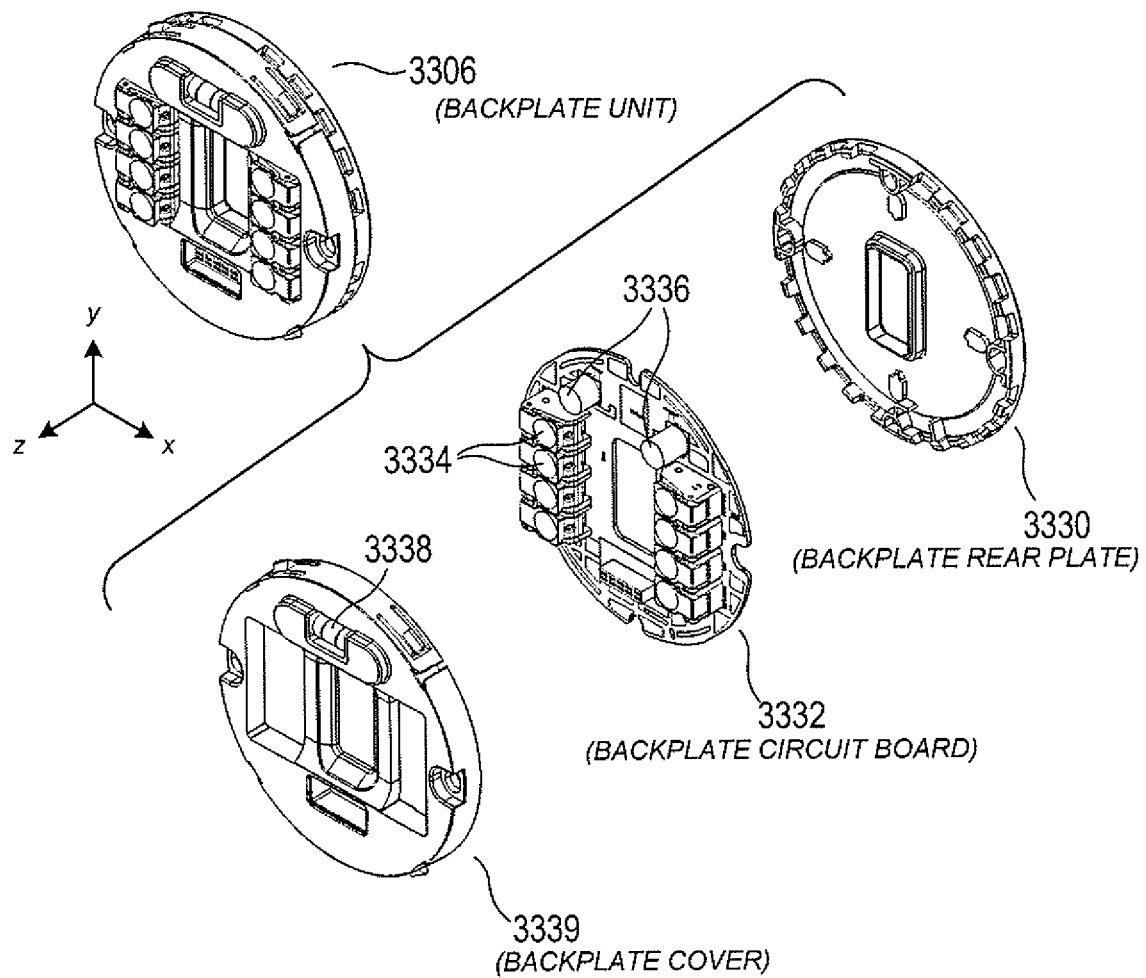
FIGS. 36A-36B illustrate exploded front and rear perspective views, respectively, of the backplate unit.
Figure 36B:
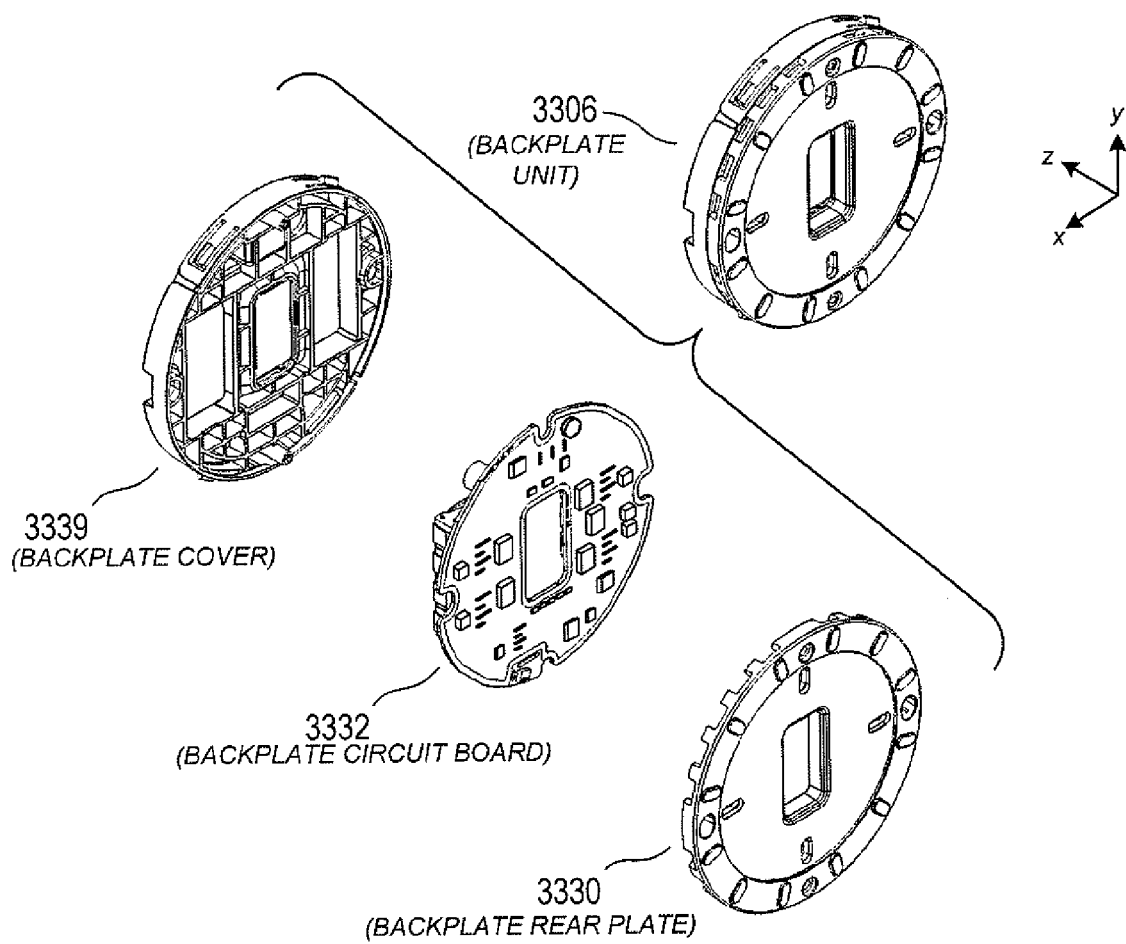

FIGS. 36A-36B illustrate exploded front and rear perspective views, respectively, of the backplate unit. Backplate unit 3306 comprises a backplate rear plate 3330, a backplate circuit board 3332, and a backplate cover 3339. FIG. 36A shows the HVAC wire connectors 3334 that include integrated wire-insertion-sensing circuitry and two relatively large capacitors 3336 that are used by the power stealing circuitry that is mounted on the back side of the backplate circuit board 3332.

Figure 37:
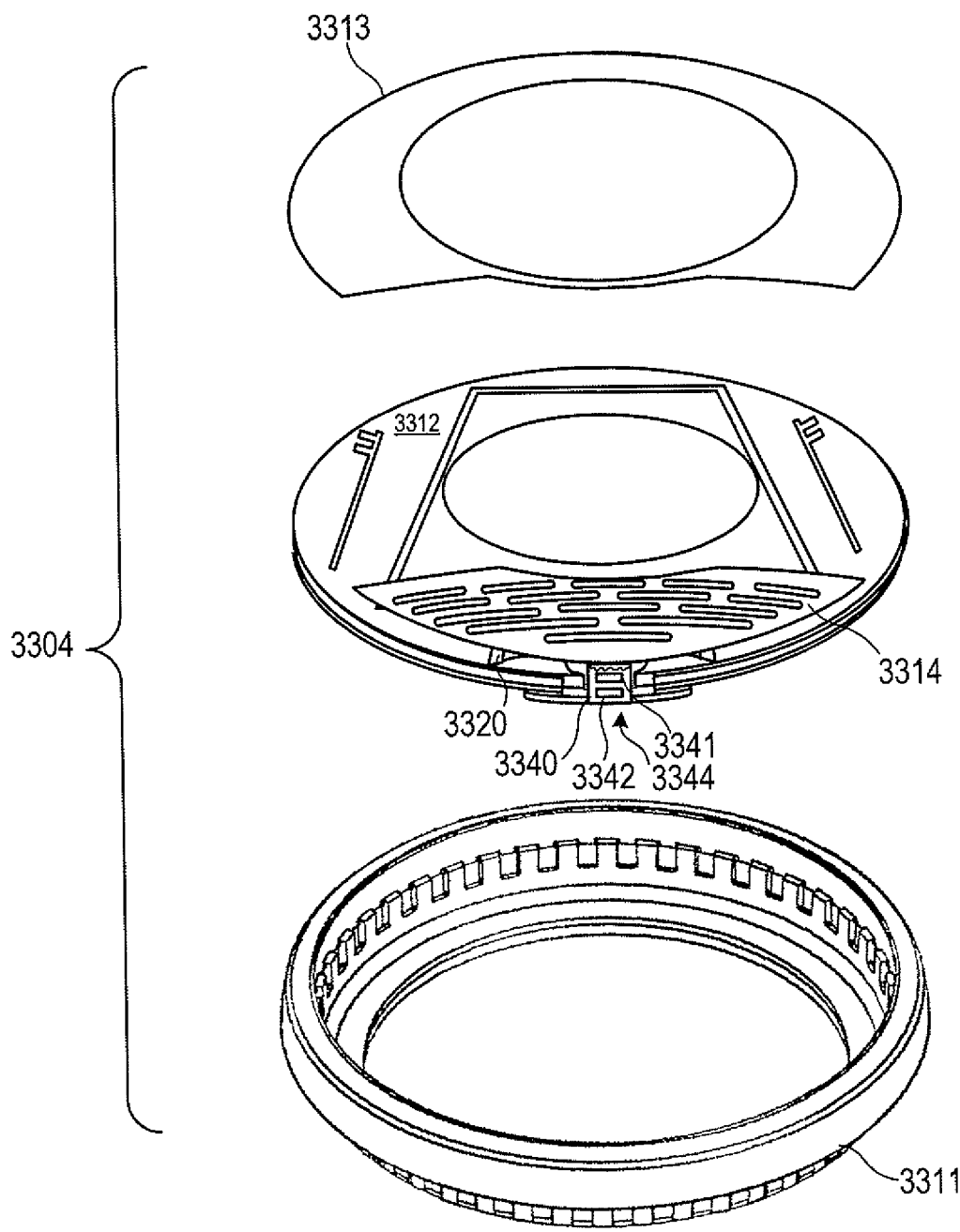
FIG. 37 shows a perspective view of a partially assembled head unit.

FIG. 37 shows a perspective view of a partially assembled head unit. In certain implementations, placement of grille member 3314 over the Fresnel lens 3320 and an associated PIR motion sensor 3344 conceals and protects these PIR sensing elements, while horizontal slots in the grille member 3314 allow the PIR motion sensing hardware, despite being concealed, to detect the lateral motion of occupants in a room or area. A temperature sensor 3340 uses a pair of thermal sensors to more accurately measure ambient temperature. A first or upper thermal sensor 3341 associated with temperature sensor 3340 gathers temperature data closer to the area outside or on the exterior of the thermostat while a second or lower thermal sensor 3342 collects temperature data more closely associated with the interior of the housing. In one implementation, each of the temperature sensors 3341 and 3342 comprises a Texas Instruments TMP112 digital temperature sensor chip, while the PIR motion sensor 3344 comprises PerkinElmer DigiPyro PYD 1998 dual-element pyrodetector.

To more accurately determine the ambient temperature, the temperature taken from the lower thermal sensor 3342 is considered in conjunction with the temperatures measured by the upper thermal sensor 3341 and when determining the effective ambient temperature. This configuration can be used to compensate for the effects of internal heat produced in the thermostat by the microprocessor(s) and/or other electronic components, obviating or minimizing temperature measurement errors that might otherwise be suffered. In some implementations, the accuracy of the ambient temperature measurement may be further enhanced by thermally coupling upper thermal sensor 3341 of temperature sensor 3340 to grille member 3314 as the upper thermal sensor 3341 better reflects the ambient temperature than lower thermal sensor 3342.

Figure 38:
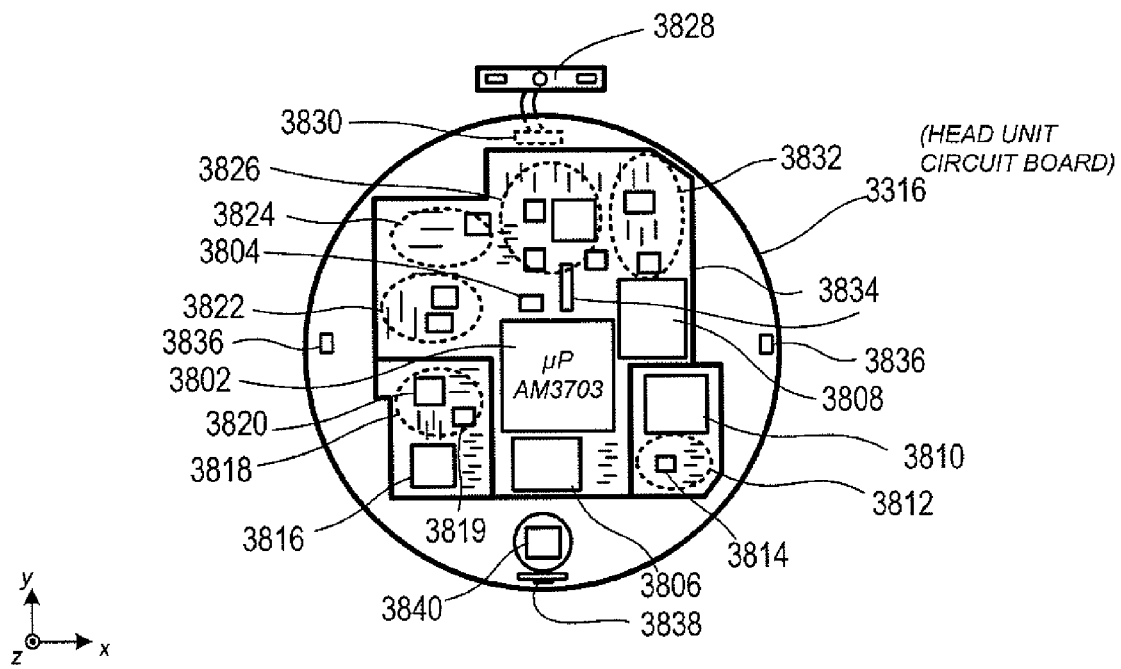
FIG. 38 illustrates the head unit circuit board.

FIG. 38 illustrates the head unit circuit board. The head unit circuit board 3316 comprises a head unit microprocessor 3802 (such as a Texas Instruments AM3703 chip) and an associated oscillator 3804, along with DDR SDRAM memory 3806, and mass NAND storage 3808. A Wi-Fi module 3810, such as a Murata Wireless Solutions LBWA19XSLZ module, which is based on the Texas Instruments WL1270 chipset supporting the 802.11 b/g/n WLAN standard, is provided in a separate compartment of RF shielding 3834 for Wi-Fi capability. Wi-Fi module 3810 is associated with supporting circuitry 3812 including an oscillator 3814. A ZigBee module 3816, which can be, for example, a C2530F256 module from Texas Instruments, is provided, also in a separately shielded RF compartment, for ZigBee capability. The ZigBee module 3816 is associated with supporting circuitry 3818, including an oscillator 3819 and a low-noise amplifier 3820. Display backlight voltage conversion circuitry 3822, piezoelectric driving circuitry 3824, and power management circuitry 3826 are additionally provided. A proximity sensor and an ambient light sensor (PROX/ALS), more particularly a Silicon Labs SI1142 Proximity/Ambient Light Sensor with an I2C Interface, is provided on a flex circuit 3828 that attaches to the back of the head unit circuit board by a flex circuit connector 3830. Battery-charging-supervision-disconnect circuitry 3832 and spring/RF antennas 3836 are additionally provided. A temperature sensor 3838 and a PIR motion sensor 3840 are additionally provided.

Figure 39:
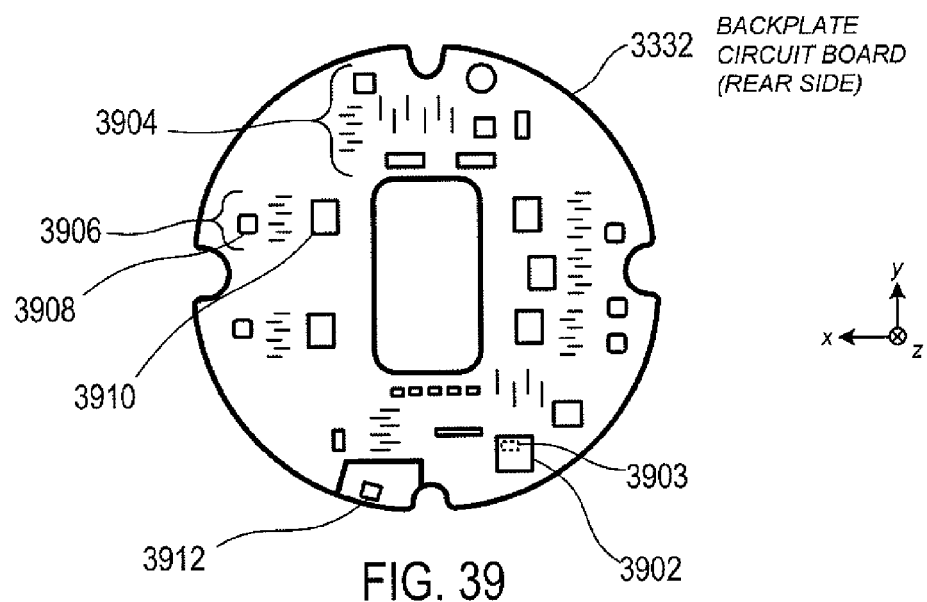
FIG. 39 illustrates a rear view of the backplate circuit board.

FIG. 39 illustrates a rear view of the backplate circuit board. The backplate circuit board 3332 comprises a backplate processor/microcontroller 3902, such as a Texas Instruments MSP430F System-on-Chip Microcontroller that includes an on-board memory 3903. The backplate circuit board 3332 further comprises power-supply circuitry 3904, which includes power-stealing circuitry, and switch circuitry 3906 for each HVAC respective HVAC function. For each such function, the switch circuitry 3906 includes an isolation transformer 3908 and a back-to-back NFET package 3910. The use of FETs in the switching circuitry allows for active power stealing, i.e., taking power during the HVAC ON cycle, by briefly diverting power from the HVAC relay circuit to the reservoir capacitors for a very small interval, such as 100 micro-seconds. This time is small enough not to trip the HVAC relay into the OFF state but is sufficient to charge up the reservoir capacitors. The use of FETs allows for this fast switching time (100 micro-seconds), which would be difficult to achieve using relays (which stay on for tens of milliseconds). Also, such relays would readily degrade with fast switching, and they would also make audible noise. In contrast, the FETS operate with essentially no audible noise. A combined temperature/humidity sensor module 3912, such as a Sensirion SHT21 module, is additionally provided. The backplate microcontroller 3902 performs polling of the various sensors, sensing for mechanical wire insertion at installation, alerting the head unit regarding current vs. setpoint temperature conditions and actuating the switches accordingly, and other functions such as looking for appropriate signal on the inserted wire at installation.

Next, an implementation of the above-described automated-control-schedule-learning methods for the above-described intelligent thermostat is provided. FIGS. 40A-D illustrate steps for achieving initial learning. FIGS. 41A-M illustrate a progression of conceptual views of a thermostat schedule. The progression of conceptual views of a thermostat schedule occurs as processing is performed according to selected steps of FIGS. 40A-40D, for an example one-day monitoring period during an initial aggressive-learning period. For one implementation, the steps of FIGS. 40A-40D are carried out by the head unit microprocessor of thermostat 3302, with or without Internet connectivity. In other implementations, one or more of the steps of FIGS. 40A-40D can be carried out by a cloud server to which the thermostat 3302 has network connectivity. While the example presented in FIGS. 41A-41M is for a heating schedule scenario, the described method is likewise applicable for cooling-schedule learning, and can be readily extended to HVAC schedules containing mixtures of heating setpoints, cooling setpoints, and/or range setpoints. While the examples of FIGS. 40A-41M are presented in the particular context of establishing a weekly schedule, which represents one particularly appropriate time basis for HVAC schedule establishment and execution, in other implementations a bi-weekly HVAC schedule, a semi-weekly HVAC schedule, a monthly HVAC schedule, a bi-monthly HVAC schedule, a seasonal HVAC schedule, and other types of schedules may be established. While the examples of FIGS. 40A-41M are presented and/or discussed in terms of a typical residential installation, this is for the purpose of clarity of explanation. The methods are applicable to a wide variety of other types of enclosures, such as retail stores, business offices, industrial settings, and so forth. In the discussion that follows, the time of a particular user action or setpoint entry are generally expressed as both the day and the time of day of that action or entry, while the phrase "time of day" is generally used to express a particular time of day.

The initial learning process represents an "aggressive learning" approach in which the goal is to quickly establish an at least roughly appropriate HVAC schedule for a user or users based on a very brief period of automated observation and tracking of user behavior. Once the initial learning process is established, the thermostat 3302 then switches over to steady-state learning, which is directed to perceiving and adapting to longer-term repeated behaviors of the user or users. In most cases, the initial learning process is begun, in step 4002, in response to a new installation and startup of the thermostat 3302 in a residence or other controlled environment, often following a user-friendly setup interview. Initial learning can also be invoked by other events, such as a factory reset of the intelligent thermostat 3302 or an explicit request of a user who may wish for the thermostat 3302 to repeat the aggressive-learning phase.

In step 4004, a default beginning schedule is accessed. For one implementation, the beginning schedule is simply a single setpoint that takes effect at 8 AM each day and that includes a single setpoint temperature. This single setpoint temperature is dictated by a user response that is provided near the end of the setup interview or upon invocation of initial learning, where the user is asked whether to start learning a heating schedule or a cooling schedule. When the user chooses heating, the initial single setpoint temperature is set to 68° F., or some other appropriate heating setpoint temperature, and when the user chooses cooling, the initial single setpoint temperature is set to 80° F., or some other appropriate cooling setpoint temperature. In other implementations, the default beginning schedule can be one of a plurality of predetermined template schedules that ° is selected directly or indirectly by the user at the initial setup interview. FIG. 41A illustrates an example of a default beginning schedule having heating setpoints labeled "a" through "g".

In step 4006, a new monitoring period is begun. The selection of a one-day monitoring period has been found to provide good results in the case of control-schedule acquisition in an intelligent thermostat. However, other monitoring periods can be used, including multi-day blocks of time, sub-day blocks of time, other suitable periods, and can alternatively be variable, random, or continuous. For example, when performed on a continuous basis, any user setpoint change or scheduled setpoint input can be used as a trigger for processing that information in conjunction with the present schedule to produce a next version, iteration, or refinement of the schedule. For one implementation, in which the thermostat 3302 is a power-stealing thermostat having a rechargeable battery, the period of one day has been found to provide a suitable balance between the freshness of the schedule revisions and the need to maintain a modest computing load on the head unit microprocessor to preserve battery power.

Figure 41B:
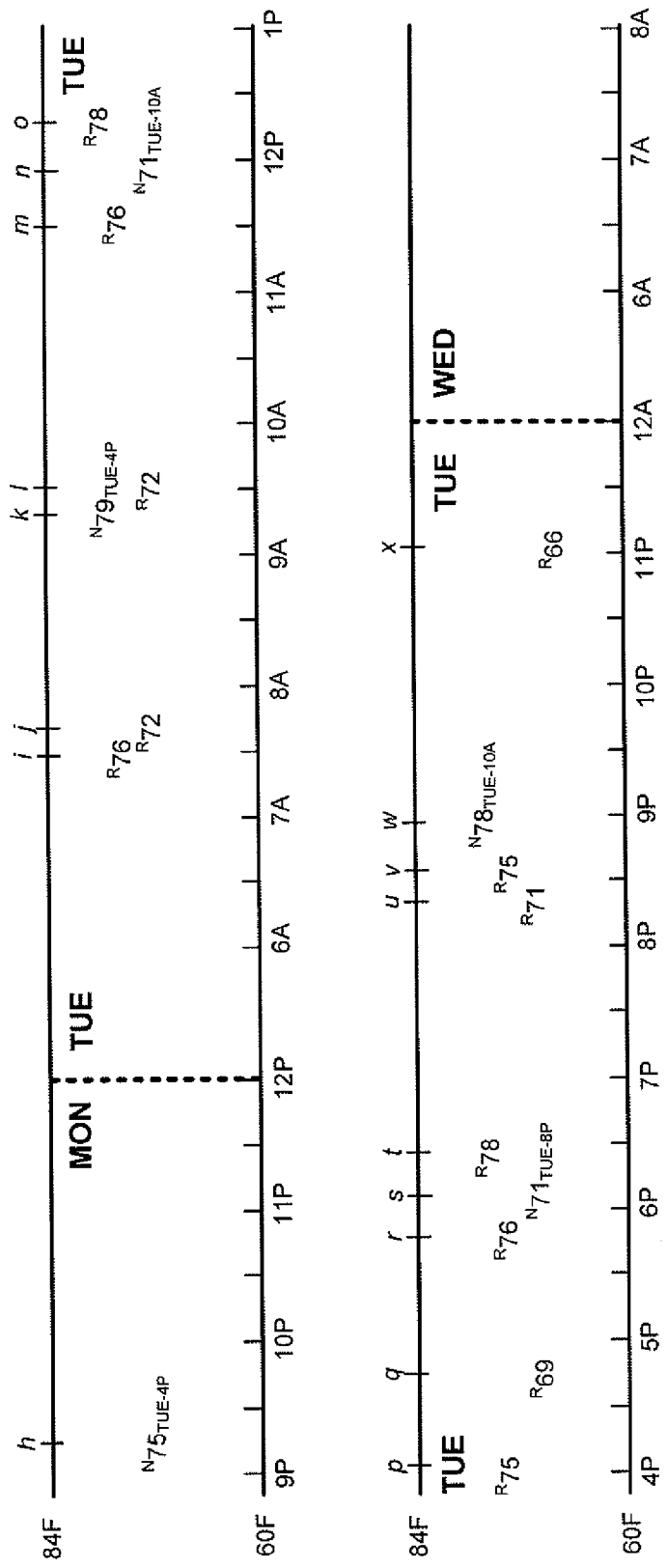

In step 4008, throughout the day, the intelligent thermostat 3302 receives and stores both immediate-control and schedule-change inputs. FIG. 41B shows a representation of a plurality of immediate-control and schedule-change user setpoint entries that were made on a typical day of initial learning, which happens to be a Tuesday in the currently described example. In the following discussion and in the accompanying drawings, including FIGS. 41A-41M, a preceding superscript "N" identifies a schedule-change, or non-real-time ("NRT"), setpoint entry and a preceding superscript "R" identifies an immediate-control, or real-time ("RT") setpoint entry. An encircled number represents a pre-existing scheduled setpoint. For each NRT setpoint, a succeeding subscript that identifies the entry time of that NRT setpoint is also provided. No such subscript is needed for RT setpoints, since their horizontal position on the schedule is indicative of both their effective time and their entry time. Thus, in the example shown in FIG. 41B, at 7:30 AM a user made an RT setpoint entry "i" having a temperature value of 76° F., at 7:40 AM a user made another RT setpoint entry "j" having a temperature value of 72° F., at 9:30 AM a user made another RT setpoint entry "l" having a temperature value of 72° F., at 11:30 AM a user made another RT setpoint entry "m" having a temperature value of 76° F., and so on. On Tuesday, at 10 AM, a user created, through a scheduling interface, an NRT setpoint entry "n" that is to take effect on Tuesdays at 12:00 PM and created an NRT setpoint entry "w" that is to take effect on Tuesdays at 9:00 PM. Subsequently, on Tuesday at 4:00 PM, a user created an NRT setpoint entry "h" that is to take effect on Mondays at 9:15 PM and created an NRT setpoint entry "k" that was to take effect on Tuesdays at 9:15 AM. Finally, on Tuesday at 8 PM, a user created an NRT setpoint entry "s" that is to take effect on Tuesdays at 6:00 PM.

Referring now to step 4010, throughout the 24-hour monitoring period, the intelligent thermostat controls the HVAC system according to whatever current version of the control schedule is in effect as well as whatever RT setpoint entries are made by the user and whatever NRT setpoint entries have been made that are causally applicable. The effect of an RT setpoint entry on the current setpoint temperature is maintained until the next pre-existing setpoint is encountered, until a causally applicable NRT setpoint is encountered, or until a subsequent RT setpoint entry is made. Thus, with reference to FIGS. 41A-41B, on Tuesday morning, at 6:45 PM, the current operating setpoint of the thermostat changes to 73° F. due to pre-existing setpoint "b," then, at 7:30 AM, the current operating setpoint changes to 76° F. due to RT setpoint entry "i," then, at 7:45 AM, the current operating setpoint changes to 72° F. due to RT setpoint entry "j," then, at 8:15 AM, the current operating setpoint changes to 65° F. due to pre-existing setpoint entry "c," then, at 9:30 AM, the current operating setpoint changes to 72° F. due to RT setpoint entry "l," then, at 11:30 AM, the current operating setpoint changes to 76° F. due to RT setpoint entry "m," then at 12:00 PM the current operating setpoint changes to 71° F. due to NRT setpoint entry "n," then, at 12:15 PM, the current operating setpoint changes to 78° F., due to RT setpoint entry "o," and so forth. At 9:15 AM, there is no change in the current setpoint due to NRT setpoint entry "k" because it did not yet exist. By contrast, the NRT setpoint entry "n" is causally applicable because it was entered by the user at 10 AM that day and took effect at its designated effective time of 12:00 PM.

According to one optional alternative embodiment, step 4010 can be carried out so that an RT setpoint entry is only effective for a maximum of 2 hours, or other relatively brief interval, as the operating setpoint temperature, with the operating setpoint temperature returning to whatever temperature would be specified by the pre-existing setpoints on the current schedule or by any causally applicable NRT setpoint entries. This optional alternative embodiment is designed to encourage the user to make more RT setpoint entries during the initial learning period so that the learning process can be achieved more quickly. As an additional optional alternative, the initial schedule, in step 4004, is assigned with relatively low-energy setpoints, as, for example, relatively low-temperature setpoints in winter, such as 62° F., which generally produces a lower-energy control schedule. As yet another alternative, during the first few days, instead of reverting to pre-existing setpoints after 2 hours, the operating setpoint instead reverts to a lowest-energy pre-existing setpoint in the schedule.

Figure 40A:
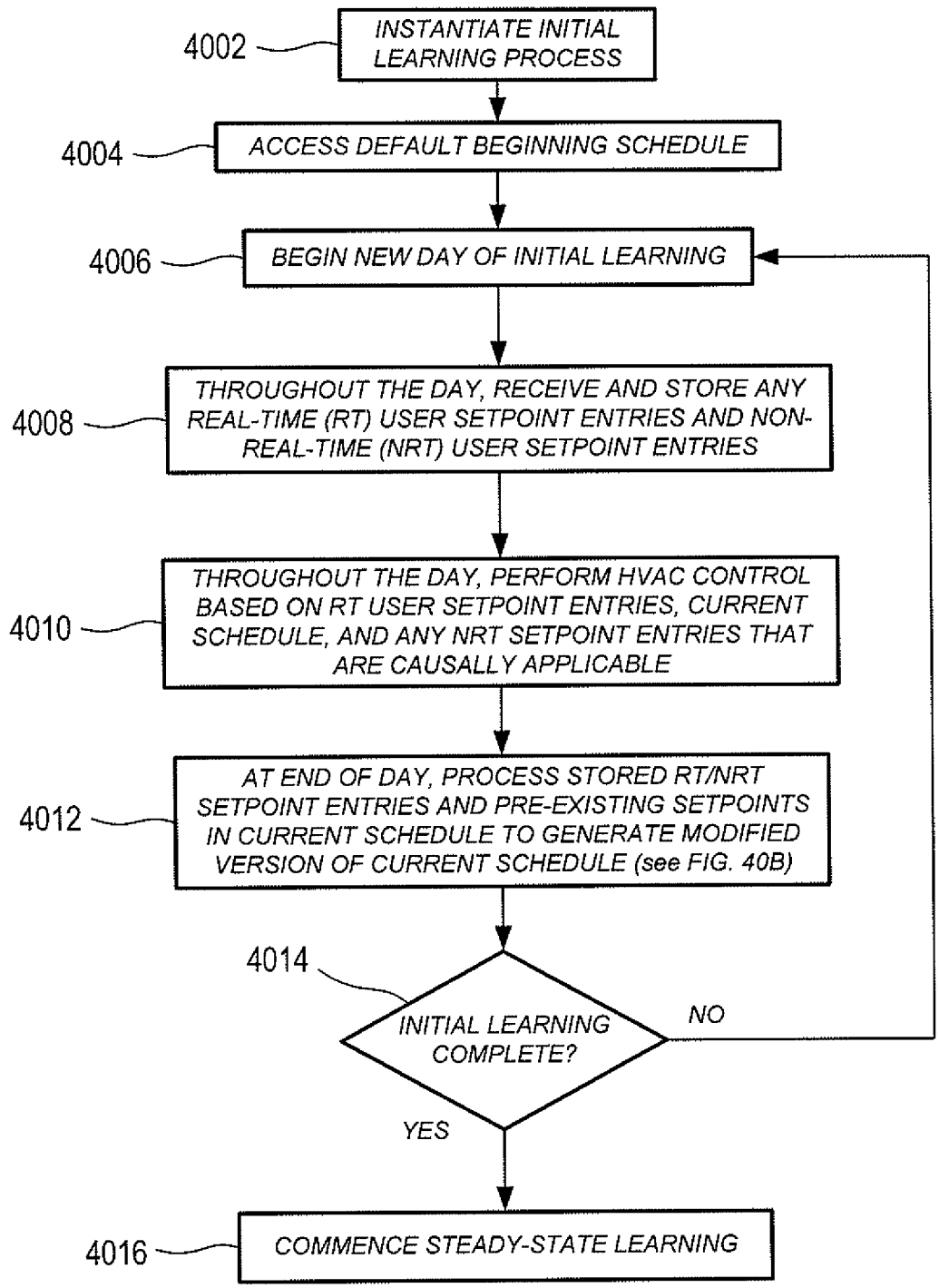
FIGS. 40A-D illustrate steps for achieving initial learning.
Figure 40B:
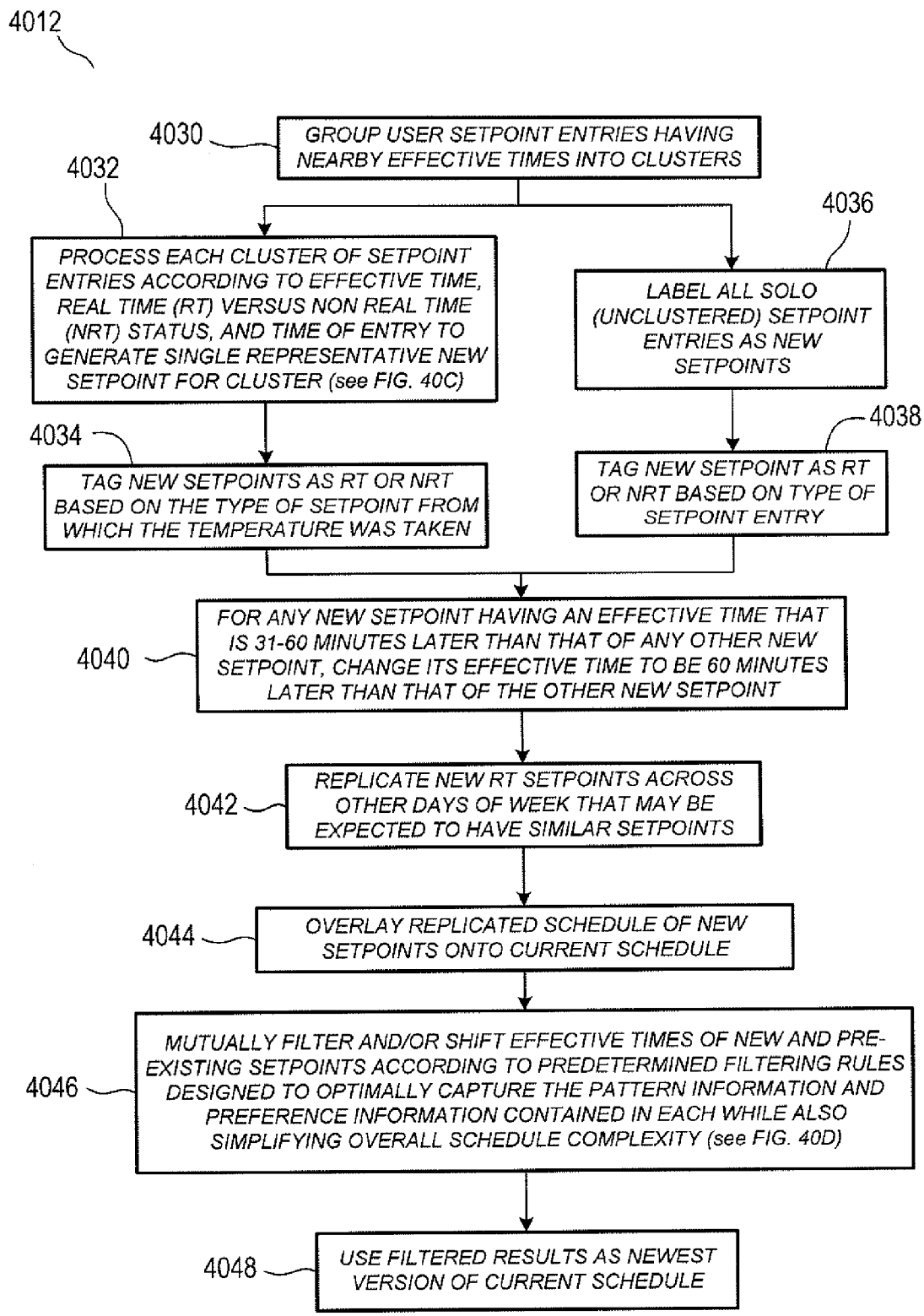

Referring now to step 4012, at the end of the monitoring period, the stored RT and NRT setpoints are processed with respect to one another and the current schedule to generate a modified version, iteration, or refinement of the schedule, the particular steps for which are shown in FIG. 40B. This processing can be carried out, for example, at 11:50 PM of the learning day, or at some other time near or around midnight. When it is determined that the initial learning is not yet complete, in step 4014, the modified version of the schedule is used for another day of initial learning, in steps 4006-4010, is yet again modified in step 4012, and the process continues until initial learning is complete. When initial learning is complete, steady-state learning begins in step 4016, described below with respect to FIGS. 32A-33.

For some implementations, the decision, in step 4014, regarding whether or not the initial control-schedule learning is complete is based on both the passage of time and whether there has been a sufficient amount of user behavior to record and process. For one implementation, the initial learning is considered to be complete only when two days of initial learning have passed and there have been ten separate one-hour intervals in which a user has entered an RT or NRT setpoint. Any of a variety of different criteria can be used to determine whether there has been sufficient user interaction to conclude initial learning.

Figure 41C:
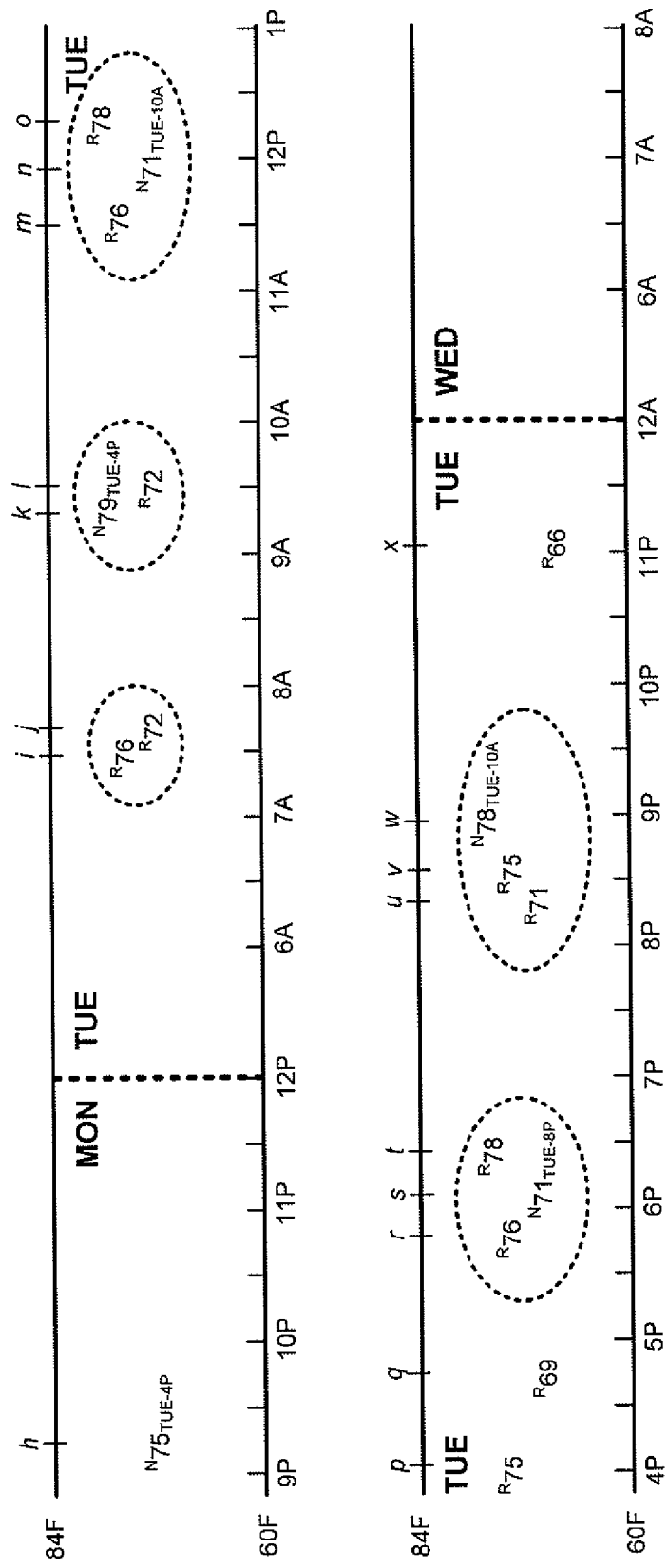

FIG. 40B illustrates steps for processing stored RT and NRT setpoints that correspond generally to step 4012 of FIG. 40A. In step 4030, setpoint entries having nearby effective times are grouped into clusters, as illustrated in FIG. 41C. In one implementation, any set of two or more setpoint entries for which the effective time of each member is separated by less than 30 minutes from that of at least one other member constitutes a single cluster.

In step 4032, each cluster of setpoint entries is processed to generate a single new setpoint that represents the entire cluster in terms of effective time and temperature value. This process is directed to simplifying the schedule while, at the same time, best capturing the true intent of the user by virtue of the user's setpoint-entry behavior. While a variety of different approaches, including averaging of temperature values and effective times of cluster members, can be used, one method for carrying out step 4032, described in more detail in FIG. 40C, takes into account the NRT vs. RT status of each setpoint entry, the effective time of each setpoint entry, and the entry time of each setpoint entry.

Figure 40C:
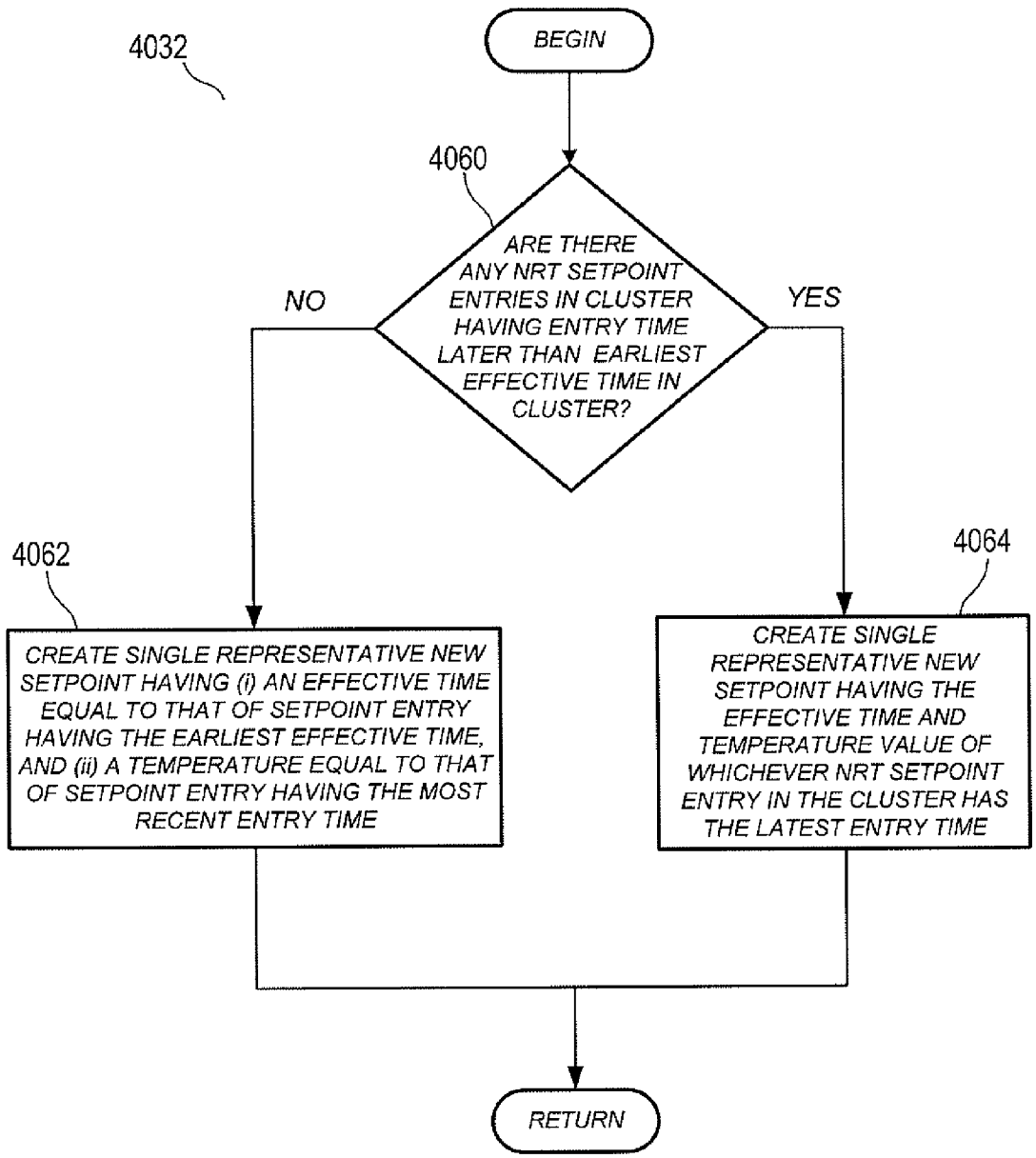

Referring now to FIG. 40C, which corresponds to step 4032 of FIG. 40B, a determination is made, in step 4060, whether there are any NRT setpoint entries in the cluster having an entry time that is later than the earliest effective time in the cluster. When this is the case, then, in step 4064, the cluster is replaced by a single representative setpoint with both the effective time and the temperature value of the latest-entered NRT setpoint entry. This approach provides deference to the wishes of the user who has taken the time to specifically enter a desired setpoint temperature for that time. When, in step 4060, there are no such NRT setpoint entries, then, in step 4062, the cluster is replaced by a single representative setpoint with an effective time of the earliest effective cluster member and a setpoint temperature equal to that of the cluster member having the latest entry time. This approach provides deference to the wishes of the user as expressed in the immediate-control inputs and existing setpoints.

Referring again to FIG. 40B, in step 4034, the new representative setpoint that determined in step 4032 is tagged with an "RT" or "NRT" label based on the type of setpoint entry from which the setpoint's temperature value was assigned. Thus, in accordance with the logic of FIG. 40C, were an NRT setpoint to have the latest-occurring time of entry for the cluster, the new setpoint would be tagged as "NRT." Were an RT setpoint to have the latest-occurring time of entry, the new setpoint would be tagged as "RT." In steps 4036-4038, any singular setpoint entries that are not clustered with other setpoint entries are simply carried through as new setpoints to the next phase of processing, in step 4040.

Figure 41D:
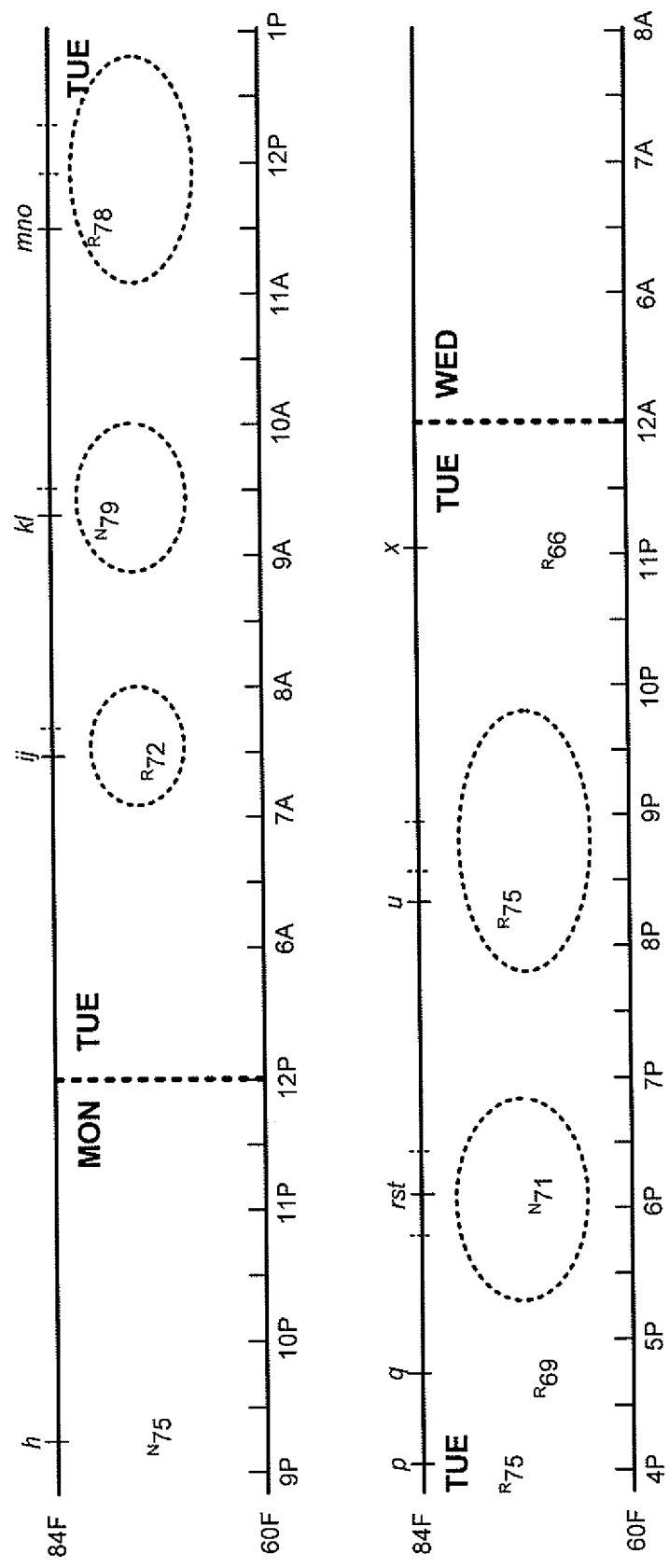

Referring to FIGS. 41C-41D, it can be seen that, for the "ij" cluster, which has only RT setpoint entries, the single representative setpoint "ij" is assigned to have the earlier effective time of RT setpoint entry "i" while having the temperature value of the later-entered RT setpoint entry "j," representing an application of step 4062 of FIG. 40C, and that new setpoint "ij" is assigned an "RT" label in step 4034. It can further be seen that, for the "kl" cluster, which has an NRT setpoint "k" with an entry time later than the earliest effective time in that cluster, the single representative setpoint "kl" is assigned to have both the effective time and temperature value of the NRT setpoint entry "k," representing an application of step 4064 of FIG. 40C, and that new setpoint "kl" is assigned an "NRT" label in step 4034. For the "mno" cluster, which has an NRT setpoint "n" but with an entry time earlier than the earliest effective time in that cluster, the single representative setpoint "mno" is assigned to have the earliest effective time of RT setpoint entry "m" while having the temperature value of the latest-entered setpoint entry "o," again representing an application of step 4062 of FIG. 40C, and that new setpoint "mno" is assigned an "RT" label in step 4034. The remaining results shown in FIG. 41D, all of which are also considered to be new setpoints at this stage, also follow from the methods of FIGS. 40B-40C.

Figure 41E:
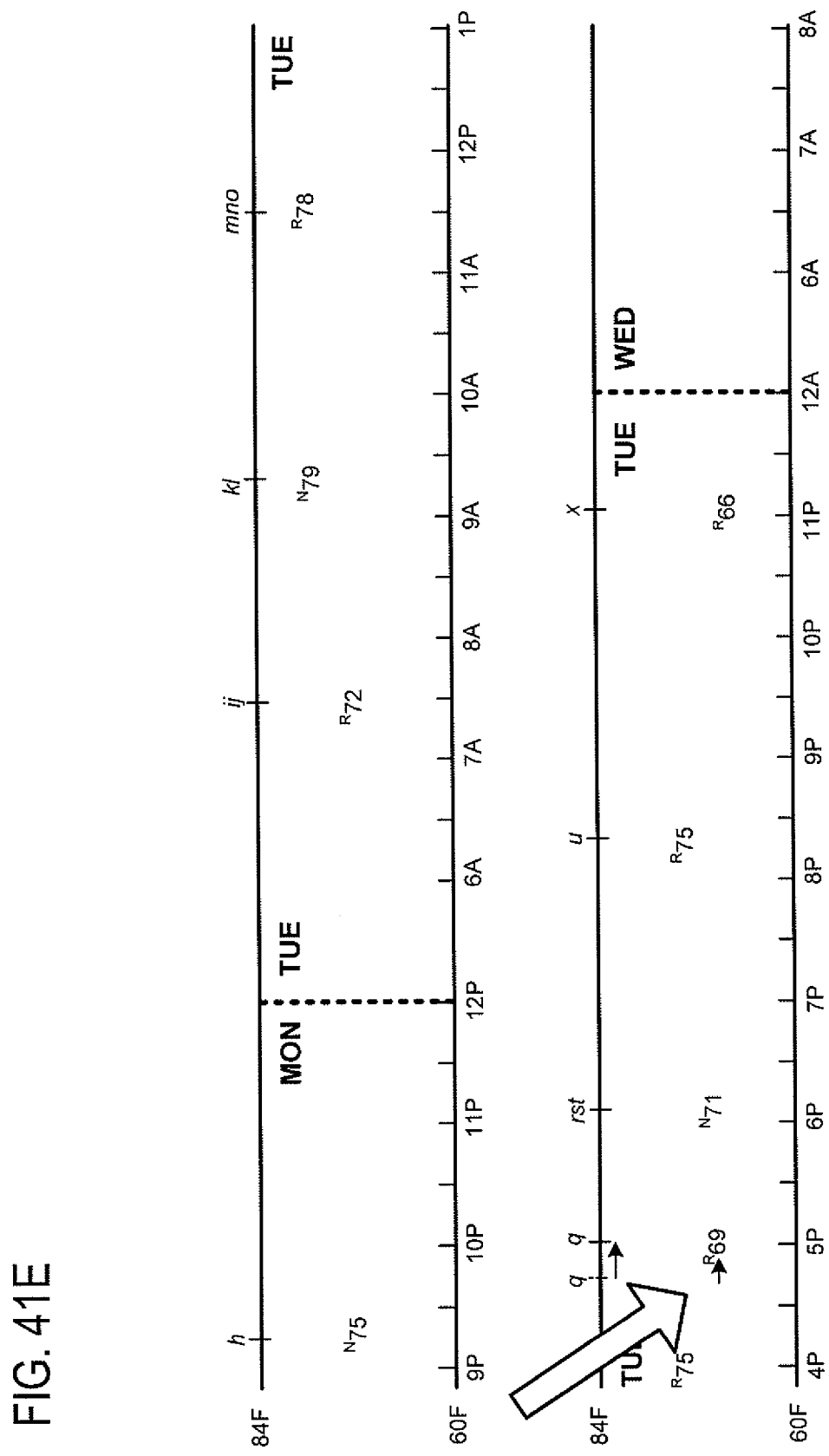

Referring again to FIG. 40B, step 4040 is next carried out after steps 4034 and 4038 and applied to the new setpoints as a group, which are shown in FIG. 41D. In step 4040, any new setpoint having an effective time that is 31-60 minutes later than that of any other new setpoint is moved, in time, to have a new effective time that is 60 minutes later that that of the other new setpoint. This is shown in FIG. 41E with respect to the new setpoint "q," the effective time of which is being moved to 5:00 PM so that it is 60 minutes away from the 4:00 PM effective time of the new setpoint "p." In one implementation, this process is only performed a single time based on an instantaneous snapshot of the schedule at the beginning of step 4040. In other words, there is no iterative cascading effect with respect to these new setpoint separations. Accordingly, while step 4040 results in a time distribution of new setpoint effective times that are generally separated by at least one hour, some new setpoints having effective times separated by less than one hour may remain. These minor variances have been found to be tolerable, and often preferable to deleterious effects resulting from cascading the operation to achieve absolute one-hour separations. Furthermore, these one-hour separations can be successfully completed later in the algorithm, after processing against the pre-existing schedule setpoints. Other separation intervals may be used in alternative implementations.

Referring to step 4042 of FIG. 40B, consistent with the aggressive purposes associated with initial learning, the new setpoints that have now been established for the current learning day are next replicated across other days of the week that may be expected to have similar setpoints, when those new setpoints have been tagged as "RT" setpoints. Preferably, new setpoints tagged as "NRT" are not replicated, since it is likely that the user who created the underlying NRT setpoint entry has already created similar desired NRT setpoint entries. For some implementations that have been found to be well suited for the creation of a weekly schedule, a predetermined set of replication rules is applied. These replication rules depend on which day of the week the initial learning process was first started. The replication rules are optimized to take into account the practical schedules of a large population of expected users, for which weekends are often differently structured than weekdays, while, at the same time, promoting aggressive initial-schedule establishment. For one implementation, the replication rules set forth in Table 1 are applicable.

TABLE 1

| If the First Initial Learning Day was . . . | And the Current Learning Day is . . . | Then Replicate New Setpoints Onto . . . |
|---|---|---|
| Any Day Mon-Thu | Any Day Mon-Fri | All Days Mon-Fri |
| | Sat or Sun | Sat and Sun |
| Friday | Fri | All 7 Days |
| | Sat or Sun | Sat and Sun |
| | Any Day Mon-Thu | All Days Mon-Fri |
| Saturday | Sat or Sun | Sat and Sun |
| | Any Day Mon-Fri | All Days Mon-Fri |

TABLE 1-continued

| If the First Initial Learning Day was . . . | And the Current Learning Day is . . . | Then Replicate New Setpoints Onto . . . |
|---|---|---|
| Sunday | Sun | All 7 Days |
| | Mon or Tue | All 7 Days |
| | Any Day Wed-Fri | All Days Mon-Fri |
| | Sat | Sat and Sun |

Figure 41F:
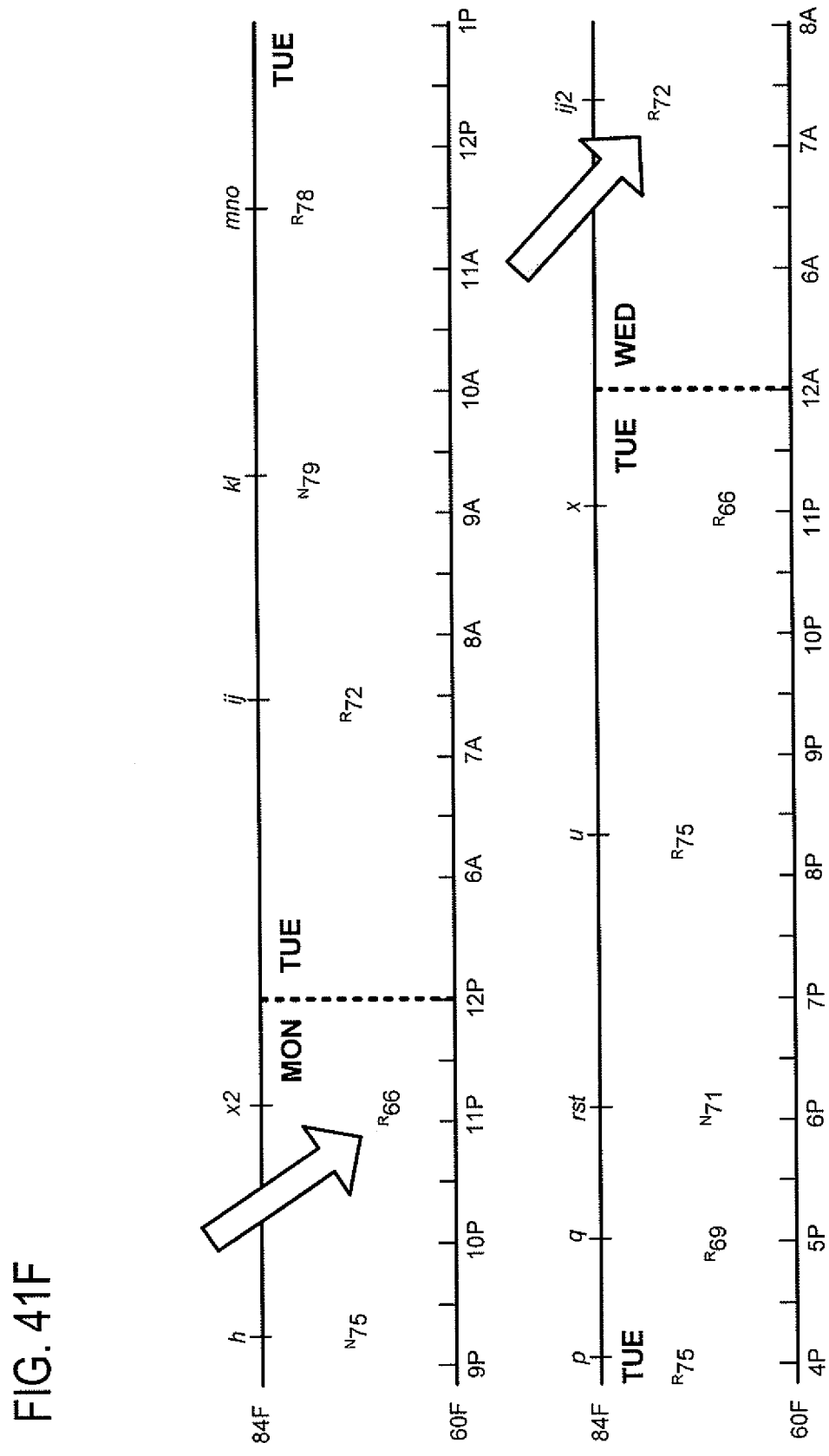

FIG. 41F illustrates effects of the replication of the RT-tagged new setpoints of FIG. 41E, from a Tuesday monitoring period, onto the displayed portions of the neighboring days Monday and Wednesday. Thus, for example, the RT-tagged new setpoint "x," having an effective time of 11:00 PM, is replicated as new setpoint "x2" on Monday, and all other weekdays, and the RT-tagged new setpoint "ij," having an effective time of 7:30 AM, is replicated as new setpoint "ij2" on Wednesday and all other weekdays. As per the rules of Table 1, all of the other RT-tagged new setpoints, including "mno," "p," "q," and "u," are also replicated across all other weekdays. Neither of the NRT-tagged new setpoints "kl" or "rst" is replicated. The NRT user setpoint entry "h," which was entered on Tuesday by a user who desired it to be effective on Mondays, is not replicated.

Figures 1, 40D:
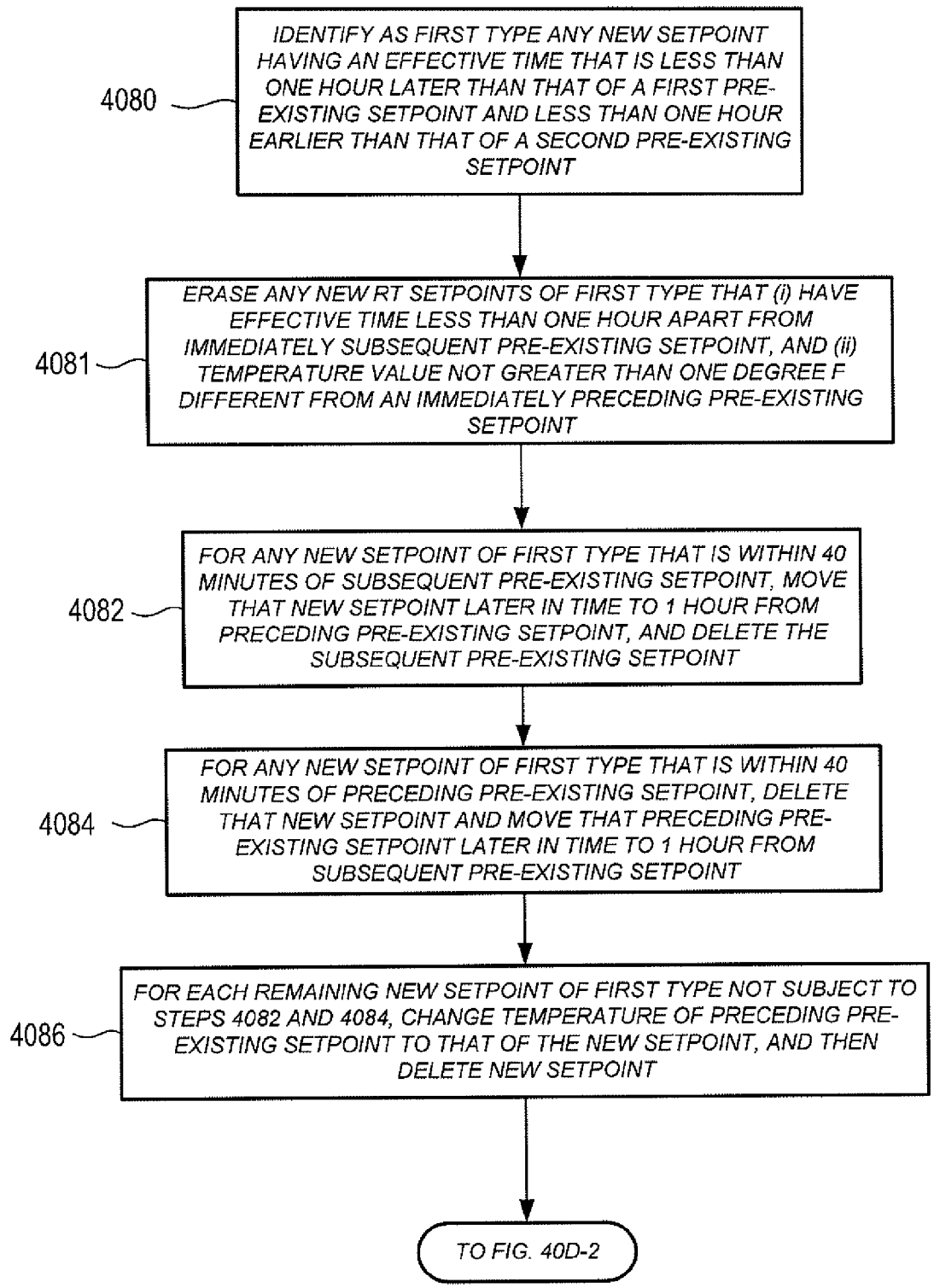
Figures 2, 40D:
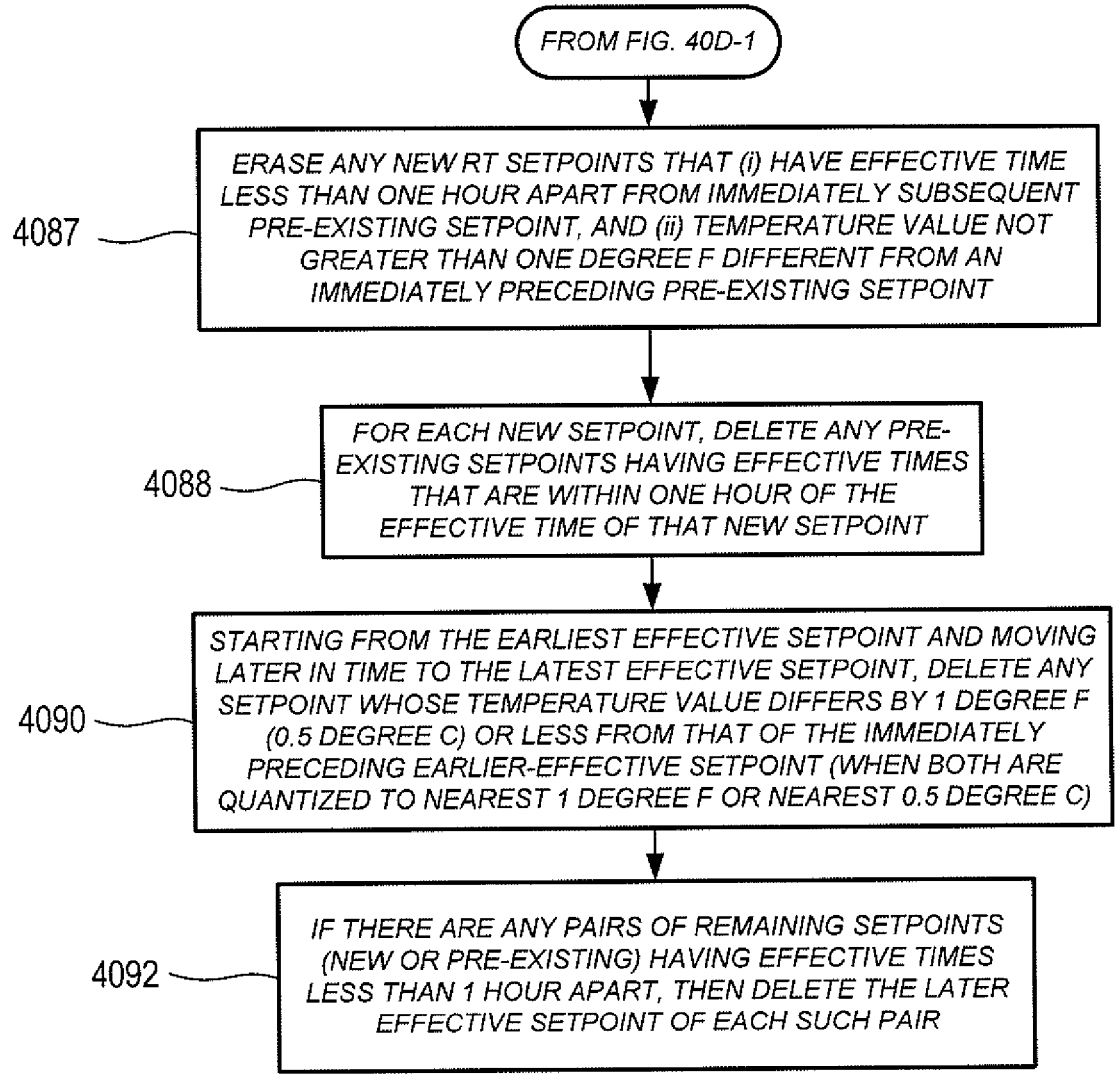
Figure 41G:
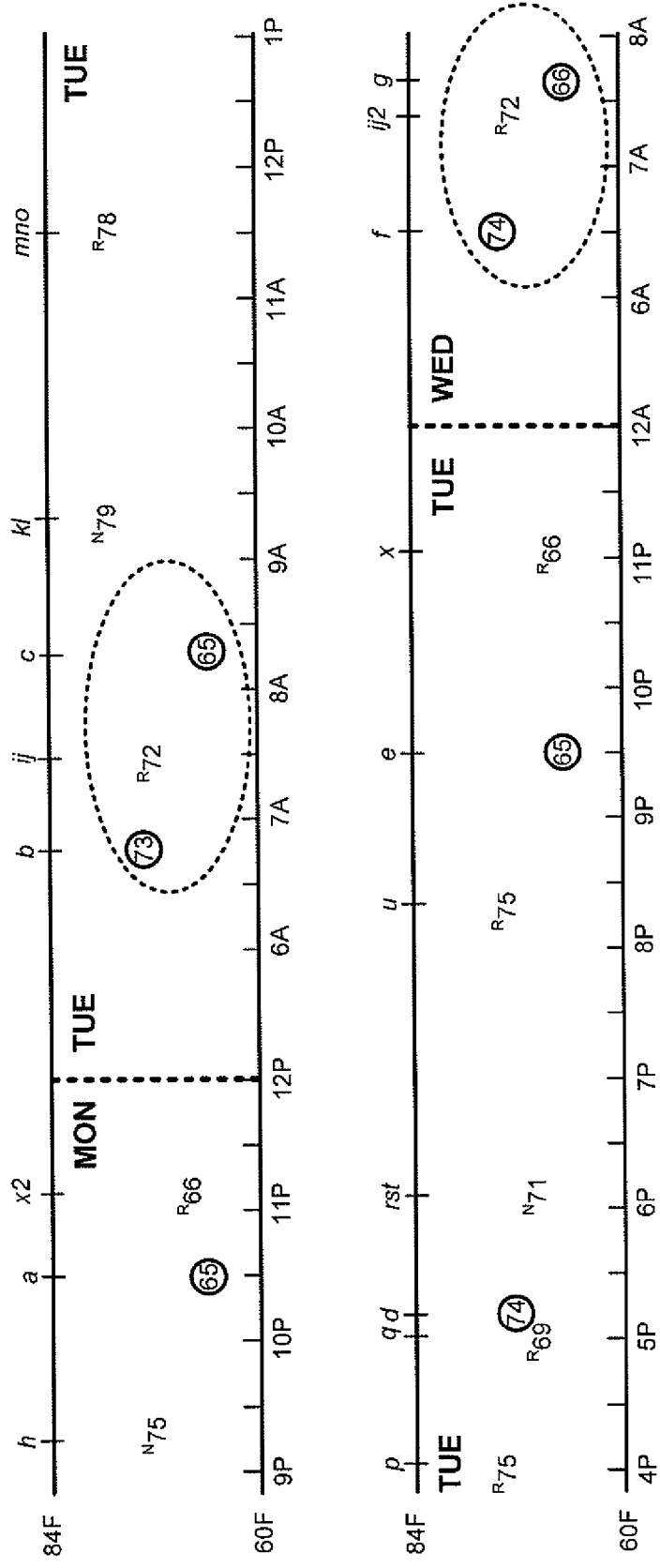

Referring now to step 4044 of FIG. 40B, the new setpoints and replicated new setpoints are overlaid onto the current schedule of pre-existing setpoints, as illustrated in FIG. 41G, which shows the pre-existing setpoints encircled and the new setpoints not encircled. In many of the subsequent steps, the RT-tagged and NRT-tagged new setpoints are treated the same, and, when so, the "RT" and "NRT" labels are not used in describing such steps. In step 4046, a mutual-filtering and/or time-shifting of the new and pre-existing setpoints is carried out according to predetermined filtering rules that are designed to optimally or near optimally capture the pattern information and preference information, while also simplifying overall schedule complexity. While a variety of different approaches can be used, one method for carrying out the objective of step 4046 is described, in greater detail, in FIG. 40D. Finally, in step 4048, the results of step 4046 become the newest version of the current schedule that is either further modified by another initial learning day or that is used as the starting schedule in the steady-state learning process.

Figure 41H:
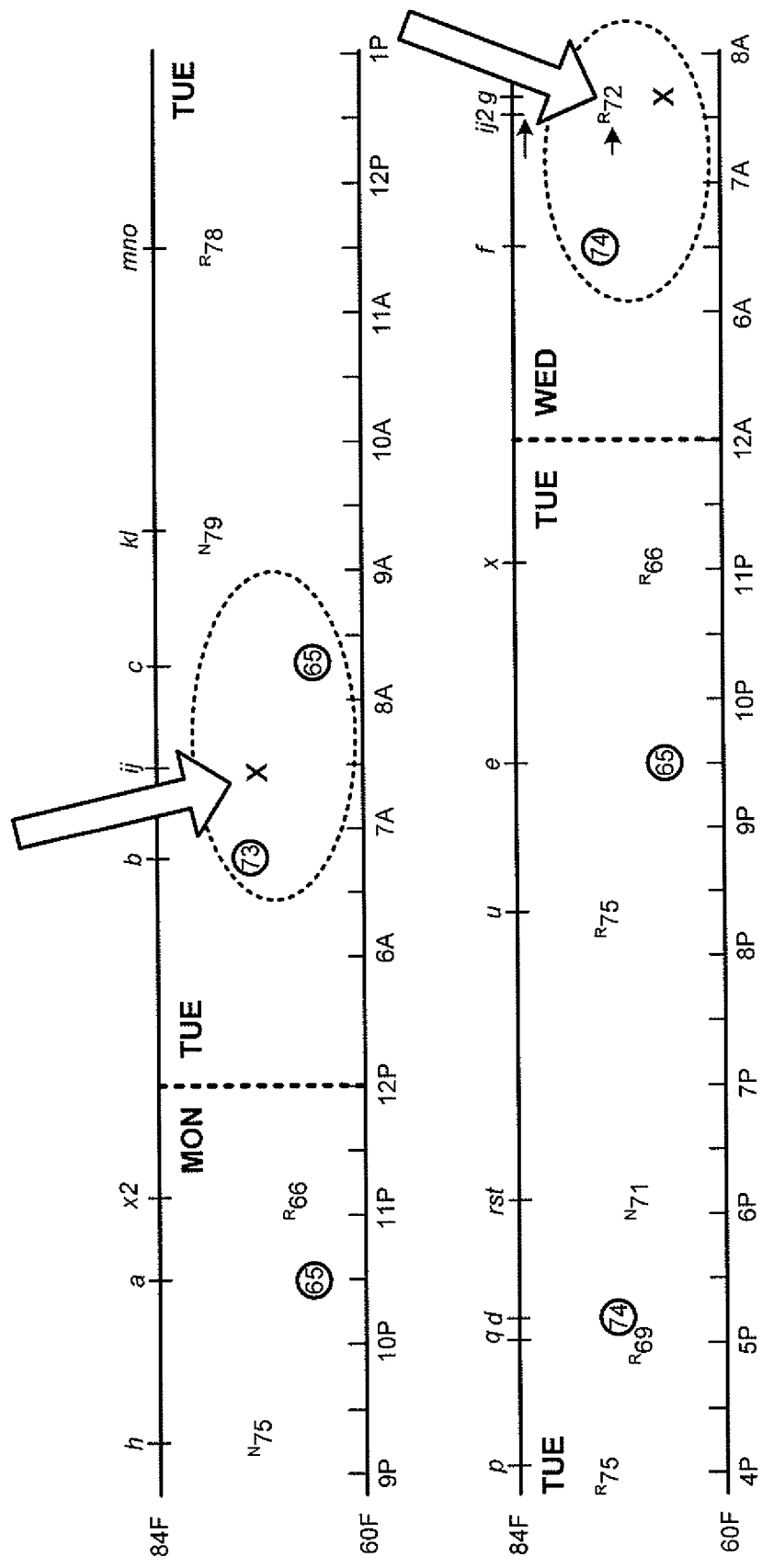

Referring to FIG. 40D, which sets forth one method for carrying out the processing of step 4046 of FIG. 40C, a first type of any new setpoint having an effective time that is less than one hour later than that of a first pre-existing setpoint and less than one hour earlier than that of a second pre-existing setpoint is identified in step 4080. Examples of such new setpoints of the first type are circled in dotted lines in FIG. 41G. The steps of FIG. 40D are carried out for the entire weeklong schedule, even though only a portion of that schedule is shown in FIG. 41G, for explanatory purposes. In step 4081, any new setpoints of the first type are deleted when they have effective times less than one hour earlier than the immediately subsequent pre-existing setpoint and when they have a temperature value that is not more than one degree F. away from that of the immediately preceding pre-existing setpoint. For purposes of step 4081 and other steps in which a nearness or similarity evaluation between the temperature values of two setpoints is undertaken, the comparison of the setpoint values is carried out with respect to rounded versions of their respective temperature values, the rounding being to the nearest one degree F. or to the nearest 0.5 degree C., even though the temperature values of the setpoints may be maintained to a precision of 0.2° F. or 0.1° C. for other operational purposes. When using rounding, for example, two setpoint temperatures of 77.6° F. and 79.4° F. are considered as 1 degree F. apart when each is first rounded to the nearest degree F., and therefore not greater than 1 degree F. apart. Likewise, two setpoint temperatures of 20.8° C. and 21.7° C. will be considered as 0.5 degree C. apart when each is first rounded to the nearest 0.5 degree C., and therefore not greater than 0.5 degree C. apart. When applied to the example scenario at FIG. 41G, new setpoint "ij" falls within the purview of the rule in step 4081, and that new setpoint "ij" is thus deleted, as shown in FIG. 41H.

Subsequent to the deletion of any new setpoints of the first type in step 4081, any new setpoint of the first type that has an effective time that is within 30 minutes of the immediately subsequent pre-existing setpoint is identified in step 4082. When such first-type setpoints are identified, they are moved, later in time, to one hour later than the immediately preceding pre-existing setpoint, and the immediately subsequent pre-existing setpoint is deleted. When applied to the example scenario at FIG. 41G, new setpoint "ij2" falls within the purview of the rule in step 4082 and new setpoint "ij2" is therefore moved, later in time, to one hour from the earlier pre-existing setpoint "f," with the subsequent pre-existing setpoint "g" deleted, as shown in FIG. 41H. Subsequently, in step 4084, any new setpoint of the first type that has an effective time that is within 30 minutes of the immediately preceding pre-existing setpoint there is identified. When such a first-type setpoint is identified, the setpoint is moved, earlier in time, to one hour earlier than the immediately subsequent pre-existing setpoint and the immediately preceding pre-existing setpoint is deleted. In step 4086, for each remaining new setpoint of the first type that is not subject to the purview of steps 4082 or 4084, the setpoint temperature of the immediately preceding pre-existing setpoint is changed to that of the new setpoint and that new setpoint is deleted.

Figure 41I:
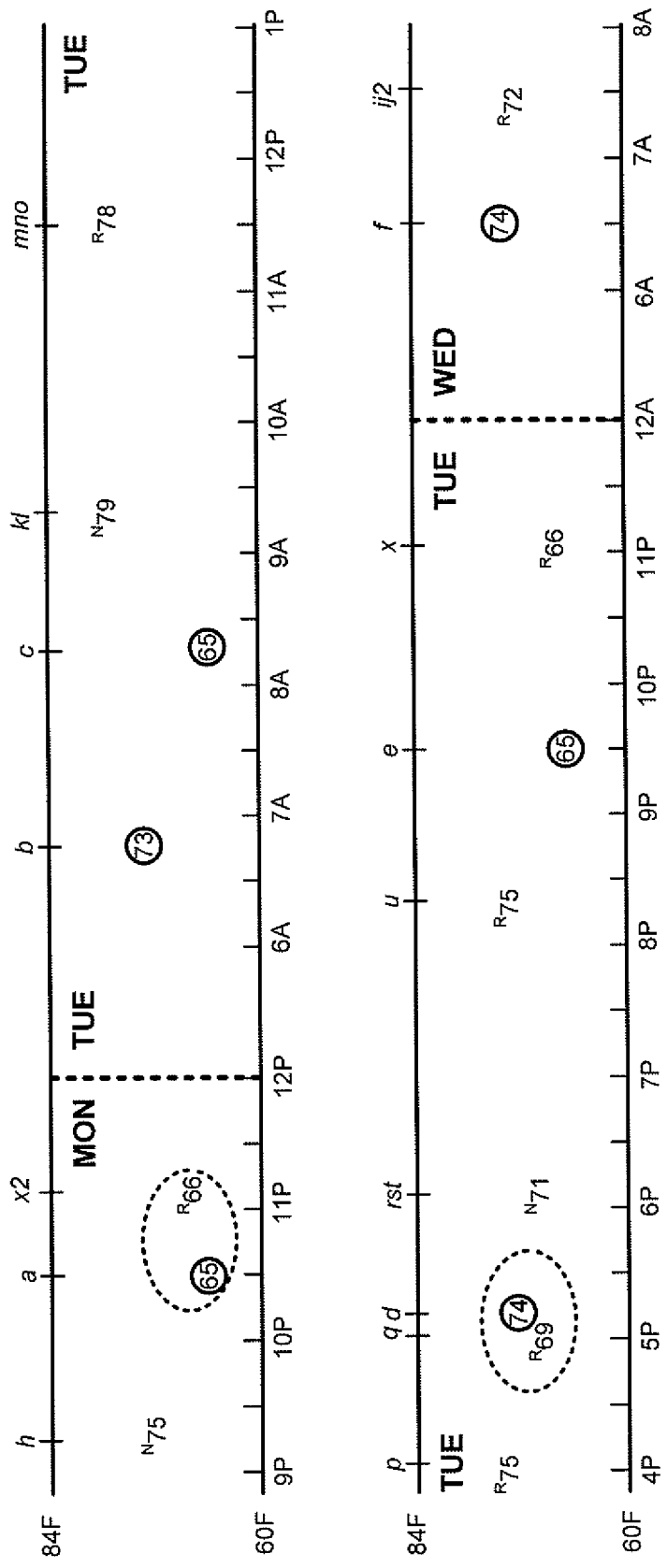
Figure 41J:
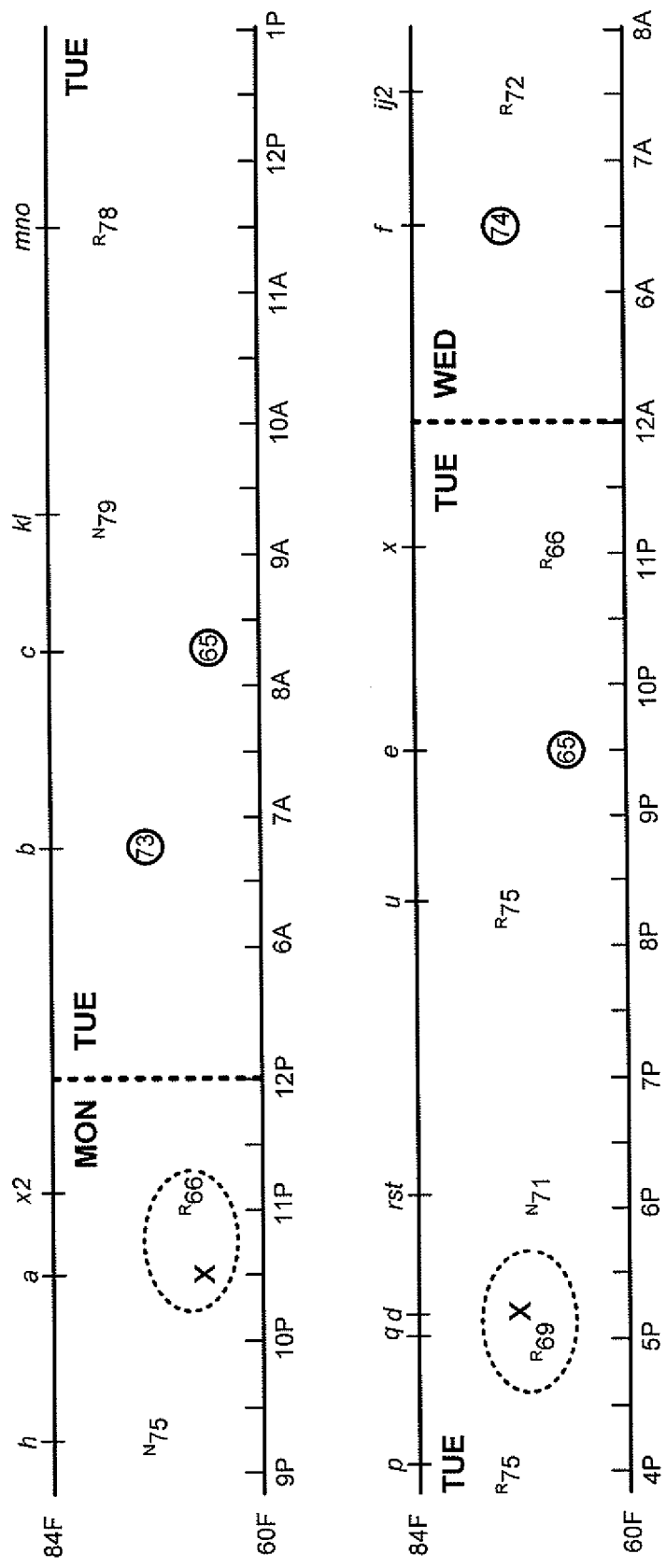

In step 4087, any RT-tagged new setpoint that is within one hour of an immediately subsequent pre-existing setpoint and that has a temperature value not greater than one degree F. different from an immediately preceding pre-existing setpoint is identified and deleted. In step 4088, for each new setpoint, any pre-existing setpoint that is within one hour of that new setpoint is deleted. Thus, for example, FIG. 41I shows a pre-existing setpoint "a" that is less than one hour away from the new setpoint "x2," and so the pre-existing setpoint "a" is deleted, in FIG. 41J. Likewise, the pre-existing setpoint "d" is less than one hour away from the new setpoint "q," and so the pre-existing setpoint "d" is deleted, in FIG. 41J.

Figure 41K:
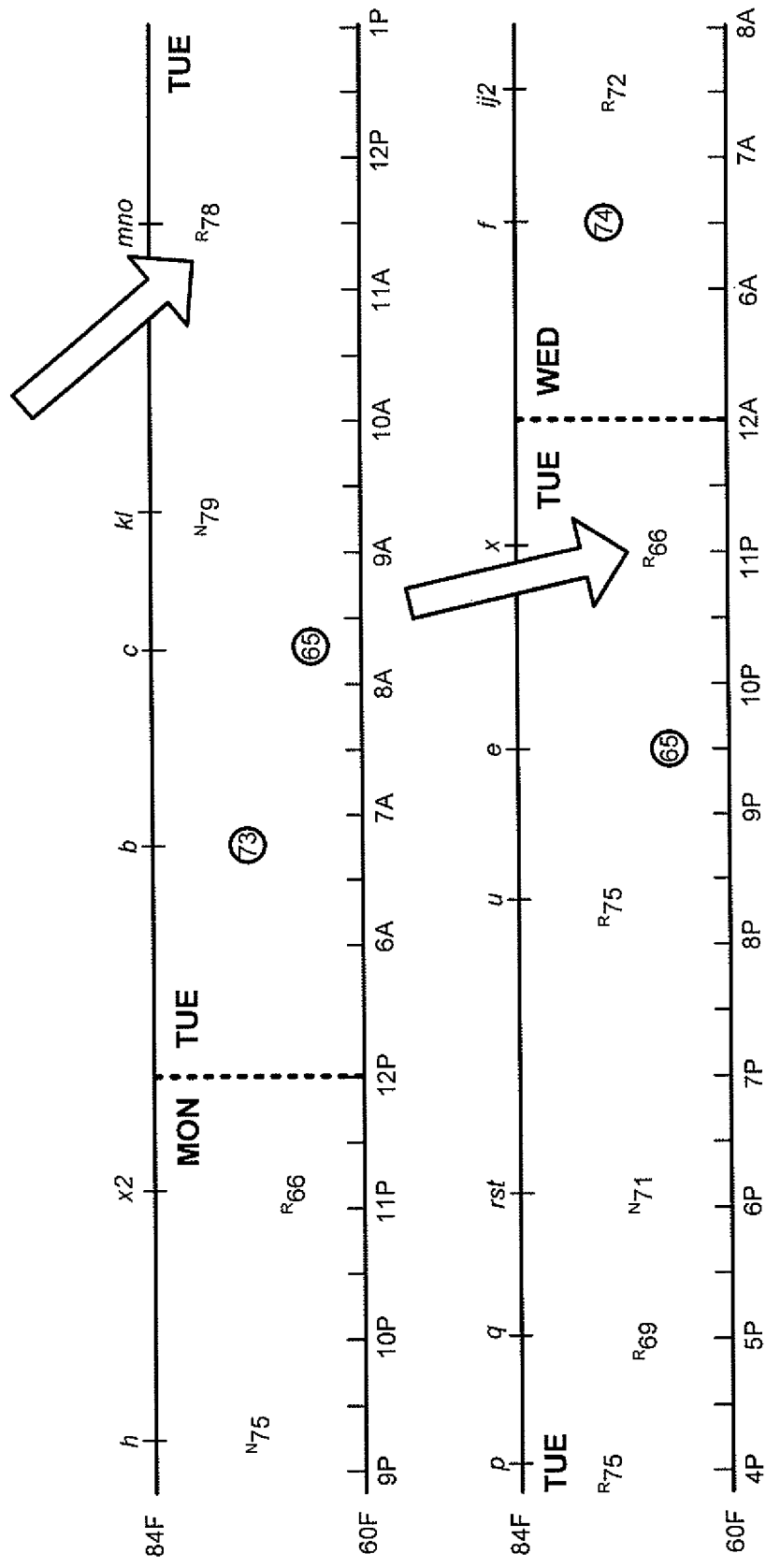
Figure 41L:
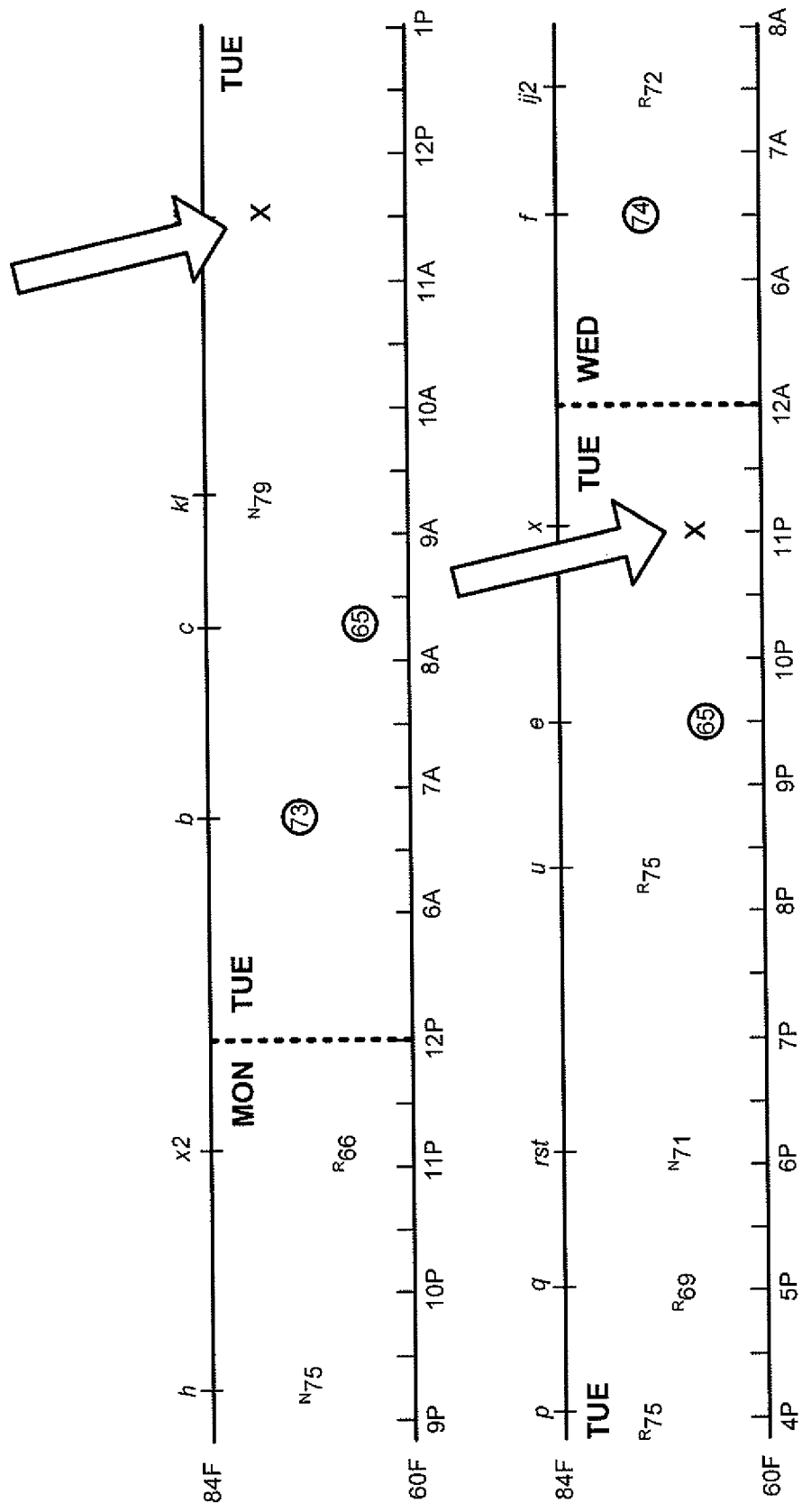
Figure 41M:
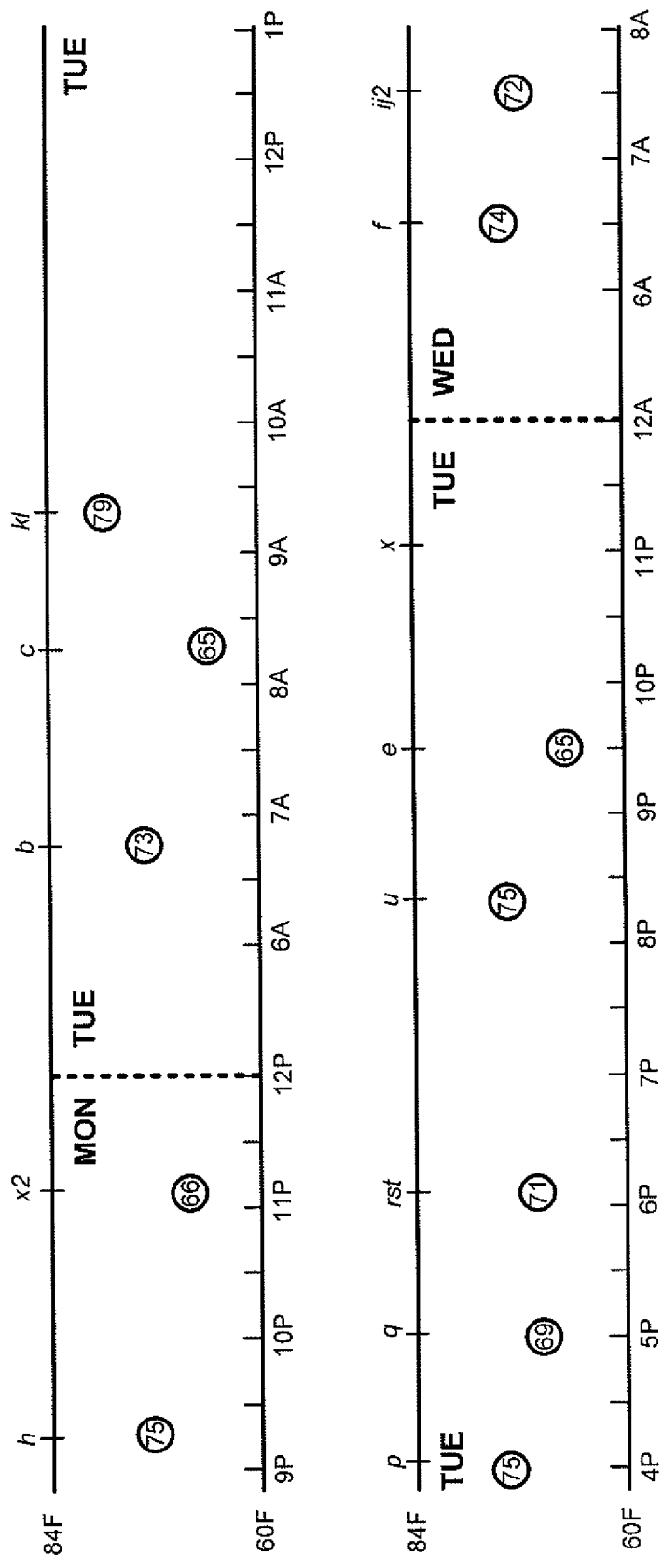

In step 4090, starting from the earliest effective setpoint time in the schedule and moving later in time to the latest effective setpoint time, a setpoint is deleted when the setpoint has a temperature value that differs by not more than 1 degree F. or 0.5 degree C. from that of the immediately preceding setpoint. As discussed above, anchor setpoints, in many implementations, are not deleted or adjusted as a result of automatic schedule learning. For example, FIG. 41K shows the setpoints "mno" and "x" that are each not more than one degree F. from immediately preceding setpoints, and so setpoints "mno" and "x" are deleted, in FIG. 41L. Finally, in step 4092, when there are any remaining pairs of setpoints, new or pre-existing, having effective times that are less than one hour apart, the later effective setpoint of each pair is deleted. The surviving setpoints are then established as members of the current schedule, as indicated in FIG. 41M, all of which are labeled "pre-existing setpoints" for subsequent iterations of the initial learning process of FIG. 40A or, when that process is complete, for subsequent application of steady-state learning, described below. Of course, the various time intervals for invoking the above-discussed clustering, resolving, filtering, and shifting operations may vary, in alternative implementations.

Figure 42A:
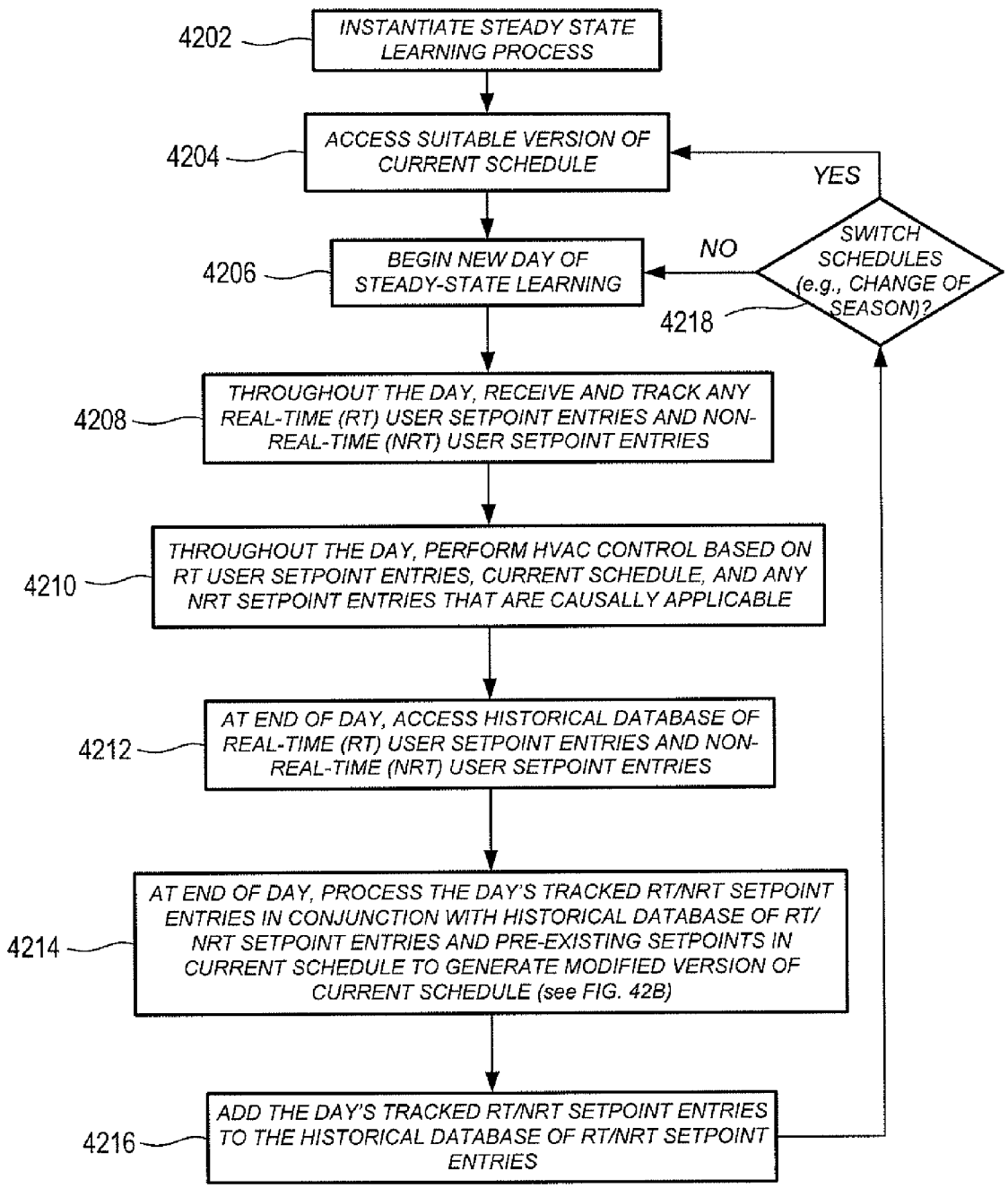
FIGS. 42A-42B illustrate steps for steady-state learning.
Figure 42B:
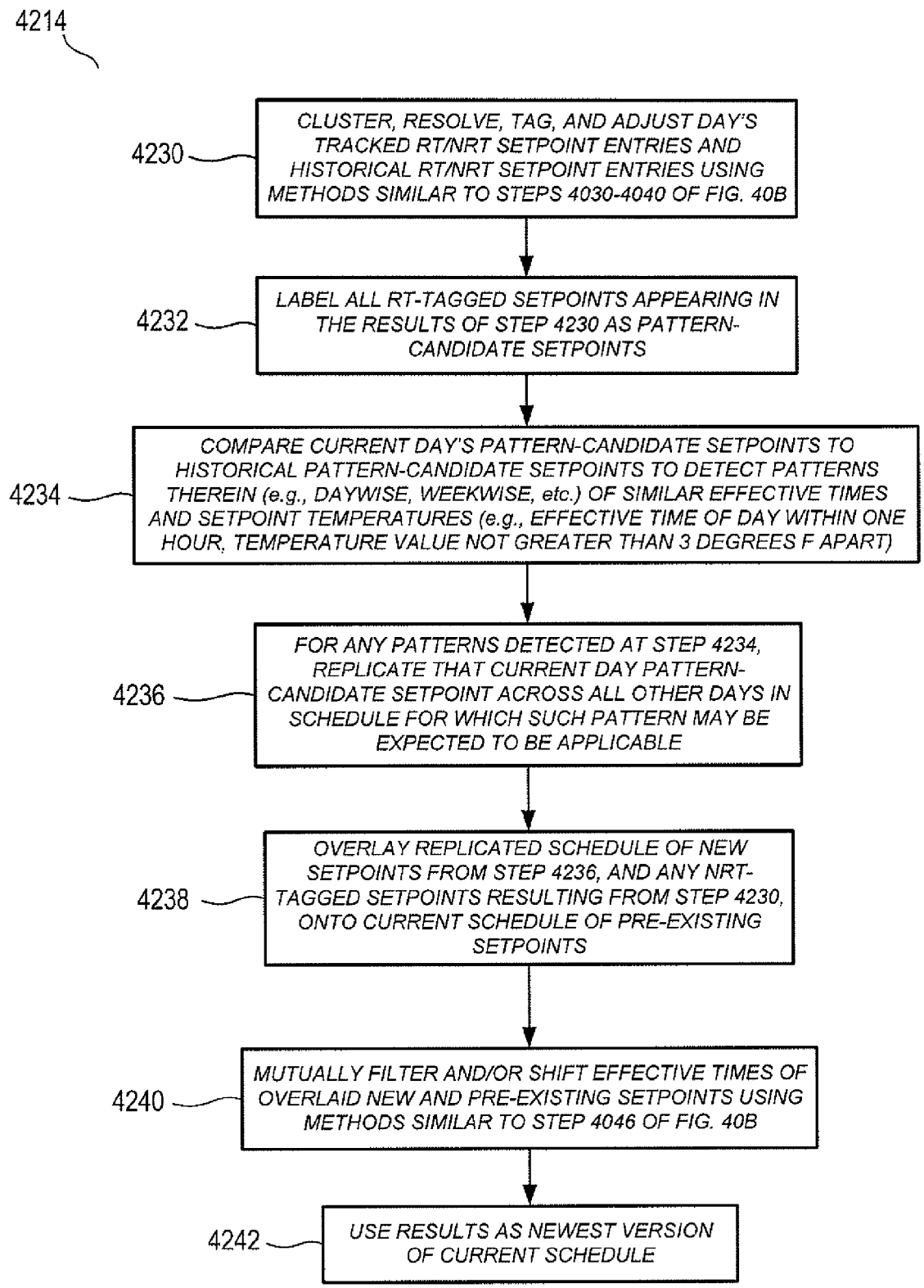

FIGS. 42A-42B illustrate steps for steady-state learning. Many of the same concepts and teachings described above for the initial learning process are applicable to steady-state learning, including the tracking of real-time user setpoint entries and non-real time user setpoint entries, clustering, resolving, replicating, overlaying, and final filtering and shifting.

Certain differences arise between initial and steady state learning, in that, for the steady-state learning process, there is an attention to the detection of historical patterns in the setpoint entries, an increased selectivity in the target days across which the detected setpoint patterns are replicated, and other differences. Referring to FIG. 42A, the steady state learning process begins in step 4202, which can correspond to the completion of the initial learning process (FIG. 40A, step 4016), and which can optionally correspond to a resumption of steady-state learning after a user-requested pause in learning. In step 4204, a suitable version of the current schedule is accessed. When the steady-state learning is being invoked immediately following initial learning, often be the case for a new intelligent-thermostat installation, the control schedule is generally the current schedule at the completion of initial learning.

However, a previously established schedule may be accessed in step 4204, in certain implementations. A plurality of different schedules that were previously built up by the intelligent thermostat 3302 over a similar period in the preceding year can be stored in the thermostat 3302, or, alternatively, in a cloud server to which it has a network connection. For example, there may be a "January" schedule that was built up over the preceding January and then stored to memory on January 31. When step 4204 is being carried out on January 1 of the following year, the previously stored "January" schedule can be accessed. In certain implementations, the intelligent thermostat 3302 may establish and store schedules that are applicable for any of a variety of time periods and then later access those schedules, in step 4204, for use as the next current schedule. Similar storage and recall methods are applicable for the historical RT/NRT setpoint entry databases that are discussed further below.

In step 4206, a new day of steady-state learning is begun. In step 4208, throughout the day, the intelligent thermostat receives and tracks both real-time and non-real time user setpoint entries. In step 4210, throughout the day, the intelligent thermostat proceeds to control an HVAC system according to the current version of the schedule, whatever RT setpoint entries are made by the user, and whatever NRT setpoint entries have been made that are causally applicable.

According to one optional alternative embodiment, step 4210 can be carried out so that any RT setpoint entry is effective only for a maximum of 4 hours, after which the operating setpoint temperature is returned to whatever temperature is specified by the pre-existing setpoints in the current schedule and/or whatever temperature is specified by any causally applicable NRT setpoint entries. As another alternative, instead of reverting to any pre-existing setpoints after 4 hours, the operating setpoint instead reverts to a relatively low energy value, such as a lowest pre-existing setpoint in the schedule. This low-energy bias operation can be initiated according to a user-settable mode of operation.

At the end of the steady-state learning day, such as at or around midnight, processing steps 4212-4216 are carried out. In step 4212, a historical database of RT and NRT user setpoint entries, which may extend back at least two weeks, is accessed. In step 4214, the day's tracked RT/NRT setpoint entries are processed in conjunction with the historical database of RT/NRT setpoint entries and the pre-existing setpoints in the current schedule to generate a modified version of the current schedule, using steps that are described further below with respect to FIG. 42B. In step 4216, the day's tracked RT/NRT setpoint entries are then added to the historical database for subsequent use in the next iteration of the method. Notably, in step 4218, whether there should be a substitution of the current schedule to something that is more appropriate and/or preferable is determined, such as for a change of season, a change of month, or another such change. When a schedule change is determined to be appropriate, a suitable schedule is accessed in step 4204, before the next iteration. Otherwise, the next iteration is begun in step 4206 using the most recently computed schedule. In certain implementations, step 4218 is carried out based on direct user instruction, remote instruction from an automated program running on an associated cloud server, remote instruction from a utility company, automatically based on the present date and/or current/forecasted weather trends, or based on a combination of one or more of the above criteria or other criteria.

Referring to FIG. 42B, which corresponds to step 4214 of FIG. 42A, steps similar to those of steps 4030-4040 of FIG. 40B are carried out in order to cluster, resolve, tag, and adjust the day's tracked RT/NRT setpoint entries and historical RT/NRT setpoint entries. In step 4232, all RT-tagged setpoints appearing in the results of step 4232 are identified as pattern-candidate setpoints. In step 4234, the current day's pattern-candidate setpoints are compared to historical pattern-candidate setpoints to detect patterns, such as day-wise or week-wise patterns, of similar effective times and similar setpoint temperatures. In step 4236, for any such patterns detected in step 4234 that include a current-day pattern-candidate setpoint, the current-day pattern-candidate setpoint is replicated across all other days in the schedule for which such pattern may be expected to be applicable. As an example, Table 2 illustrates one particularly useful set of pattern-matching rules and associated setpoint replication rules.

TABLE 2

| If Today Was... | And the Detected Match is With... | Then Replicate The Matched Support Onto... |
|---|---|---|
| Tue | Yesterday | All Days Mon-Fri |
|  | Last Tuesday | Tuesdays Only |
| Wed | Yesterday | All Days Mon-Fri |
|  | Last Wednesday | Wednesdays Only |
| Thu | Yesterday | All Days Mon-Fri |
|  | Last Thursday | Thursdays Only |
| Fri | Yesterday | All Days Mon-Fri |
|  | Last Friday | Fridays Only |
| Sat | Yesterday | All 7 Days of Week |
|  | Last Saturday | Saturdays Only |
| Sun | Yesterday | Saturdays and Sundays |
|  | Last Sunday | Sundays Only |
| Mon | Yesterday | All 7 Days of Week |
|  | Last Monday | Mondays Only |

For one implementation, in carrying out step 4236, the replicated setpoints are assigned the same effective time of day, and the same temperature value, as the particular current day pattern-candidate setpoint for which a pattern is detected. In other implementations, the replicated setpoints can be assigned the effective time of day of the historical pattern-candidate setpoint that was involved in the match and/or the temperature value of that historical pattern-candidate setpoint. In still other implementations, the replicated setpoints can be assigned the average effective time of day of the current and historical pattern-candidate setpoints that were matched and/or the average temperature value of the current and historical pattern-candidate setpoints that were matched.

In step 4238, the resulting replicated schedule of new setpoints is overlaid onto the current schedule of pre-existing setpoints. Also, in step 4238, any NRT-tagged setpoints resulting from step 4230 are overlaid onto the current schedule of pre-existing setpoints. In step 4240, the overlaid new and pre-existing setpoints are then mutually filtered and/or shifted in effective time using methods similar to those discussed above for step 4046 of FIG. 40B. The results are then established, in step 4242, as the newest version of the current schedule.

Background Schedule Simulation

Figure 43A:
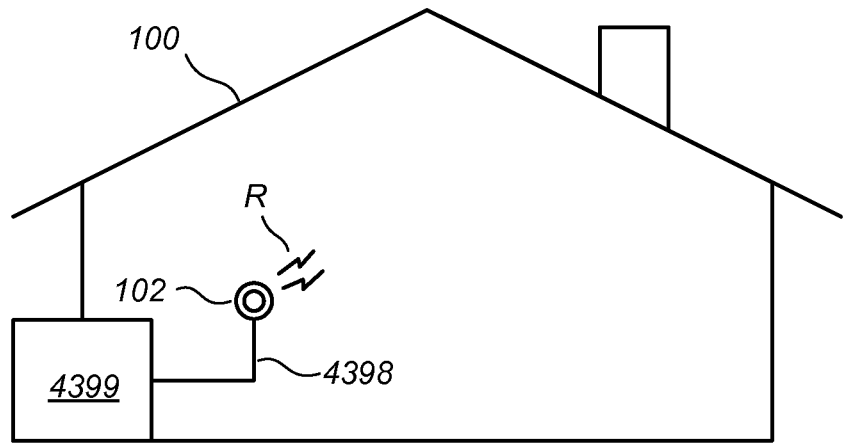
FIG. 43A illustrates the intelligent thermostat as installed in a smart home environment having an HVAC system and a set of control wires extending therefrom.

FIG. 43A illustrates the intelligent thermostat 102 as installed in a smart home environment 100 having an HVAC system 4399 and a set of control wires 4398 extending therefrom. The intelligent thermostat 102 is, of course, extremely well suited for installation by contractors in new home construction and/or in the context of complete HVAC system replacement. However, one alternative key business opportunity leveraged according to one embodiment is the marketing and retailing of the intelligent thermostat 102 as a replacement thermostat in an existing home, wherein the customer (and/or an HVAC professional) disconnects their old thermostat from the existing wires 298 and substitutes in the intelligent thermostat 102.

In either case, the intelligent thermostat 102 can advantageously serve as an "inertial wedge" for inserting an entire energy-saving technology platform into the home. Simply stated, because most homeowners understand and accept the need for home to have a thermostat, even the most curmudgeonly and techno-phobic homeowners will readily accept the simple, non-intimidating, and easy-to-use intelligent thermostat 102 into their homes. Once in the home, of course, the intelligent thermostat 102 will advantageously begin saving energy for a sustainable planet and saving money for the homeowner, including the curmudgeons. Additionally, however, as homeowners "warm up" to the intelligent thermostat 102 platform and begin to further appreciate its delightful elegance and seamless operation, they will be more inclined to take advantage of its advanced features, and they will furthermore be more open and willing to embrace a variety of compatible follow-on products and services as are described further hereinbelow. This is an advantageous win-win situation on many fronts, because the planet is benefitting from the propagation of energy-efficient technology, while at the same time the manufacturer of the intelligent thermostat and/or their authorized business partners can further expand their business revenues and prospects.

Figure 43B:
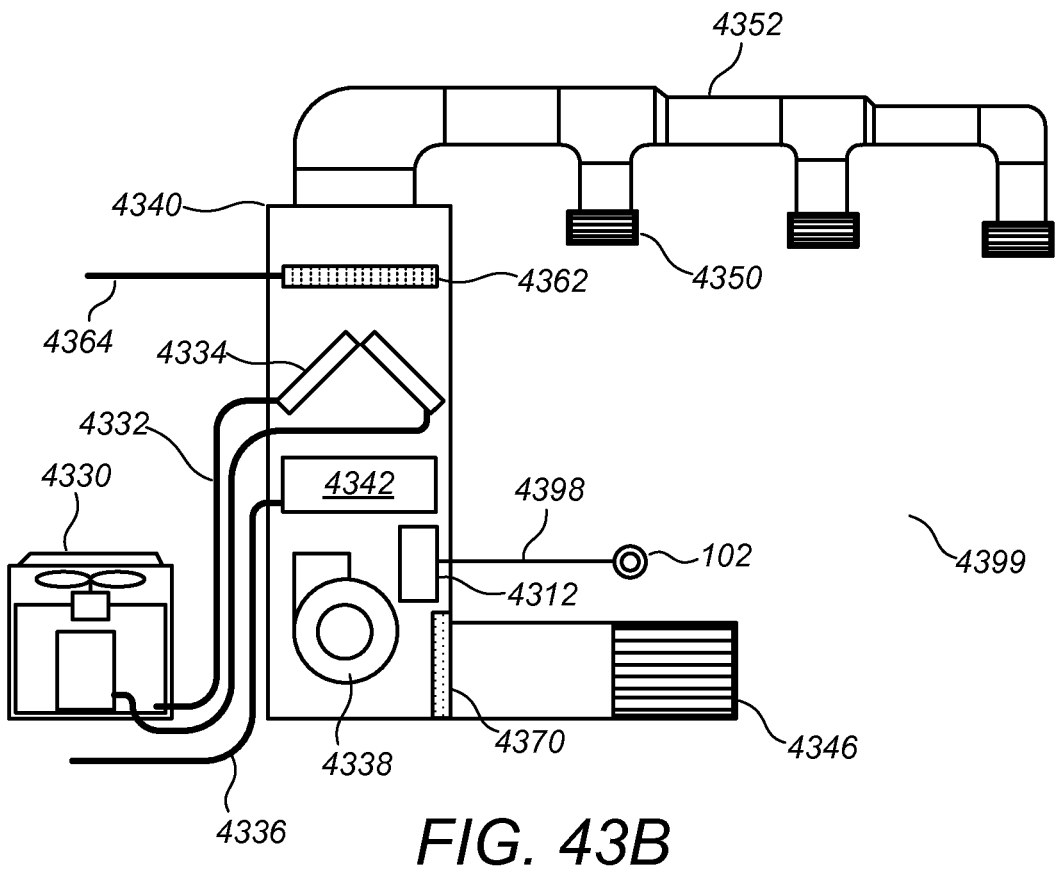
FIG. 43B illustrates an exemplary diagram of the HVAC system of FIG. 43A.

FIG. 43B illustrates an exemplary diagram of the HVAC system 4399 of FIG. 43A. HVAC system 4399 provides heating, cooling, ventilation, and/or air handling for an enclosure, such as the smart home environment 100 depicted in FIG. 43A. The HVAC system 4399 depicts a forced air type heating system, although according to other embodiments, other types of systems could be used. In heating, heating coils or elements 4342 within air handler 4340 provide a source of heat using electricity or gas via line 4336. Cool air is drawn from the enclosure via return air duct 4346 through filter 4370 using fan 4338 and is heated by the heating coils or elements 4342. The heated air flows back into the enclosure at one or more locations through a supply air duct system 4352 and supply air grills such as grill 4350. In cooling, an outside compressor 4330 passes a gas such as Freon through a set of heat exchanger coils to cool the gas. The gas then goes via line 4332 to the cooling coils 4334 in the air handlers 4340 where it expands, cools and cools the air being circulated through the enclosure via fan 4338. According to some embodiments a humidifier 4362 is also provided which moistens the air using water provided by a water line 4364. Although not shown in FIG. 43B, according to some embodiments the HVAC system for the enclosure has other known components such as dedicated outside vents to pass air to and from the outside, one or more dampers to control airflow within the duct systems, an emergency heating unit, and a dehumidifier. The HVAC system is selectively actuated via control electronics 4312 that communicate with the intelligent thermostat 102 over control wires 4398.

Figure 44:
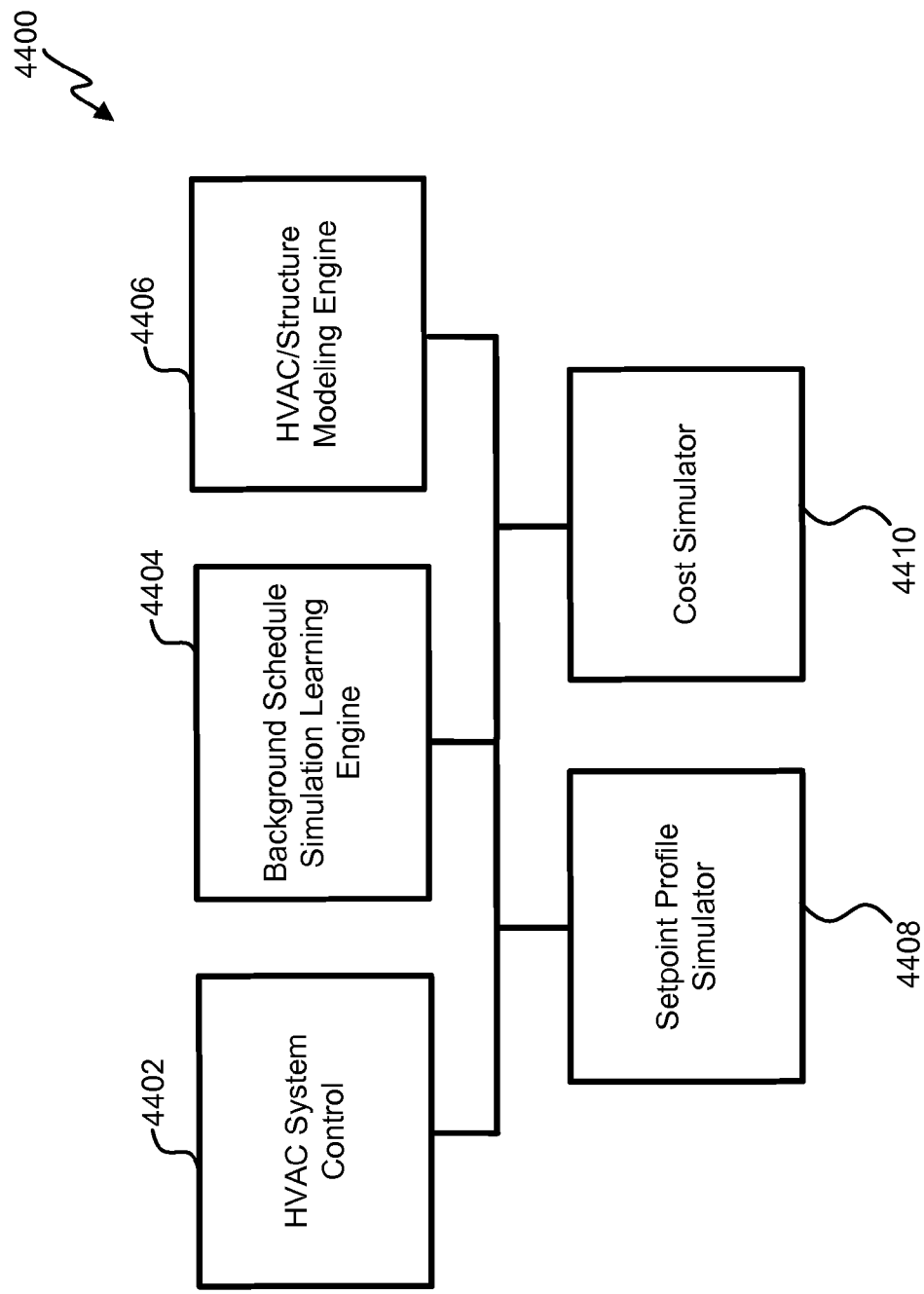
FIG. 44 illustrates components of a background schedule simulation system.

FIG. 44 illustrates one embodiment of components of a background schedule simulation system 4400. The background schedule simulation system 4400 can generate simulation data indicating a simulated energy consumption and/or a simulated energy cost over a period of time. This generated energy consumption and/or simulated energy cost can then be compared to the actual energy consumption and/or actual energy cost over the same period of time. Advantageously, this comparison can be used to incentivize a user, even the most environmentally unfriendly user, to conserve energy by displaying the comparative cost of the inefficient energy consumption.

The background schedule simulation system 4400 can be a component of the smart home environment 100, and can be co-located within the intelligent thermostat 102. In some embodiments, the background schedule simulation system can be configured to receive inputs from and provide outputs to other components of the smart home environment 100. These inputs can be environmental inputs including data relating to an environmental parameter of a climate controlled enclosure within the smart home environment 100, such as the ambient temperature within a building, including a home, or within a portion of the building, including a room, data relating to environmental parameter of the area outside of the climate controlled enclosure, such as the ambient temperature outside the building or outside a portion of the building, data relating to the human occupancy of the climate controlled enclosure including, for example, whether a human is in the climate controlled enclosure, energy price information, and energy consumption information.

In some embodiments, the inputs received by the background schedule simulation system 4400 can include user inputs including a control schedule such as an HVAC schedule that can include one or several setpoints. The setpoints can include a setpoint time and a setpoint temperature, and can thereby define a desired environmental parameter, such as a temperature, for the climate controlled enclosure and a time when the setpoint is applicable to the climate controlled enclosure. In some embodiments, the setpoint time can define: a starting time for the applicability of the setpoint to the climate controlled enclosure, a starting time and an end time that bound the applicability of the setpoint to the climate controlled enclosure, and/or a starting time and a duration that bound the applicability of the setpoint to the climate controlled enclosure. In some embodiments in which the HVAC schedule comprises a plurality of setpoints, the setpoint time can define a starting time for the applicability of the setpoint to the climate controlled enclosure, and the applicability of the setpoint to the climate controlled enclosure can last until the setpoint time of a different setpoint is reached.

As discussed above, the setpoints can be set when the HVAC schedule is created, and the setpoints can be changed while the HVAC schedule is being operated, which change can be accomplished via an update which can be received by the background schedule simulation system 4400. In some embodiments, and as discussed above setpoints can be added, removed, and/or changed, including changing one or both of the setpoint time and the setpoint temperature. A setpoint can be changed, as discussed above, by the user providing an RT setpoint and/or an NRT setpoint. In some embodiments, a setpoint can be further changed based on the occupancy of the climate controlled enclosure. Thus, in some embodiments, a setpoint resulting in the consumption of a lesser amount of energy can be implemented when the climate controlled enclosure is not occupied by a human.

Referring again to FIG. 44 the background schedule simulation system 4400 can include an HVAC system control 4402. The HVAC system control 4402 can control the HVAC system 4399 based on received inputs. In some embodiments, the HVAC system control 4402 can receive the user provided HVAC schedule, hereinafter referred to as the first HVAC schedule, can receive updates including one or several RT setpoints, one or several NRT setpoints, and/or an occupancy profile indicating whether the climate controlled enclosure is occupied by a human, and an input indicative of an environmental parameter of the climate controlled enclosure including, for example, the ambient temperature in the climate controlled enclosure.

The HVAC system control 4402 can generate HVAC system control signals, an actual runtime profile, and/or a record HVAC schedule based on the inputs. The HVAC system control signals can control the operation of the HVAC system, and specifically can comprise the instructions to the HVAC system 4399 that turn the HVAC system 4399 on and off. The record HVAC schedule can be a historical record of the setpoints executed by the HVAC system control 4402. The actual runtime profile can comprise the collection of the control signals generated by the HVAC system control 4402 over the period of time. Thus, the actual runtime profile is a historic record of when the HVAC system 4399 was turned on and the duration of the operation of the HVAC system 4399.

The background schedule simulation system 4400 includes a background schedule simulation learning engine 4404. The background schedule simulation learning engine 4404 can, like the HVAC system control 4402 receive inputs relating to and used for controlling the operation of the HVAC system 4399. In some embodiments, the background schedule simulation learning engine 4404 can receive the first HVAC schedule, and can receive updates including one or several RT setpoints, one or several NRT setpoints, and/or an occupancy profile indicating whether the climate controlled enclosure is occupied by a human. In one particular embodiment, the background schedule simulation learning engine 4404 can receive the first HVAC schedule and can receive updates including one or several RT setpoints and/or one or several NRT setpoints.

The background schedule simulation engine 4404 can generate a learned schedule, hereinafter referred to as the second HVAC schedule. The second HVAC schedule can be generated using the learning processes and algorithms discussed in greater detail above, and can be used as the basis for alternate operation of the HVAC system 4399 in the comparison of actual energy consumption and/or actual energy cost with the simulated energy consumption and/or simulated energy cost.

The background schedule simulation system 4400 includes a HVAC/structure modeling engine 4406. The HVAC/structure modeling engine 4406 can generate a model of the HVAC system 4399 and the associated climate controlled enclosure. The HVAC/structure modeling engine

4406 can use a variety of inputs in generating the model of the HVAC system 4399 in the associated climate controlled enclosure. In some embodiments, for example, these inputs can include the actual runtime profile generated by the HVAC system control 4402, the ambient temperature inside the climate controlled enclosure, the energy consumption of the HVAC system 4399 during operation, and the ambient temperature of the area outside and surrounding the climate controlled enclosure. This information can be used to determine the rate of ambient temperature change in the climate control enclosure when the HVAC system 4399 is not in operation and the rate of ambient temperature change when the HVAC system 4399 is in operation.

In some embodiments, for example, the HVAC/structure modeling engine 4406 generates a HVAC/structure model which is a model of a thermal property of the HVAC system 4399 and the climate controlled enclosure, which thermal property can relate to the rate of heat transfer to and from the climate controlled enclosure and the amount of energy consumed by the HVAC system 4399 to affect an ambient temperature change inside the climate controlled enclosure. In some embodiments, for example, this thermal property can include, for example, one or several of a thermal resistance, a thermal conductivity, and/or a heat flux. As used herein, a model of a thermal property of an HVAC system, or thermal property model, includes information sufficient to be able to compute HVAC system runtime results in view of at least one input driving function. Such input driving function can include, for example, an actual or hypothetical HVAC schedule, an actual or hypothetical outside temperature profile versus time, actual or hypothetical occupancy information versus time, and so forth. The thermal property model can include, but is not limited to, a thermal conductivity metric that reflects the ability of the structure to hold heat/cool, the heating/cooling capacity of the HVAC system, the size of the home in square feet and/or cubic feet, and so forth. The thermal property model can additionally and/or alternatively include specialized parameters that are specific to one or more abstract models of the HVAC characteristics of the home that do not necessarily map into conventional units or metrics such as BTU/hour or square footage, but that instead map specifically into internal control system parameters of those abstract models. For some embodiments, one or more of the thermal modeling methods described in the commonly assigned U.S. Ser. No. 12/881,463 can be used to generate the thermal property model.

The background schedule simulation system 4400 can include a setpoint profile simulator 4408. In some embodiments, for example, the setpoint profile simulator 4408 can generate a setpoint profile comprising simulated setpoints simulated to occur during the period of time. In some embodiments, the setpoint profile simulator 4408 can receive inputs from the other components of the background schedule simulation system 4400 including, for example, the second HVAC schedule, which was generated by the learning engine 4404, and the occupancy profile. In some embodiments, for example, the setpoint profile simulator 4408 can merge the second HVAC schedule and the occupancy profile to identify which setpoints would have been affected by the absence of a human from the climate controlled enclosure. The setpoint profile simulator 4408 can then generate simulated setpoints for times in which no human was present in the climate controlled enclosure. These setpoints can be combined with the setpoints of the second HVAC schedule simulated as occurring during times in which a human was present in the climate controlled enclosure to create a setpoint profile, which represents the setpoints that would have been used in the operation the HVAC system 4399 during the period of time if the HVAC system 4399 had operated according to the second HVAC schedule.

The background schedule simulation system 4400 includes a cost simulator 4410. The cost simulator 4410 can be configured to receive inputs from other components of the background schedule simulation system 4400 and energy price information, which information can comprise actual energy price information for the time period or estimated price information for the time period. The cost simulator 4410 can use these inputs and the energy price information to generate an estimated cost of operating the HVAC system 4399 according to the provided inputs and the energy price information. In one embodiment, for example, the cost simulator 4410 can receive an input identifying the rate of energy consumption by the HVAC system 4399 when the HVAC system 4399 is being operated, a runtime profile which can be, for example, the actual runtime profile and/or a simulated runtime profile, and energy price information. In some embodiments, when the cost simulator 4410 uses the actual runtime profile, the actual energy consumption and/or the actual energy cost can be calculated, and in embodiments when the cost simulator 4410 uses the simulated runtime profile, the simulated energy consumption and/or the simulated energy cost can be calculated.

Figure 45:
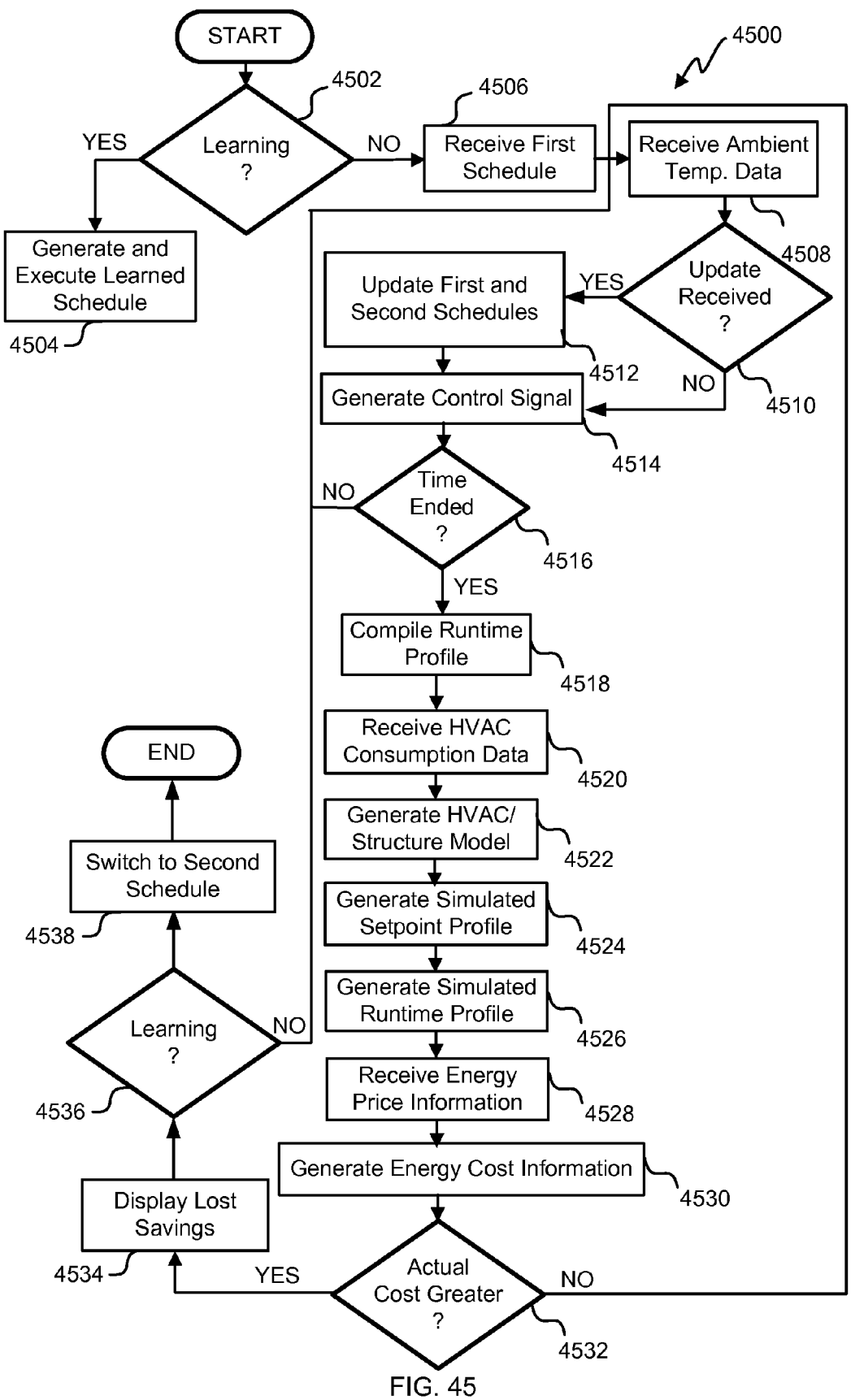
FIG. 45 illustrates an exemplary implementation of the background schedule simulation system.

FIG. 45 illustrates one embodiment of a process 4500 for background schedule simulation. This process 4500 can be performed with the components of the background schedule simulation system 4400 discussed above. The process 4500 begins at decision state 4502 wherein it is determined if learning is enabled. In some embodiments, for example, the determination of whether learning is enabled can include querying the user as to whether to enable learning, and receiving an input from the user indicating whether to enable learning. If learning is enabled, the process proceeds to block 4504 and generates and executes the learned schedule as discussed above.

Returning again to decision state 4502, if learning is not enabled, the process 4500 proceeds to block 4506 wherein the first HVAC schedule is received. In some embodiments, for example, the first HVAC schedule can be received from the user and can, for example, be received by the intelligent thermostat 102 and provided to the background schedule simulation system 4400.

After the first HVAC schedule has been received, the process 4500 proceeds to block 4508 wherein ambient temperature data for the climate controlled enclosure is received. In some embodiments, for example, the ambient temperature data for the climate controlled enclosure can be measured by a component of the smart home environment 100 including, for example, a sensor located in the intelligent thermostat 102. This ambient temperature data for the climate control enclosure can be provided to the background schedule simulation system 4400.

After the ambient temperature data for the climate controlled enclosure has been received, the process 4500 proceeds to decision state 4510 wherein it is determined if an update has been received. In some embodiments this determination can include determining whether the user has provided an RT setpoint and/or an NRT setpoint, or if the occupancy status of the climate controlled enclosure has changed.

If it is determined that an update has been received, then the process 4500 proceeds to block 4512 wherein the first and second HVAC schedules are updated. In some embodiments, for example, the first HVAC schedule can be updated by the HVAC system control 4402 to reflect the received updates. In some embodiments, for example, the second HVAC schedule can be updated by the learning engine 4404 based on the learning algorithms and processes discussed above in connection with the received updates. Although both the first HVAC schedule and the second HVAC schedule are updated based on the updates as the second HVAC schedule is also based on the above discussed learning algorithms and learning processes, the first HVAC schedule and the second HVAC schedule can differ.

After the first and second HVAC schedules have been updated, and returning again to decision state 4510, if it is determined that no update has been received, the process 4500 proceeds to block 4514 wherein a control signal is generated. The control signal can be generated by the HVAC system control 4402 based on the first HVAC schedule and any update thereto. As discussed above, the control signal can control the operation of the HVAC system 4399 including, for example, when the HVAC system 4399 is operating and when the HVAC system 4399 is not operating.

After the control signal is generated, the process 4500 proceeds to decision state 4516 wherein it is determined if the time period has ended. As discussed above, in some embodiments the background schedule simulation system 4400 is configured to compare actual energy consumption and/or actual energy cost to simulated energy consumption and/or simulated energy cost over a period of time. In some embodiments, the background schedule simulation engine 4400 can be configured to determine if this period of time has ended. If the period of time has not ended, the process 4500 returns to block 4508 and continues as described above.

If it is determined that the period of time has ended, the process 4500 proceeds to block 4518 wherein the actual runtime profile is compiled. In some embodiments, for example, the actual runtime profile can comprise the collection of control signals generated by the HVAC system control 4402 over the period of time.

After the actual runtime profile is compiled, the process 4500 proceeds to block 4520 wherein HVAC consumption data is received. In some embodiments, for example, the HVAC consumption data can comprise data indicating the amount of energy consumed by the HVAC system 4399 per length of time that the HVAC system 4399 is in operation. In some embodiments, for example, this information can be received from a component of the smart home environment 100 including, for example, the HVAC system 4399, a smart meter, or any other device or source containing this information.

After the HVAC consumption data has been received, the process 4500 proceeds to block 4522 wherein the HVAC/structure model is generated. In some embodiments, the HVAC/structure model can be generated by the HVAC/structure modeling engine 4406. As discussed above, in some embodiments, the HVAC/structure modeling engine 4406 can generate a model of the HVAC system 4399 and the associated climate controlled enclosure which can be a model of one or several thermal properties of the HVAC system 4399 and the associated climate controlled enclosure.

After the HVAC/structure model has been generated, the process proceeds to block 4524 wherein a simulated setpoint profile is generated. In some embodiments, for example, the simulated setpoint profile can be generated by the setpoint profile simulator 4408. In some embodiments, and as discussed above, the simulated setpoint profile can be generated based on the second HVAC schedule and the occupancy profile, and can include the setpoints that would have controlled the operation of the HVAC system 4399 during the period of time if the HVAC system 4399 had operated according to the second HVAC schedule for that time.

After the simulated setpoint profile has been generated, the process 4500 proceeds to block 4526 wherein the simulated runtime profile is generated. In some embodiments, for example, the simulated runtime profile can be generated based on the HVAC/structure model generated in block 4522, based on the simulated setpoint profile generated in block 4524, and/or based on the ambient temperature outside the climate controlled enclosure. In some embodiments, for example, the simulated runtime profile can be generated by the HVAC/structure modeling engine 4408.

After the simulated runtime profile has been generated, the process 4500 proceeds to block 4528 wherein energy price information is received. In some embodiments, for example, the energy price information can be actual price information for the period of time or estimated price information for the period of time. In some embodiments, for example, the energy price information can be stored in one of the components of the background schedule simulation system 4400 and/or in the intelligent thermostat 102 or other component of the smart home environment 100. In some embodiments, for example, the energy price information can be received from a source outside of the smart home environment 100 such as, for example, the energy provider and/or the user.

After the energy price information has been received, the process 4500 proceeds to block 4530 wherein energy cost information is generated. In some embodiments, for example, the energy cost information can be generated by the cost simulator 4410 and can be based on the energy price information, the HVAC consumption data received in block 4520, and one of the actual runtime profile and the simulated runtime profile. In some embodiments, for example, the cost simulator 4410 can generate an actual energy cost based on the actual runtime profile and the simulated energy cost based on the simulated runtime profile.

After the energy cost information is generated, the process 4500 proceeds to decision state 4532 wherein it is determined if the actual energy cost is greater than the simulated energy cost. In some embodiments, for example, the determination of whether the actual energy cost is greater than the simulated energy cost can be made by the cost simulator 4410 of the background schedule simulation system 4400.

If it is determined that the actual cost of energy consumed is less than the simulated cost of energy consumed, then the process 4500 returns to block 4508 and proceeds as discussed above. If it is determined that the actual cost of energy consumption is greater than the simulated cost of energy consumption, then the process 4500 proceeds to block 4534 wherein an indicator of lost savings is provided. In some embodiments, for example, this indicator of lost savings can identify the length of the period of time and the amount of money and/or energy that could have been saved during that period of time if the user had elected to generate and execute a learned schedule. In some embodiments this indicator can include a statement such as, "Hey, you could have saved X dollars!" and a question asking whether the user would like to start saving money or energy.

After the indicator of lost savings has been provided, the process 4500 proceeds to decision state 4536 wherein it is determined if learning is enabled. In some embodiments, for example, the determination of whether learning is enabled can include querying the user as to whether to enable learning, which can include querying the user as to whether he would like to save money and/or energy, and receiving an input from the user indicating whether to enable learning and/or whether to save money and/or energy. If learning is not enabled, then the process 4500 proceeds to block 4508.

If learning is enabled, then the process 4500 proceeds to block 4538 wherein the HVAC control system 4402 switches to operation according to the second HVAC schedule. In some embodiments, for example, operation according to an HVAC schedule can comprise operating the HVAC system 4399 based only on the setpoints in the HVAC schedule, and in some embodiments, operation according to an HVAC schedule can comprise operating the HVAC system 4399 based on the setpoints in the HVAC schedule and on other data. In some embodiments, for example, operating the HVAC system 4399 according to the HVAC schedule can include operating the HVAC system 4399 based on HVAC schedule setpoints and any received updates. A person of skill in the art will recognize that the phrase "according to" is not narrowly defined to mean only operation of the HVAC system 4399 in exact compliance with each HVAC schedule setpoint, but includes operation of the HVAC system 4399 in compliance with some or all of the HVAC schedule setpoints and/or in compliance with any other received data.

In some embodiments, for example, the switch from operating the HVAC system 4399 according to the first HVAC schedule to according to the second HVAC schedule can be performed over a transition period. In some embodiments, for example, this transition period can be short including, for example, a length of time such as a nanosecond or a microsecond, and in some embodiments, for example, this transition period can be extended to a length of time such as, for example, several weeks or months, and may specifically comprise two weeks. In some embodiments in which the transition period is extended, the switch from operating the HVAC system 4399 according to the first HVAC schedule to according to the second HVAC schedule can be gradually performed during the transition period. Advantageously, the gradual switch between HVAC schedules can decrease the ability of the user to notice the transition and increase the likelihood of the user remaining with the learned, second HVAC schedule.

Figure 46:
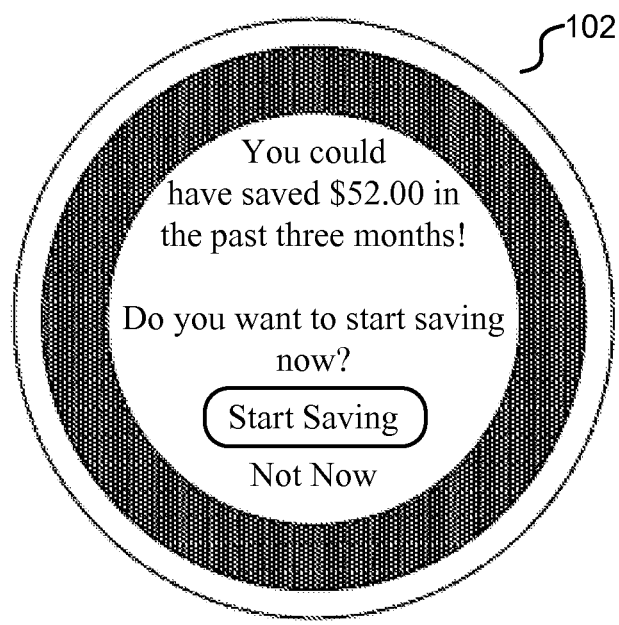
FIGS. 46 to 48 illustrate examples of remote graphical user interface displays presented to the user on their data appliance for managing their background schedule simulation system and/or otherwise interacting with their smart home environment including the background schedule simulation system.
Figure 47:
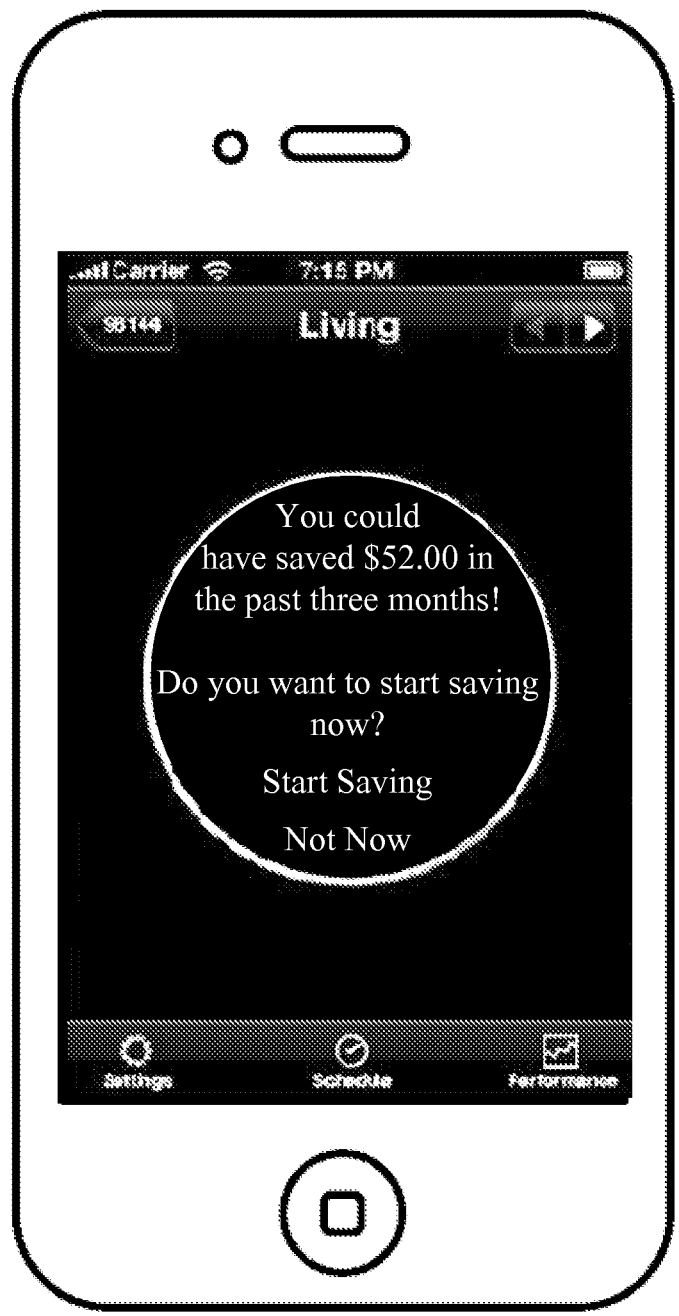
Figure 48:
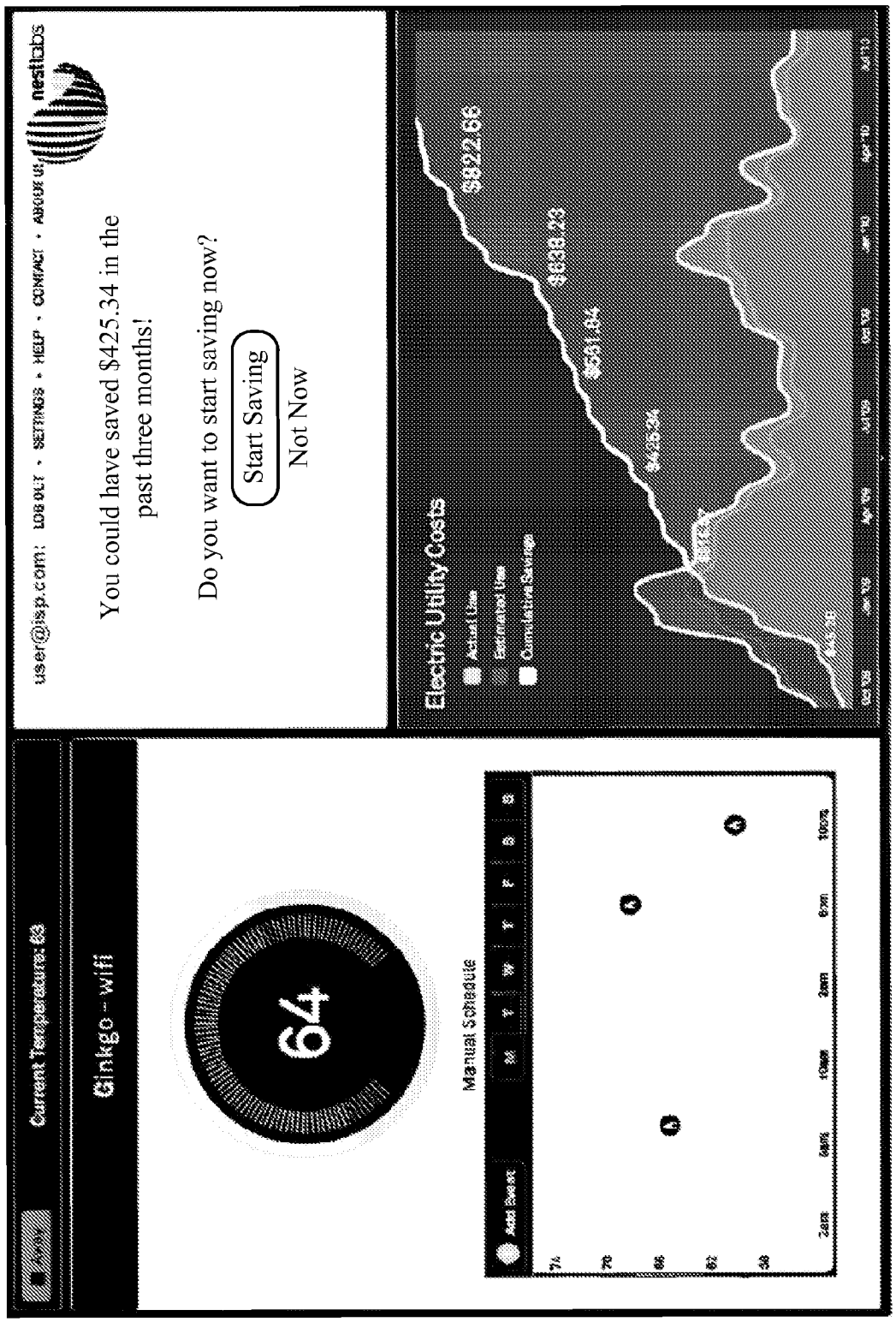

FIGS. 46 to 48 illustrate examples of remote graphical user interface displays presented to the user on the data appliance for managing their background schedule simulation system and/or otherwise interacting with their smart home environment including the background schedule simulation system. For the embodiment in FIG. 46, the user interface display is provided directly by a designated one of the user's intelligent thermostats 102. For the embodiment shown in FIG. 47, the user interface display is provided on a portable data device such as a smart phone including an iPhone. For the embodiment shown in FIG. 48, the user interface display is provided in a conventional browser window.

In one embodiment, and as seen in FIGS. 46 to 48, the user interface display can display a message indicating the amount of money that could have been saved over the period of time. As specifically seen in FIGS. 46 to 48 this message states "You could have saved $52.00 in the past three months! Do you want to start saving now?" which message is followed by a first option identified with the phrase "Start Saving" and a second option identified by the phrase "Not Now." In some embodiments, the first option identified with the phrase "Start Saving" can correspond to a user decision to enable learning and/or to operate the HVAC system 4399 according to the second HVAC schedule, and the second option identified with the phrase "Not Now" can correspond to a user decision to not enable learning and/or to operate the HVAC system 4399 according to the first HVAC schedule. In one embodiment, the user interface can default to the first option so as to bias the user towards enabling learning. In some alternative embodiments, the phrase "Not Now" could be replaced by more stern or even pejorative language, such as "Continue Losing" or "Keep Losing," which may turn out to be more effective in driving the behaviors of some groups or sub-groups of users in certain environments or scenarios.

In the embodiment depicted in FIG. 46, the user interface allows the user to enter "ring rotation" and "inward click" user inputs to select between the first and second options. In the embodiment depicted in FIGS. 47 and 48, the user interface allows the user to select between the first and second options by, for example, touchscreen, mouseclick, keyboard, keypad, or any other user input.

Although the present invention has been described in terms of particular examples, it is not intended that the invention be limited to these examples. Modifications within the spirit of the invention will be apparent to those skilled in the art. For example, as discussed above, automated control-schedule learning may be employed in a wide variety of different types of intelligent controllers in order to learn one or more schedules that may span period of time from milliseconds to years. Intelligent-controller logic may include logic-circuit implementations, firmware, and computer-instruction-based routine and program implementations, all of which may vary depending on the selected values of a wide variety of different implementation and design parameters, including programming language, modular organization, hardware platform, data structures, control structures, and many other such design and implementation parameters. As discussed above, the steady-state learning mode follows aggressive learning may include multiple different phases, with the intelligent controller generally becoming increasingly conservative, with regard to schedule modification, with later phases. Automated-control-schedule learning may be carried out within an individual intelligent controller, may be carried out in distributed fashion among multiple controllers, may be carried out in distributed fashion among one or more intelligent controllers and remote computing facilities, and may be carried out primarily in remote computing facilities interconnected with intelligent controllers. By way of still further example, although automated thermal modeling (i.e., without requiring user assistance) is used in one or more embodiments described above as a basis for acquiring a home thermal model that enables the subject background schedule simulations, the scope of the present teachings is not so limited. Thus, in other embodiments, the user may be requested to provide certain data points that may assist in the building of a thermal model, such as may be implemented using one or more methods of U.S. Ser. No. 13/440,910, supra, in which a persistent background application queries the user during periods of "downtime" or "idle" computing activity about their HVAC environment.

It is appreciated that the previous description of the disclosed examples is provided to enable any person skilled in the art to make or use the present disclosure. Various modifications to these examples will be readily apparent to those skilled in the art, and the generic principles defined herein may be applied to other examples without departing from the spirit or scope of the disclosure. Thus, the present disclosure is not intended to be limited to the examples shown herein but is to be accorded the widest scope consistent with the principles and novel features disclosed herein.

The invention claimed is:

1. A method for promoting energy efficiency in association with an HVAC system of a climate controlled enclosure, the HVAC system being controlled by a network-connected thermostat having a user interface controllable by a user, the method comprising:

receiving a first HVAC schedule comprising a plurality of setpoints, each setpoint comprising an indication of a setpoint time and a setpoint temperature for the climate controlled enclosure;

operating, over a period of time, the HVAC system according to the first HVAC schedule;

measuring, over said period of time, an actual ambient temperature in the climate controlled enclosure;

receiving an update corresponding to at least one of: a real-time setpoint change, a schedule change, and an occupancy profile, wherein the real-time setpoint change comprises a desired temperature for immediate implementation entered by the user using the user interface during said period of time, wherein the schedule change comprises at least one of (i) a change to the setpoint temperature or setpoint time of one or more setpoints of the first HVAC schedule, (ii) the removal of the one or more setpoints from the first HVAC schedule, and (iii) the addition of one or more new setpoints to the first HVAC schedule, and wherein the occupancy profile comprises indications over said period of time of whether one or more occupants is present in the climate controlled enclosure;

processing said received update in conjunction with the first HVAC schedule to generate a second HVAC schedule representative of what would have been generated by an automated schedule learning algorithm operating over said period of time, wherein the second HVAC schedule is generated in the background based on the first HVAC schedule, the received update, and the automated schedule learning algorithm, the second HVAC schedule and the first HVAC schedule exist simultaneously, and the second HVAC schedule is maintained distinct from the first HVAC schedule;

simulating the second HVAC schedule using a thermal model of the climate controlled enclosure;

subsequent to said period of time, generating a cost difference indicator corresponding to a cost difference between an actual cost of operating the HVAC system according to the first HVAC schedule over said period of time and a hypothetical cost of operating the HVAC system according to the second HVAC schedule over said period of time based on simulating the second HVAC schedule using the thermal model of the climate controlled enclosure; and displaying said cost difference indicator to the user using said user interface.

2. The method of claim 1, wherein said user interface is remote.

3. The method of claim 1, further comprising:
receiving an input indicating:
desired non-activation of the automated scheduled learning algorithm; and
in response to the input indicating desired non-activation, operating, over a second period of time, the HVAC system according to the first HVAC schedule.

4. The method of claim 1, further comprising generating a first runtime profile indicating time intervals for which the HVAC system was actively heating or cooling over said period of time.

5. The method of claim 4, further comprising determining the energy consumed by the HVAC system as a result of said first runtime profile.

6. The method of claim 5, wherein determining the energy consumed by the HVAC system comprises receiving an indicator of a relationship between HVAC system energy consumption and said first runtime profile.

7. The method of claim 5, wherein said generating the cost difference indicator comprises:
receiving outside temperature data for said period of time corresponding to ambient temperature in an area outside the climate controlled enclosure;
processing said actual ambient temperature in the climate controlled enclosure over said period of time in conjunction with the outside temperature data over said period of time and said first runtime profile to generate the thermal model of the climate controlled enclosure; and
processing said outside temperature data in conjunction with said thermal model of the climate controlled enclosure and said second HVAC schedule to generate a second runtime profile.

8. The method of claim 7, wherein said generating the cost difference indicator further comprises:
determining the actual cost of operating the HVAC system according to the first HVAC schedule over said period of time using the determined energy consumed by the HVAC system as a result of said first runtime profile;
determining the hypothetical energy consumed by the HVAC system as a result of said second runtime profile over said period of time; and
determining the hypothetical cost of operating the HVAC system according to the second HVAC schedule over said period of time using the hypothetical energy consumed by the HVAC system as a result of said second runtime profile over said period of time.

9. The method of claim 8, wherein the determination of the actual cost of operating the HVAC system according to the first HVAC schedule over said period of time further uses the a measure of per unit energy cost.

10. The method of claim 9, wherein the measure of per unit energy cost comprises actual per unit energy cost data collected over said period of time.

11. The method of claim 9, wherein the measure of per unit energy cost comprises estimated per unit energy cost data.

12. The method of claim 1, wherein each step of the method is performed by the network-connected thermostat.

13. The method of claim 1, wherein displaying said cost difference indicator to the user further comprises displaying a query to the user as to whether the HVAC system should operate according to said second HVAC schedule.

14. The method of claim 13, further comprising:
receiving an instruction to operate the HVAC system according to said second HVAC schedule; and
transitioning to operating the HVAC system according to said second HVAC schedule over a transition period.

15. The method of claim 14, wherein the transition period comprises two weeks.

16. A method for promoting energy efficiency in association with an HVAC system of a climate controlled enclosure, the HVAC system being controlled by a network-connected thermostat having a user interface controllable by a user, the method comprising:
measuring an actual ambient temperature in the climate controlled enclosure over a period of time;
generating a plurality of control signals over said period of time according to at least one of a first HVAC schedule and an update, wherein the first HVAC schedule comprises a plurality of setpoints, each setpoint comprising an indication of a setpoint time and a desired setpoint temperature for the climate controlled enclosure, wherein the update comprises at least one of a real-time setpoint change, a schedule change, and an occupancy profile, and wherein the control signals direct the operation of the HVAC system;

determining the actual energy consumed by operating the HVAC system according to the plurality of control signals over said period of time;

receiving outside temperature data indicative of an ambient temperature of an area outside the climate controlled enclosure;

processing said actual ambient temperature in the climate controlled enclosure over said period of time in conjunction with the outside temperature data over said period of time and said control signals to generate a thermal model of the climate controlled enclosure;

generating a hypothetical runtime profile from the first HVAC schedule, said period of time, said update, said thermal model of the climate controlled enclosure, the actual ambient temperature in the climate controlled enclosure, an automated schedule learning algorithm, and the outside temperature data, wherein the hypothetical runtime profile and the first HVAC schedule exist simultaneously, and the hypothetical runtime profile is maintained distinct from the first HVAC schedule;

calculating the hypothetical energy consumed by the HVAC system as a result of said hypothetical runtime profile being simulated for said period of time;

generating an indicator of the difference between the hypothetical energy consumed by the HVAC system in accordance with the hypothetical runtime profile and the actual energy consumed by the HVAC system as controlled according to the first HVAC schedule for said period of time;

providing the indicator of the difference to the user.

17. The method of claim 16, further comprising processing said received update in conjunction with the first HVAC schedule to generate a second HVAC schedule representative of what would have been generated by the automated schedule learning algorithm operating over said period of time.

18. The method of claim 16, wherein said processing to generate said thermal model of the climate controlled enclosure further comprises:

calculating a temperature response of the climate controlled enclosure, wherein the temperature response comprises a speed with which the actual ambient temperature of the climate controlled enclosure approaches the ambient temperature of the area outside the climate controlled enclosure; and calculating a thermal property of the climate controlled enclosure.

19. The method of claim 18, wherein said thermal property of the climate controlled enclosure comprises an insulative property of the climate controlled enclosure.

20. The method of claim 19, wherein said insulative property is calculated from the temperature response, the actual ambient temperature of the climate controlled enclosure, and the data indicative of the ambient temperature of the area outside the climate controlled enclosure.

21. The method of claim 18, wherein the indicator of the difference between the hypothetical energy consumed by the HVAC system and the actual energy consumed by the HVAC system is an indicator of the price difference between the actual energy consumed and the hypothetical energy consumed.

22. The method of claim 20, further comprising displaying a query as to whether to operate the HVAC system according to the second HVAC schedule.

23. The method of claim 21, further comprising:

receiving an instruction to operate the HVAC system according to said second HVAC schedule; and transitioning to operating the HVAC system according to said second HVAC schedule over a transition period.

24. The method of claim 16, wherein the method is performed by the network-connected thermostat.

25. A system for promoting energy efficiency in association with an HVAC system of a climate controlled enclosure, the HVAC system being controlled by a network-connected thermostat having a user interface controllable by a user, the system comprising:

a sensor configured to measure ambient temperature in the climate controlled enclosure; and a processor configured to:

request measurement of an actual ambient temperature in the climate controlled enclosure over a period of time;

generate a plurality of control signals over said period of time according to at least one of a first HVAC schedule and an update, wherein the first HVAC schedule comprises a plurality of setpoints, each setpoint comprising an indication of a setpoint time and a desired setpoint temperature for the climate controlled enclosure, wherein the update comprises at least one of a real-time setpoint change, a schedule change, and an occupancy profile, and wherein the control signals direct the operation of the HVAC system;

determine the actual energy consumed by operating the HVAC system according to the plurality of control signals over said period of time;

receive outside temperature data indicative of the ambient temperature of an area outside the climate controlled enclosure;

process said actual ambient temperature in the climate controlled enclosure over said period of time in conjunction with the outside temperature data over said period of time and said control signals to generate a thermal model of the climate controlled enclosure;

generate a hypothetical runtime profile from the first HVAC schedule, said period of time, said update, said thermal model of the climate controlled enclosure, the actual ambient temperature in the climate controlled enclosure, and the outside temperature data, wherein:

the hypothetical runtime profile is generated in the background based on the first HVAC schedule and the hypothetical runtime profile is maintained distinct from the first HVAC schedule;

calculate the hypothetical energy consumed by the HVAC system as a result of said hypothetical runtime profile during said period of time;

generate an indicator of the difference between the hypothetical energy consumed by the HVAC system according to the hypothetical runtime profile and the actual energy consumed by the HVAC system for said period of time as controlled according to the first HVAC schedule; and provide the indicator of the difference to the user.

26. The system of claim 25, further comprising the network-connected thermostat, wherein the processor is located in the network-connected thermostat.

27. The system of claim 25, wherein the processor is further configured to process said received update in conjunction with the first HVAC schedule to generate a second HVAC schedule representative of what would have been generated by an automated schedule learning algorithm operating over said period of time.

28. The system of claim 25, wherein the processor is further configured to:

calculate a temperature response of the climate controlled enclosure, wherein the temperature response comprises a speed with which the actual ambient temperature of said climate controlled enclosure approaches the ambient temperature of the area outside the climate controlled enclosure; and calculate a thermal property of the climate controlled enclosure.

29. The system of claim 25, wherein the indicator of the difference between the hypothetical energy consumed by the HVAC system and the actual energy consumed by the HVAC system is an indicator of the price difference between \the actual energy consumed and the hypothetical energy consumed.

30. The system of claim 25, wherein the processor is further configured to:

receive an instruction to operate the HVAC system according to said second HVAC schedule; and transition to operating the HVAC system according to said second HVAC schedule over a transition period.

* * * * *